US012767679B2

(12) United States Patent
Lee et al.

(10) Patent No.: US 12,767,679 B2
(45) Date of Patent: Oct. 20, 2026

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Hyunjung Lee, Yongin-si (KR); Seokhwan Hwang, Yongin-si (KR); Iljoon Kang, Yongin-si (KR); Sungbum Kim, Yongin-si (KR); Eunsoo Ahn, Yongin-si (KR); Eunyoung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 771 days.

(21) Appl. No.: 18/297,769

(22) Filed: Apr. 10, 2023

(65) Prior Publication Data

US 2024/0092815 A1 Mar. 21, 2024

(30) Foreign Application Priority Data

Aug. 4, 2022 (KR) ........................ 10-2022-0097576

(51) Int. Cl.
*C07F 15/00* (2006.01)
*H10K 85/30* (2023.01)

(52) U.S. Cl.
CPC ....... *C07F 15/0086* (2013.01); *H10K 85/346* (2023.02); *C07B 2200/05* (2013.01)

(58) Field of Classification Search
None
See application file for complete search history.

(56) References Cited

U.S. PATENT DOCUMENTS

| | | | | |
|---|---|---|---|---|
| 9,238,668 | B2 | 1/2016 | Li et al. | |
| 9,318,725 | B2 | 4/2016 | Li | |
| 9,425,415 | B2 | 8/2016 | Li et al. | |
| 9,461,254 | B2 | 10/2016 | Tsai et al. | |
| 9,493,698 | B2 | 11/2016 | Beers et al. | |
| 9,698,359 | B2 | 7/2017 | Li et al. | |
| 9,899,614 | B2 | 2/2018 | Li et al. | |
| 10,020,455 | B2 | 7/2018 | Li et al. | |
| 12,082,487 | B2 * | 9/2024 | Lee | H10K 85/346 |
| 12,250,874 | B2 * | 3/2025 | Ahn | C09K 11/06 |
| 12,520,717 | B2 * | 1/2026 | Ko | H10K 85/636 |
| 2012/0223634 | A1 * | 9/2012 | Xia | C07F 15/0086 546/4 |
| 2013/0048963 | A1 | 2/2013 | Beers et al. | |
| 2014/0364605 | A1 | 12/2014 | Li et al. | |
| 2015/0295190 | A1 * | 10/2015 | Chen | C09B 57/00 546/4 |
| 2017/0317298 | A1 * | 11/2017 | Anémian | H05B 33/14 |
| 2018/0375036 | A1 | 12/2018 | Chen et al. | |
| 2020/0140471 | A1 * | 5/2020 | Chen | H10K 85/346 |
| 2020/0216481 | A1 | 7/2020 | Chen et al. | |
| 2022/0112231 | A1 * | 4/2022 | Han | H10K 85/346 |
| 2022/0162246 | A1 * | 5/2022 | Chen | C07F 15/0086 |
| 2022/0199918 | A1 * | 6/2022 | Ahn | C09K 11/06 |
| 2022/0271241 | A1 * | 8/2022 | Horwitz | C07F 15/0033 |
| 2023/0115552 | A1 * | 4/2023 | Thompson | C09K 11/06 257/40 |
| 2023/0167145 | A1 * | 6/2023 | Thompson | H10K 85/658 257/40 |
| 2023/0301170 | A1 * | 9/2023 | Han | C07F 15/0086 |
| 2023/0371360 | A1 * | 11/2023 | Chen | C07F 15/0086 |
| 2024/0092815 | A1 * | 3/2024 | Lee | H10K 85/6572 |
| 2024/0298518 | A1 * | 9/2024 | Hamze | C07F 15/0086 |
| 2025/0143169 | A1 * | 5/2025 | Jeon | H10K 85/6574 |
| 2026/0013321 | A1 * | 1/2026 | Sheina | H10K 50/121 |
| 2026/0022294 | A1 * | 1/2026 | Lee | C09K 11/06 |
| 2026/0026189 | A1 * | 1/2026 | Lee | H10K 50/131 |

* cited by examiner

FOREIGN PATENT DOCUMENTS

| | | |
|---|---|---|
| JP | 6009279 | 10/2016 |
| KR | 10-2019-0000812 | 1/2019 |

*Primary Examiner* — Robert S Loewe
(74) *Attorney, Agent, or Firm* — Womble Bond Dickinson (US) LLP

(57) ABSTRACT

Embodiments provide an organometallic compound, a light-emitting device including the organometallic compound, and an electronic apparatus including the light-emitting device. The light-emitting device includes a first electrode, a second electrode facing the first electrode, an interlayer between the first electrode and the second electrode and including an emission layer, and the organometallic compound, which is represented by Formula 1, wherein Formula 1 is explained in the specification:

[Formula 1]

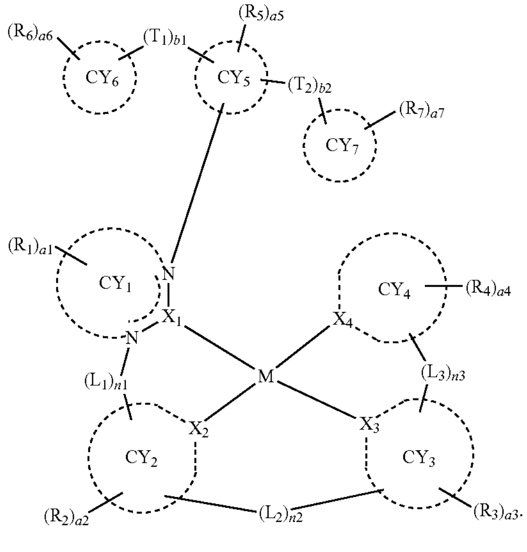

20 Claims, 8 Drawing Sheets

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0097576 under 35 U.S.C. § 119, filed on Aug. 4, 2022, in the Korean Intellectual Property Office, the entire contents of which are incorporated herein by reference.

BACKGROUND

1. Technical Field

Embodiments relate to an organometallic compound, a light-emitting device including the organometallic compound, and an electronic apparatus including the light-emitting device.

2. Description of the Related Art

Among light-emitting devices, organic light-emitting devices are self-emissive devices that have wide viewing angles, high contrast ratios, short response times, and excellent characteristics in terms of luminance, driving voltage, and response speed, compared to devices in the art.

In an example, an organic light-emitting device may have a structure in which a first electrode is arranged on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. The excitons may transition from an excited state to a ground state, thus generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound having low driving voltage and excellent luminance and luminescence efficiency, a light-emitting device including the organometallic compound, and an electronic apparatus including the light-emitting device.

Additional aspects will be set forth in part in the description which follows and, in part, will be apparent from the description, or may be learned by practice of the embodiments.

According to embodiments, a light-emitting device may include a first electrode, a second electrode facing the first electrode, an interlayer between the first electrode and the second electrode and including an emission layer, and an organometallic compound represented by Formula 1:

[Formula 1]

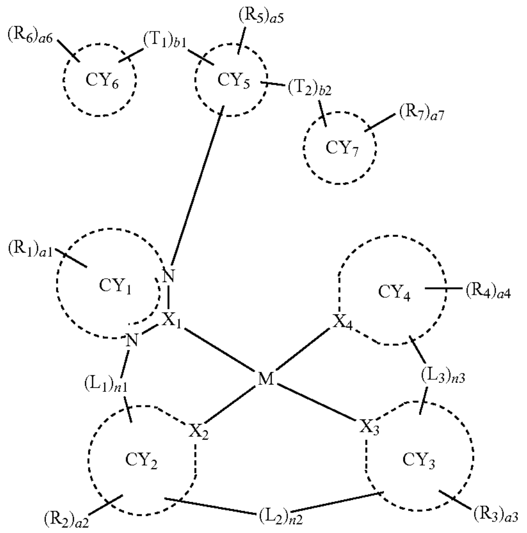

In Formula 1,

M may be platinum (Pt), palladium (Pd), gold (Au), nickel (Ni), silver (Ag), or copper (Cu), $X_1$ may be C, and $X_2$ to $X_4$ may each independently be C or N, a bond between $X_1$ and M may be a coordinate bond, one of a bond between $X_2$ and M, a bond between $X_3$ and M, and a bond between $X_4$ and M may be a coordinate bond, and the remainder thereof may each be a covalent bond, ring $CY_1$ may be a $C_1$-$C_{60}$ nitrogen-containing heterocyclic group including two N atoms as ring-forming atoms and $X_1$, ring $CY_2$ to ring $CY_7$ may each independently be a $C_3$-$C_{60}$ carbocyclic group or a $C_1$-$C_{60}$ heterocyclic group, $L_1$ to $L_3$ may each independently be a single bond, *—C($R_8$)($R_9$)—*', *—C($R_8$)=*', *=C($R_8$)—*', *—C($R_8$)=C($R_9$)—*', *—C(=O)—*', *—C(=S)—*', *—C≡C—*', *—B($R_8$)—*', *—N($R_8$)—*', *—O—*', *—P($R_8$)—*', *—Si($R_8$)($R_9$)—*', *—P(=O)($R_8$)—*', *—S—*', *—S(=O)—*', *—S(=O)$_2$—*', or *—Ge($R_8$)($R_9$)—*', n1 to n3 may each independently be an integer from 1 to 3, $T_1$ may be a single bond, *—C($Z_1$)($Z_2$)—*', *—Si($Z_1$)($Z_2$)—*', *—B($Z_1$)—*', *—N($Z_1$)—*', or *—P($Z_1$)—*', but may not be *—N(Ph)-*', $T_2$ may be a single bond, *—C($Z_3$)($Z_4$)—*', *—Si($Z_3$)($Z_4$)—*', *—B($Z_3$)—*', *—N($Z_3$)—*', or *—P($Z_3$)—*', but may not be *—N(Ph)-*',

* and *' each indicate a binding site to a neighboring atom, and Ph is a phenyl group, b1 and b2 may each independently be 1, 2, or 3, $R_1$ to $R_9$ and $Z_1$ to $Z_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a divalent carbon atom among $R_1$ to $R_9$ and $Z_1$ to $Z_4$ may optionally be substituted with *—C(=O)—*' or *—C(=S)—*', a1 to a7 may each independently be an integer from 0 to 20, at least one of Conditions a to c may be satisfied:

[Condition a]

two or more $R_5$(s) are connected to each other to form ring W, wherein ring W is a ring condensed with ring $CY_5$;

[Condition b]

$T_1$ is not a single bond, and at least one of $Z_1$ and $Z_2$ is connected to at least one of ring $CY_5$ and ring $CY_6$ to form ring W, wherein ring W is a ring condensed with at least one of ring $CY_5$ and ring $CY_6$;

[Condition c]

$T_2$ is not a single bond, and at least one of $Z_3$ and $Z_4$ is connected to at least one of ring $CY_5$ and ring $CY_7$ to form ring W, wherein ring W is a ring condensed with at least one of ring $CY_5$ and ring $CY_7$, wherein ring W may be a $C_3$-$C_{30}$ non-aromatic carbocyclic group unsubstituted or substituted with at least one $R_{10a}$ or a $C_1$-$C_{30}$ non-aromatic heterocyclic group unsubstituted or substituted with at least one $R_{10a}$, and a ring-forming divalent carbon atom of ring W may optionally be substituted with *—C(=O)—*' or *—C(=S)—*', in Formula 1, each of: two or more of $R_1$(s) in the number of a1; two or more of $R_2$(s) in the number of a2; two or more of $R_3$(s) in the number of a3; two or more of $R_4$(s) in the number of a4; two or more of $R_6$(s) in the number of a6; two or more of $R_7$(s) in the number of a7; and $R_8$ and $R_9$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the light-emitting device may further include a second compound including at least one π electron-deficient nitrogen-containing $C_1$-$C_{60}$ cyclic group, a third compound including a group represented by Formula 3, a fourth compound that is a delayed fluorescence compound, or any combination thereof, wherein the organometallic compound, the second compound, the third compound, and the fourth compound may be different from each other, and wherein Formula 3 is explained below.

In an embodiment, the second compound may include a pyridine group, a pyrimidine group, a pyrazine group, a pyridazine group, a triazine group, or any combination thereof.

In an embodiment, the emission layer may include: a first compound which is the organometallic compound; and the second compound, the third compound, the fourth compound, or any combination thereof.

In an embodiment, the emission layer may emit blue light, and the blue light may have a maximum emission wavelength in a range of about 410 nm to about 500 nm.

According to embodiments, an electronic apparatus may include the light-emitting device.

In an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode.

In an embodiment, the electronic apparatus may further include a color filter, a color conversion layer, a touch screen layer, a polarizing layer, or any combination thereof.

According to embodiments, an electronic equipment may include the light-emitting device, wherein the electronic equipment may be a flat panel display, a curved display, a computer monitor, a medical monitor, a television, an advertisement board, an indoor light, an outdoor light, a signal light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3D display, a virtual reality display, an augmented reality display, a vehicle, a video wall including multiple displays tiled together, a theater screen, a stadium screen, a phototherapy device, or a sign.

According to embodiments, an organometallic compound may be represented by Formula 1, which is explained herein.

In an embodiment, M may be Pt.

In an embodiment, ring $CY_1$ may be an imidazole group, a triazole group, an oxadiazole group, a thiadiazole group, a benzimidazole group, an imidazopyridine group, a furoimidazole group, a thienoimidazole group, an imidazopyrimidine group, an imidazopyrazine group, an imidazopyridazine group, a benzoxadiazole group, or a benzothiadiazole group.

In an embodiment, ring $CY_2$ to ring $CY_7$ may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, an imidazopyridazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, $L_1$ to $L_3$ may each independently be a single bond, $*—C(R_8)(R_9)—*'$, $*—B(R_8)—*'$, $*—N(R_8)—*'$, $*—O—*'$, $*—P(R_8)—*'$, $*—Si(R_8)(R_9)—*'$, $*—S—*'$ or $*—Ge(R_8)(R_9)—*'$.

In an embodiment, $T_1$ may be a single bond, $*—C(Z_1)(Z_2)—*'$, or $*—Si(Z_1)(Z_2)—*'$, and $T_2$ may be a single bond, $*—C(Z_3)(Z_4)—*'$, or $*—Si(Z_3)(Z_4)—*'$.

In an embodiment, at least one of Conditions 1 to 4 may be satisfied, which are explained below.

In an embodiment, in Formula 1, a moiety represented by

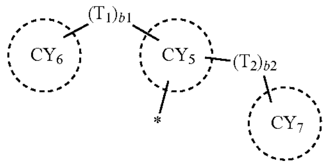

may be a moiety represented by Formula CY5A, which is explained below.

In an embodiment, ring W may be a cyclobutane group, a cyclopentane group, a cyclohexane group, a cycloheptane group, a cyclooctane group, an adamantane group, a norbornane group, a bicyclo[1.1.1]pentane group, a bicyclo[2.1.1]hexane group, a bicyclo[2.2.2]octane group, a cyclopentene group, a cyclohexene group, a cycloheptane group, a cyclopentadiene group, a 1,2,3,4-tetrahydronaphthalene group, a decahydronaphthalene group, an octahydropentalene group, an indene group, an octahydro-1H-indene group, a benzosilole group, a benzogermole group, an azaindene group, an azabenzosilole group, an azabenzogermole group, a cyclopentanone group, a cyclopentanethione group, a cyclohexanone group, a cyclohexanethione group, a hexahydro-1H-indene-2,4-dione group, an octahydronaphthalene-1,7-dione group, a hexahydronaphthalene-1,6(2H,7H)-dione group, an octahydro-1H-quinolizine group, an octahydroindolizine group, a hexahydro-1H-pyrrolizine group, a decahydroquinoline group, a decahydroisoquinoline group, an octahydro-1H-indole group, a spiro[4.4]nonane group, a spiro[4.5]decane group, a spiro[5.5]undecane group, a 5,6,7,8-tetrahydroisoquinoline group, or a 5,6,7,8-tetrahydroquinoline group, each unsubstituted or substituted with at least one $R_{10a}$.

In an embodiment, in Formula 1, a moiety represented by

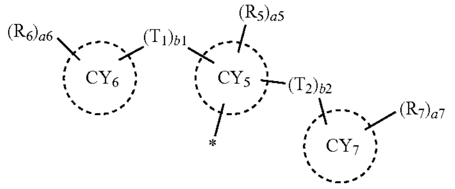

may be a moiety represented by one of Formulae W1-1 to W1-7, which are explained below.

In an embodiment, the organometallic compound may be represented by Formula 1-1 or Formula 1-2, which are explained below.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
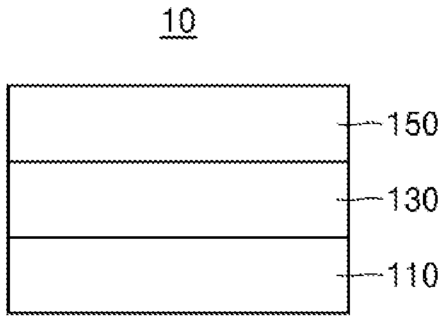
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being “on”, “connected to”, or “coupled to” another element, it can be directly on, connected to, or coupled to the other element, or one or more intervening elements may be present therebetween. In a similar sense, when an element (or region, layer, part, etc.) is described as “covering” another element, it can directly cover the other element, or one or more intervening elements may be present therebetween.

In the description, when an element is “directly on,” “directly connected to,” or “directly coupled to” another element, there are no intervening elements present. For example, “directly on” may mean that two layers or two elements are disposed without an additional element such as an adhesion element therebetween.

As used herein, the expressions used in the singular such as “a,” “an,” and “the,” are intended to include the plural forms as well, unless the context clearly indicates otherwise.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

In the specification and the claims, the term “at least one of” is intended to include the meaning of “at least one selected from the group consisting of” for the purpose of its meaning and interpretation. For example, “at least one of A, B, and C” may be understood to mean A only, B only, C only, or any combination of two or more of A, B, and C, such as ABC, ACC, BC, or CC. When preceding a list of elements, the term, “at least one of,” modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within +20%, 10%, or ±5% of the stated value.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An embodiment provides an organometallic compound which may be represented by Formula 1:

[Formula 1]

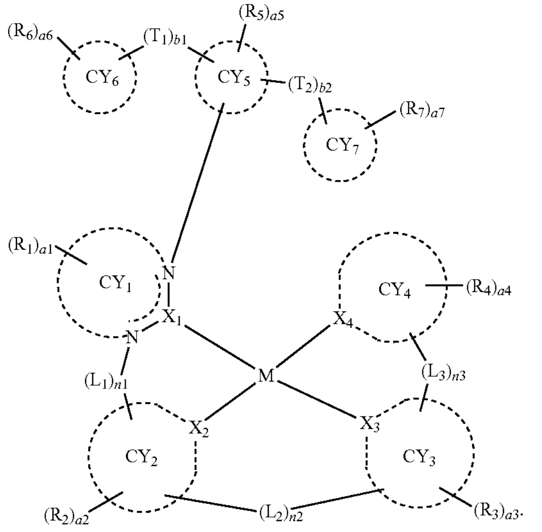

In Formula 1, M may be platinum (Pt), palladium (Pd), gold (Au), nickel (Ni), silver (Ag), or copper (Cu).

In an embodiment, M may be Pt.

In Formula 1, $X_1$ may be C, and $X_2$ to $X_4$ may each independently be C or N.

In Formula 1, a bond between $X_1$ and M may be a coordinate bond.

In Formula 1, one of a bond between $X_2$ and M, a bond between $X_3$ and M, and a bond between $X_4$ and M may be a coordinate bond, and the remainder thereof may each be a covalent bond.

In an embodiment, $X_1$ may be C of a carbene moiety.

In an embodiment, $X_2$ and $X_3$ may each be C, and $X_4$ may be N.

In an embodiment, a bond between $X_2$ and M and a bond between $X_3$ and M may each be a covalent bond, and a bond between $X_4$ and M may be a coordinate bond.

In an embodiment, $X_4$ may be N, and a bond between $X_4$ and M may be a coordinate bond.

In Formula 1, ring $CY_1$ may be a $C_1$-$C_{60}$ nitrogen-containing heterocyclic group including two N atoms as ring-forming atoms and $X_1$.

In an embodiment, ring $CY_1$ may be an imidazole group, a triazole group, an oxadiazole group, a thiadiazole group, a benzimidazole group, an imidazopyridine group, a furoimidazole group, a thienoimidazole group, an imidazopyrimidine group, an imidazopyrazine group, an imidazopyridazine group, a benzoxadiazole group, or a benzothiadiazole group.

In embodiments, ring $CY_1$ may be an imidazole group, a triazole group, a benzimidazole group, an imidazopyridine group, an imidazopyrimidine group, an imidazopyrazine group, or an imidazopyridazine group. For example, ring $CY_1$ may be an imidazole group or a benzimidazole group.

In Formula 1, ring $CY_2$ to ring $CY_7$ may each independently be a $C_3$-$C_{60}$ carbocyclic group or a $C_1$-$C_{60}$ heterocyclic group.

In an embodiment, ring $CY_2$ to ring $CY_7$ may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine(azafluorene) group, an indolopyridine(azacarbazole) group, a benzofuropyridine(azadibenzofuran) group, a benzothienopyridine(azadibenzothiophene) group, a benzosilolopyridine (azadibenzosilole) group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, an imidazopyridazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

For example, ring $CY_2$ to ring $CY_4$ may each independently be a benzene group, a carbazole group, a dibenzofuran group, a dibenzothiophene group, an indolopyridine (azacarbazole) group, a benzofuropyridine (azadibenzofuran) group, a benzothienopyridine (azadibenzothiophene) group, a pyridine group, or a pyrimidine group.

For example, ring $CY_5$ to $CY_7$ may each independently be a benzene group, a pyridine group, or a pyrimidine group.

In Formula 1, $L_1$ to $L_3$ may each independently be a single bond, *—C($R_8$)($R_9$)—*', *—C($R_8$)=*', *=C($R_8$)—*', *—C($R_8$)=C($R_9$)—*', *—C(=O)—*', *—C(=S)—*', *—C≡C—*', *—B($R_8$)—*', *—N($R_8$)—*', *—O—*', *—P($R_8$)—*', *—Si($R_8$)($R_9$)—*', *—P(=O)($R_8$)—*', *—S—*', *—S(=O)—*', *—S(=O)$_2$—*', or *—Ge($R_8$)($R_9$)—*'.

In Formula 1, n1 to n3 respectively indicate the number of $L_1$(s), the number of $L_2$(s), and the number of L(s). In Formula 1, n1 to n3 may each independently be an integer from 1 to 3. For example, n1 to n3 may each be 1.

In an embodiment, $L_1$ to $L_3$ may each independently be a single bond, *—C($R_8$)($R_9$)—*', *—B($R_8$)—*', *—N($R_8$)—*', *—O—*', *—P($R_8$)—*', *—Si($R_8$)($R_9$)—*', *—S—*' or *—Ge($R_8$)($R_9$)—*'.

For example, $L_1$ may be a single bond.

For example, $L_2$ may be *—N($R_8$)—*', *—O—*', *—P($R_8$)—*', or *—S—*'.

For example, $L_3$ may be a single bond or *—N($R_8$)—*'.

In embodiments, in Formula 1, $L_3$ may be a single bond, and a moiety represented by

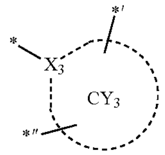

may be a moiety represented by Formula CY3A or Formula CY3B;

$L_3$ may not be a single bond, and a moiety represented by

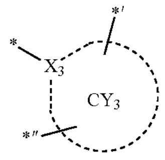

may be a moiety represented by Formula CY3C; or $L_3$ may be *—N($R_8$)—*', and $R_8$ and $R_3$ may be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$:

CY3A

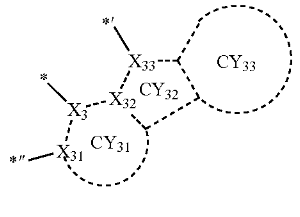

-continued

CY3B

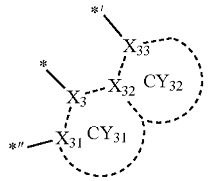

CY3C

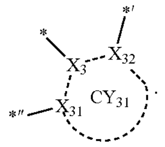

In Formulae CY3A to CY3C, $X_3$ and $X_{31}$ to $X_{33}$ may each independently be C or N, ring $CY_{31}$, ring $CY_{32}$, and ring $CY_{33}$ may each independently be the same as ring $CY_3$ as defined herein, a bond between $X_{31}$ and $X_3$, a bond between $X_3$ and $X_{32}$, and a bond between $X_{32}$ and $X_{33}$ may each be a chemical bond,

*" indicates a binding site to $(L_2)_{n2}$ in Formula 1,

* indicates a binding site to M in Formula 1, and

*' indicates a binding site to $(L_3)_{n3}$ in Formula 1.

In an embodiment, in Formulae CY3A and CY3B, $X_{31}$, $X_3$, and $X_{32}$ may each be C, and $X_{33}$ may be N.

In embodiments, in Formula CY3C, $X_{31}$, $X_3$, and $X_{32}$ may each be C.

In Formula 1, $T_1$ may be a single bond, *—C($Z_1$)($Z_2$)—*', *—Si($Z_1$)($Z_2$)—*', *—B($Z_1$)—*', *—N($Z_1$)—*', or *—P($Z_1$)—*', and $T_2$ may be a single bond, *—C($Z_3$)($Z_4$)—*', *—Si($Z_3$)($Z_4$)—*', *—B($Z_3$)—*', *—N($Z_3$)—*', or *—P($Z_3$)—*'. In Formula 1, each of $T_1$ and $T_2$ may not be *—N(Ph)-*', and Ph is a phenyl group. In Formula 1, for $T_1$ and $T_2$, * and *' each indicate a binding site to a neighboring atom.

In an embodiment, $T_1$ may be a single bond, *—C($Z_1$)($Z_2$)—*', or *—Si($Z_1$)($Z_2$)—*', and $T_2$ may be a single bond, *—C($Z_3$)($Z_4$)—*', or *—Si($Z_3$)($Z_4$)—*'.

In Formula 1, b1 and b2 may each independently be 1, 2, or 3. In an embodiment, b1 and b2 may each be 1.

In Formula 1, $R_1$ to $R_9$ and $Z_1$ to $Z_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), wherein a divalent carbon atom among $R_1$ to $R_9$ and $Z_1$ to $Z_4$ may optionally be substituted with *—C(═O)—*' or *—C(═S)—*'.

The divalent carbon atom among $R_1$ to $R_9$ and $Z_1$ to $Z_4$ may optionally be substituted with *—C(═O)—*' or *—C(═S)—*'. For example, the divalent carbon atom among $R_1$ to $R_9$ and $Z_1$ to $Z_4$ may not be substituted with either of *—C(═O)—*' and *—C(═S)—*'; or at least one divalent carbon atom among $R_1$ to $R_9$ and $Z_1$ to $Z_4$ may each independently be substituted with *—C(═O)—*', so that a ketone derivative for each of $R_1$ to $R_9$ and $Z_1$ to $Z_4$ may be formed; or at least one divalent carbon atom among $R_1$ to $R_9$ and $Z_1$ to $Z_4$ may each independently be substituted with *—C(═S)—*' so that a thioketone derivate for each of $R_1$ to $R_9$ and $Z_1$ to $Z_4$ may be formed.

In an embodiment, when $R_5$ is a $C_1$-$C_{60}$ alkyl group (e.g., an n-propyl group, etc.), a divalent carbon atom included in $R_5$ may be substituted with *—C(═O)—*' to form a ketone derivative (e.g., a propane-2-one group, etc.) of the $C_1$-$C_{60}$ alkyl group. In embodiments, when $R_5$ is a $C_3$-$C_{20}$ cycloalkyl group (e.g., a cyclopentyl group, etc.), a divalent carbon atom included in $R_5$ may be substituted with *—C(═O)—*' to form a ketone derivative (e.g., a cyclopentanone group, etc.) of the $C_3$-$C_{20}$ cycloalkyl group.

In an embodiment, at least one of $R_4$(s) in the number of a4 in Formula 1 may not be hydrogen.

In an embodiment, $R_1$ to $R_9$ and $Z_1$ to $Z_4$ may each independently be:

hydrogen, deuterium, —F, —Cl, —Br, —I, hydroxyl group, cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, —C(═O)($Q_{11}$), —S(═O)$_2$($Q_{11}$), or any combination thereof;

a cyclopentyl group, a cyclohexyl group, a cycloheptyl group, a cyclooctyl group, an adamantanyl group, a norbornanyl group, a cyclopentanone group, a cyclohexanone group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, hydroxyl group, cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolecarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

For example, $R_1$ to $R_9$ may each independently be:

hydrogen, deuterium, —F, a cyano group, a $C_1$-$C_{20}$ alkyl group. or a $C_1$-$C_{20}$ alkoxy group;

a $C_1$-$C_{20}$ alkyl group or a $C_1$-$C_{20}$ alkoxy group, each substituted with deuterium, —F, $—CD_3$, $—CD_2H$, $—CDH_2$, $—CF_3$, $—CF_2H$, $—CFH_2$, a cyano group, a $C_1$-$C_1$ alkyl group, a cyclopentyl group, a cyclohexyl group, a cycloheptyl group, a cyclooctyl group, an adamantanyl group, a norbornanyl group, a phenyl group, a biphenyl group, a terphenyl group, a naphthyl group, a pyridinyl group, a pyrimidinyl group, $—C(=O)(Q_{11})$, $—S(=O)_2(Q_{11})$, or any combination thereof;

a cyclopentyl group, a cyclohexyl group, a cycloheptyl group, a cyclooctyl group, an adamantanyl group, a norbornanyl group, a cyclopentanone group, a cyclohexanone group, a phenyl group, a biphenyl group, a terphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a cyano group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, an imidazopyridinyl group, an imidazopyrimidinyl group, $-C(=O)(Q_{31})$, $-S(=O)_2(Q_{31})$, or any combination thereof; or $-Si(Q_1)(Q_2)(Q_3)$, $-N(Q_1)(Q_2)$, $-B(Q_1)(Q_2)$, $-C(=O)(Q_1)$, or $-S(=O)_2(Q_1)$, and $Q_1$ to $Q_3$, $Q_{31}$, and $Q_{32}$ may each independently be:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, or $-CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, or a pyrimidinyl group, each unsubstituted or substituted with deuterium, a $C_1$-$C_{10}$ alkyl group, a phenyl group, a biphenyl group, a pyridinyl group, a pyrimidinyl group, or any combination thereof.

For example, $Z_1$ to $Z_4$ may each independently be:

hydrogen, deuterium, —F, a cyano group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with deuterium, —F, $-CD_3$, $-CD_2H$, $-CDH_2$, $-CF_3$, $-CF_2H$, $-CFH_2$, a cyano group, a $C_1$-$C_{10}$ alkyl group, a cyclopentyl group, a cyclohexyl group, a cycloheptyl group, a cyclooctyl group, an adamantanyl group, a norbornanyl group, a phenyl group, a biphenyl group, a terphenyl group, a naphthyl group, a pyridinyl group, a pyrimidinyl group, $-C(=O)(Q_{11})$, $-S(=O)_2(Q_{11})$, or any combination thereof.

In Formula 1, a1 to a7 may each independently be an integer from 0 to 20. For example, a1 to a7 may each independently be an integer from 0 to 10.

The organometallic compound represented by Formula 1 may satisfy at least one of Conditions a to c:

[Condition a]

two or more $R_5$(s) are connected to each other to form ring W, wherein ring W is a ring condensed with ring CY5;

[Condition b]

$T_1$ is not a single bond, and at least one of $Z_1$ and $Z_2$ is connected to at least one of ring CY5 and ring CY6 to form ring W, wherein ring W is a ring condensed with at least one of ring CY5 and ring CY6; and

[Condition c]

$T_2$ is not a single bond, and at least one of $Z_3$ and $Z_4$ is connected to at least one of ring CY5 and ring CY7 to form ring W, wherein ring W is a ring condensed with at least one of ring CY5 and ring CY7.

In an embodiment, in Conditions b and c, each of $T_1$ and $T_2$ may not be *—N(Ph)-*'. In embodiments, in Condition b, $Z_1$ may not be a $C_6$-$C_{10}$ aryl group unsubstituted or substituted with at least one $R_{10a}$. In embodiments, in Condition c, $Z_3$ may not be a $C_6$-$C_{10}$ aryl group unsubstituted or substituted with at least one $R_{10a}$.

In an embodiment, when the organometallic compound satisfies Condition b, the organometallic compound may satisfy one of Conditions b-1 to b-3:

[Condition b-1]

$T_1$ is *—C($Z_1$)($Z_2$)—*' or *—Si($Z_1$)($Z_2$)—*', and each of $Z_1$ and $Z_2$ is connected to ring CY5 to form ring W, wherein ring W includes two or more cyclic groups each condensed with ring CY5 while sharing C or Si of $T_1$;

[Condition b-2]

$T_1$ is *—C($Z_1$)($Z_2$)—*' or *—Si($Z_1$)($Z_2$)—*', and each of $Z_1$ and $Z_2$ is connected to ring CY6 to form ring W, wherein ring W includes two or more cyclic groups each condensed with ring CY6 while sharing C or Si of $T_1$; and

[Condition b-3]

$T_1$ is *—C($Z_1$)($Z_2$)—*' or *—Si($Z_1$)($Z_2$)—*', and $Z_1$ is connected to ring $CY_5$ and $Z_2$ is connected to ring $CY_6$ to form ring W, wherein ring W includes a spirocyclic group condensed with each of ring $CY_5$ and ring $CY_6$ while using C or Si of $T_1$ as a common atom.

In an embodiment, when the organometallic compound satisfies Condition c, the organometallic compound may satisfy one of Conditions c-1 to c-3:

[Condition c-1]

$T_2$ is *—C($Z_3$)($Z_4$)—*' or *—Si($Z_3$)($Z_4$)—*', and each of $Z_3$ and $Z_4$ is connected to ring $CY_5$ to form ring W, wherein ring W includes two or more cyclic groups each condensed with ring $CY_5$ while sharing C or Si of $T_1$;

[Condition c-2]

$T_2$ is *—C($Z_3$)($Z_4$)—*' or *—Si($Z_3$)($Z_4$)—*', and each of $Z_3$ and $Z_4$ is connected to ring $CY_7$ to form ring W, wherein ring W includes two or more cyclic groups each condensed with ring $CY_7$ while sharing C or Si of $T_1$; and

[Condition c-3]

$T_2$ is *—C($Z_3$)($Z_4$)—*' or *—Si($Z_3$)($Z_4$)—*', and $Z_3$ is connected to ring $CY_5$ and $Z_4$ is connected to ring $CY_7$ to form ring W, wherein ring W includes a spirocyclic group condensed with each of ring $CY_5$ and ring $CY_7$ while using C or Si of $T_1$ as a common atom.

In Conditions a to c, ring W may be a $C_3$-$C_{30}$ non-aromatic carbocyclic group that is unsubstituted or substituted with at least one $R_{10a}$ or a $C_1$-$C_{30}$ non-aromatic heterocyclic group unsubstituted or substituted with at least one $R_{10a}$, and a ring-forming divalent carbon atom of ring W may optionally be substituted with *—C(=O)—*' or *—C(=S)—*'.

The ring-forming divalent carbon atom of ring W may optionally be substituted with *—C(=O)—*' or *—C(=S)—*'. For example, a ring-forming divalent carbon atom of ring W may not be substituted with either of *—C(=O)—*' and *—C(=S)—*'; or at least one ring-forming divalent carbon atom of ring W may each independently be substituted with *—C(=O)—*' to form a ketone derivative of ring W; or at least one ring-forming divalent carbon atom of ring W may each independently be substituted with *—C(=S)—*' to form a thioketone derivative of ring W.

The term "$C_3$-$C_{30}$ non-aromatic carbocyclic group" as used herein may be a cyclic group including 3 to 30 carbon atoms as ring-forming atoms and having non-aromaticity throughout the group. When the $C_3$-$C_{30}$ non-aromatic carbocyclic group includes two or more rings, the two or more rings may be condensed with each other. When at least one ring-forming divalent carbon atom is substituted with either of *—C(=O)—*' and *—C(=S)—*', "a ketone derivative of the $C_3$-$C_{30}$ non-aromatic carbocyclic group" or "a thioketone derivative of the $C_3$-$C_{30}$ non-aromatic carbocyclic group" may be formed.

The term "$C_1$-$C_{30}$ non-aromatic heterocyclic group" as used herein may be a cyclic group including, in addition to carbon atoms, at least one heteroatom (e.g., O, S, N, P, Si, B, Ge, Se, or any combination thereof) as a ring-forming atom, including 1 to 30 carbon atoms as ring-forming atoms, and having non-aromaticity throughout the group. When the $C_1$-$C_{30}$ non-aromatic heterocyclic group includes two or more rings, the two or more rings may be condensed with each other. When at least one ring-forming divalent carbon atom is substituted with either of *—C(=O)—*' and *—C(=S)—*', "a ketone derivative of the $C_1$-$C_{30}$ non-aromatic heterocyclic group" or "a thioketone derivative of the $C_1$-$C_{30}$ non-aromatic heterocyclic group" may be formed.

In an embodiment, ring W may be a cyclobutane group, a cyclopentane group, a cyclohexane group, a cycloheptane group, a cyclooctane group, an adamantane group, a norbornane group, a bicyclo[1.1.1]pentane group, a bicyclo[2.1.1]hexane group, a bicyclo[2.2.2]octane group, a cyclopentene group, a cyclohexene group, a cycloheptane group, a cyclopentadiene group, a 1,2,3,4-tetrahydronaphthalene group, a decahydronaphthalene group, an octahydropentalene group, an indene group, an octahydro-1H-indene group, a benzosilole group, a benzogermole group, an azaindene group, an azabenzosilole group, an azabenzogermole group, a cyclopentanone group, a cyclopentanethione group, a cyclohexanone group, a cyclohexanethione group, a hexahydro-1H-indene-2,4-dione group, an octahydronaphthalene-1,7-dione group, a hexahydronaphthalene-1,6(2H,7H)-dione group, an octahydro-1H-quinolizine group, an octahydroindolizine group, a hexahydro-1H-pyrrolizine group, a decahydroquinoline group, a decahydroisoquinoline group, an octahydro-1H-indole group, a spiro[4.4]nonane group, a spiro[4.5]decane group, a spiro[5.5]undecane group, a 5,6,7,8-tetrahydroisoquinoline group, or a 5,6,7,8-tetrahydroquinoline group, each unsubstituted or substituted with at least one $R_{10a}$.

In embodiments, ring W may be a cyclobutane group, a cyclopentane group, a cyclohexane group, a cycloheptane group, a cyclooctane group, an adamantane group, a norbornane group, a bicyclo[1.1.1]pentane group, a bicyclo[2.1.1]hexane group, a bicyclo[2.2.2]octane group, a decahydronaphthalene group, an octahydropentalene group, an indene group, an octahydro-1H-indene group, a cyclopentanone group, a cyclohexanone group, a hexahydro-1H-indene-2,4-dione group, an octahydronaphthalene-1,7-dione group, an hexahydronaphthalene-1,6(2H,7H)-dione group, an octahydro-1H-quinolizine group, an octahydroindolizine group, a hexahydro-1H-pyrrolizine group, a decahydroquinoline group, a decahydroisoquinoline group, an octahydro-1H-indole group, a spiro[4.4]nonane group, a spiro[4.5]decane group, or a spiro[5.5]undecane group, each unsubstituted or substituted with deuterium, —F, a cyano group, a $C_1$-$C_{20}$ alkyl group, or any combination thereof.

In an embodiment, in Formula 1, a moiety represented by

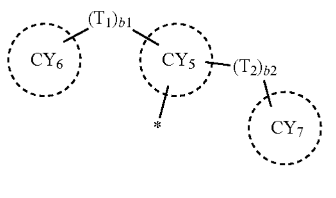

may be a moiety represented by Formula CY5A:

CY5A

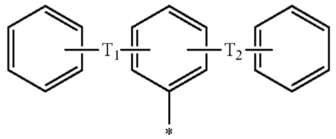

In Formula CY5A, $T_1$ and $T_2$ may each be the same as described herein, and * indicates a binding site to a neighboring atom.

For example, a group represented by Formula CY5A may be a group represented by Formula $CY_5(A)$:

CY5(A)

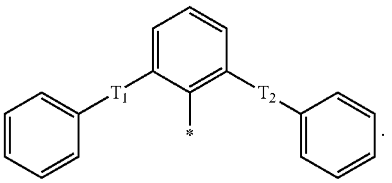

In Formula $CY_5(A)$, $T_1$ and $T_2$ may each be the same as described herein, and * indicates a binding site to a neighboring atom.

In an embodiment, in Formula 1, a moiety represented by

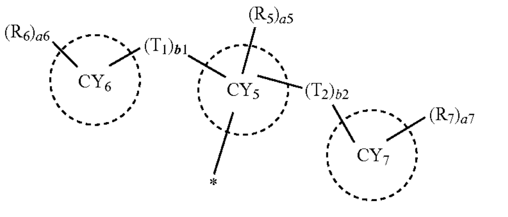

may be a moiety represented by one of Formulae W1-1 to W1-7:

W1-1

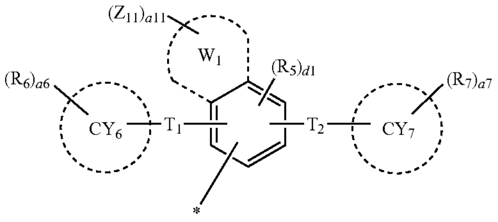

W1-2

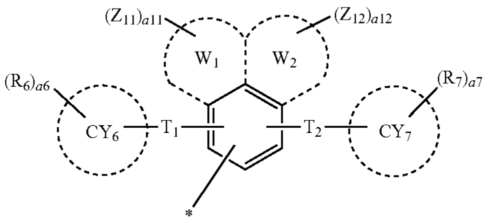

W1-3

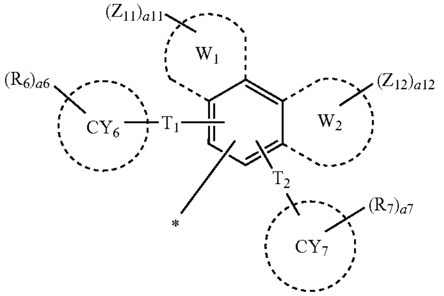

-continued

W1-4

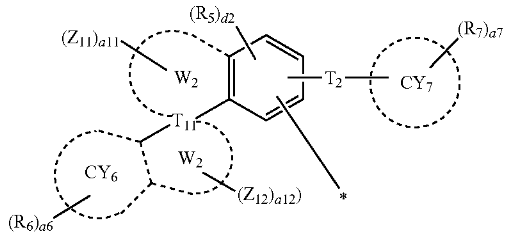

W1-5

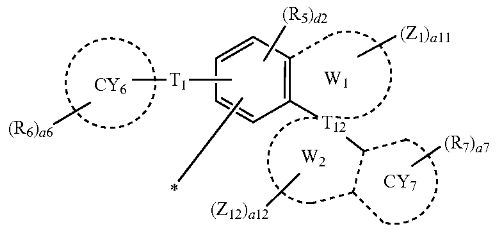

W1-6

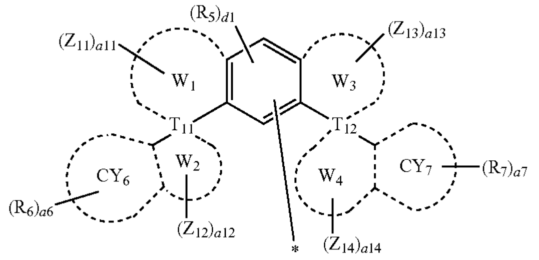

W1-7

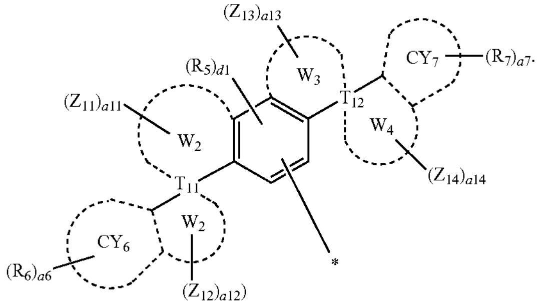

In Formulae W1-1 to W1-7, $CY_6$, $CY_7$, $R_5$ to $R_7$, a6, a7, $T_1$, and $T_2$ may each be the same as described herein, $T_{11}$ and $T_{12}$ may each independently be C or Si, ring W1 to ring W4 may each independently be a $C_3$-$C_{30}$ non-aromatic carbocyclic group or a $C_1$-$C_{30}$ non-aromatic heterocyclic group, $Z_{11}$ to $Z_{14}$ may each independently be the same as described in connection with $R_5$, a11 to a14 may each independently be an integer from 0 to 10, d1 may be 0 or 1, d2 may be an integer from 0 to 2, and

* indicates a binding site to a neighboring atom.

In embodiments, a group represented by

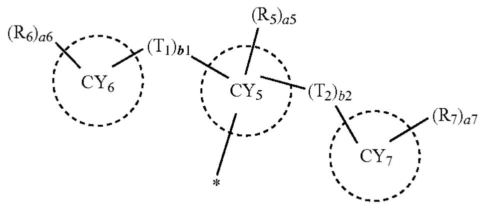

in Formula 1 may be one of groups represented by Formulae W1(1) to W1(7):

W1(1)

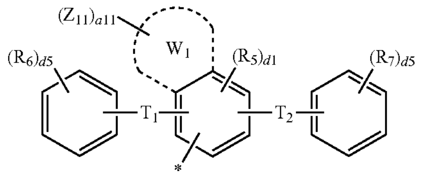

W1(2)

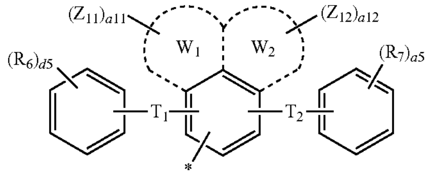

W1(3)

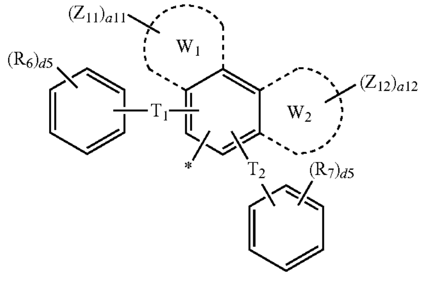

W1(4)

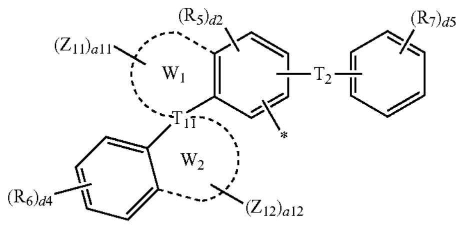

W1(5)

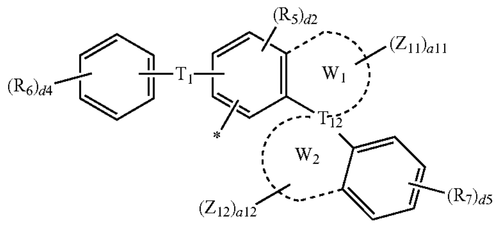

-continued

W1(6)

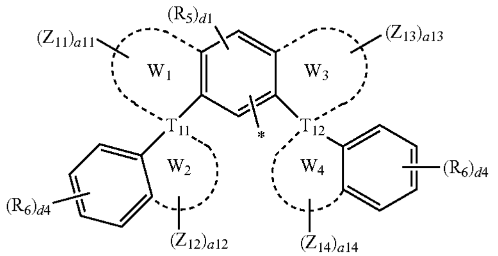

W1(7)

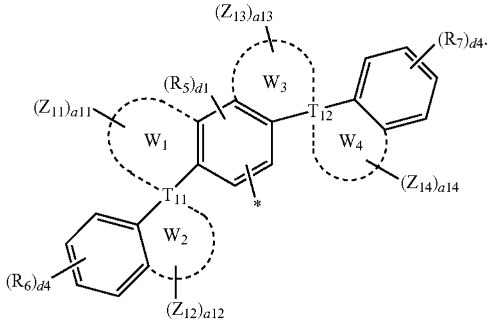

In Formulae W1(1) to W1(7), $R_5$ to $R_7$, $T_1$, and $T_2$ may each be the same as described in connection with Formula 1, $T_{11}$ and $T_{12}$ may each independently be C or Si, ring $W_1$ to ring $W_4$ may each independently be a $C_3$-$C_{30}$ non-aromatic carbocyclic group or a $C_1$-$C_{30}$ non-aromatic heterocyclic group, $Z_{11}$ to $Z_{14}$ may each be the same as described in connection with $R_5$, a11 to a14 may each independently be an integer from 0 to 10, d1 may be 0 or 1, d2 may be an integer from 0 to 2, d4 may be an integer from 0 to 4, d5 may be an integer from 0 to 5, and

* indicates a binding site to a neighboring atom.

For example, in Formula 1, a moiety represented by

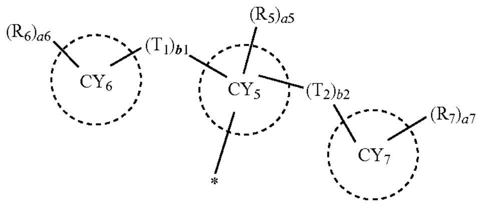

and a moiety represented by CYA in Formulae 1-1 and 1-2 may each independently be:

one of groups represented by Formulae W1-1, W1-2, and W1-4 to W1-6; or one of groups represented by Formulae W1(1), W1(2), and W1(4) to W1(6).

In embodiments, ring W1 to ring W4 in Formulae W1-1 to W1-7 and W1(1) to W1(7) may each independently be one of groups represented by Formulae W(A1) to W(A13) (hereinafter referred to as 'ring W(A1)' or the like):

W(A1)

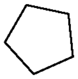

W(A2)

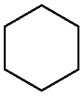

W(A3)

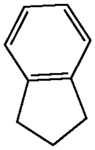

W(A4)

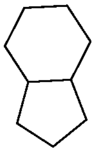

W(A5)

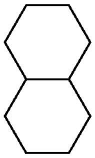

W(A6)

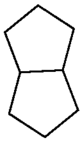

W(A7)

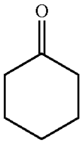

W(A8)

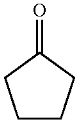

W(A9)

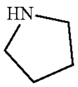

W(A10)

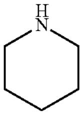

W(A11)

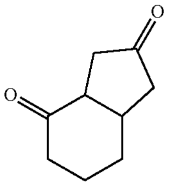

-continued

W(A12)

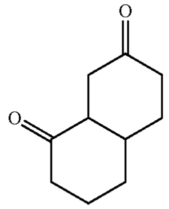

W(A13)

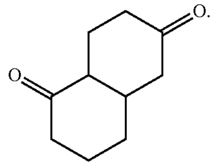

In each of ring W(A1) to ring W(A13), two or more of the ring-forming atoms may be condensed with ring $CY_5$, ring $CY_6$, and/or $CY_7$ while sharing with ring $CY_5$, $CY_6$, and/or $CY_7$.

In an embodiment, two or more of ring W(A1) to ring W(A13) may: optionally be linked to each other to form a spirocyclic group while sharing one of the ring-forming atoms as a common atom; or optionally form a condensed cyclic ring while sharing two or more neighboring atoms among the ring-forming atoms.

For example, Compound 19 may satisfy Condition a, and in this regard, in Formula 1, $T_1$ and $T_2$ may each be a single bond, two $R_5$(s) may each be a methyl group and a biphenyl group, and two $R_5$(s) may be linked to each other to form an indene group substituted with a phenyl group (or a group represented by Formula W(A3) substituted with a phenyl group), but embodiments are not limited thereto.

For example, Compound 38 may satisfy Condition a, and in this regard, in Formula W1(1), $T_1$ and $T_2$ may each be a single bond, $W_1$ may be a group represented by Formula W(A2), and each of $R_5$ to $R_7$ and $Z_{11}$ may not be H, but embodiments are not limited thereto.

For example, Compound 46 may satisfy Condition a, and in this regard: in Formula 1, $T_1$ and $T_2$ may each be a single bond, one hydrogen in each of two $R_5$(s) may be a methyl group substituted with —C(═O)(H), and an ethyl group, and two $R_5$(s) may be linked to each other to form a cyclohexanone group; or in Formula W1(1), $T_1$ and $T_2$ may each be a single bond, $W_1$ is a group represented by Formula W(A7), and each of $R_5$ to $R_7$ and $Z_{11}$ may be H. However, embodiments are not limited thereto.

For example, Compound 64 may satisfy Condition a, and in this regard: in Formula 1, $T_1$ and $T_2$ may each be a single bond, two $R_5$(s) may each be an ethyl group in which one of the terminal hydrogens is substituted with —C(═O)(H), and a ketone derivative (e.g., a cyclopentanone) in which one divalent carbon atom of the cyclopentyl group is substituted with *—C(═O)—*', and two $R_5$(s) may be linked to each other to form a hexahydro-1H-indene-2,4-dione group; or in Formula W1(1), $T_1$ and $T_2$ may each be a single bond, $W_1$ may be a group represented by Formula W(A11), and each of $R_5$ to $R_7$ and $Z_{11}$ may be H. However, embodiments are not limited thereto.

For example, Compound 82 may satisfy Condition a, and in this regard: in Formula 1, $T_1$ and $T_2$ may each be a single bond, three $R_5$(s) may each be an ethyl group, —$N(CH_3)_2$, and an ethyl group, and three $R_5$(s) may be linked to each other to form an octahydro-1H-quinolizine group; or in Formula W1(2), $T_1$ and $T_2$ may each be a single bond, $W_1$ may be a group represented by Formula W(A2), $W_2$ may be a group represented by Formula W(A10) ($W_1$ and $W_2$ are condensed with each other while sharing two neighboring atoms among the ring-forming atoms), and each of $R_5$, $R_7$, $Z_{11}$, and $Z_{12}$ may be H. However, embodiments are not limited thereto.

For example, Compound 101 may satisfy Condition c (for example, Condition c-3), and in this regard: in Formula 1, b2 may be 1, $T_2$ may be $C(Z_3)(Z_4)$, $Z_3$ and $Z_4$ may each be an ethyl group, $Z_3$ and ring $CY_5$ may be linked to each other, and at the same time, $Z_4$ and ring $CY_7$ may be linked to each other to form a spiro[4.4]nonane group in which C of $T_2$ is a common atom; or in Formula W1(5), $T_1$ may be single bond, $T_{12}$ may be C, $W_1$ and $W_2$ may each be a group represented by Formula W(A1) ($W_1$ and $W_2$ are linked to each other while sharing $T_{12}$ as a common atom), and each of $R_5$ to $R_7$, $Z_{11}$, and $Z_{12}$ may be H. However, embodiments are not limited thereto.

For example, Compound 109 may satisfy Condition b (e.g., Condition b-3) and Condition c (e.g., Condition c-3), and in this regard: in Formula 1, when b1 is 1, $T_1$ may be $C(Z_1)(Z_2)$, $Z_1$ and $Z_2$ may each be an ethyl group, $Z_1$ and ring $CY_5$ may be linked to each other, and at the same time, $Z_2$ and ring $CY_6$ may be linked to each other to form a spiro[4.4]nonane group in which C of $T_1$ is a common atom, and when b2 is 1, $T_2$ may be $C(Z_3)(Z_4)$, $Z_3$ and $Z_4$ may each be an ethyl group, $Z_3$ and ring $CY_5$ may be linked to each other, and at the same time, $Z_4$ and ring $CY_7$ may be linked to each other to form a spiro[4.4]nonane group in which C of $T_2$ is a common atom (Condition c); or in Formula W1(6), $T_{11}$ and $T_{12}$ may each be C, $W_1$ to $W_4$ may each be a group represented by Formula W(A1), and each of $R_5$ to $R_7$ and $Z_{11}$ to $Z_{14}$ may be H. However, embodiments are not limited thereto.

In Formula 1, each of: two or more of $R_1$(s) in the number of a1; two or more of $R_2$(s) in the number of a2; two or more of $R_3$(s) in the number of a3; two or more of $R_4$(s) in the number of a4; two or more of $R_6$(s) in the number of a6; two or more of $R_7$(s) in the number of a7; and $R_8$ and $R_9$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

For example, two or more of $R_1$(s) in the number of a1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_2$(s) in the number of a2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$(s) in the number of a3 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_4$(s) in the number of a4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_6$(s) in the number of a6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_7$(s) in the number of a7 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_8$ and $R_9$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formula 1, two or more of $R_1$ to $R_4$, $R_8$, and $R_9$ may optionally be linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the organometallic compound may be represented by Formula 1-1 or Formula 1-2:

[Formula 1-1]

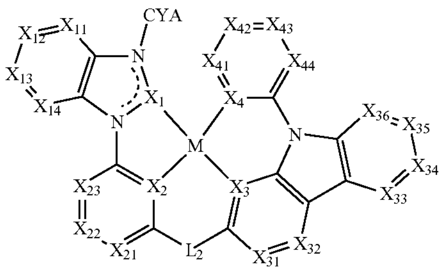

[Formula 1-2]

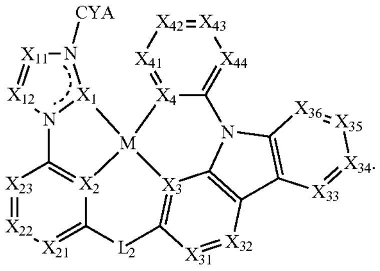

In Formulae 1-1 and 1-2,

M, $X_1$ to $X_4$, and $L_2$ may each be the same as described herein,

CYA may be a moiety represented by

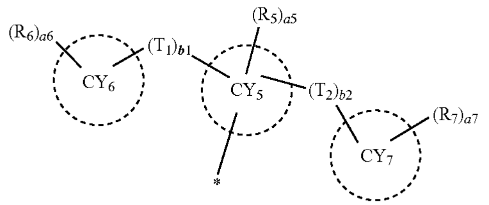

in Formula 1, $X_{11}$ may be $C(R_{11})$ or N, $X_{12}$ may be $C(R_{12})$ or N, $X_{13}$ may be $C(R_{13})$ or N, and $X_{14}$ may be $C(R_{14})$ or N, $R_{11}$ to $R_{14}$ may each independently be the same as described in connection with $R_1$, and two or more of $R_{11}$ to $R_{14}$ may optionally be bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{21}$ may be $C(R_{21})$ or N, $X_{22}$ may be $C(R_{22})$ or N, and $X_{23}$ may be $C(R_{23})$ or N, $R_{21}$ to $R_{23}$ may each independently be the same as described in connection with $R_2$, and two or more of $R_{21}$ to $R_{23}$ may optionally be bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{31}$ may be $C(R_{31})$ or N, $X_{32}$ may be $C(R_{32})$ or N, $X_{33}$ may be $C(R_{33})$ or N, $X_{34}$ may be $C(R_{34})$ or N, $X_{35}$ may be $C(R_{35})$ or N, and $X_{36}$ may be $C(R_{36})$ or N, $R_{31}$ to $R_{36}$ may each independently be the same as described in connection with $R_3$, and two or more of $R_{31}$ to $R_{36}$ may optionally be bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{41}$ may be $C(R_{41})$ or N, $X_{42}$ may be $C(R_{42})$ or N, $X_{43}$ may be $C(R_{43})$ or N, and $X_{44}$ may be $C(R_{44})$ or N, and $R_{41}$ to $R_{44}$ may each independently be the same as described in connection with $R_4$, and two or more $R_{41}$ to $R_{44}$ may optionally be bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

In an embodiment, in Formulae 1-1 and 1-2, $X_{42}$ may be $C(R_{42})$, $X_{43}$ may be $C(R_{43})$, and at least one of $R_{42}$ and $R_{43}$ may not be hydrogen. For example, each of $R_{42}$ and $R_{43}$ may not be hydrogen.

In an embodiment, the organometallic compound may satisfy at least one of Conditions 1 to 4:

[Condition 1]

in Formula 1, a moiety represented by

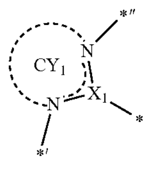

is a moiety represented by one of Formulae CY1-1 to CY1-13:

CY1-1

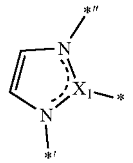

CY1-2

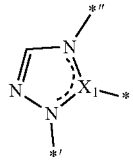

-continued
CY1-3
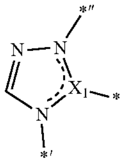
CY1-4
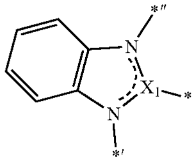
CY1-5
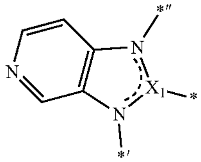
CY1-6
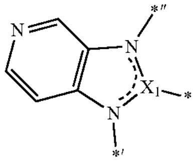
CY1-7
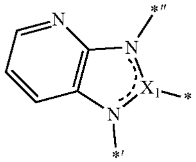
CY1-8
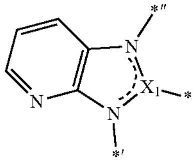
CY1-9
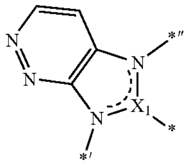
CY1-10
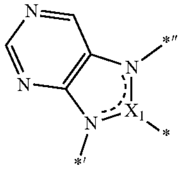
CY1-11
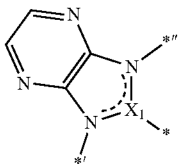
-continued
CY1-12
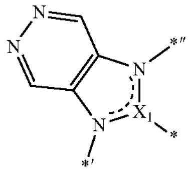
CY1-13
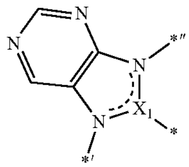
In Formulae CY1-1 to CY1-13,
$X_1$ is the same as described herein,
* indicates a binding site to M in Formula 1,
*' indicates a binding site to $(L_1)_{n1}$ in Formula 1, and
*" indicates a binding site to ring $CY_5$ in Formula 1;
[Condition 2]
in Formula 1, a moiety represented by
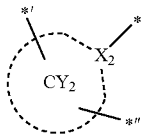
is a moiety represented by one of Formulae CY2-1 to CY2-23:
CY2-1
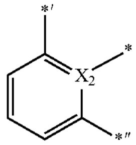
CY2-2
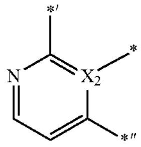
CY2-3
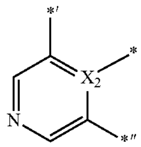
CY2-4
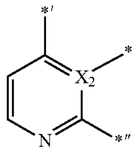

-continued
CY2-5
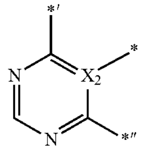
CY2-6
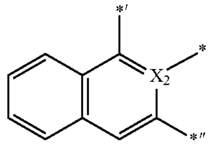
CY2-7
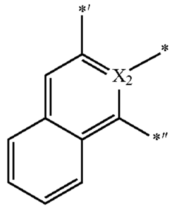
CY2-8
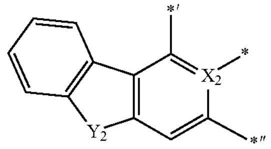
CY2-9
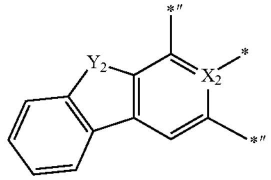
CY2-10
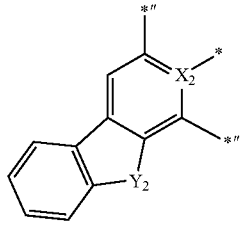
CY2-11
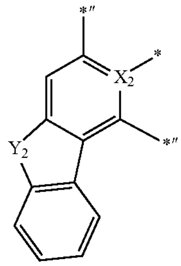
CY2-12
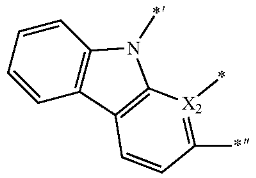
-continued
CY2-13
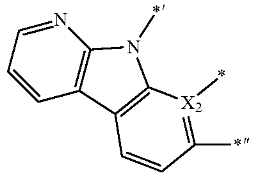
CY2-14
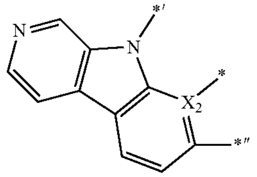
CY2-15
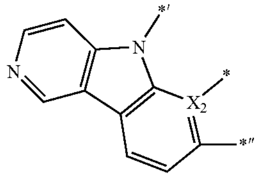
CY2-16
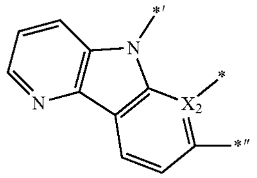
CY2-17
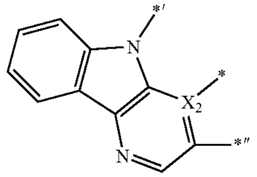
CY2-18
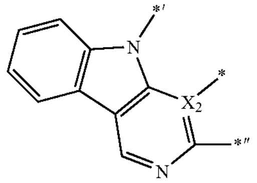
CY2-19
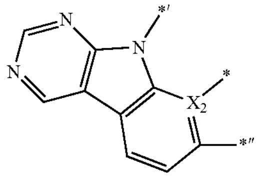
CY2-20
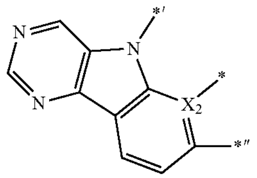

-continued
CY2-21
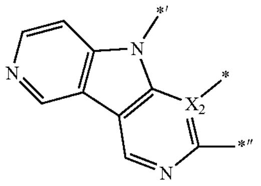
CY2-22
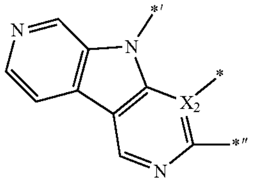
CY2-23
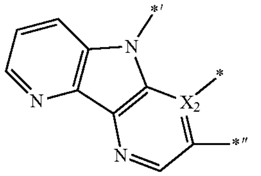
In Formulae CY2-1 to CY2-23,
$X_2$ is the same as described herein,
Y2 may include O, S, N, C, or Si,
* indicates a binding site to M in Formula 1,
*' indicates a binding site to $(L_1)_{n1}$ in Formula 1, and
*" indicates a binding site to $(L_2)_{n2}$ in Formula 1;
[Condition 3]
in Formula 1, a moiety represented by
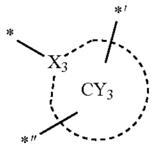
is a moiety represented by one of Formulae CY3-1 to CY3-23:
CY3-1
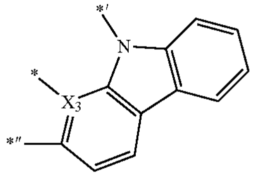
CY3-2
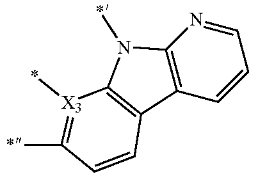
-continued
CY3-3
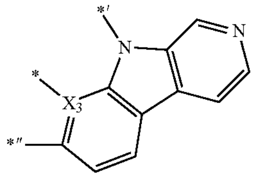
CY3-4
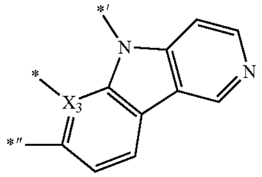
CY3-5
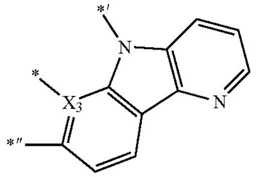
CY3-6
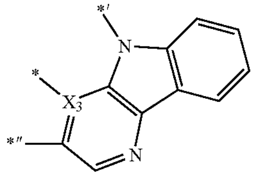
CY3-7
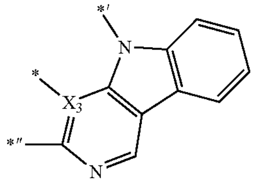
CY3-8
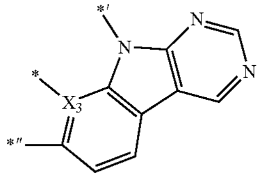
CY3-9
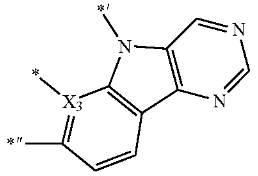
CY3-10
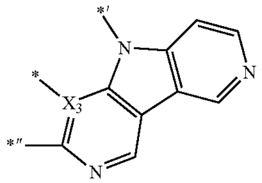

-continued

CY3-11

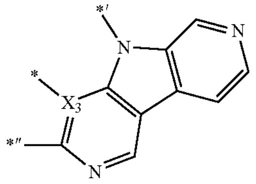

CY3-12

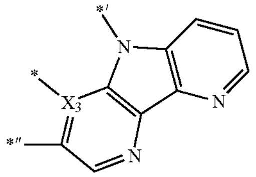

CY3-13

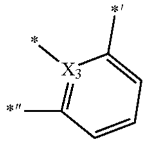

CY3-14

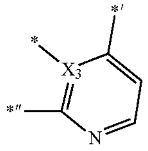

CY3-15

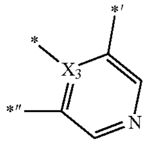

CY3-16

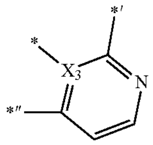

CY3-17

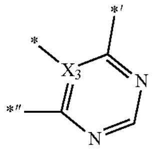

CY3-18

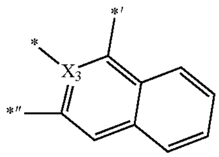

CY3-19

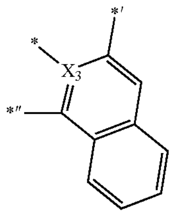

-continued

CY3-20

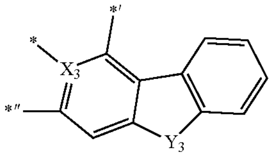

CY3-21

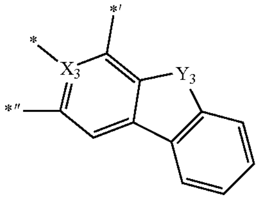

CY3-22

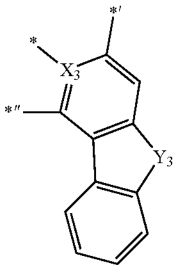

CY3-23

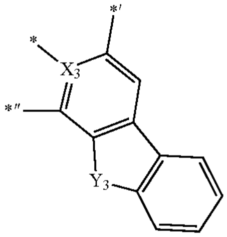

In Formulae CY3-1 to CY3-23, $X_3$ is the same as described herein,

Y3 may include O, S, N, C, or Si,

* indicates a binding site to M in Formula 1,

*' indicates a binding site to $(L_3)_{n3}$ in Formula 1, and

*" indicates a binding site to $(L_2)_{n2}$ in Formula 1; and

[Condition 4]

in Formula 1, a moiety represented by

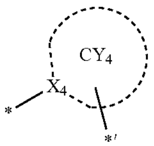

is a moiety represented by one of Formulae CY4-1 to CY4-6:

CY4-1

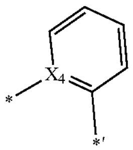

-continued
CY4-2
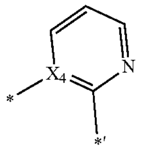
CY4-3
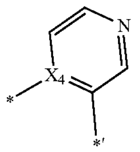
CY4-4
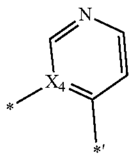
CY4-5
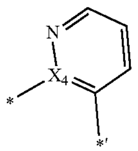
CY4-6
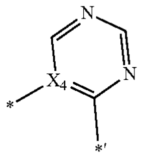
In Formulae CY4-1 to CY4-6,
$X_4$ is the same as described herein,
* indicates a binding site to M in Formula 1, and
*' indicates a binding site to $(L_3)_{n3}$ in Formula 1.
In embodiments, a moiety represented by
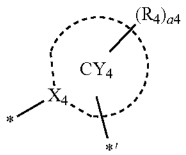
in Formula 1 and a moiety represented by
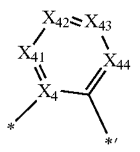
in Formulae 1-1 and 1-2 may each independently be a moiety represented by one of Formulae CY4(1) to CY4(15):
CY4(1)
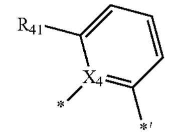
CY4(2)
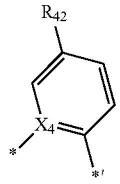
CY4(3)
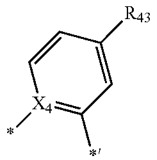
CY4(4)
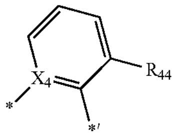
CY4(5)
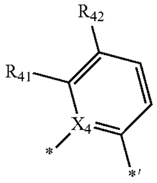
CY4(6)
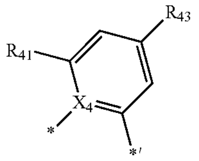
CY4(7)
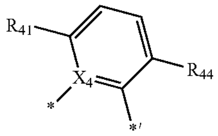
CY4(8)
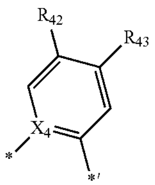
CY4(9)
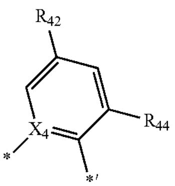

-continued

CY4(10)

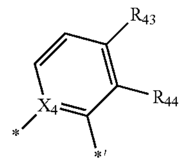

CY4(11)

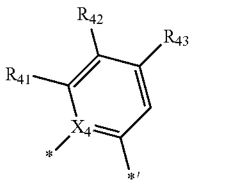

CY4(12)

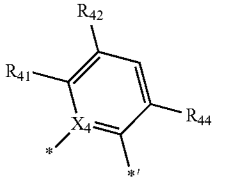

CY4(13)

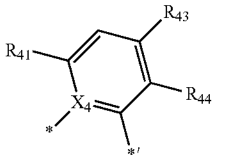

CY4(14)

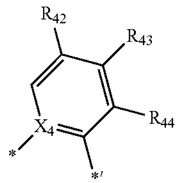

CY4(15)

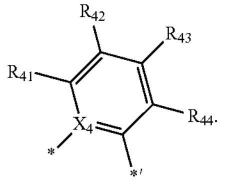

In Formulae CY4(1) to CY4(15), $X_4$ may be the same as described herein, $R_{41}$ to $R_{44}$ may each independently be the same as described in connection with $R_4$, except that each of $R_{41}$ to $R_{44}$ may not be hydrogen,

* indicates a binding site to M in Formula 1,

*' indicates a binding site to $(L_3)_{n3}$ in Formula 1.

In embodiments, in Formula CY4(1) to CY4(15), $R_{41}$ to $R_{44}$ may each independently be:

deuterium, —F, or a cyano group;

a $C_1$-$C_{20}$ alkyl group or a $C_3$-$C_{20}$ cycloalkyl group, each unsubstituted or substituted with deuterium, —F, a cyano group, or any combination thereof; or a phenyl group, a naphthyl group, a dibenzofuranyl group, or a dibenzothiophenyl group, each unsubstituted or substituted with deuterium, —F, a cyano group, a $C_1$-$C_{20}$ alkyl group, a $C_3$-$C_{20}$ cycloalkyl group, a phenyl group, a deuterated phenyl group, a fluorinated phenyl group, a ($C_1$-$C_{20}$ alkyl)phenyl group, or any combination thereof.

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{00}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the organometallic compound represented by Formula 1 may have a maximum emission wavelength (nm) of less than or equal to about 500 nm. For example, the organometallic compound may have a maximum emission wavelength in a range of about 390 nm to about 500 nm. For example, the organometallic compound may have a maximum emission wavelength in a range of about 410 nm to about 500 nm. For example, the organometallic compound may have a maximum emission wavelength in a range of about 410 nm to about 490 nm. For example, the organometallic compound may have a maximum emission wavelength in a range of about 430 nm to about 480 nm. For example, the organometallic compound may have a maximum emission wavelength in a range of about 440 nm to about 475 nm. For example, the organometallic compound may have a maximum emission wavelength in a range of about 455 nm to about 470 nm. However, embodiments are not limited thereto.

The maximum emission wavelength of the organometallic compound may refer to a simulated maximum emission wavelength ($\lambda_{max}^{sim}$) evaluated according to a density functional theory (DFT) method or an actual maximum emission wavelength ($\lambda_{max}^{exp}$). As an evaluation method, methods described in Evaluation Example 1 may be referred.

In an embodiment, the organometallic compound represented by Formula 1 may have an existence ratio of a triplet metal-ligand charge transfer state ($^3$MLCT) (hereinafter also referred to as 'existence ratio of the $^3$MLCT') of greater than or equal to about 8%. For example, the organometallic compound may have an existence ratio of the $^3$MLCT of greater than or equal to about 9%. For example, the organometallic compound may have an existence ratio of the $^3$MLCT of greater than or equal to about 11%. For example, the organometallic compound may have an existence ratio of the $^3$MLCT of greater than or equal to about 12%.

For example, an existence ratio of the $^3$MLCT may be in a range of about 8% to about 20%. For example, an existence ratio of the $^3$MLCT may be in a range of about 8% to about 19%. For example, an existence ratio of the $^3$MLCT may be in a range of about 8% to about 17%. For example, an existence ratio of the $^3$MLCT may be in a range of about 8% to about 15%. However, embodiments are not limited thereto.

The existence ratio of the $^3$MLCT in the organometallic compound may be evaluated by using a DFT method. As an evaluation method, methods described in Evaluation Example 1 may be referred.

In an embodiment, the organometallic compound represented by Formula 1 may be one of Compounds 1 to 118, but embodiments are not limited thereto:

1

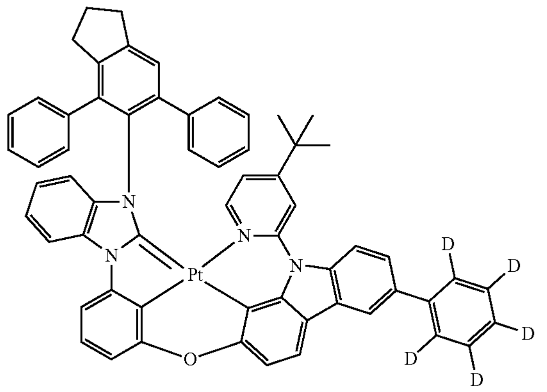

2

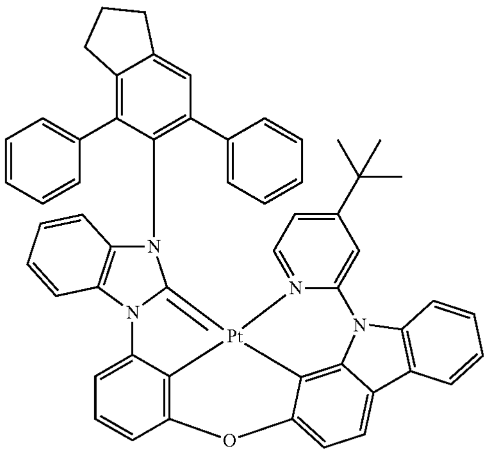

3

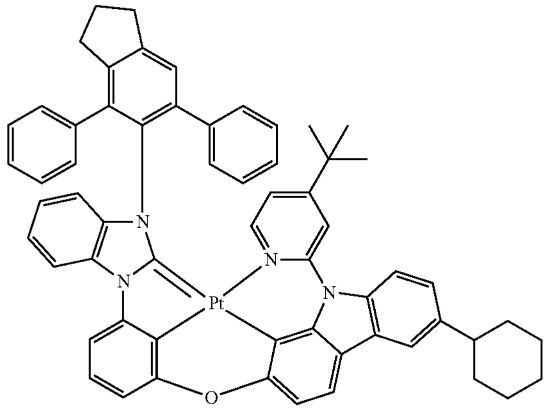

4

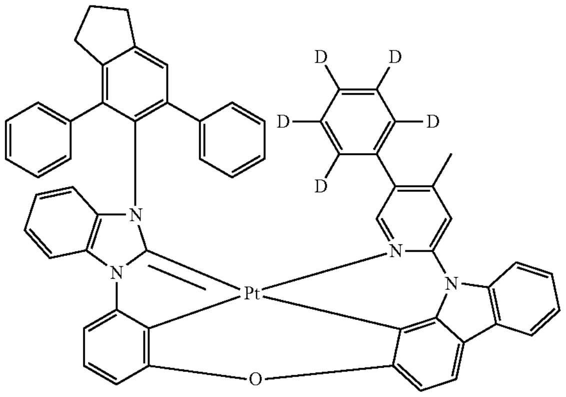

5

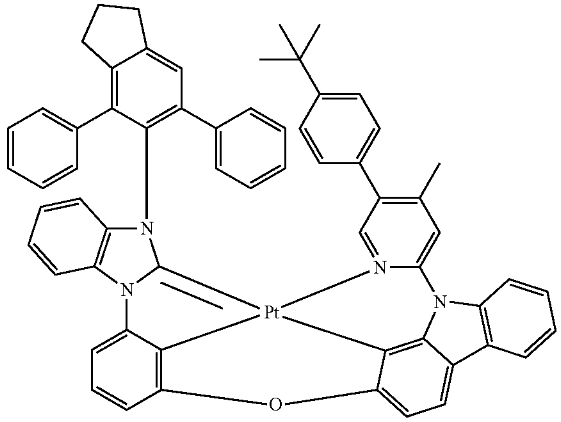

6

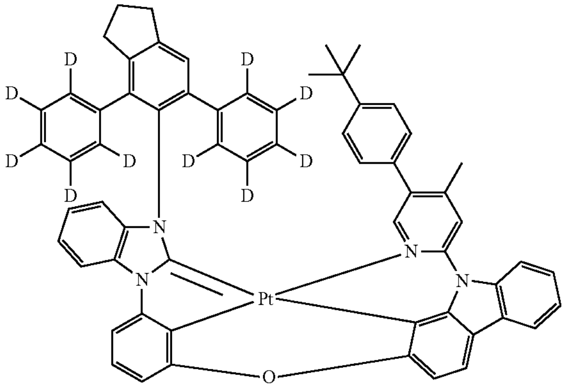

-continued
7
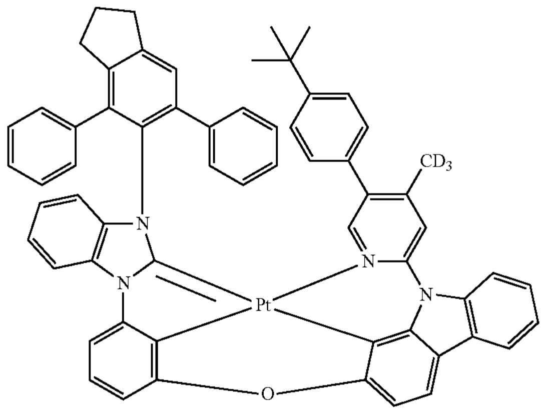
8
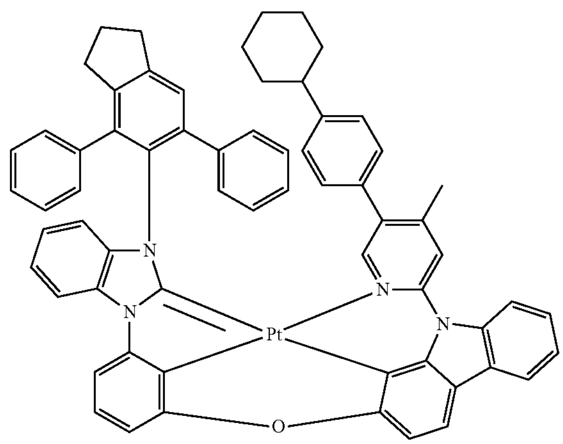
9
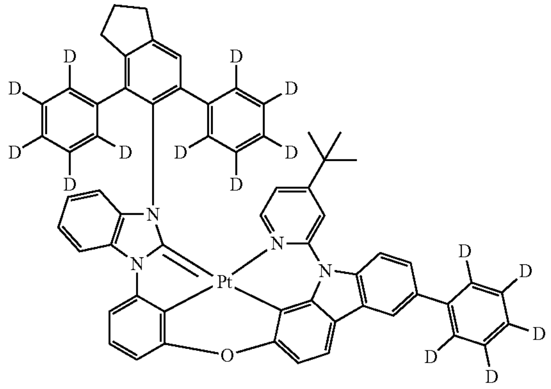
10
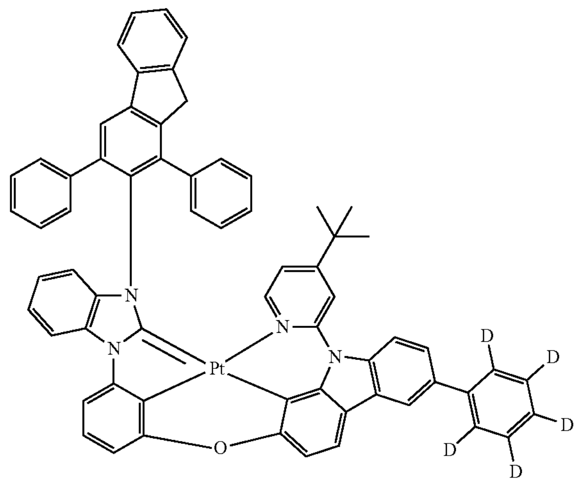
11
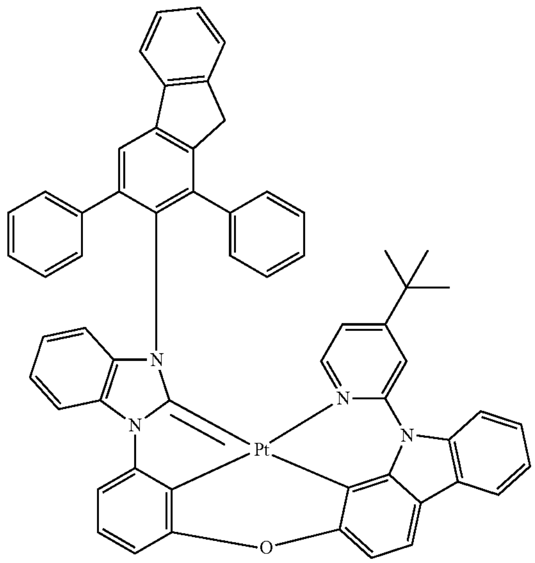
12
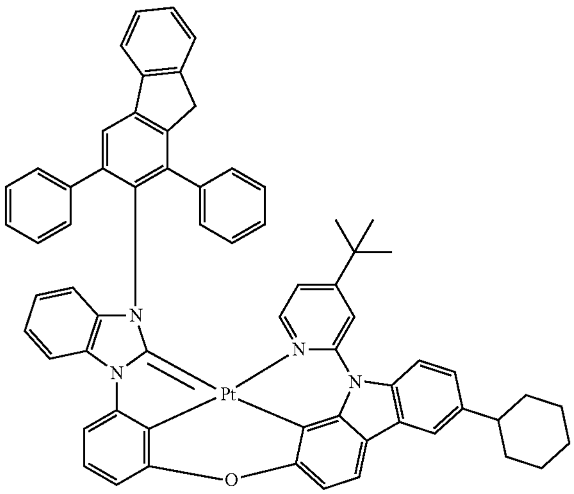

-continued
13
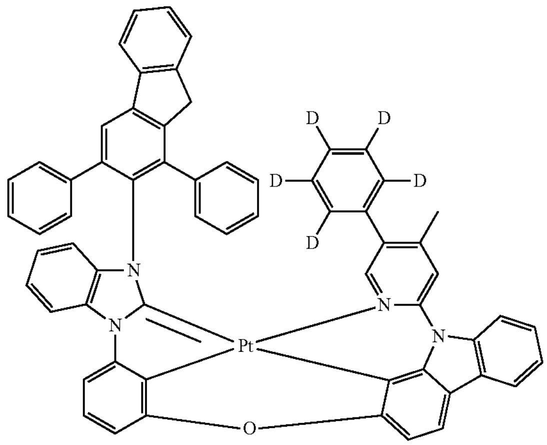
14
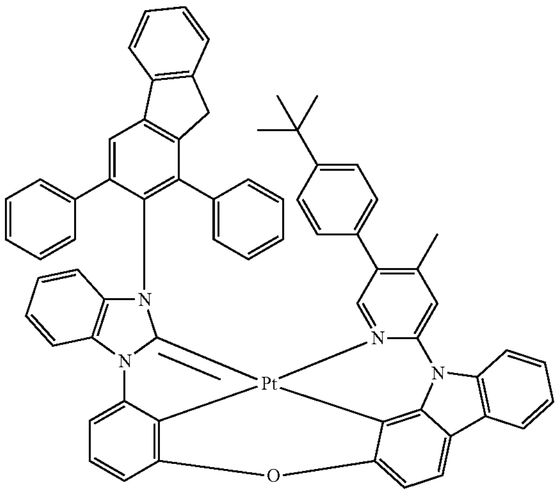
15
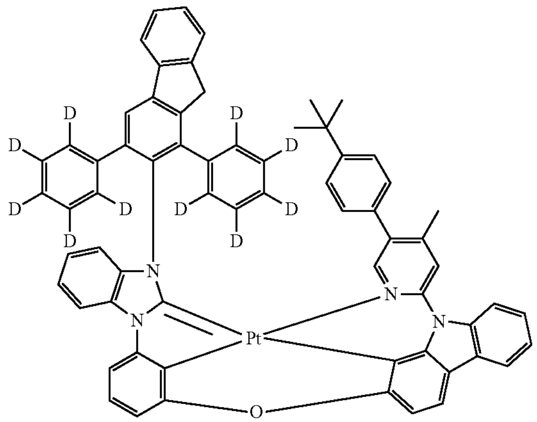
16
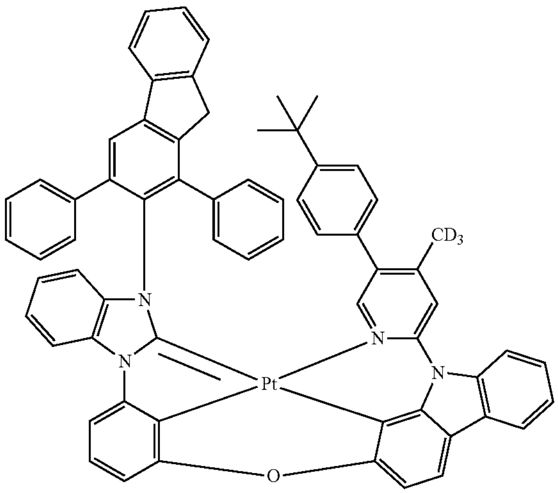
17
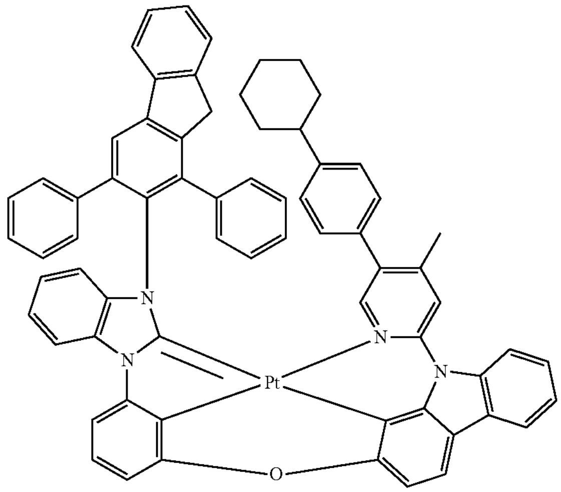
18
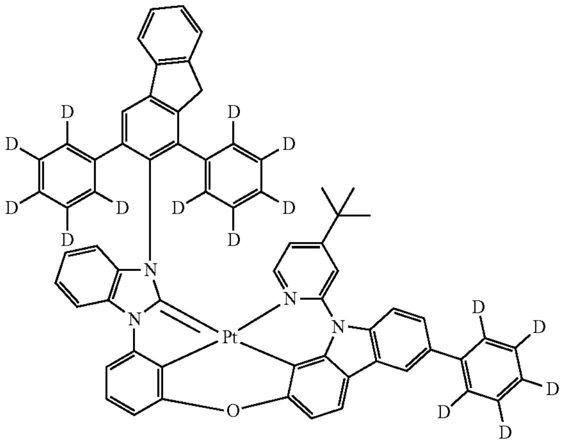

-continued
19
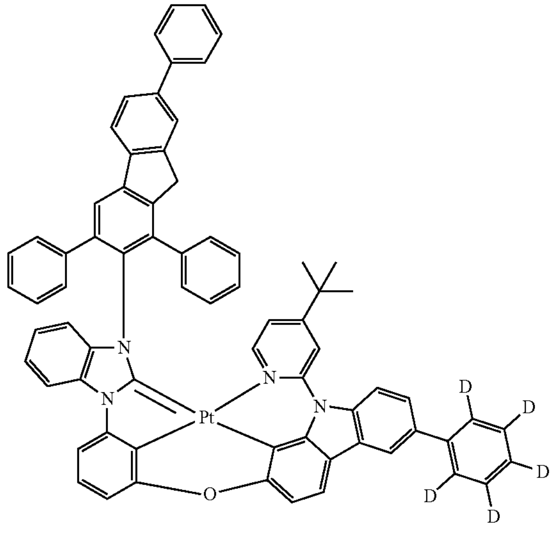
20
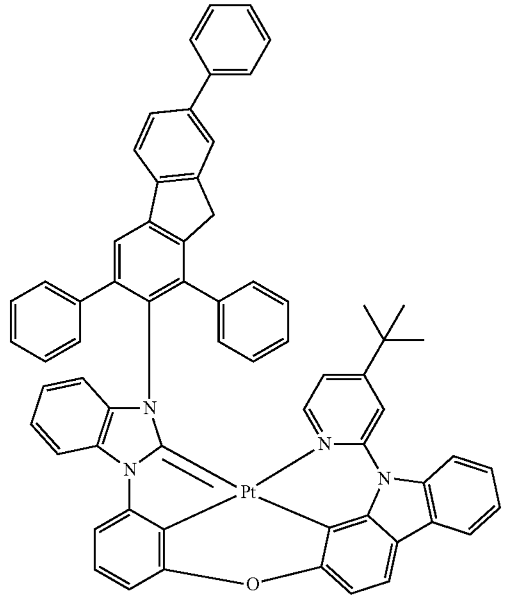
21
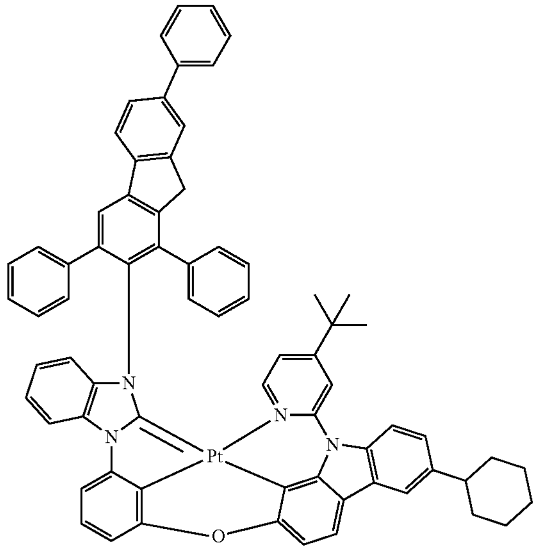
22
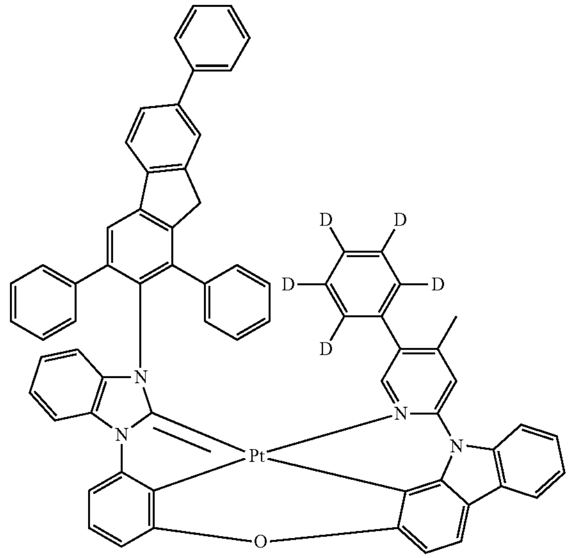

-continued
23
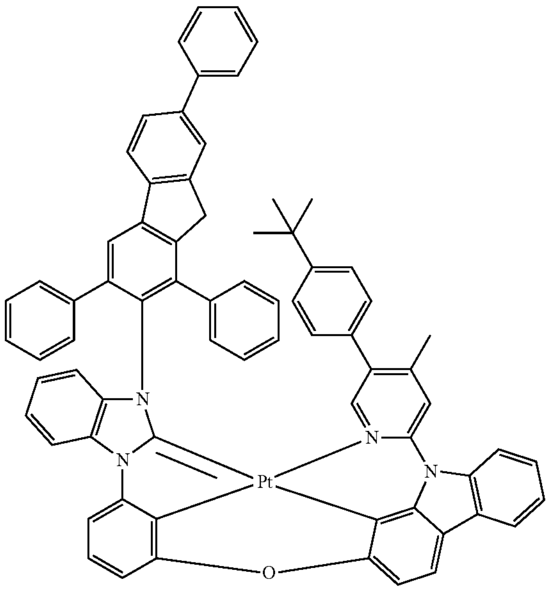
24
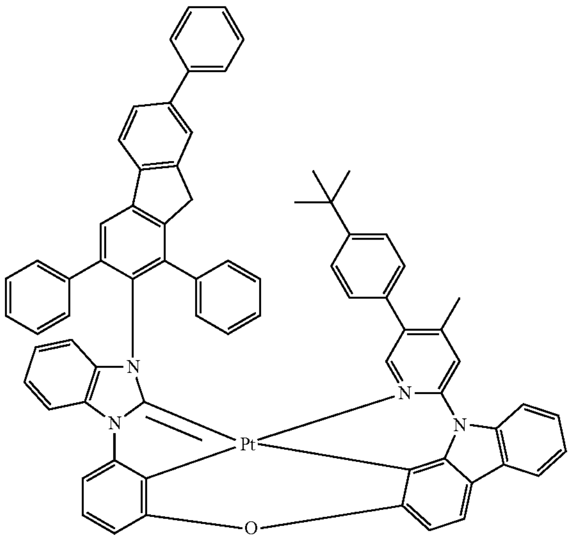
25
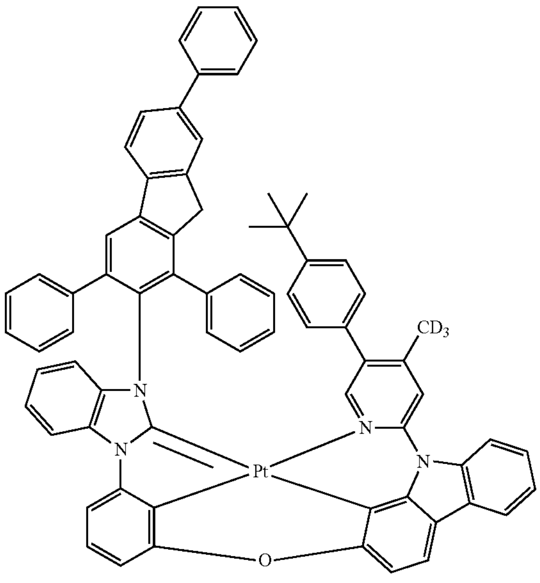
26
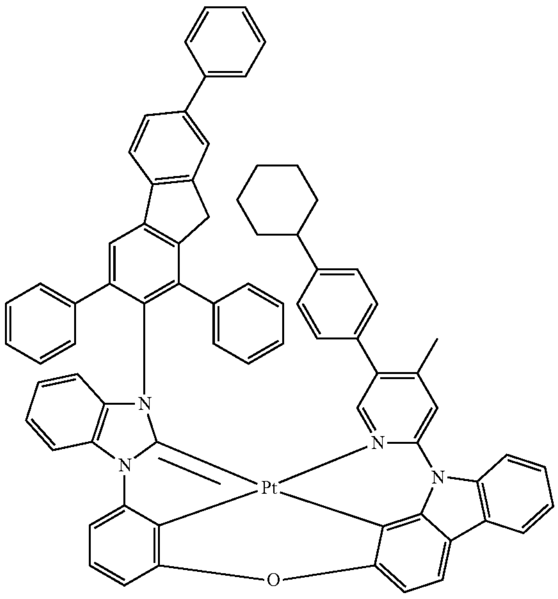

-continued
27
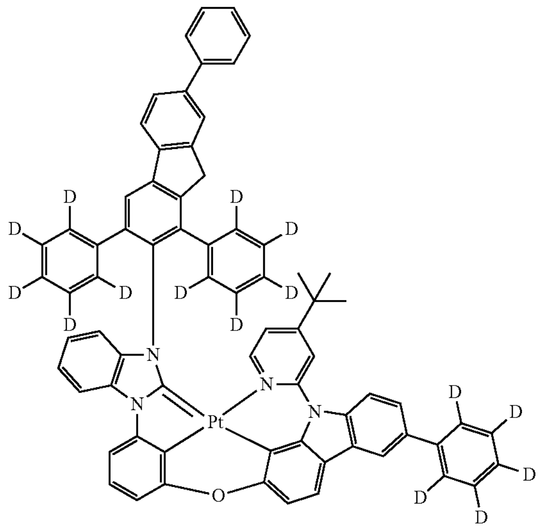
28
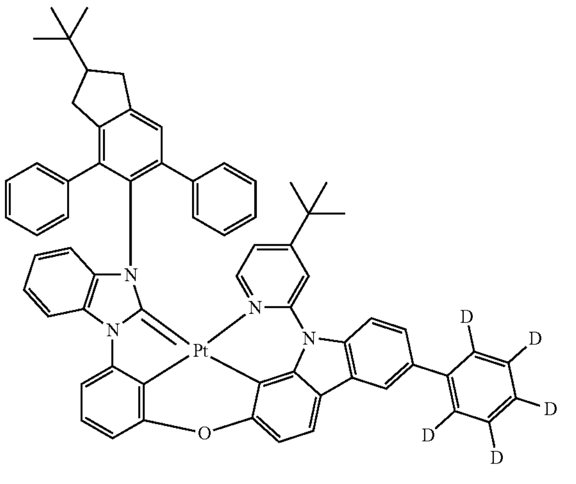
29
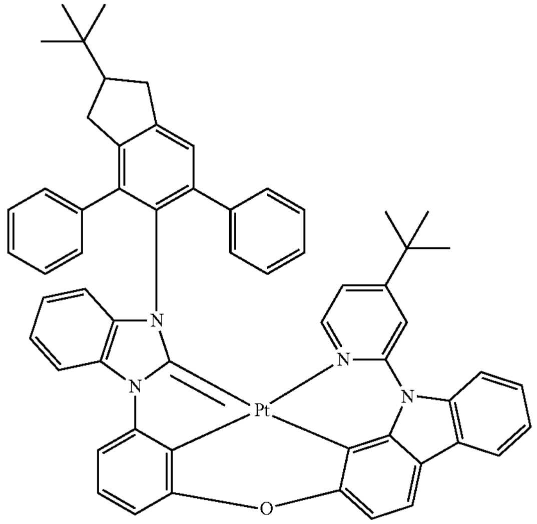
30
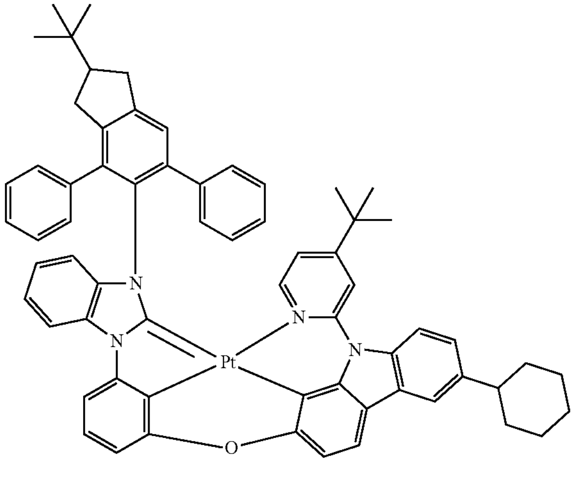
31
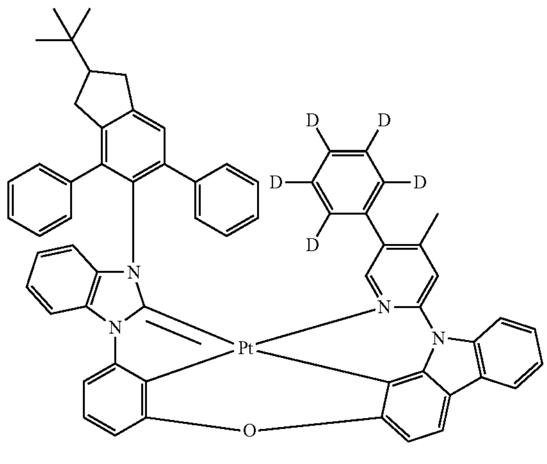
32
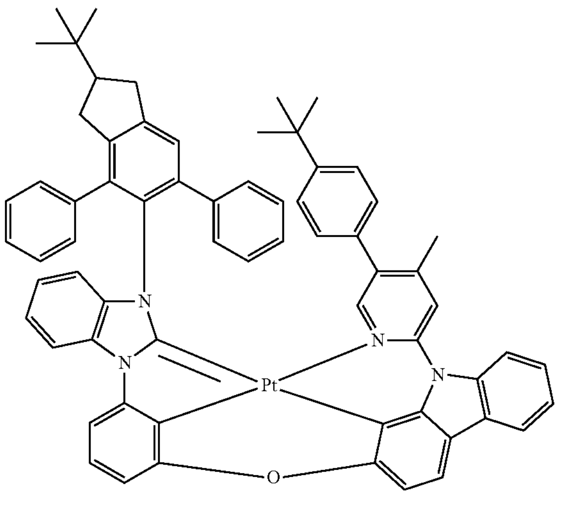

-continued
33
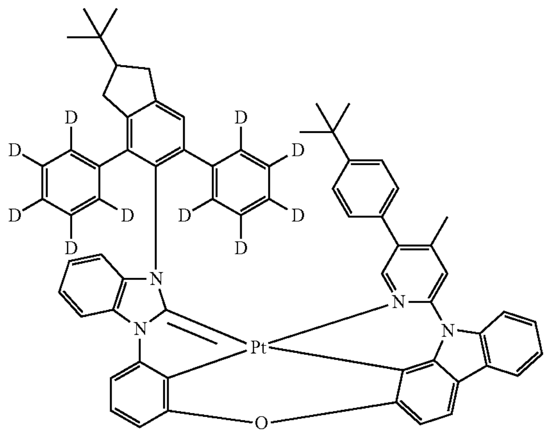
34
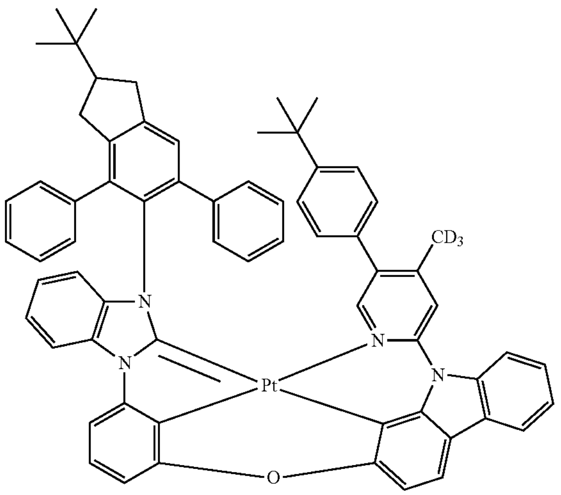
35
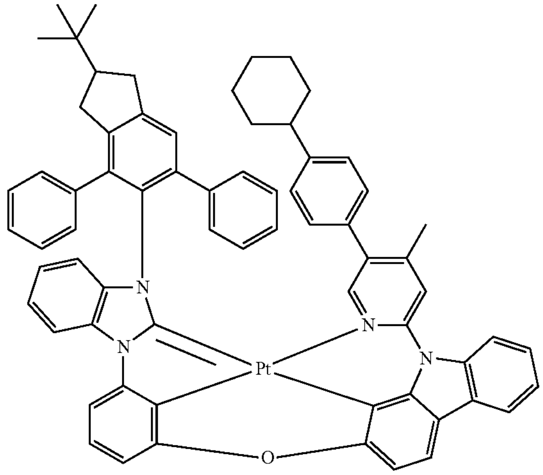
36
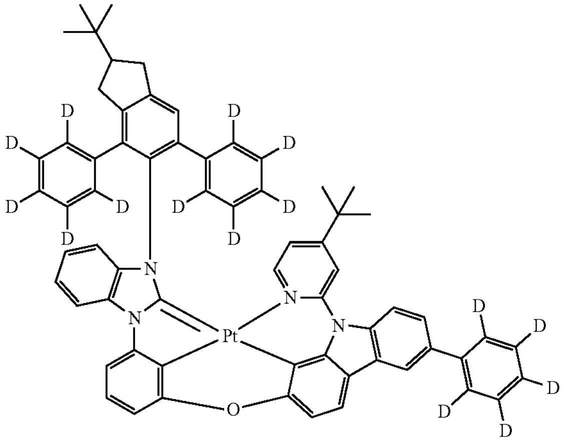
37
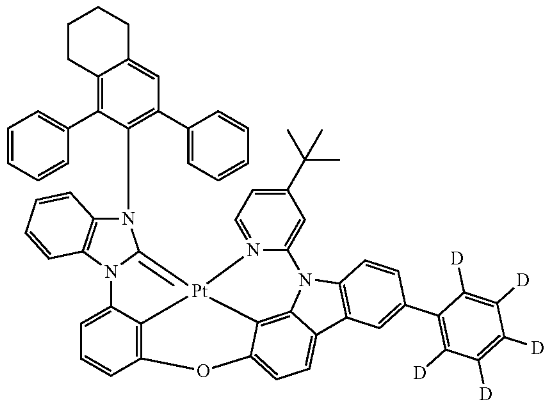
38
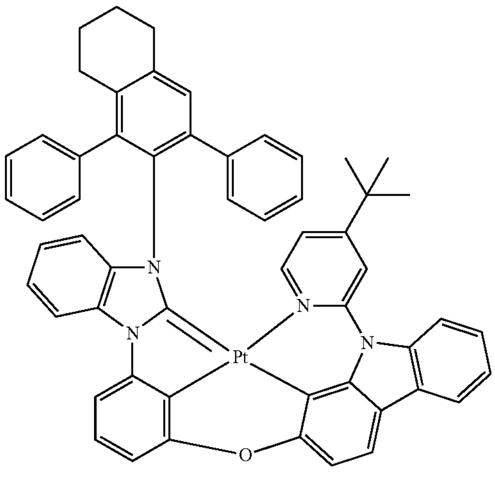

-continued
39
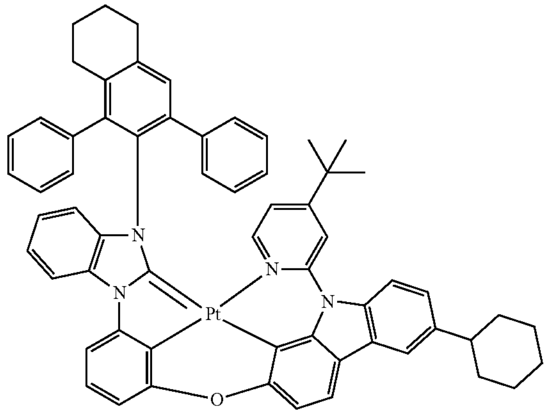
40
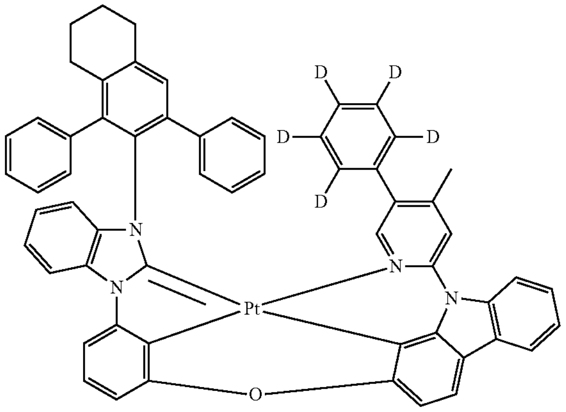
41
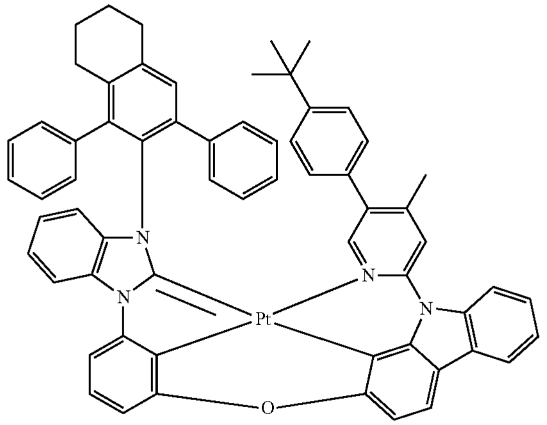
42
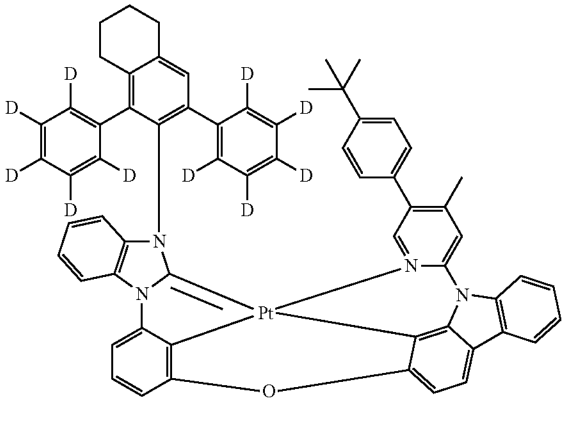
43
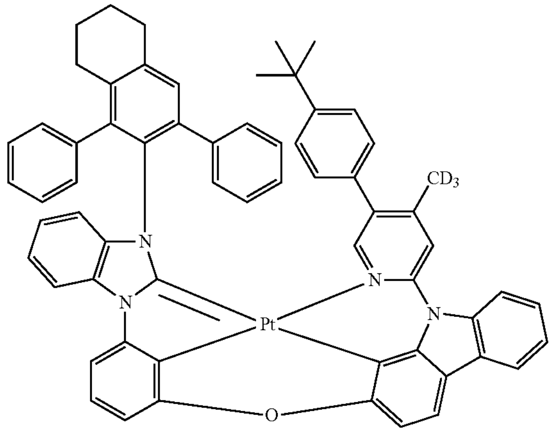
44
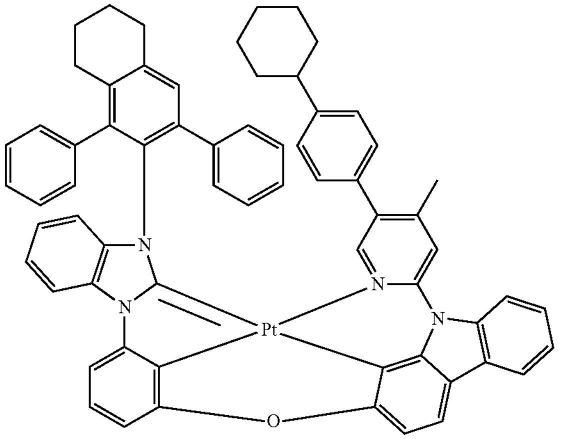

-continued
45
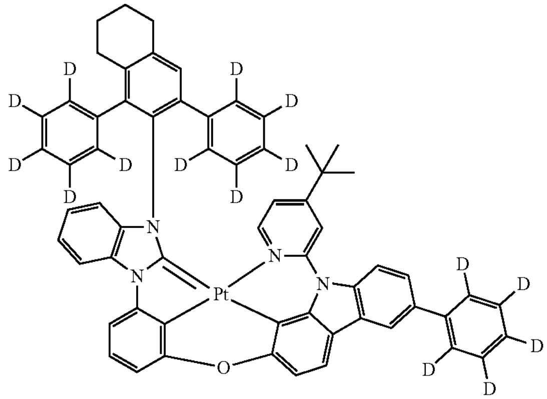
46
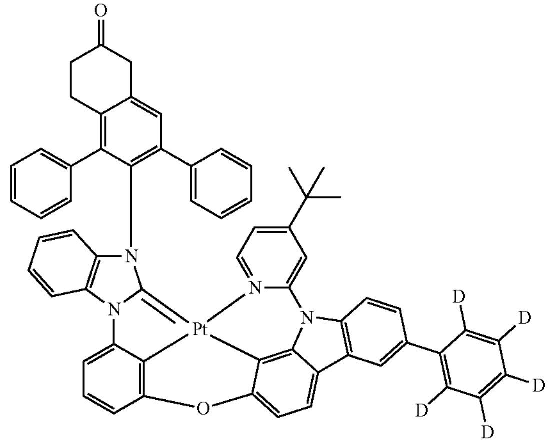
47
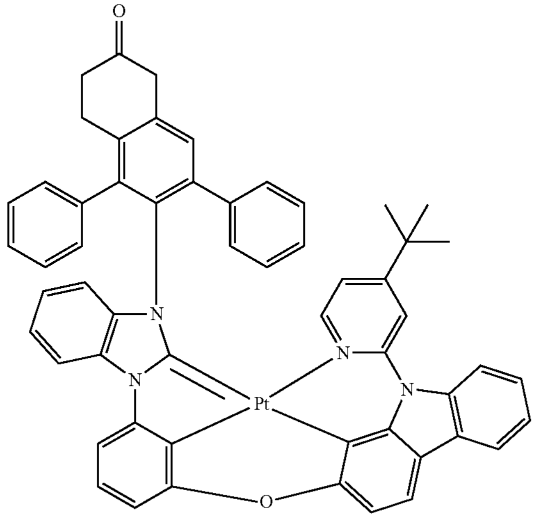
48
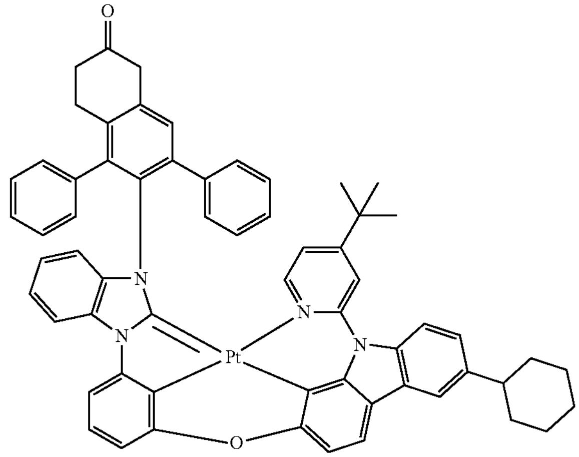
49
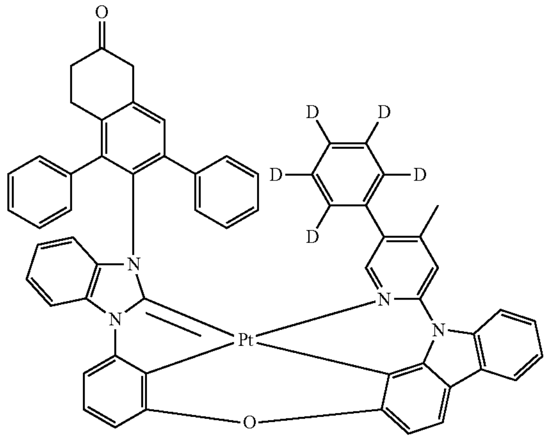
50
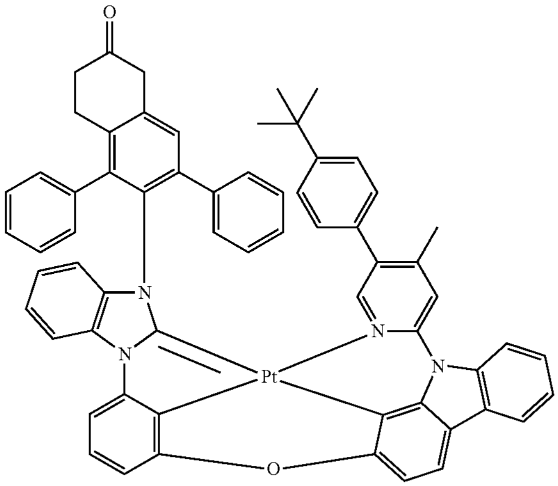

-continued
51
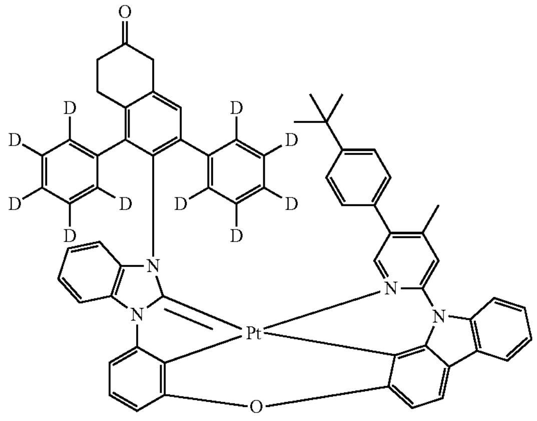
52
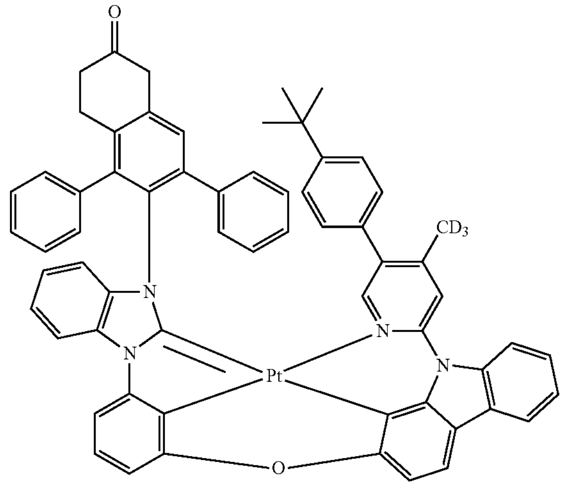
53
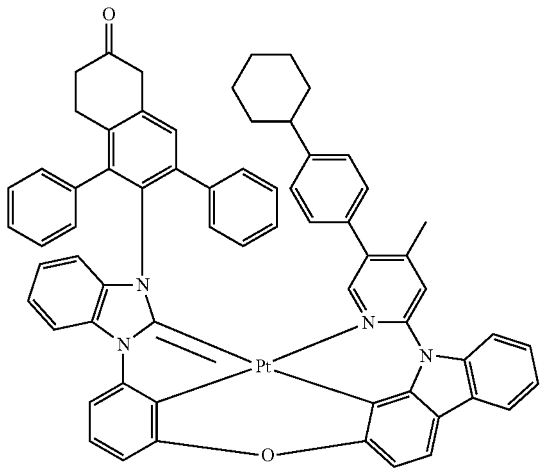
54
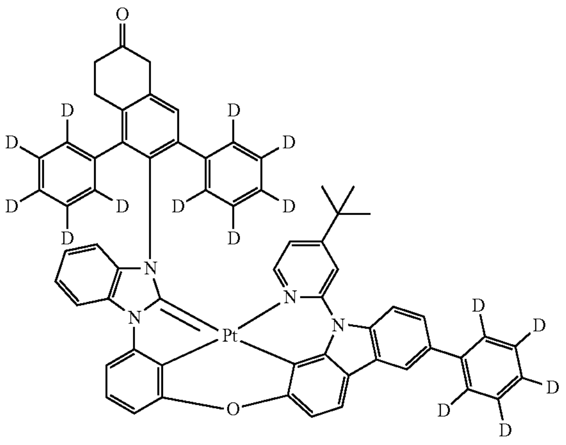
55
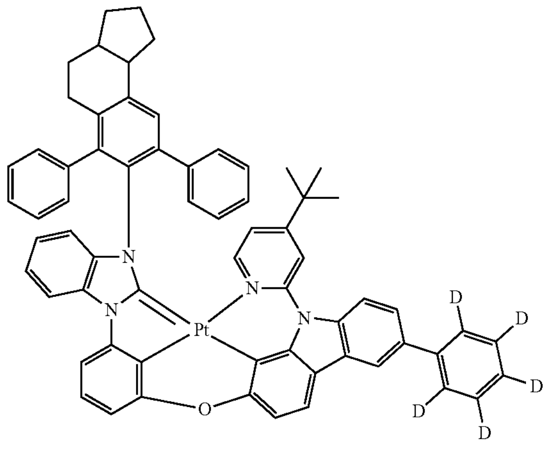
56
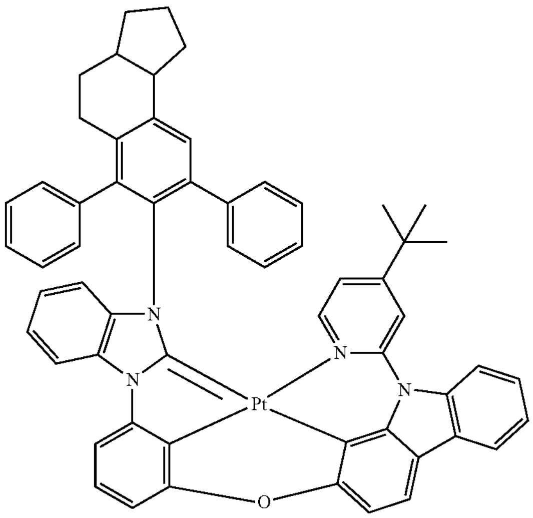

-continued
57
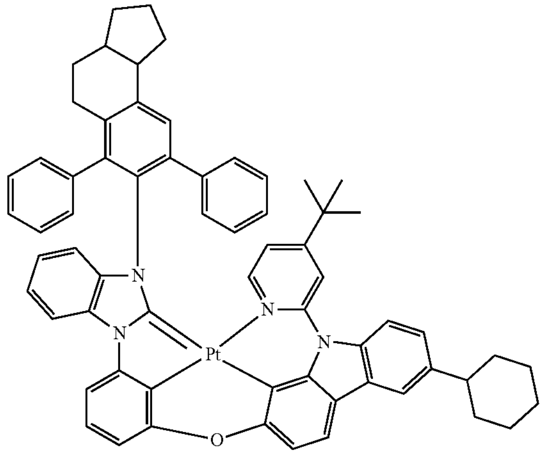
58
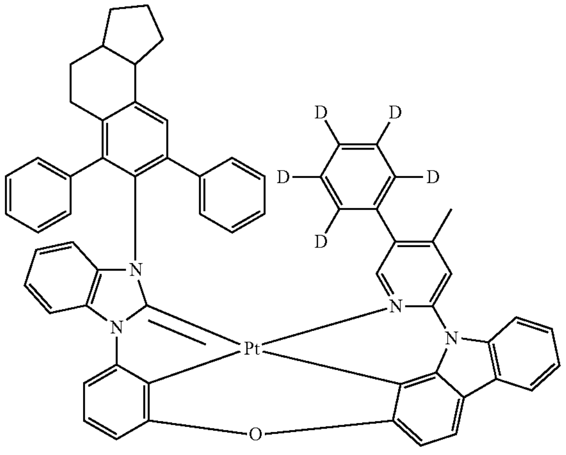
59
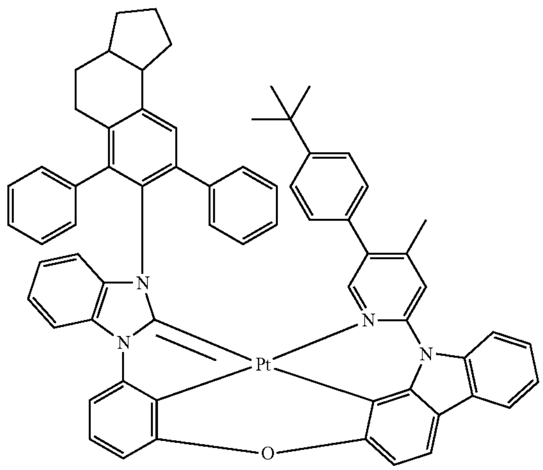
60
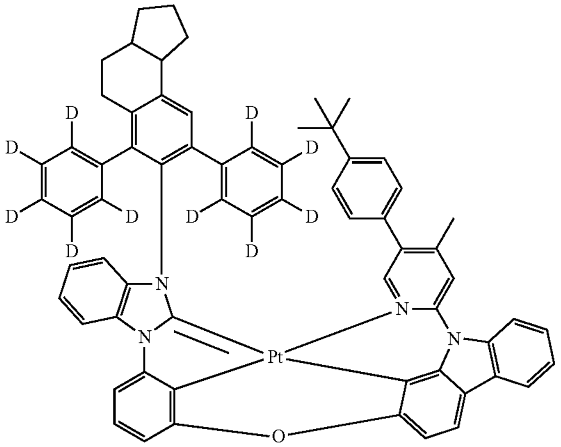
61
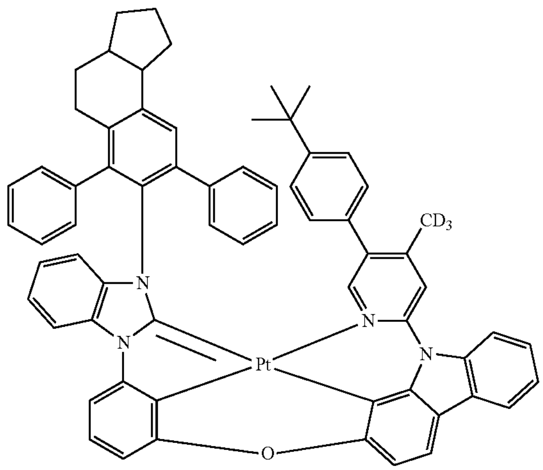
62
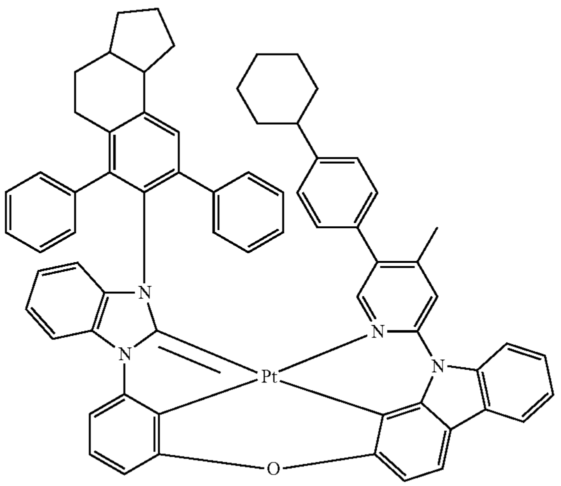

-continued
63
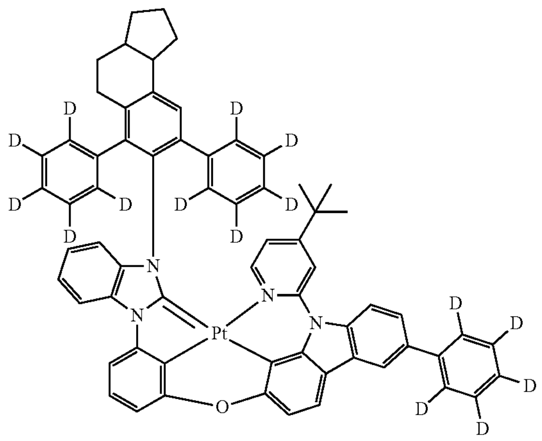
64
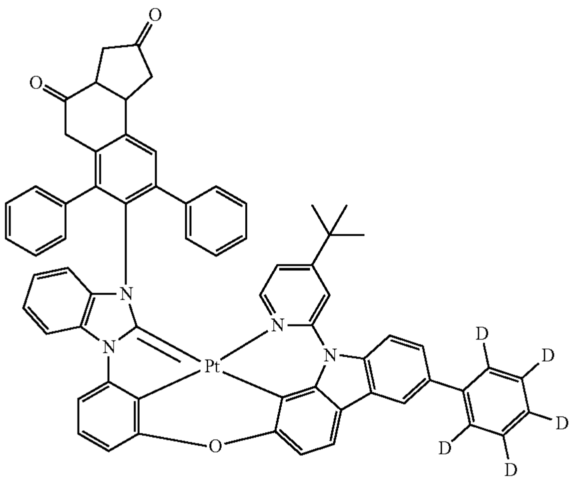
65
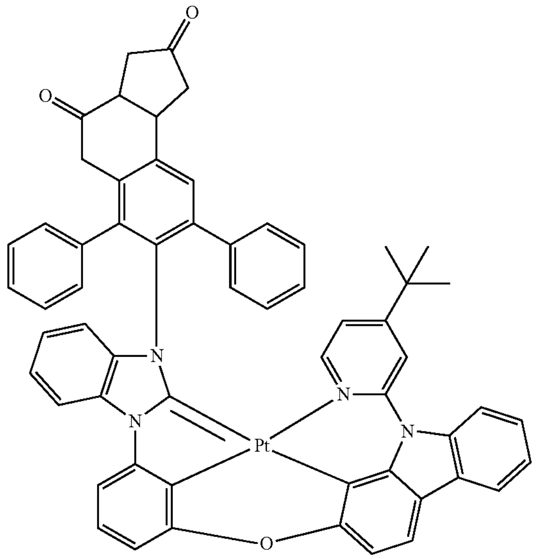
66
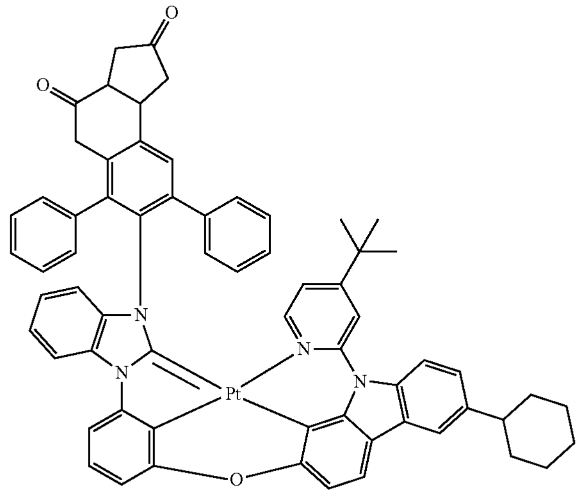
67
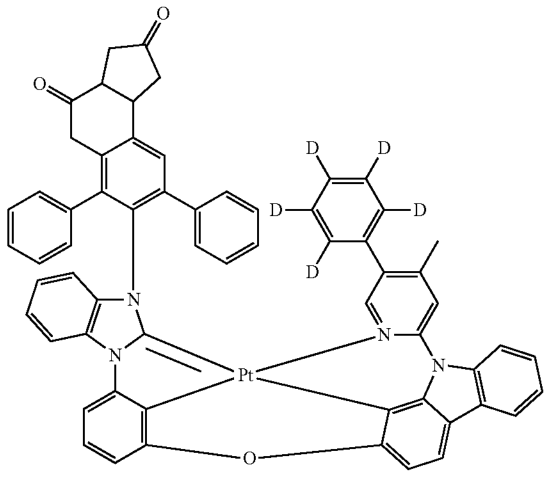
68
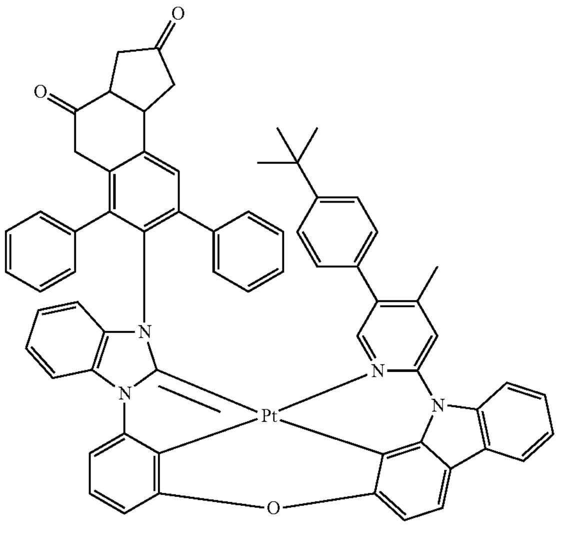

-continued
69
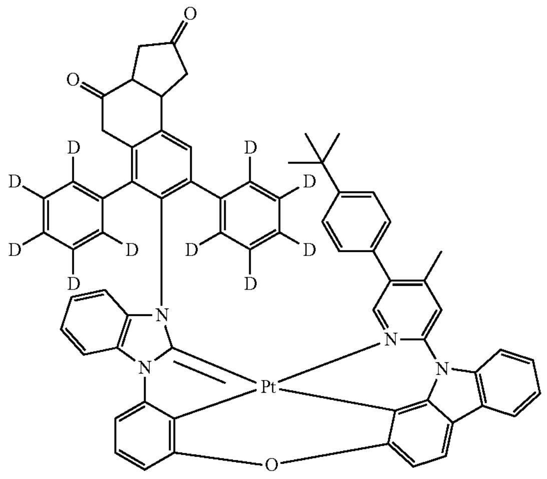
70
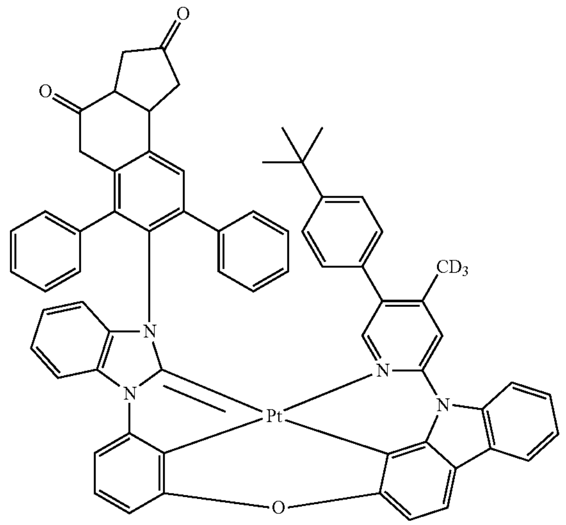
71
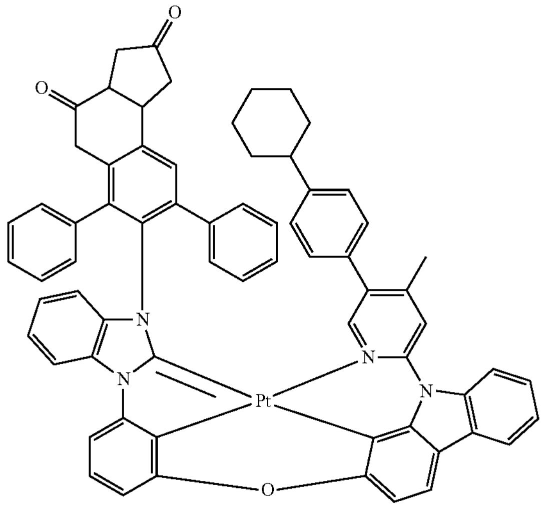
72
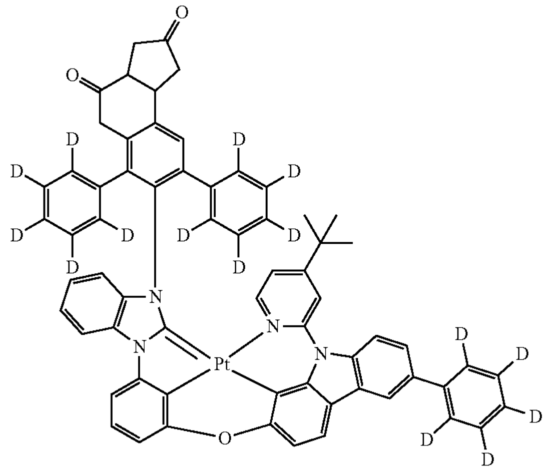
73
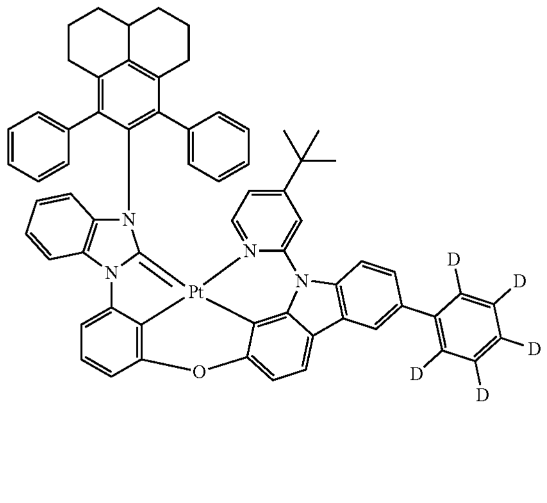
74
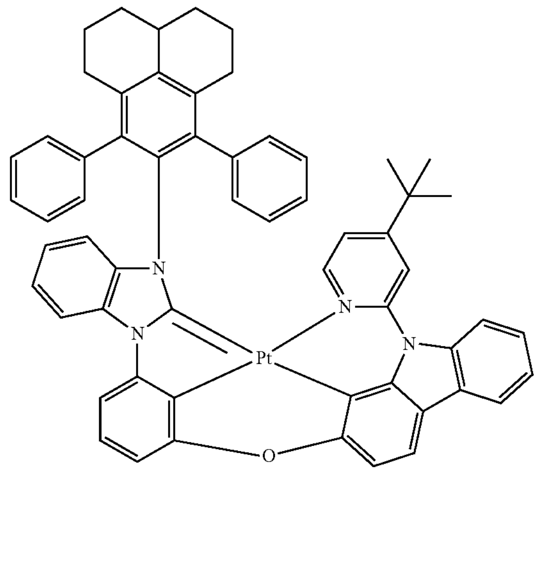

-continued
75
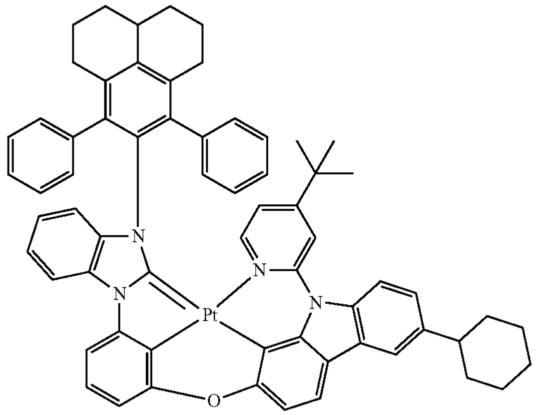
76
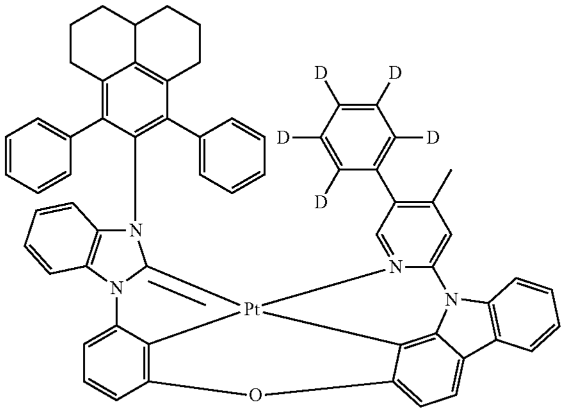
77
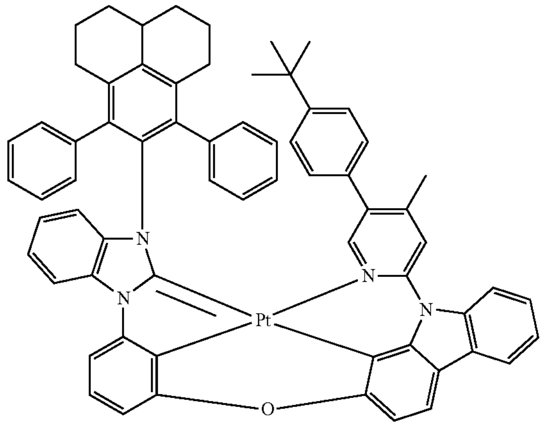
78
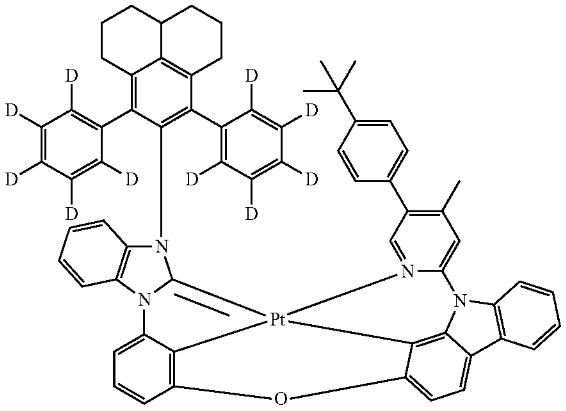
79
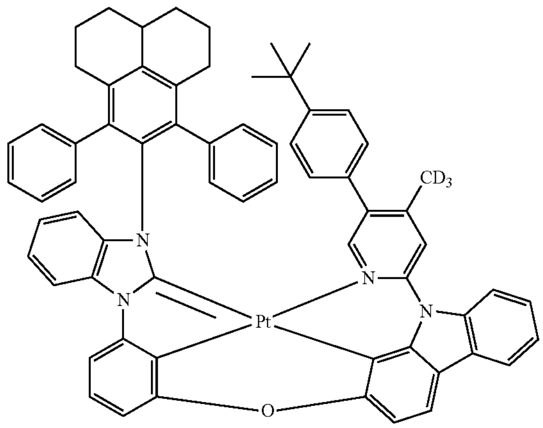
80
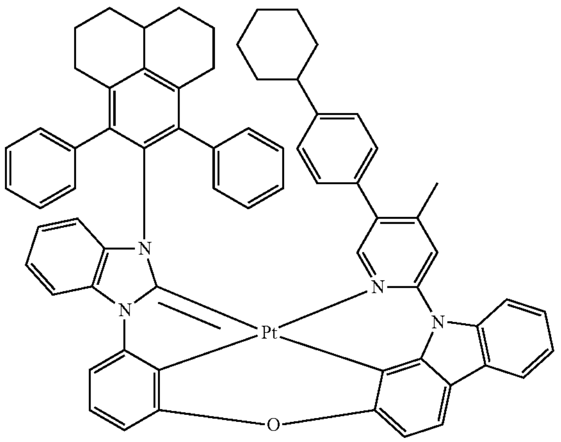

-continued
81
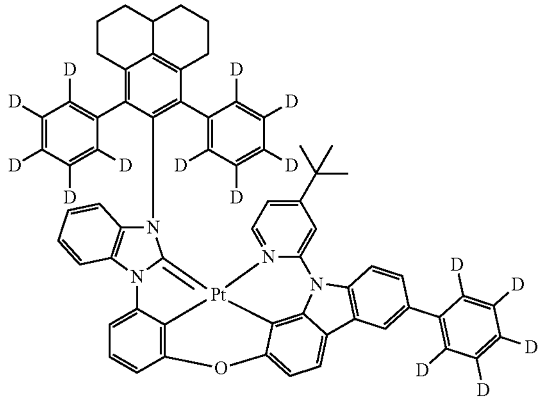
82
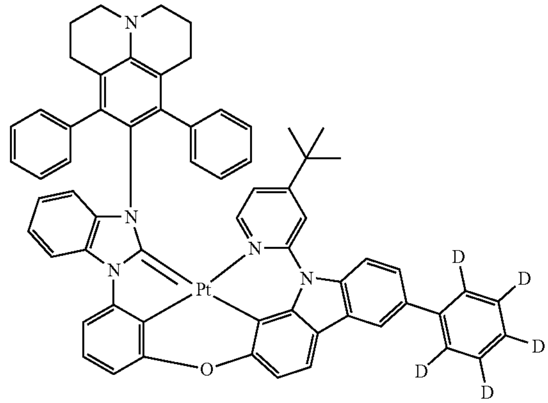
83
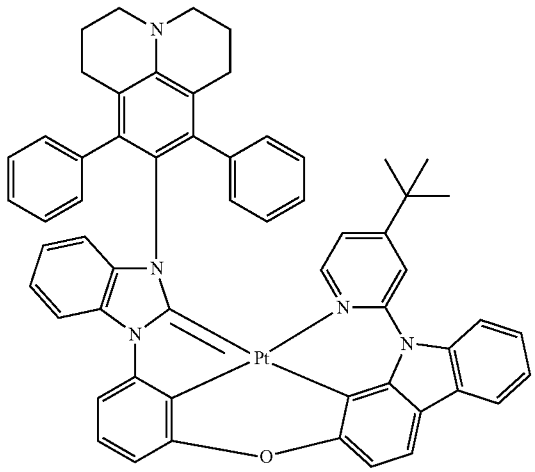
84
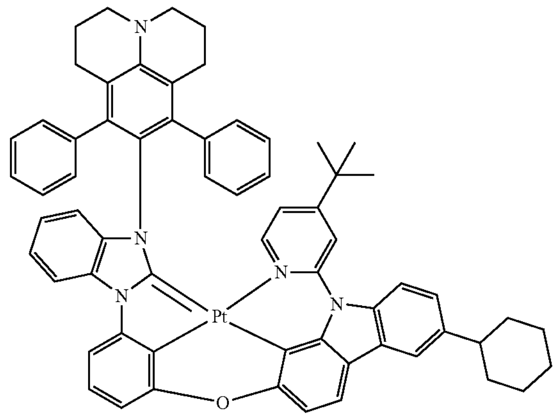
85
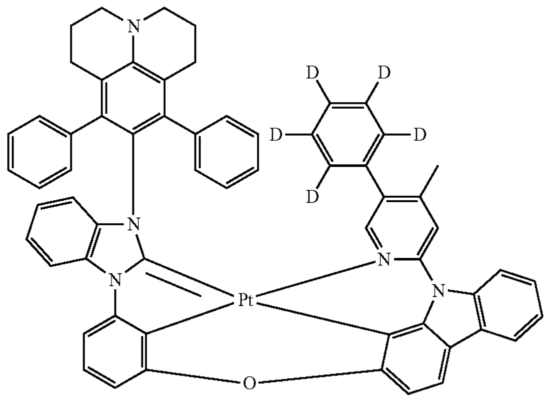
86
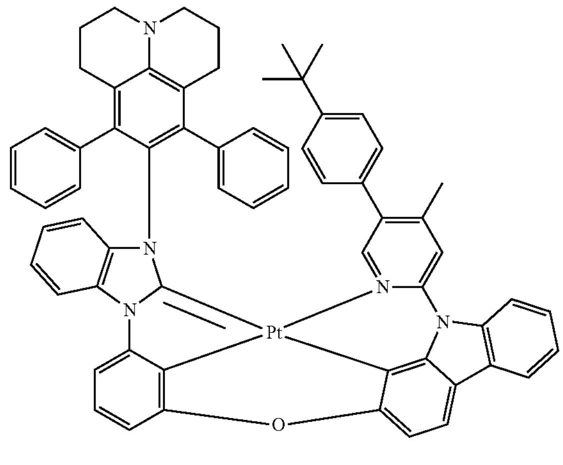

-continued
87
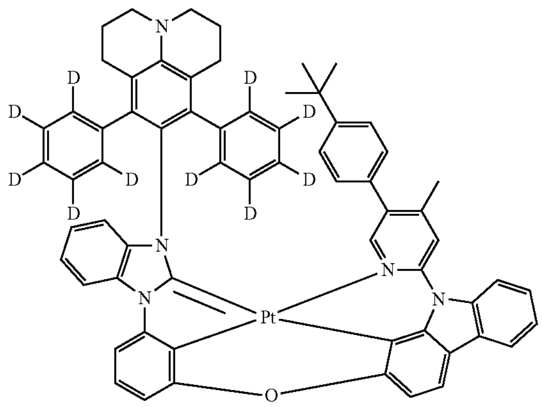
88
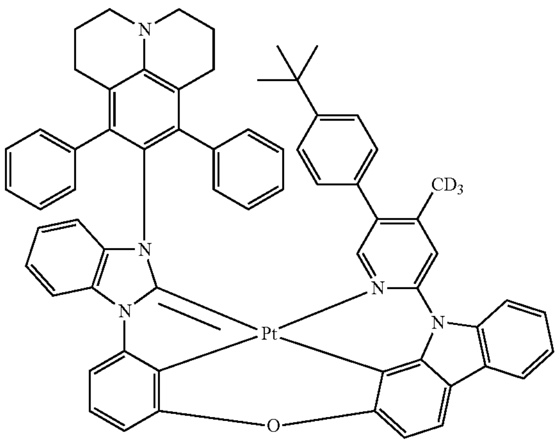
89
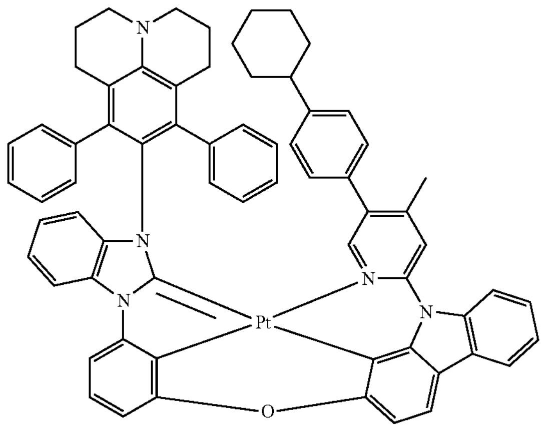
90
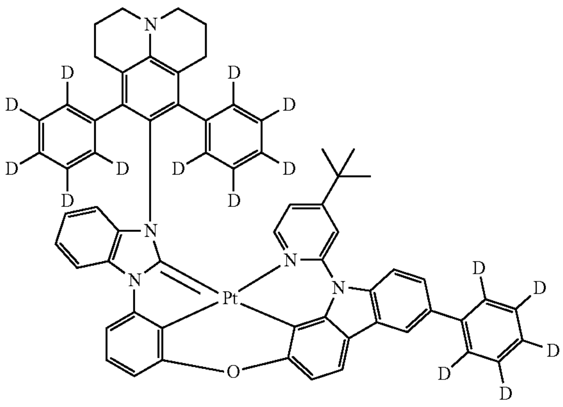
91
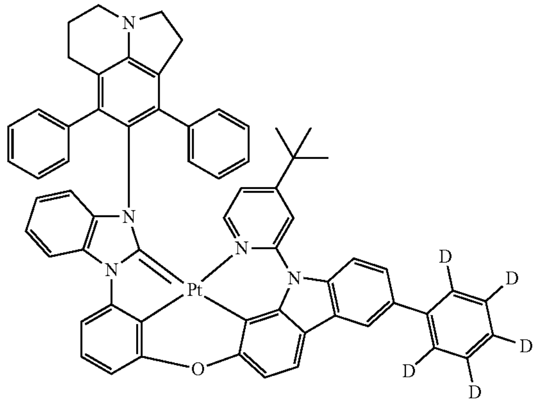
92
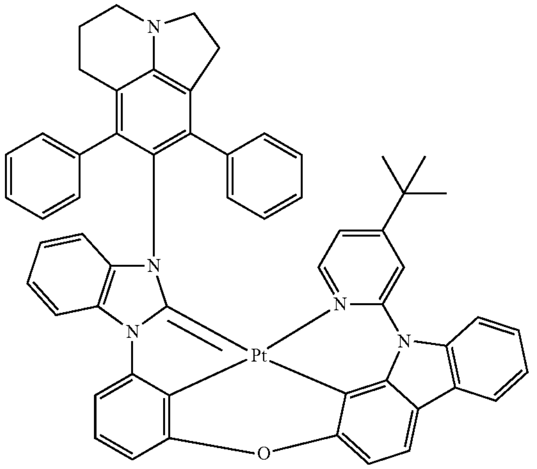

-continued
93
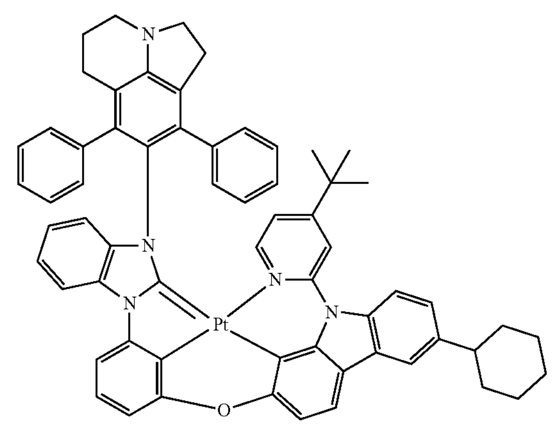
94
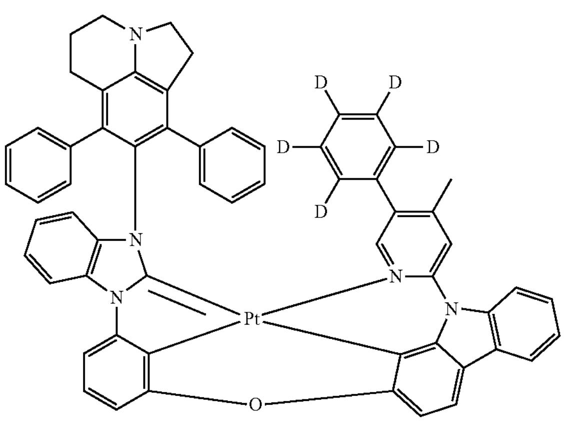
95
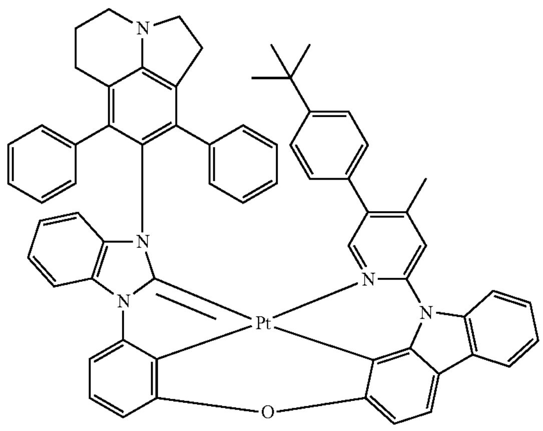
96
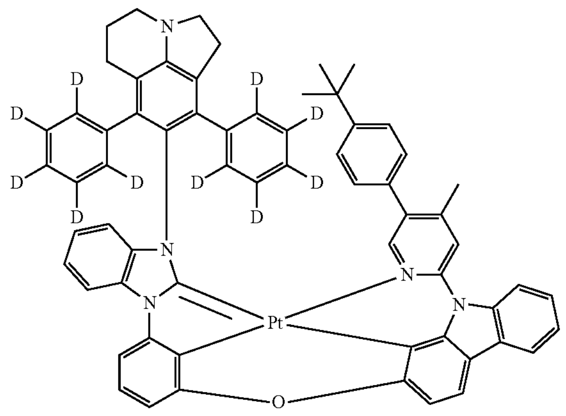
97
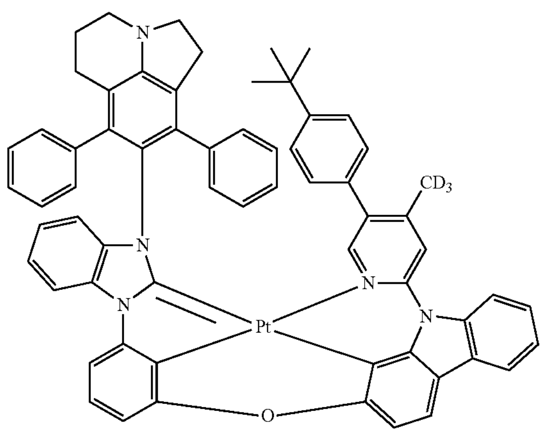
98
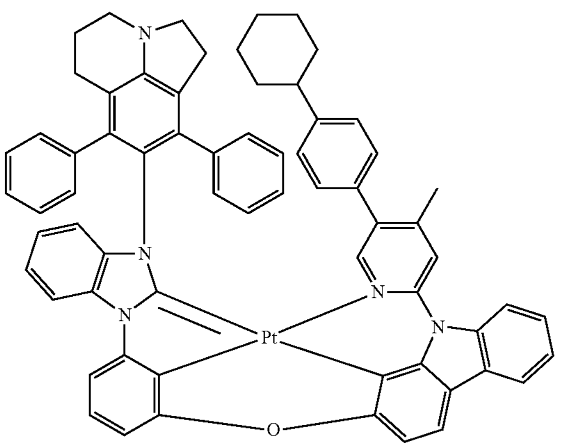

-continued
99
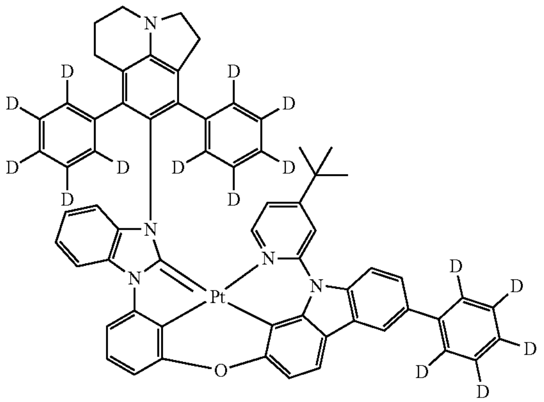
100
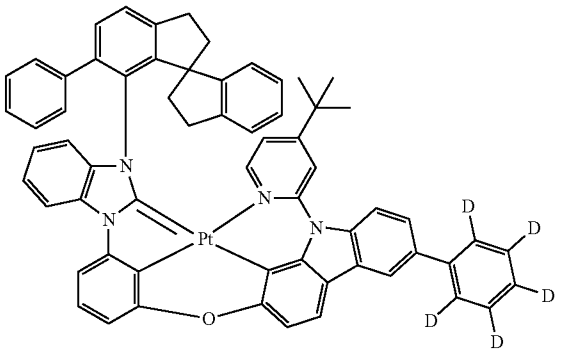
101
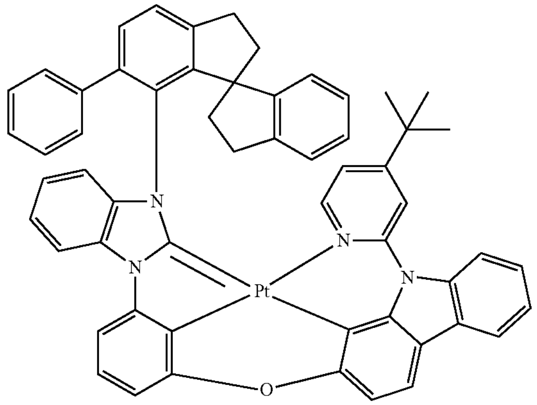
102
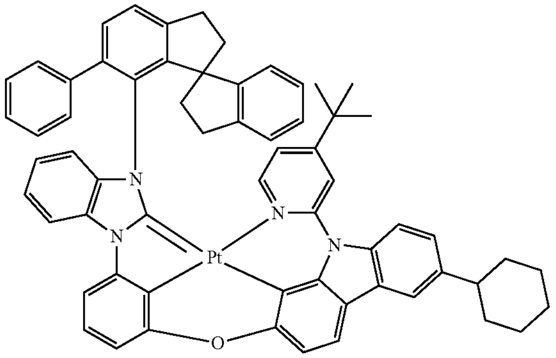
103
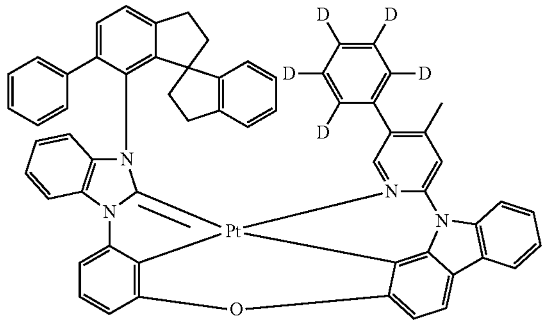
104
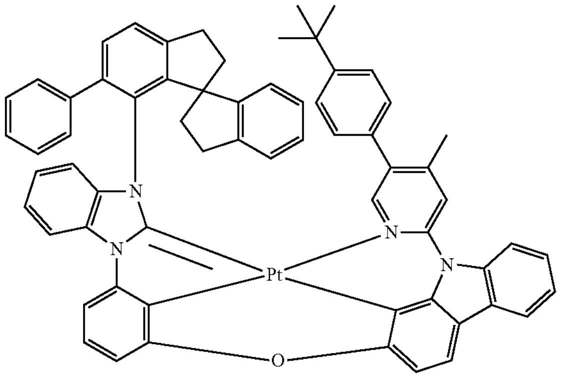
105
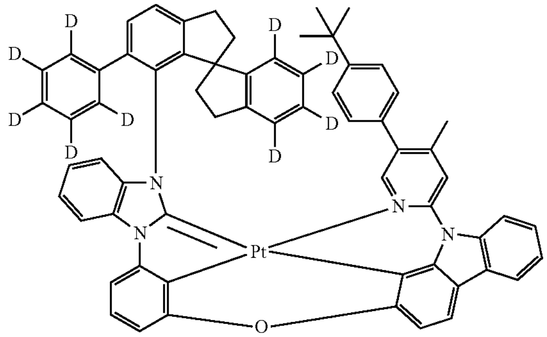
106
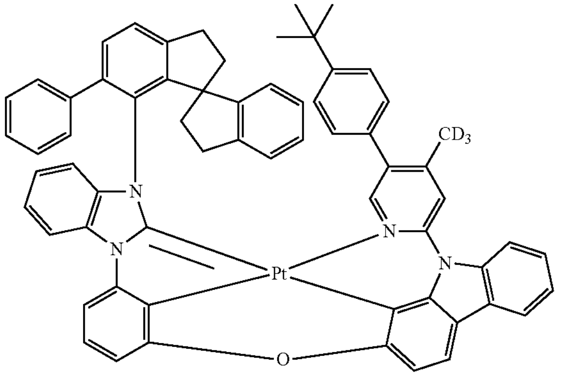

-continued
107
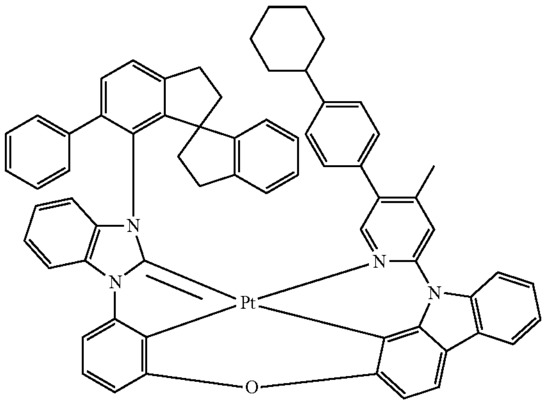
108
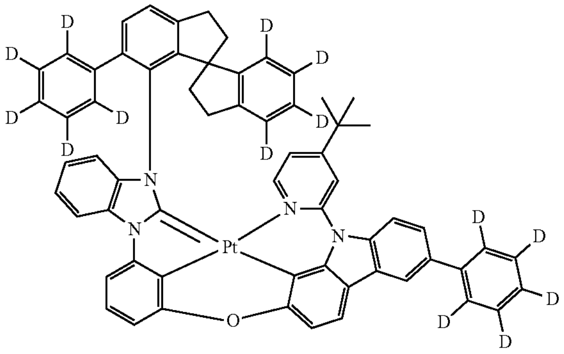
109
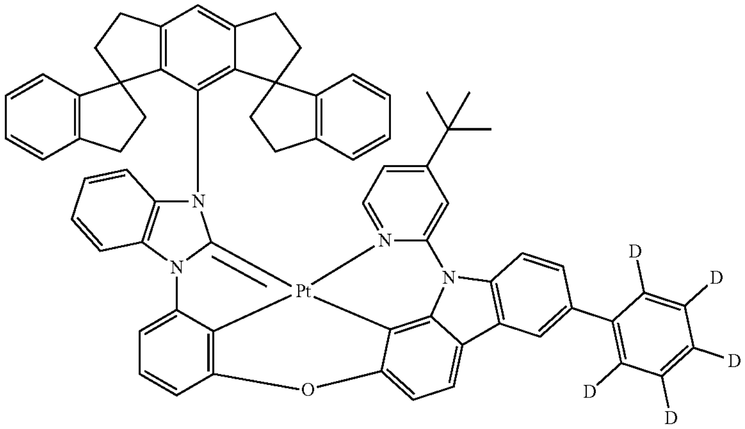
110
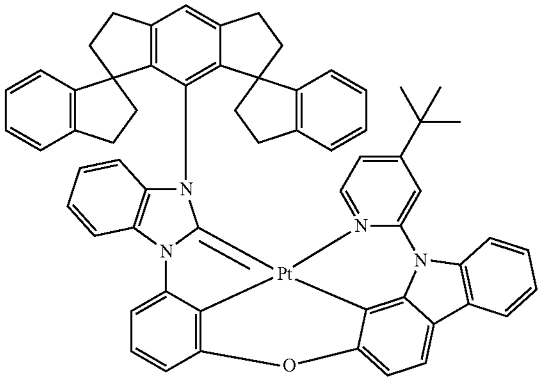
111
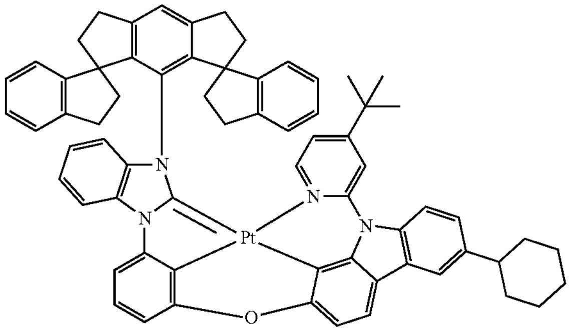
112
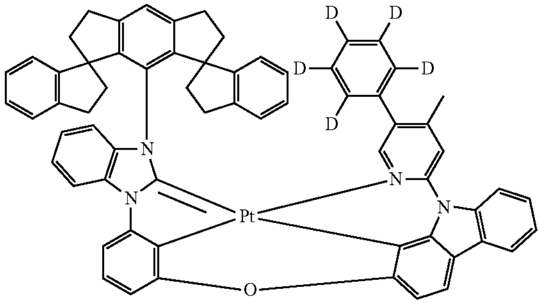
113
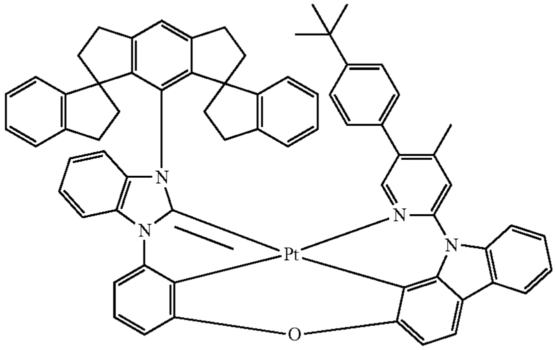

-continued
114
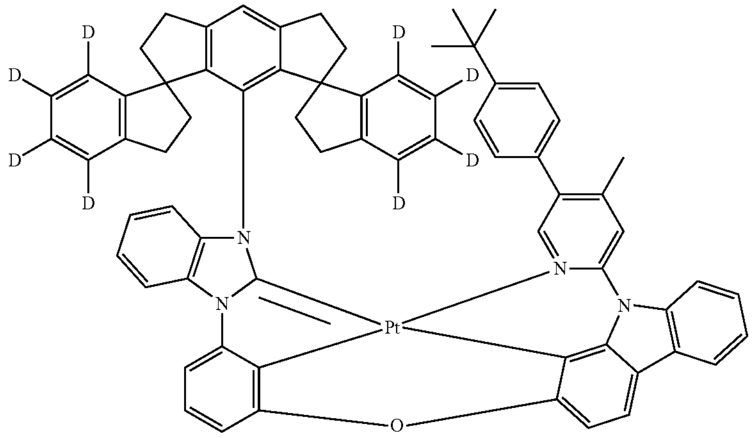
115
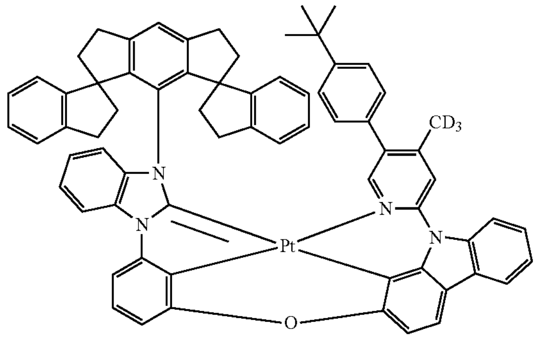
116
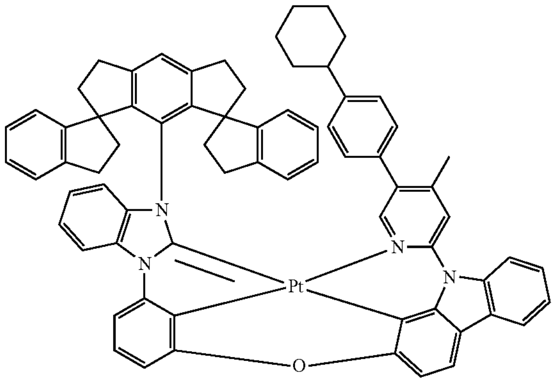
117
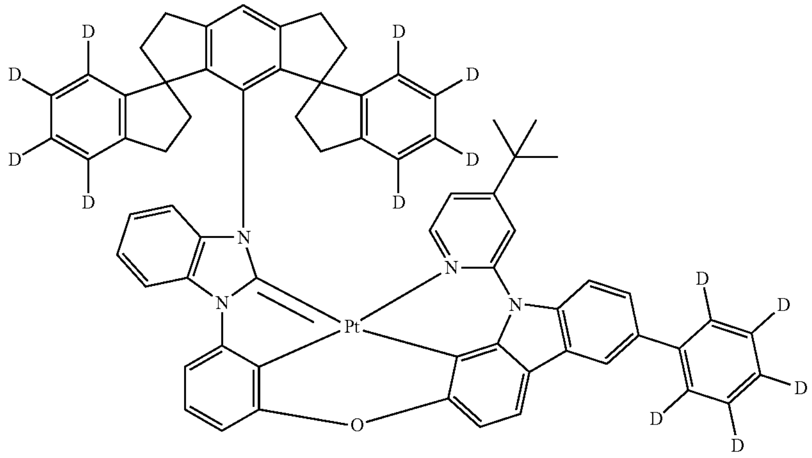

-continued

118

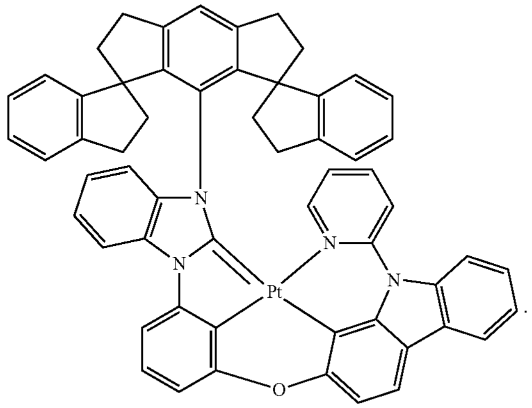

In the organometallic compound represented by Formula 1, ring $CY_5$ and ring $CY_6$ may be linked to each other via a linker $T_1$, and ring $CY_5$ and ring $CY_7$ may be linked to each other via a linker $T_2$ (see Formula 1), and:

two or more of $R_5$ may be linked to each other to form a non-aromatic cyclic group condensed with ring $CY_5$ (see Condition a); $Z_1$ of $T_1$ and/or $Z_2$ of $T_1$ may be linked to ring $CY_5$ and/or ring $CY_6$ to form a non-aromatic cyclic group condensed with ring $CY_5$ and/or ring $CY_6$ (see Condition b); and/or $Z_3$ of $T_2$ and/or $Z_4$ of $T_2$ may be linked to ring $CY_5$ and/or ring $CY_7$ to form a non-aromatic cyclic group condensed with ring $CY_5$ and/or ring $CY_7$ (see Condition c).

Accordingly, the organometallic compound may have substituents including ring $CY_5$, ring $CY_6$, and ring $CY_7$, but these substituents may have a structure in which a cyclic group is condensed with ring $CY_5$, ring $CY_6$, and/or ring $CY_7$, and thus the planarity thereof may be degraded while electron donating properties may be improved, thereby enhancing a binding force between a central metal and a ligand. By having these substituents, conjugation of the entire compound structure may be suppressed, so that the organometallic compound may have excellent structural stability and color purity and a high existence ratio of the $^3$MLCT.

Therefore, an electronic device (e.g., an organic light-emitting device) utilizing the organometallic compound may have a low driving voltage, excellent luminescence efficiency, and a long lifespan.

Synthesis methods of the organometallic compound represented by Formula 1 may be recognizable by one of ordinary skill in the art by referring to Synthesis Examples and/or Examples provided below.

At least one organometallic compound represented by Formula 1 may be used in a light-emitting device (for example, an organic light-emitting device).

Another embodiment provides a light-emitting device which may include: a first electrode; a second electrode facing the first electrode; an arranged between the first electrode and the second electrode and including an emission layer; and an organometallic compound represented by Formula 1.

In an embodiment, the first electrode of the light-emitting device may be an anode, the second electrode of the light-emitting device may be a cathode, the interlayer may further include: a hole transport region between the first electrode and the emission layer; and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In embodiments, the interlayer of the light-emitting device may include an organometallic compound represented by Formula 1.

In embodiments, the emission layer of the light-emitting device may include an organometallic compound represented by Formula 1.

In embodiments, the emission layer may emit blue light. For example, the emission layer may emit blue light having a maximum emission wavelength in a range of about 410 nm to about 500 nm. For example, the emission layer may emit blue light having a maximum emission wavelength in a range of about 420 nm to about 490 nm. For example, the emission layer may emit blue light having a maximum emission wavelength in a range of about 430 nm to about 480 nm. For example, the emission layer may emit blue light having a maximum emission wavelength in a range of about 430 nm to about 470 nm.

In embodiments, the emission layer of the light-emitting device may include a dopant and a host, and the dopant may include the organometallic compound represented by Formula 1. For example, the organometallic compound may serve as a dopant. The emission layer may emit red light, green light, blue light, and/or white light. In an embodiment, the emission layer may emit blue light, and the blue light may have a maximum emission wavelength in a range of about 410 nm to about 500 nm. For example, the blue light may have a maximum emission wavelength in a range of about 420 nm to about 490 nm. For example, the blue light may have a maximum emission wavelength in a range of about 430 nm to about 480. For example, the blue light may have a maximum emission wavelength in a range of about 430 nm to 470 nm.

In embodiments, the electron transport region of the light-emitting device may include a hole blocking layer, and the hole blocking layer may include a phosphine oxide-containing compound, a silicon-containing compound, or any combination thereof. For example, the hole blocking layer may directly contact the emission layer.

In an embodiment, the light-emitting device may further include at least one of a first capping layer located outside the first electrode and a second capping layer located outside the second electrode, and at least one of the first capping layer and the second capping layer may each independently include an organometallic compound represented by Formula 1. The first capping layer and/or the second capping layer may each be the same as described herein.

In an embodiment, the light-emitting device may further include:

a first capping layer outside the first electrode and including an organometallic compound represented by Formula 1;

a second capping layer outside the second electrode and including an organometallic compound represented by Formula 1; or the first capping layer and the second capping layer.

The wording "(interlayer and/or capping layer) includes an organometallic compound" as used herein may be understood as "(interlayer and/or capping layer) may include one kind of organometallic compound represented by Formula 1 or two different kinds of organometallic compounds, each independently represented by Formula 1."

In an embodiment, the interlayer and/or the capping layer may include Compound 1 only as the organometallic compound. Here, Compound 1 may be present in the emission layer of the light-emitting device. In embodiments, the interlayer may include, as the organometallic compound, Compound 1 and Compound 2. Here, Compound 1 and Compound 2 may be present in a same layer (for example, both Compound 1 and Compound 2 may be present in the emission layer), or may be present in different layers (for example, Compound 1 may be present in the emission layer, and Compound 2 may be present in the electron transport region).

The term "interlayer" as used herein refers to a single layer and/or all layers between a first electrode and a second electrode of a light-emitting device.

In an embodiment, the light-emitting device may include a first compound which is the organometallic compound represented by Formula 1; and the light-emitting device may further include:

a second compound including at least one π electron-deficient nitrogen-containing $C_1$-$C_{60}$ cyclic group, a third compound including a group represented by Formula 3, a fourth compound which may emit delayed fluorescence (for example, the fourth compound may be a delayed fluorescence compound), or any combination thereof, wherein the first compound, the second compound, the third compound, and the fourth compound may be different from each other:

[Formula 3]

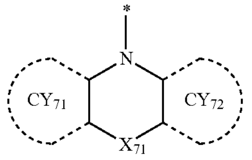

In Formula 3, ring $CY_{71}$ and ring $CY_{72}$ may each independently be a π electron-rich $C_3$-$C_{60}$ cyclic group or a pyridine group, $X_{71}$ may be: a single bond; or a linking group including O, S, N, B, C, Si, or any combination thereof, and

* indicates a binding site to a neighboring atom in the third compound.

In an embodiment, CBP and mCBP may be excluded from the third compound:

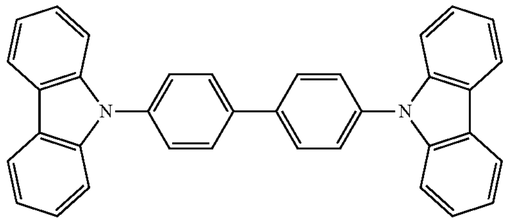

CBP

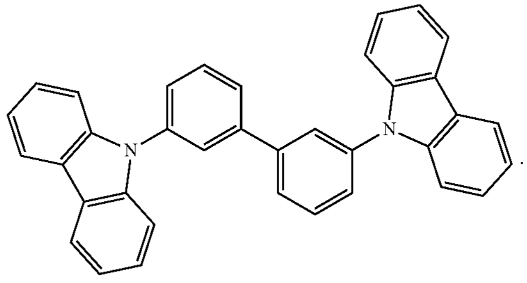

mCBP

In an embodiment, the interlayer of the light-emitting device may include:

the first compound; and the second compound, the third compound, the fourth compound, or any combination thereof.

In an embodiment, the emission layer of the light-emitting device may include:

the first compound; and the second compound, the third compound, the fourth compound, or any combination thereof, wherein the emission layer may emit phosphorescent light or fluorescent light emitted from the first compound.

For example, blue light may be emitted from the first compound, and the blue light may have a maximum emission wavelength in a range of about 410 nm to about 500 nm. For example, the blue light may have a maximum emission wavelength in a range of about 430 nm to about 500 nm. For example, the blue light may have a maximum emission wavelength in a range of about 430 nm to about 470 nm.

[Descriptions of second compound, third compound, and fourth compound]

In an embodiment, the second compound may include a pyridine group, a pyrimidine group, a pyrazine group, a pyridazine group, a triazine group, or any combination thereof.

In embodiments, the light-emitting device may further include at least one of the second compound and the third compound, in addition to the first compound.

In embodiments, the light-emitting device may further include the fourth compound, in addition to the first compound.

In embodiments, the light-emitting device may include the first compound, the second compound, the third compound, and the fourth compound.

In embodiments, the interlayer may include the second compound. In addition to the first compound and the second compound, the interlayer may further include the third compound, the fourth compound, or any combination thereof.

In embodiments, a difference between a triplet energy level (electron Volts, eV) of the fourth compound and a singlet energy level (eV) of the fourth compound may be in a range of about 0 eV to about 0.5 eV (for example, in a range of about 0 eV to about 0.3 eV).

In embodiments, the fourth compound may include at least one cyclic group including boron (B) and nitrogen (N) as ring-forming atoms.

In embodiments, the fourth compound may be a $C_8$-$C_{60}$ polycyclic group-containing compound including at least two condensed cyclic groups that share a boron atom (B).

In embodiments, the fourth compound may include a condensed ring in which at least one third ring may be condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In embodiments, the interlayer may include the fourth compound. In addition to the first compound and the fourth compound, the interlayer may include the second compound, the third compound, or any combination thereof.

In embodiments, the interlayer may include the third compound. For example, the third compound may not include CBP as described herein or mCBP as described herein.

In an embodiment, the emission layer in the interlayer may include: the first compound; and the second compound, the third compound, the fourth compound, or any combination thereof.

The emission layer may emit phosphorescence or fluorescence emitted from the first compound. For example, the phosphorescence or fluorescence emitted from the first compound may be blue light.

In embodiments, the emission layer of the light-emitting device may include the second compound and the third compound, wherein the second compound and the third compound may form an exciplex.

In embodiments, the emission layer of the light-emitting device may include the first compound, the second compound, and the third compound, wherein the second compound and the third compound may form an exciplex.

In embodiments, the emission layer in the light-emitting device may include the first compound and the fourth compound, and the fourth compound may improve color purity, luminescence efficiency, and lifespan characteristics of the light-emitting device.

In an embodiment, the second compound may include a compound represented by Formula 2:

[Formula 2]

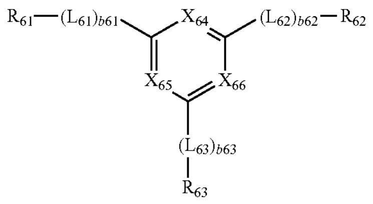

In Formula 2, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer from 1 to 5, $X_{64}$ may be N or C($R_{64}$), $X_{65}$ may be N or C($R_{65}$), $X_{66}$ may be N or C($R_{66}$), and at least one of $X_{64}$ to $X_{66}$ may each be N, $R_{61}$ to $R_{66}$ may each be the same as described herein, and $R_{10a}$ may be the same as described herein.

In embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

[Formula 3-1]

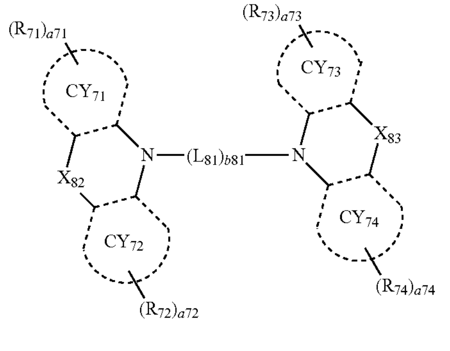

[Formula 3-2]

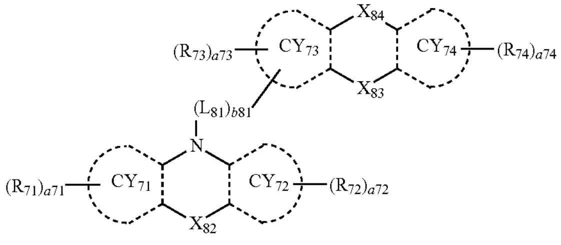

-continued

[Formula 3-3]

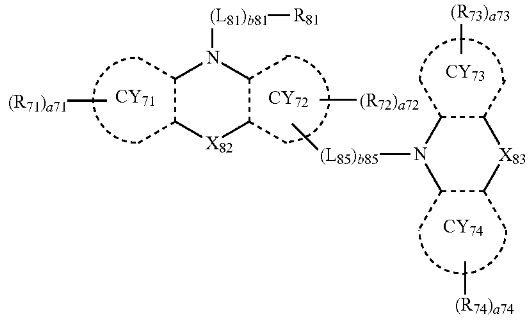

[Formula 3-4]

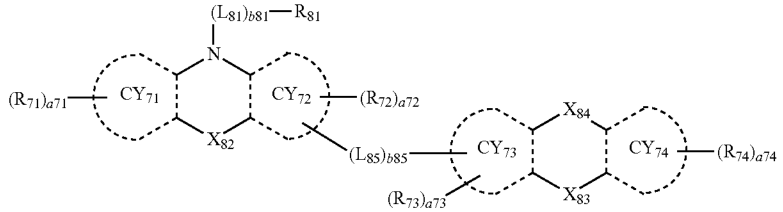

[Formula 3-5]

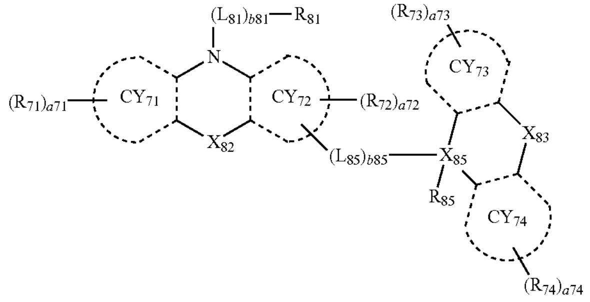

In Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], $C(R_{82a})(R_{82b})$, or $Si(R_{82a})(R_{82b})$, $X_{83}$ may be a single bond, O, S, N-[$(L_{83})_{b83}$-$R_{83}$], $C(R_{83a})(R_{83b})$, or $Si(R_{83a})(R_{83b})$, $X_{84}$ may be O, S, N-[$(L_{84})_{b84}$-$R_{84}$], $C(R_{84a})(R_{84b})$, or $Si(R_{84a})(R_{84b})$, $X_{85}$ may be C or Si, $L_{81}$ to $L_{85}$ may each independently be a single bond, *—$C(Q_4)(Q_5)$-*', *—$Si(Q_4)(Q_5)$-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each independently be the same as described in connection with $Q_1$ in the specification, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are each the same as described herein, a71 to a74 may each independently be an integer from 0 to 20, and $R_{10a}$ may be the same as described herein.

In embodiments, the fourth compound may be a compound represented by Formula 502, a compound represented by Formula 503, or any combination thereof:

[Formula 502]

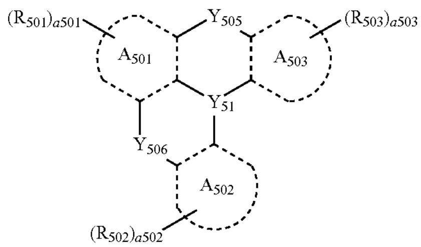

[Formula 503]

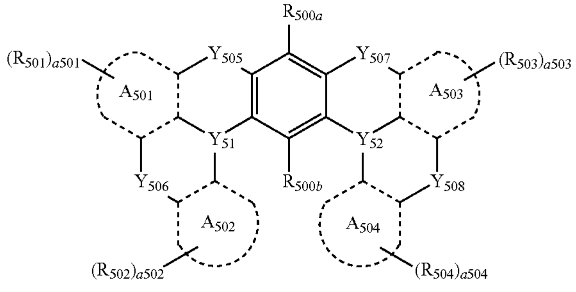

In Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{505}$ may be O, S, $N(R_{505})$, $B(R_{505})$, $C(R_{505a})(R_{505b})$, or $Si(R_{505a})(R_{505b})$, $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{505a}$, and $R_{508b}$ are each the same as described herein, a501 to a504 may each independently be an integer from 0 to 20, and $R_{10a}$ may be the same as described herein.

[Description of Formulae 2, 3-1 to 3-5, 502, and 503]

In Formula 2, b61 to b63 respectively indicate the number of $L_{61}$(s) to the number of Les(s), and b61 to b63 may each independently be an integer from 1 to 5. When b61 is 2 or greater, two or more of $L_{61}$ may be identical to or different from each other, when b62 is 2 or greater, two or more of $L_{62}$ may be identical to or different from each other, and when b63 is 2 or greater, two or more of $L_{60}$ may be identical to or different from each other. In an embodiment, b61 to b63 may each independently be 1 or 2.

In an embodiment, in Formula 2, $L_{61}$ to $L_{63}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzoxacilline group, a dibenzothiacilline group, a dibenzodihydroazacilline group, a dibenzodihydrodicilline group, a dibenzodihydrocilline group, a dibenzodioxane group, a dibenzoxathiene group, a dibenzoxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(═O)(Q_{31})$, $—S(═O)_2(Q_{31})$, $—P(═O)(Q_{31})(Q_{32})$, or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formula 2, a bond between $L_{61}$ and $R_{61}$, a bond between $L_{62}$ and $R_{62}$, a bond between $L_{63}$ and $R_{63}$, a bond between two or more $L_{61}$(s), a bond between two or more $L_{62}$(s), a bond between two or more $L_{63}$(s), a bond between $L_{61}$ and carbon between $X_{64}$ and $X_{65}$ in Formula 2, a bond between $L_{62}$ and carbon between $X_{64}$ and $X_{66}$ in Formula 2, and a bond between $L_{63}$ and carbon between $X_{65}$ and $X_{66}$ in Formula 2 may each be a carbon-carbon single bond.

In Formula 2, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may each be N. $R_{64}$ to $R_{66}$ may each be the same as described herein. For example, two or three of $X_{64}$ to $X_{66}$ may each be N.

In the specification, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{00}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(═O)(Q_1)$, $—S(═O)_2(Q_1)$, or $—P(═O)(Q_1)(Q_2)$, and $Q_1$ to $Q_3$ may each be the same as described herein.

In an embodiment, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503; and $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

[Formula 91]

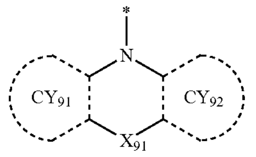

wherein in Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{11b})$, or $Si(R_{91a})(R_{91b})$, $R_{11}$, $R_{11a}$, and $R_{91b}$ may respectively be the same as described in connection with $R_{82}$, $R_{82a}$, and $R_{82b}$ as described herein, $R_{10a}$ may be the same as described herein, and

* indicates a binding site to a neighboring atom.

In embodiments, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{11}$, $R_{91a}$, and $R_{91b}$ may each independently be:

hydrogen or a $C_1$-$C_1$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_1$ alkyl group, a phenyl group, a biphenyl group, a pyridinyl group, a pyrimidinyl group, a pyridazinyl group, a pyrazinyl group, a triazinyl group, or any combination thereof.

In embodiments, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503; and $R_{10a}$ may each independently be:

hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-19, a group represented by one of Formulae 10-1 to 10-249, $—C(Q_1)(Q_2)(Q_3)$, $—Si(Q_1)(Q_2)(Q_3)$, $—N(Q_1)(Q_2)$, or $—P(=O)(Q_1)(Q_2)$, wherein $Q_1$ to $Q_3$ are each the same as described in the specification:

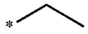

9-1

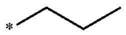

9-2

-continued
9-3
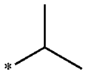
9-4
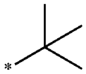
9-5
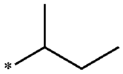
9-6
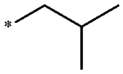
9-7
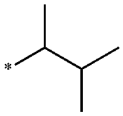
9-8
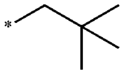
9-9
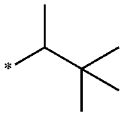
9-10
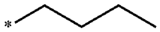
9-11
9-12
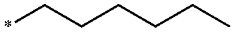
9-13
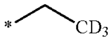
9-14
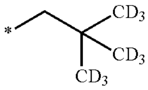
9-15
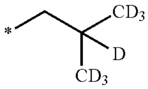
9-16
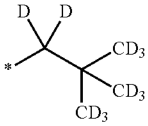
9-17
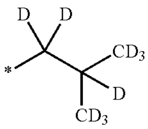
9-18
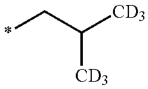
9-19
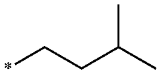
-continued
10-1
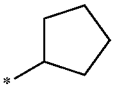
10-2
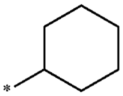
10-3
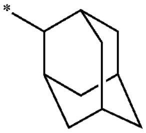
10-4
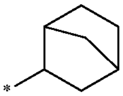
10-5
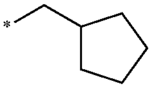
10-6
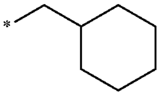
10-7
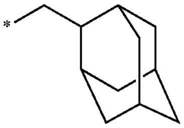
10-8
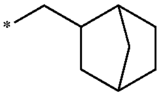
10-9
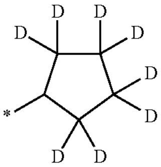
10-10
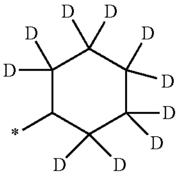
10-11
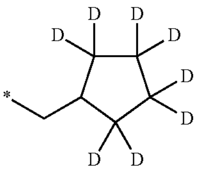

-continued
10-12
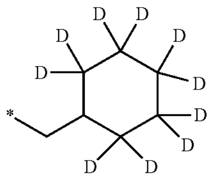
10-13
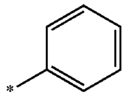
10-14
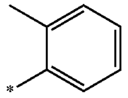
10-15
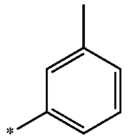
10-16
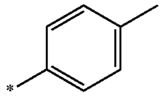
10-17
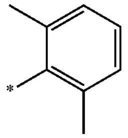
10-18
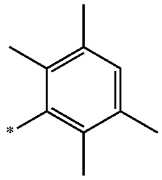
10-19
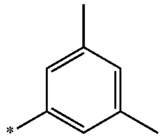
10-20
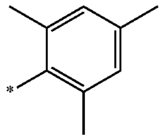
10-21
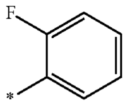
10-22
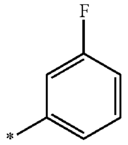
-continued
10-23
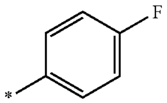
10-24
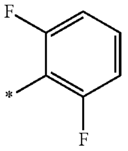
10-25
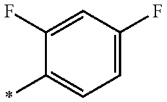
10-26
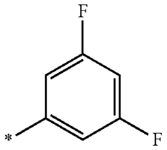
10-27
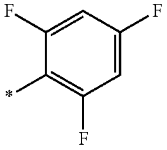
10-28
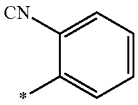
10-29
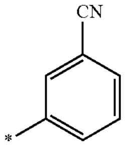
10-30
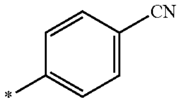
10-31
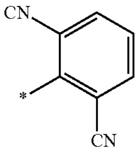
10-32
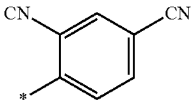
10-33
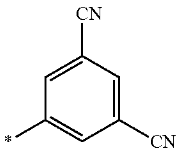

-continued
10-34
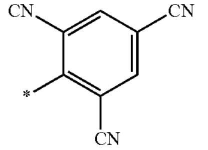
10-35
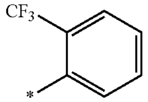
10-36
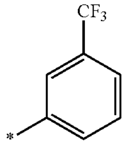
10-37
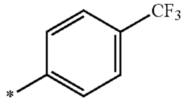
10-38
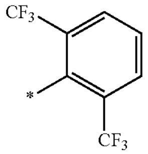
10-39
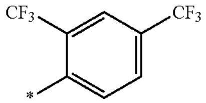
10-40
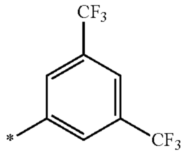
10-41
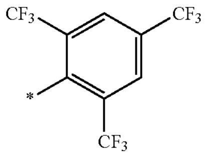
10-42
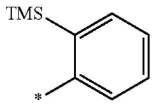
10-43
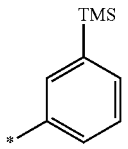
10-44
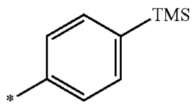
-continued
10-45
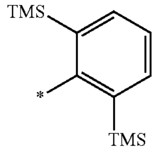
10-46
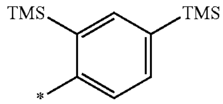
10-47
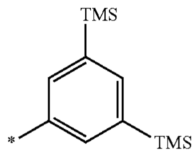
10-48
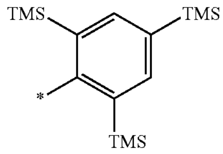
10-49
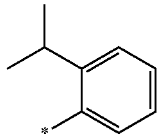
10-50
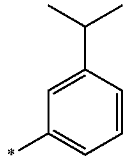
10-51
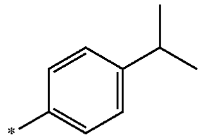
10-52
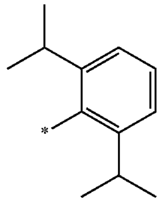
10-53
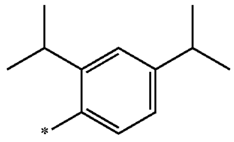

-continued
10-54
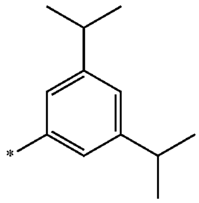
10-55
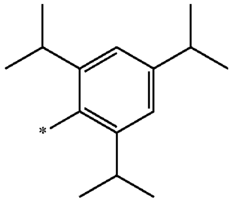
10-56
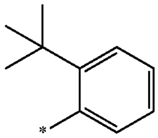
10-57
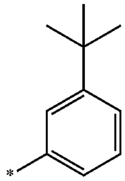
10-58
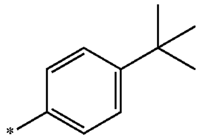
10-59
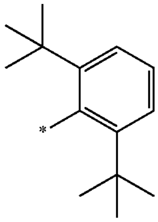
10-60
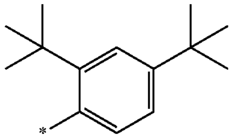
10-61
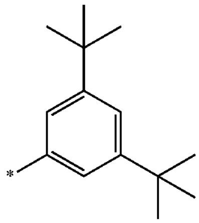
-continued
10-62
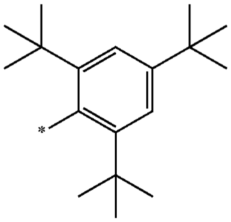
10-63
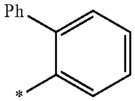
10-64
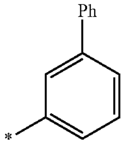
10-65
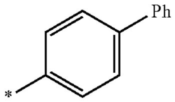
10-66
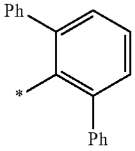
10-67
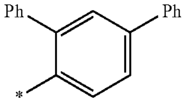
10-68
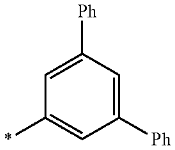
10-69
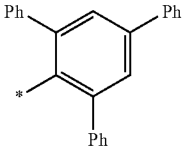
10-70
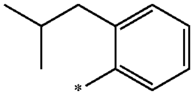
10-71
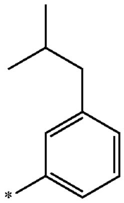

-continued
10-72
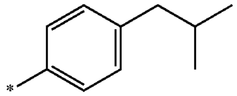
10-73
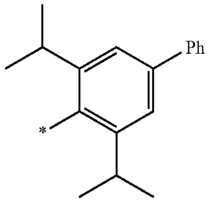
10-74
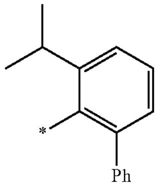
10-75
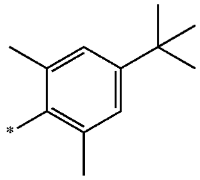
10-76
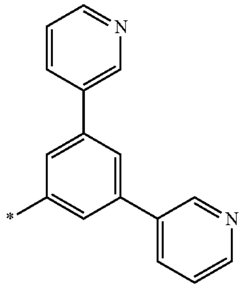
10-77
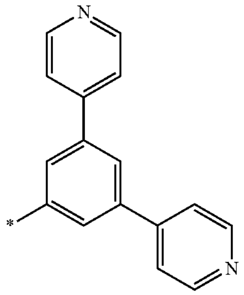
10-78
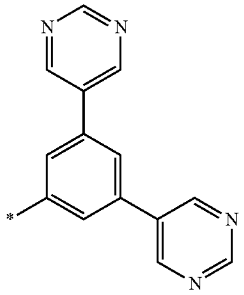
-continued
10-79
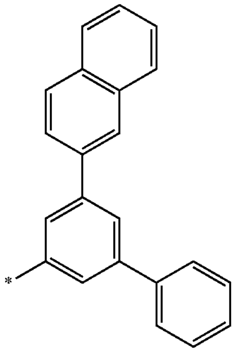
10-80
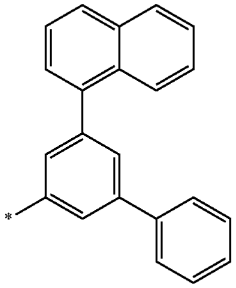
10-81
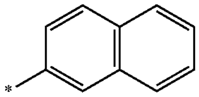
10-82
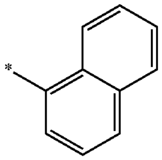
10-83
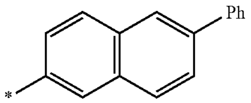
10-84
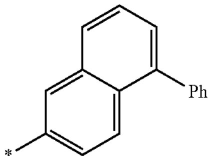
10-85
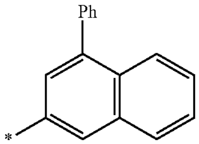
10-86
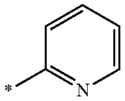
10-87
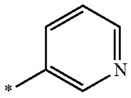

-continued
10-88
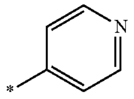
10-89
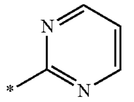
10-90
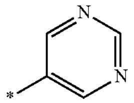
10-91
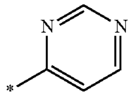
10-92
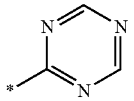
10-93
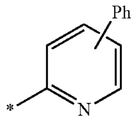
10-94
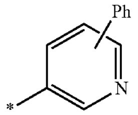
10-95
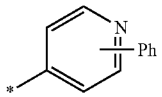
10-96
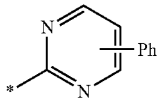
10-97
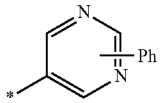
10-98
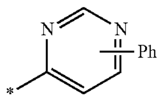
10-99
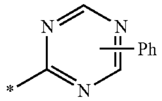
10-100
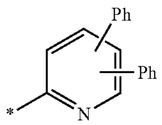
-continued
10-101
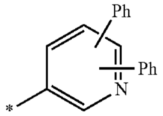
10-102
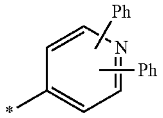
10-103
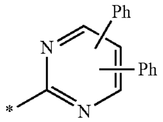
10-104
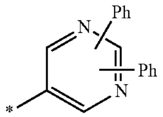
10-105
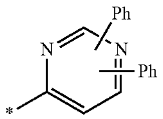
10-106
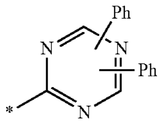
10-107
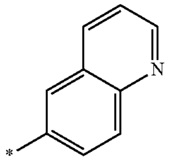
10-108
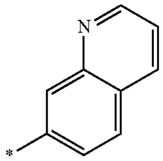
10-109
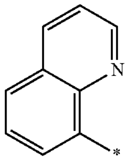
10-110
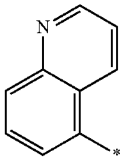

-continued
10-111
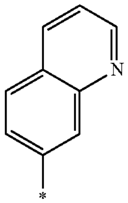
10-112
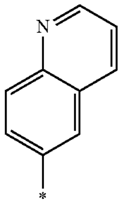
10-113
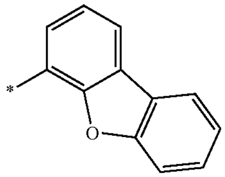
10-114
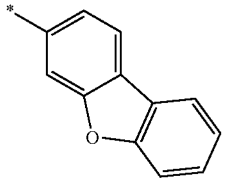
10-115
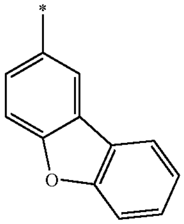
10-116
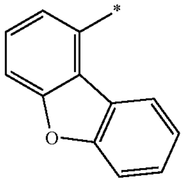
10-117
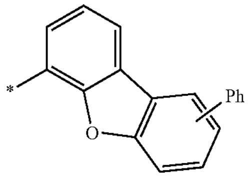
10-118
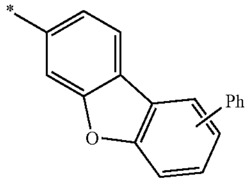
-continued
10-119
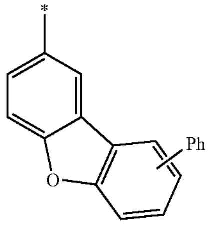
10-120
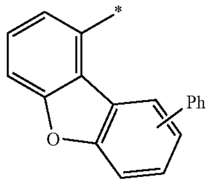
10-121
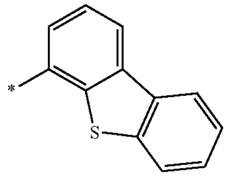
10-122
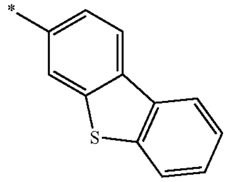
10-123
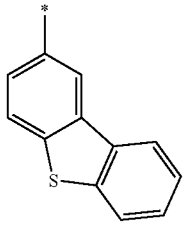
10-124
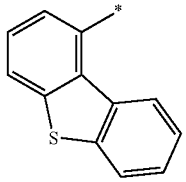
10-125
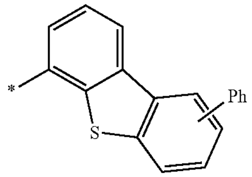
10-126
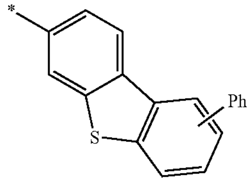

-continued
10-127
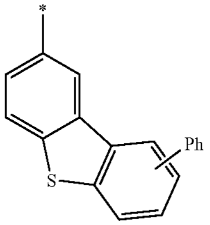
10-128
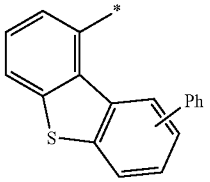
10-129
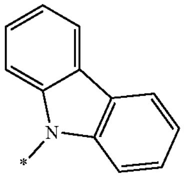
10-130
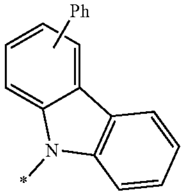
10-131
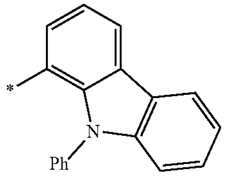
10-132
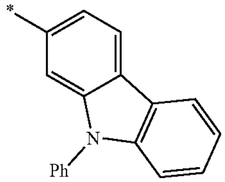
10-133
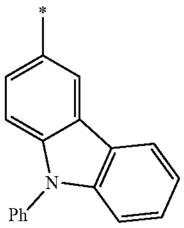
10-134
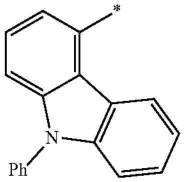
-continued
10-135
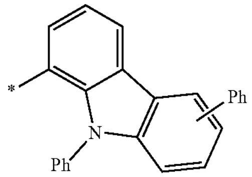
10-136
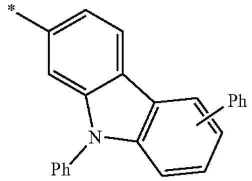
10-137
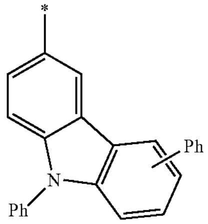
10-138
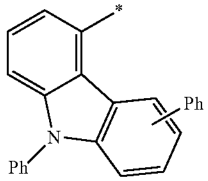
10-139
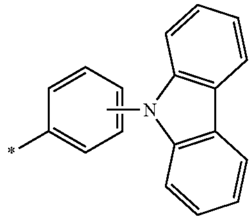
10-140
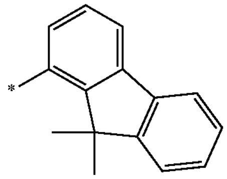
10-141
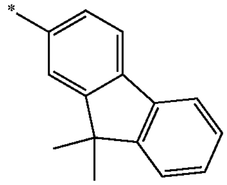

-continued
10-142
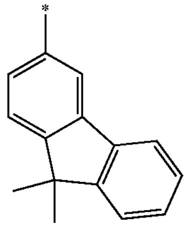
10-143
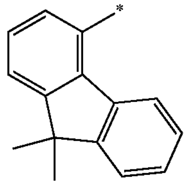
10-144
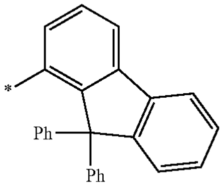
10-145
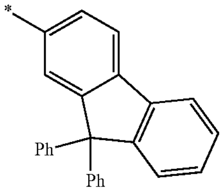
10-146
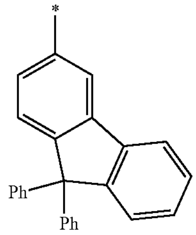
10-147
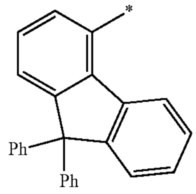
10-148
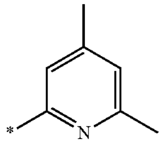
10-149
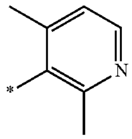
-continued
10-150
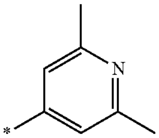
10-151
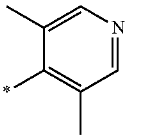
10-152
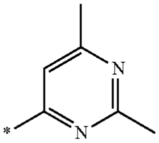
10-153
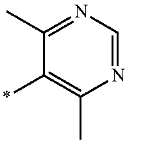
10-154
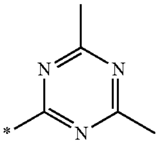
10-155
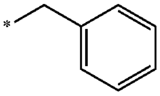
10-156
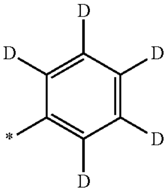
10-157
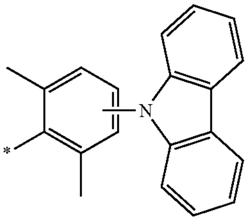
10-158
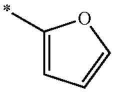
10-159
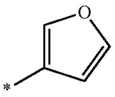
10-160
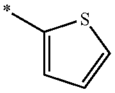

-continued
10-161
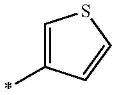
10-162
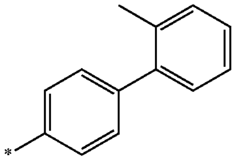
10-163
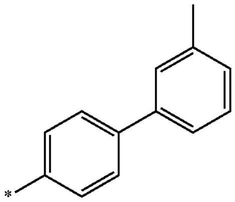
10-164
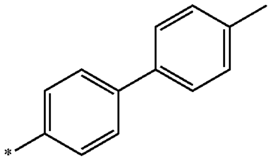
10-165
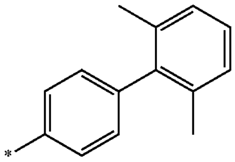
10-166
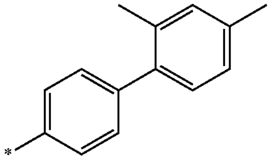
10-167
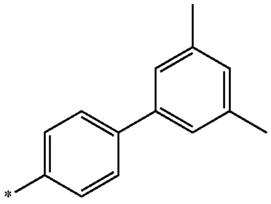
10-168
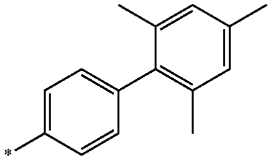
10-169
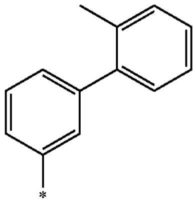
-continued
10-170
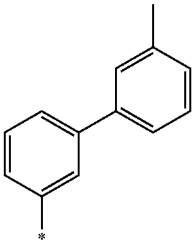
10-171
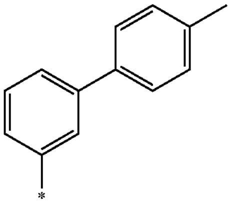
10-172
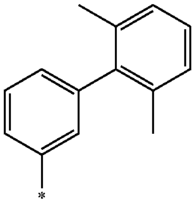
10-173
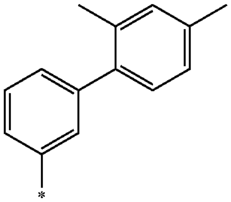
10-174
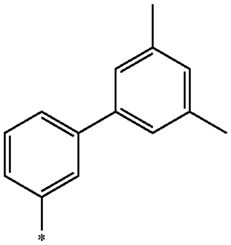
10-175
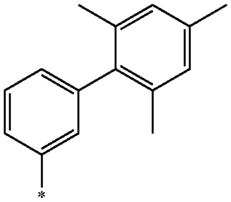
10-176
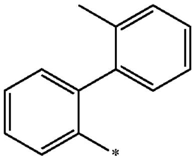

-continued
10-177
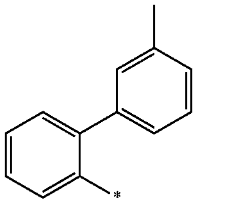
10-178
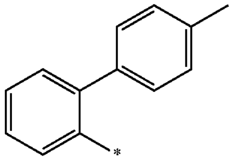
10-179
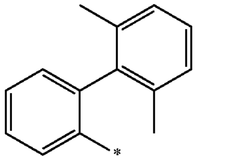
10-180
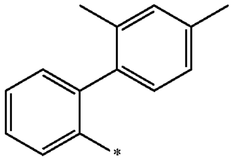
10-181
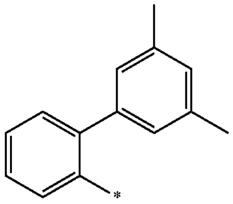
10-182
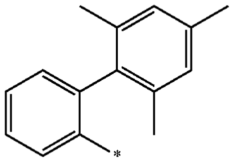
10-183
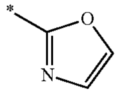
10-184
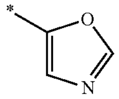
10-185
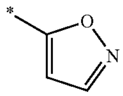
10-186
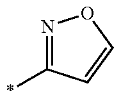
-continued
10-187
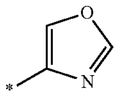
10-188
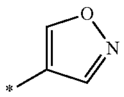
10-189
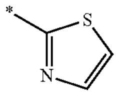
10-190
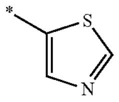
10-191
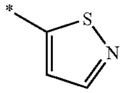
10-192
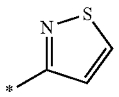
10-193
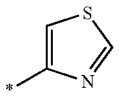
10-194
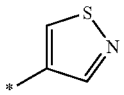
10-195
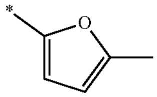
10-196
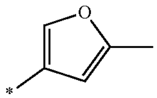
10-197
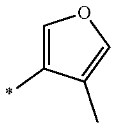
10-198
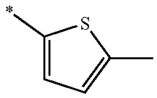
10-199
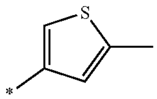
10-200
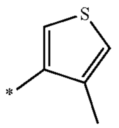

-continued
10-201
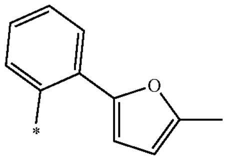
10-202
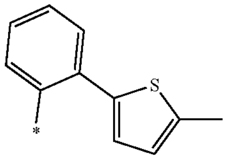
10-203
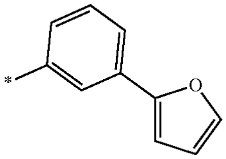
10-204
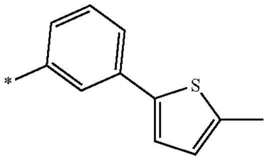
10-205
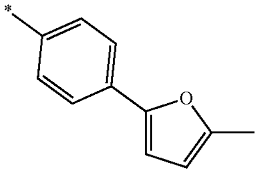
10-206
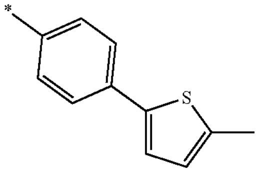
10-207
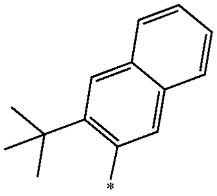
10-208
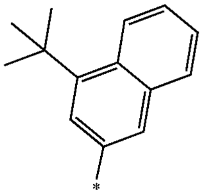
-continued
10-209
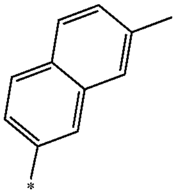
10-210
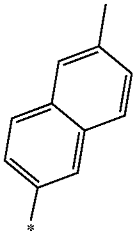
10-211
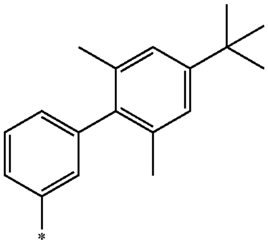
10-212
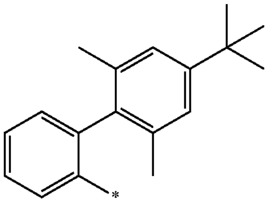
10-213
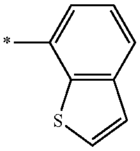
10-214
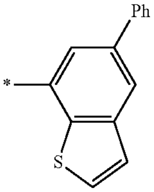
10-215
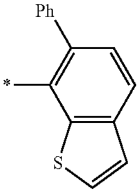
10-216
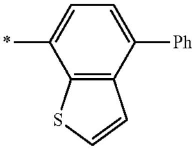

-continued
10-217
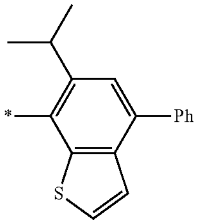
10-218
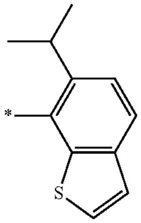
10-219
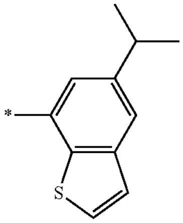
10-220
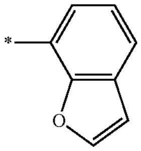
10-221
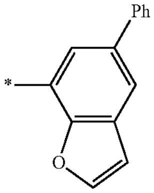
10-222
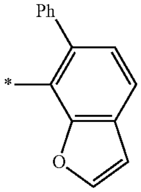
10-223
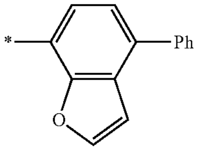
-continued
10-224
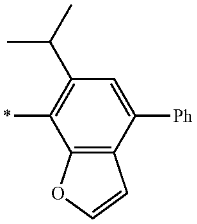
10-225
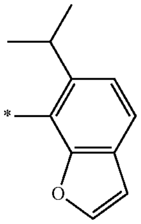
10-226
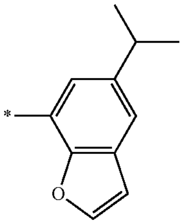
10-227
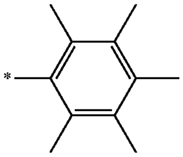
10-228
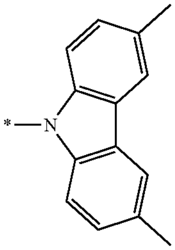
10-229
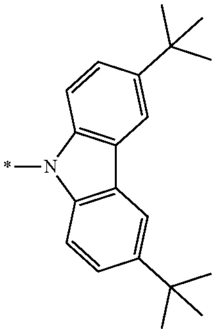

-continued
10-230
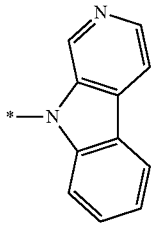
10-231
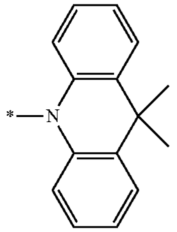
10-232
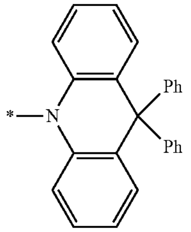
10-233
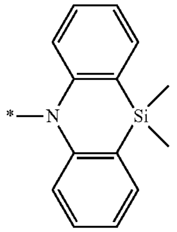
10-234
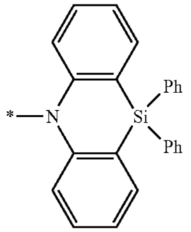
10-235
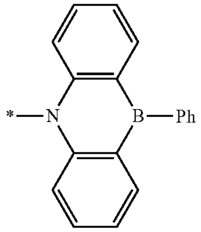
10-236
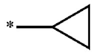
-continued
10-237
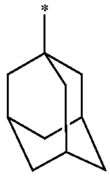
10-238
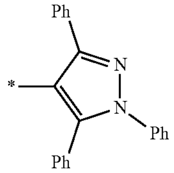
10-239
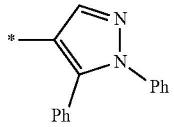
10-240
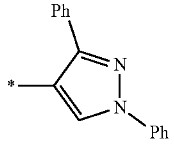
10-241
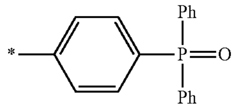
10-242
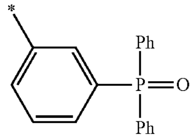
10-243
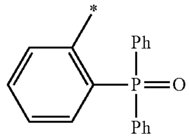
10-244
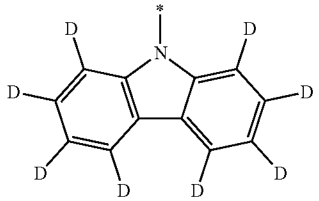
10-245
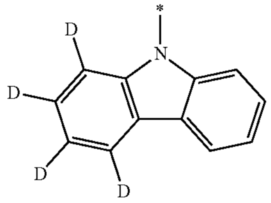

-continued 10-246

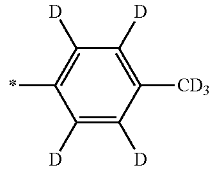

10-247

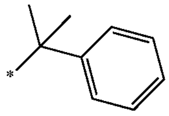

10-248

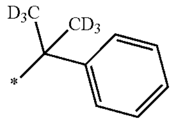

10-249

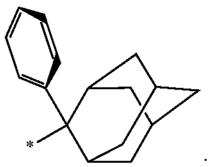

In Formulae 9-1 to 9-19 and 10-1 to 10-249, * indicates a binding site to a neighboring atom, Ph represents a phenyl group, and TMS represents a trimethylsilyl group.

In Formulae 3-1 to 3-5, 502, and 503, a71 to a74 and a501 to a504 respectively indicate the number of $R_{71}$(s) to the number of $R_{74}$(s) and the number of $R_{501}$(s) to the number of $R_{504}$(s), and a71 to a74 and a501 to a504 may each independently be an integer from 0 to 20.

When a71 is 2 or greater, two or more of $R_{71}$ may be identical to or different from each other, when a72 is 2 or greater, two or more of $R_{72}$ may be identical to or different from each other, when a73 is 2 or greater, two or more of $R_{73}$ may be identical to or different from each other, when a74 is 2 or greater, two or more of $R_{74}$ may be identical to or different from each other, when a501 is 2 or greater, two or more of $R_{501}$ may be identical to or different from each other, when a502 is 2 or greater, two or more of $R_{502}$ may be identical to or different from each other, when a503 is 2 or greater, two or more of $R_{503}$ may be identical to or different from each other, and when a504 is 2 or greater, two or more of $R_{504}$ may be identical to or different from each other. In embodiments, a71 to a74 and a501 to a504 may each independently be an integer from 0 to 8.

In an embodiment, in Formula 2, a group represented by $*-(L_{61})_{b61}-R_{61}$ and a group represented by $*-(L_{62})_{b62}-R_{62}$ may each not be a phenyl group.

In embodiments, in Formula 2, a group represented by $*-(L_{61})_{b61}-R_{61}$ and a group represented by $*-(L_{62})_{b62}-R_{62}$ may be identical to each other.

In embodiments, in Formula 2, a group represented by $*-(L_{61})_{b61}-R_{61}$ and a group represented by $*-(L_{62})_{b62}-R_{62}$ may be different from each other.

In embodiments, in Formula 2, b61 and b62 may each independently be 1, 2, or 3, and $L_{61}$ and $L_{62}$ may each independently be a benzene group, a pyridine group, a pyrimidine group, a pyridazine group, a pyrazine group, or a triazine group, each unsubstituted or substituted with at least one $R_{10a}$.

In embodiments, in Formula 2, $R_{61}$ and $R_{62}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, or $—Si(Q_1)(Q_2)(Q_3)$, wherein $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 2, a group represented by $*-(L_{61})_{b61}-R_{61}$ may be a group represented by one of Formulae $CY_{51-1}$ to CY51-26, and/or a group represented by $*-(L_{62})_{b62}-R_{62}$ may be a group represented by one of Formulae CY52-1 to CY52-26, and/or a group represented by $*-(L_{63})_{b63}-R_{63}$ may be a group represented by one of Formulae CY53-1 to CY53-27, $—C(Q_1)(Q_2)(Q_3)$, or $—Si(Q_1)(Q_2)(Q_3)$:

CY51-1

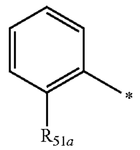

CY51-2

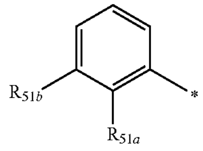

CY51-3

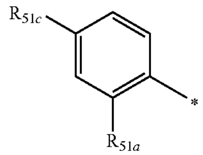

CY51-4

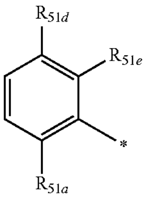

CY51-5

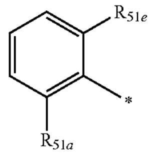

CY51-6

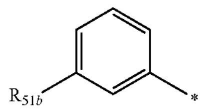

-continued
CY51-7
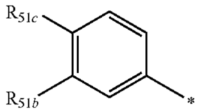
CY51-8
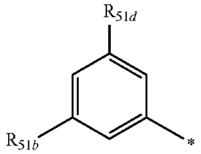
CY51-9
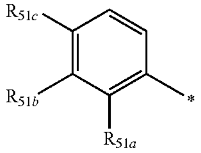
CY51-10
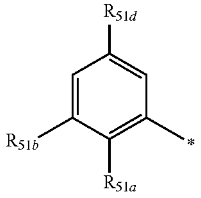
CY51-11
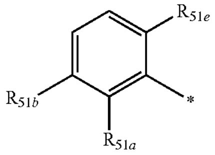
CY51-12
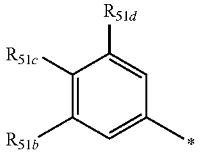
CY51-13
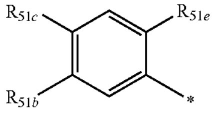
CY51-14
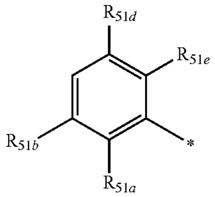
CY51-15
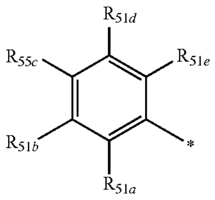
-continued
CY51-16
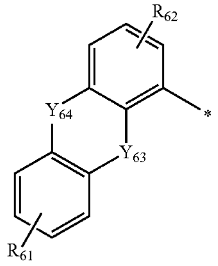
CY51-17
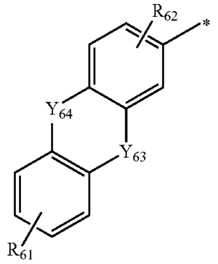
CY51-18
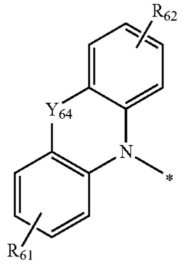
CY51-19
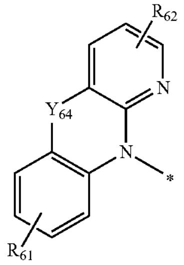
CY51-20
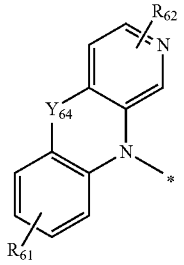
CY51-21
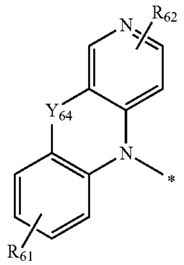

-continued
CY51-22
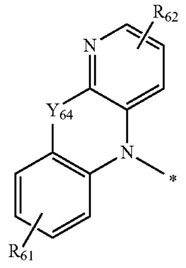
CY51-23
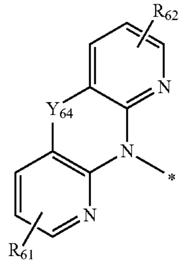
CY51-24
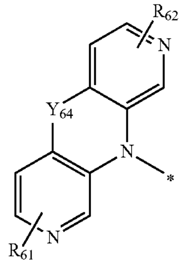
CY51-25
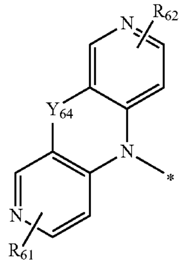
CY51-26
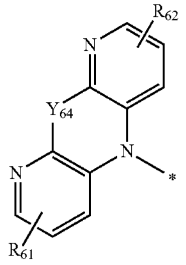
CY52-1
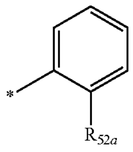
-continued
CY52-2
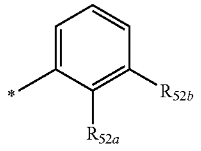
CY52-3
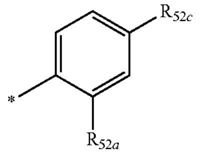
CY52-4
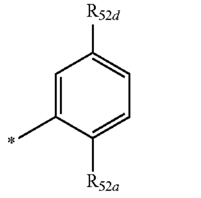
CY52-5
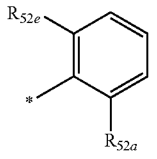
CY52-6
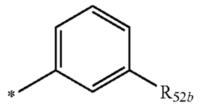
CY52-7
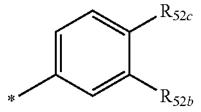
CY52-8
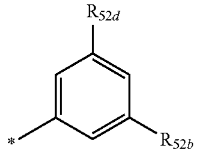
CY52-9
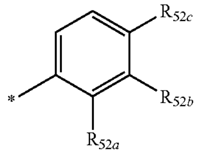
CY52-10
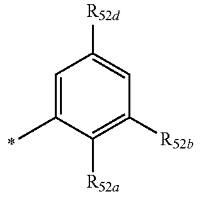

-continued
CY52-11
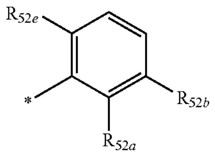
CY52-12
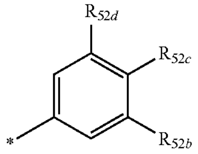
CY52-13
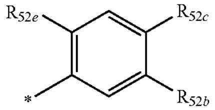
CY52-14
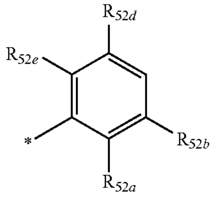
CY52-15
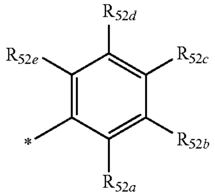
CY52-16
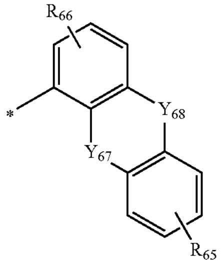
CY52-17
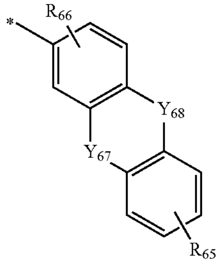
-continued
CY52-18
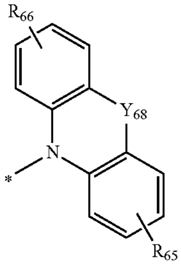
CY52-19
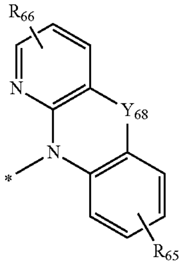
CY52-20
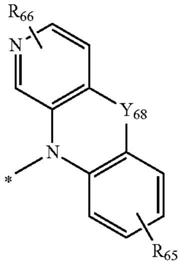
CY52-21
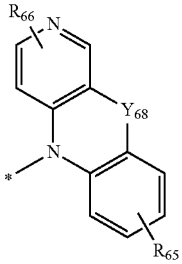
CY52-22
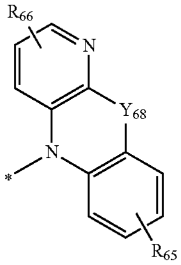
CY52-23
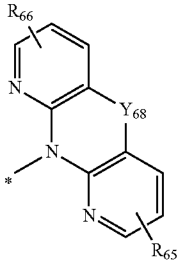

-continued
CY52-24
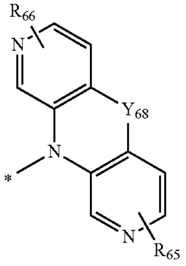
CY52-25
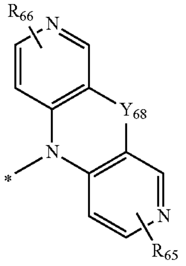
CY52-26
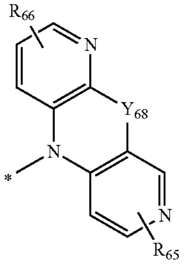
CY53-1
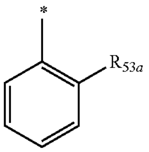
CY53-2
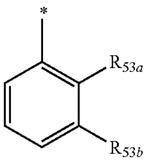
CY53-3
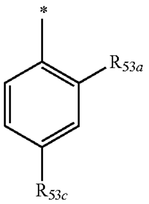
CY53-4
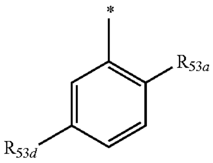
-continued
CY53-5
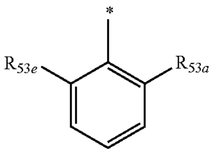
CY53-6
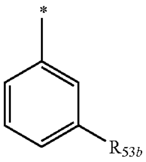
CY53-7
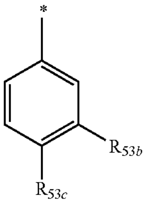
CY53-8
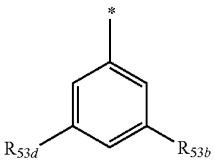
CY53-9
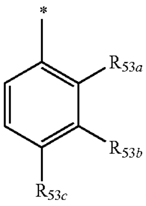
CY53-10
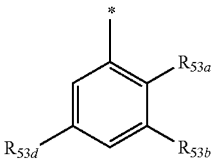
CY53-11
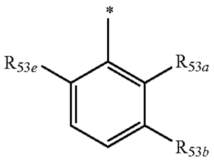
CY53-12
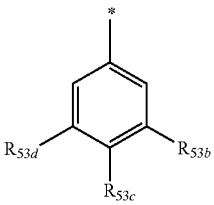

-continued
CY53-13
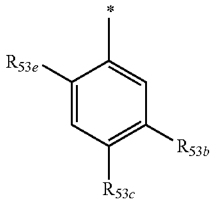
CY53-14
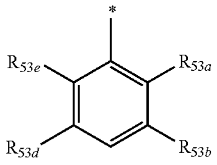
CY53-15
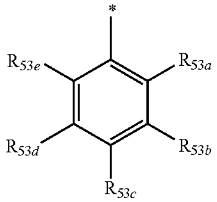
CY53-16
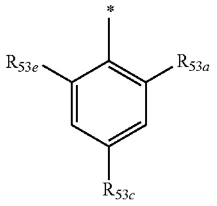
CY53-17
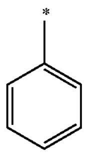
CY53-18
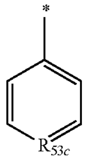
CY53-19
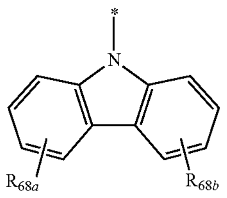
CY53-20
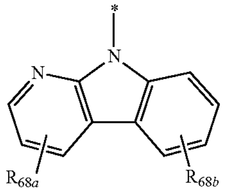
-continued
CY53-21
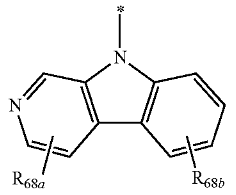
CY53-22
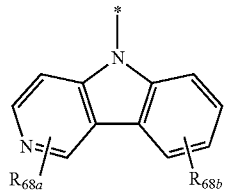
CY53-23
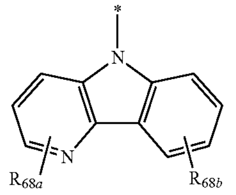
CY53-24
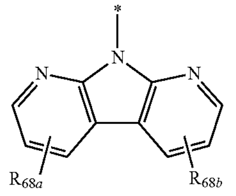
CY53-25
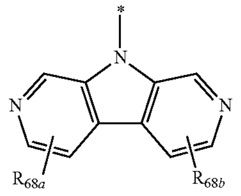
CY53-26
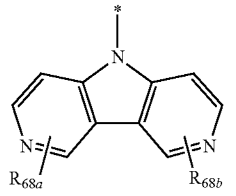
CY53-27
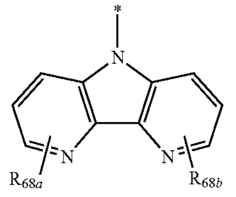
wherein in Formulae CY51-1 to CY51-26, CY52-1 to CY52-26, and CY53-1 to CY53-27,
$Y_{63}$ may be a single bond, O, S, $N(R_{63})$, $B(R_{63})$, $C(R_{63a})(R_{63b})$, or $Si(R_{63a})(R_{63b})$,
$Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, N($R_{67}$), B($R_{67}$), C($R_{67a}$)($R_{67b}$), or Si($R_{67a}$)($R_{67b}$), $Y_{68}$ may be a single bond, O, S, N($R_{68}$), B($R_{68}$), C($R_{68a}$)($R_{68b}$), or Si($R_{68a}$)($R_{68b}$), $Y_{63}$ and $Y_{64}$ in Formulae CY51-16 and CY51-17 may not each be a single bond at the same time, $Y_{67}$ and $Y_{68}$ in Formulae CY52-16 and CY52-17 may not each be a single bond at the same time, $R_{51a}$ to $R_{51e}$, $R_{61}$ to $R_{64}$, $R_{63a}$, $R_{63b}$, $R_{64a}$, and $R_{64b}$ may each independently be the same as described in connection with $R_{61}$ as described herein, except that $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each independently be the same as described in connection with $R_{62}$ as described herein, except that $R_{52a}$ to $R_{52e}$ may not each be hydrogen, $R_{53a}$ to $R_{53e}$, $R_{69a}$, and $R_{69b}$ may each independently be the same as described in connection with $R_{63}$ as described herein, except that $R_{53a}$ to $R_{53e}$ may not each be hydrogen, and

* indicates a binding site to a neighboring atom.

In embodiments, in Formulae CY51-1 to CY51-26 and Formulae CY52-1 to 52-26, $R_{51a}$ to $R_{51e}$ and $R_{52a}$ to $R_{52e}$ may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, $Y_{63}$ may be O or S and $Y_{64}$ may be Si($R_{64a}$)($R_{64b}$), or $Y_{63}$ may be Si($R_{63a}$)($R_{63b}$) and $Y_{64}$ may be O or S, and in Formulae CY52-16 and CY52-17, $Y_{67}$ may be O or S and $Y_{68}$ may be Si($R_{68a}$)($R_{68b}$), or $Y_{67}$ may be Si($R_{67a}$)($R_{67b}$) and $Y_{68}$ may be O or S.

In embodiments, in Formulae 3-1 to 3-5, $L_{81}$ to $L_{85}$ may each independently be:

a single bond; or $*—C(Q_4)(Q_5)-*'$ or $*—Si(Q_4)(Q_5)-*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, $-P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In embodiments, in Formulae 3-1 and 3-2, a group represented by

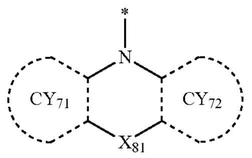

may be a group represented by one of Formulae CY71-1(1) to CY71-1(8), and/or in Formulae 3-1 and 3-3, a group represented by

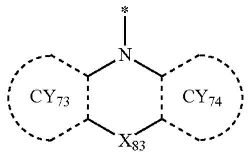

may be a group represented by one of Formulae CY71-2(1) to CY71-2(8), and/or in Formulae 3-2 and 3-4, a group represented by

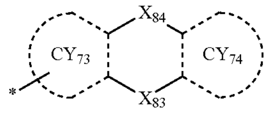

may be a group represented by one of Formulae CY71-3(1) to CY71-3(32), and/or in Formulae 3-3 to 3-5, a group represented by

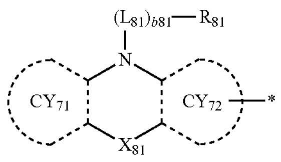

may be a group represented by one of Formulae CY71-4(1) to CY71-4(32), and/or in Formula 3-5, a group represented by

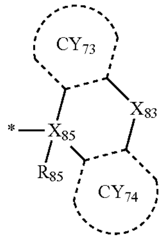

may be a group represented by one of Formulae CY71-5(1) to CY71-5(8):

CY71-1(1)

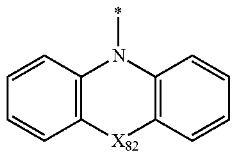

CY71-1(2)

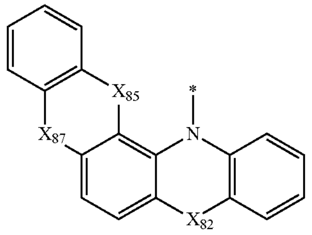

CY71-1(3)

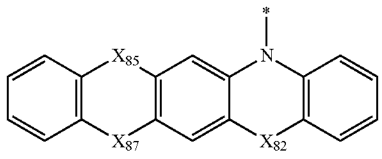

CY71-1(4)

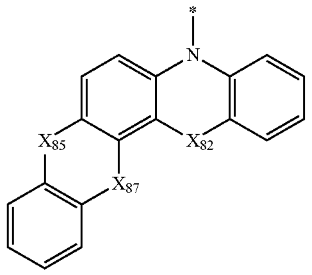

CY71-1(5)

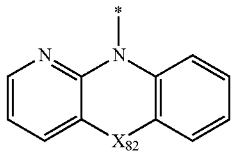

CY71-1(6)

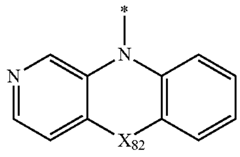

-continued
CY71-1(7)
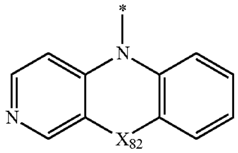
CY71-1(8)
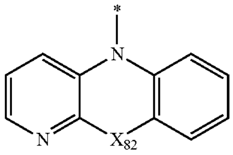
CY71-2(1)
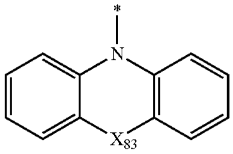
CY71-2(2)
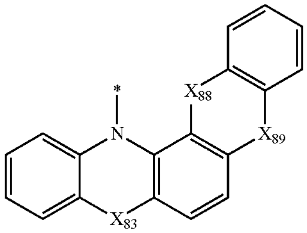
CY71-2(3)
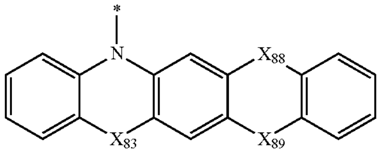
CY71-2(4)
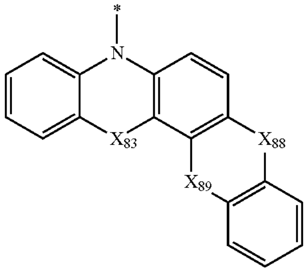
CY71-2(5)
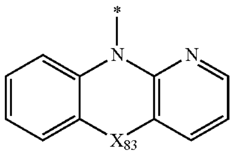
CY71-2(6)
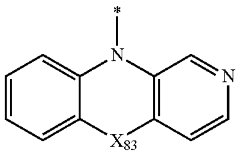
-continued
CY71-2(7)
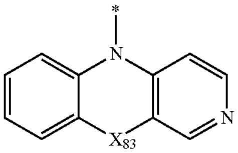
CY71-2(8)
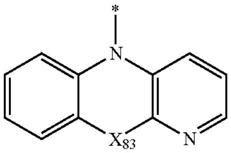
CY71-3(1)
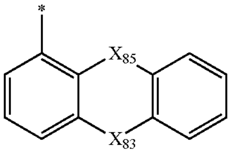
CY71-3(2)
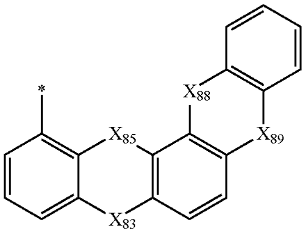
CY71-3(3)
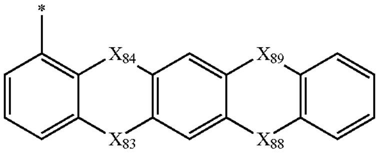
CY71-3(4)
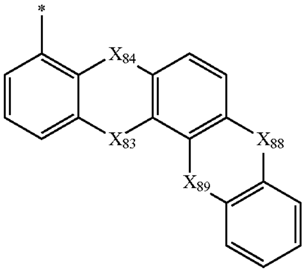
CY71-3(5)
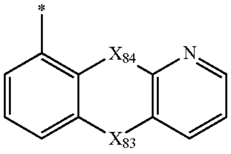
CY71-3(6)
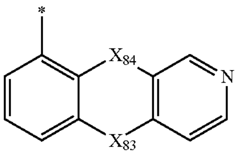

-continued
CY71-3(7)
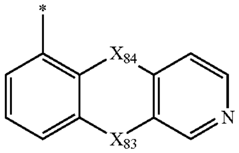
CY71-3(8)
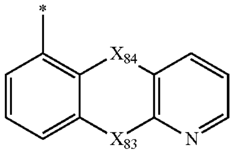
CY71-3(9)
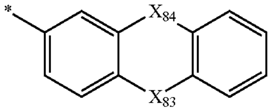
CY71-3(10)
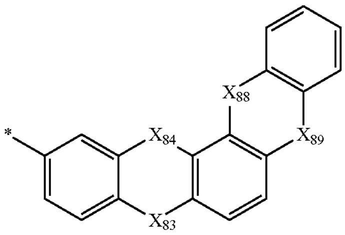
CY71-3(11)
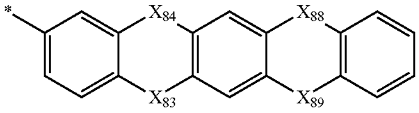
CY71-3(12)
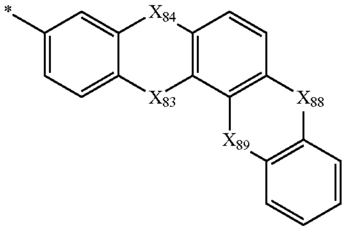
CY71-3(13)
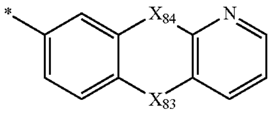
CY71-3(14)
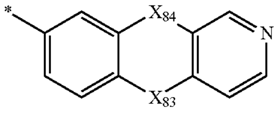
CY71-3(15)
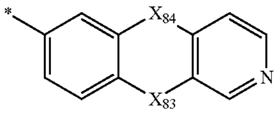
CY71-3(16)
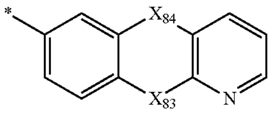
-continued
CY71-3(17)
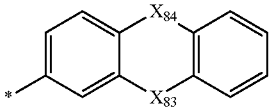
CY71-3(18)
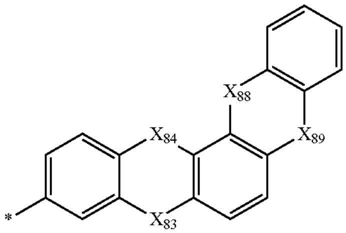
CY71-3(19)
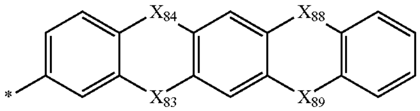
CY71-3(20)
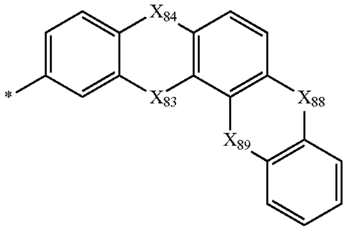
CY71-3(21)
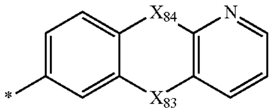
CY71-3(22)
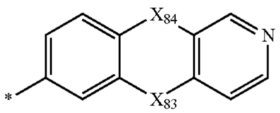
CY71-3(23)
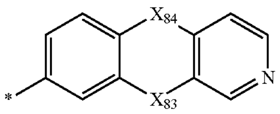
CY71-3(24)
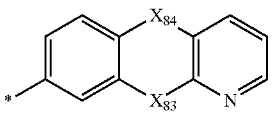
CY71-3(25)
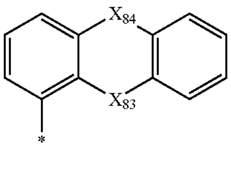

-continued
CY71-3(26)
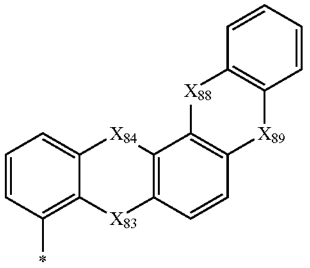
CY71-3(27)
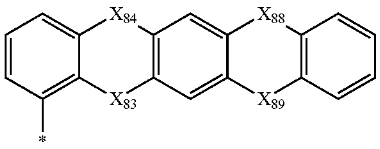
CY71-3(28)
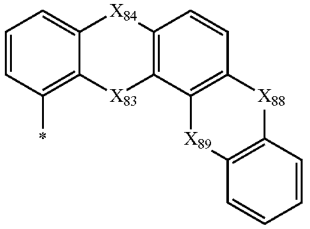
CY71-3(29)
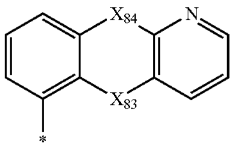
CY71-3(30)
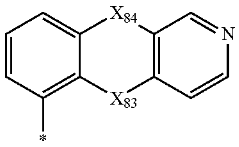
CY71-3(31)
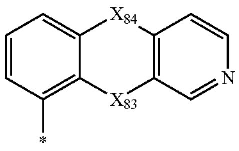
CY71-3(32)
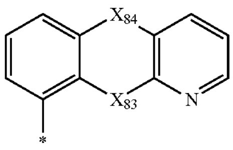
CY71-4(1)
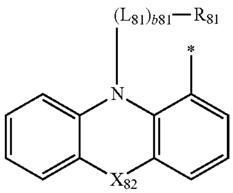
-continued
CY71-4(2)
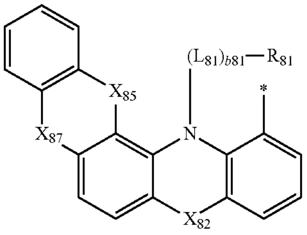
CY71-4(3)
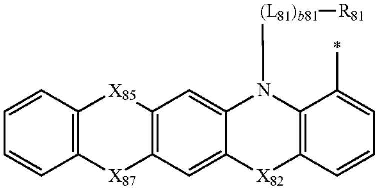
CY71-4(4)
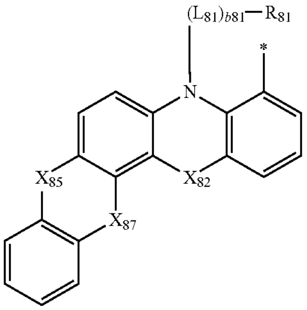
CY71-4(5)
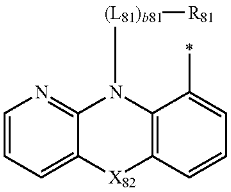
CY71-4(6)
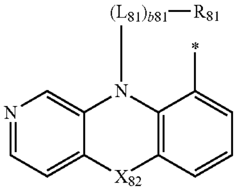
CY71-4(7)
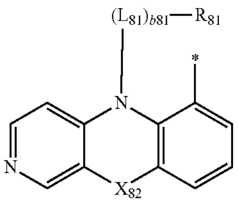
CY71-4(8)
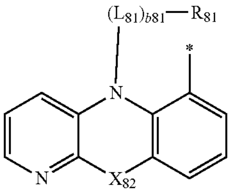

CY71-4(9)
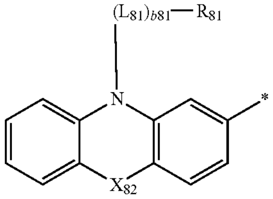
CY71-4(10)
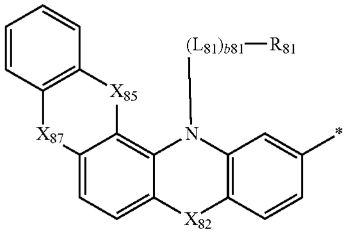
CY71-4(11)
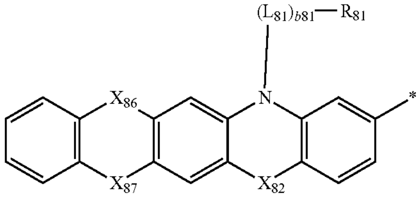
CY71-4(12)
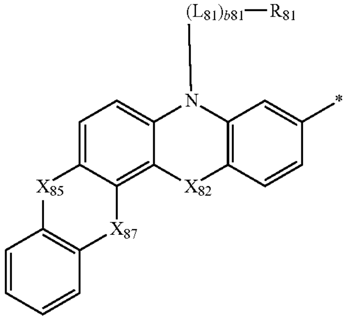
CY71-4(13)
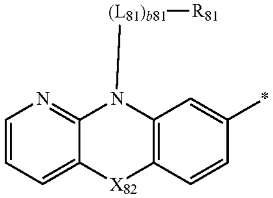
CY71-4(14)
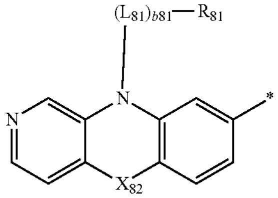
CY71-4(15)
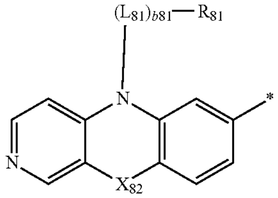
CY71-4(16)
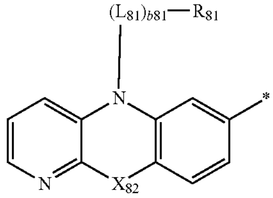
CY71-4(17)
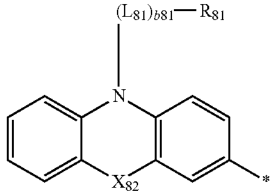
CY71-4(18)
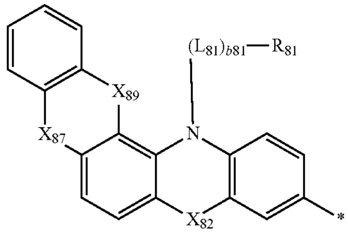
CY71-4(19)
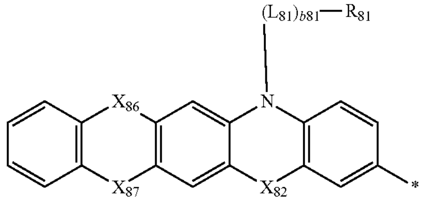
CY71-4(20)
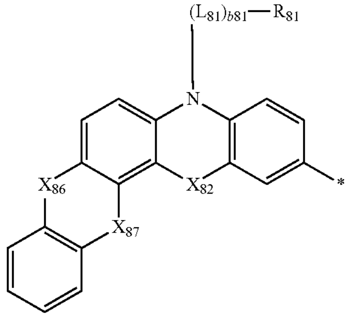
CY71-4(21)
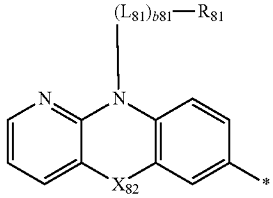
CY71-4(22)
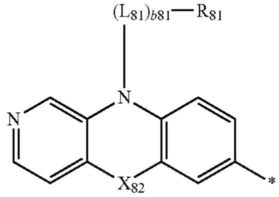

-continued
CY71-4(23)
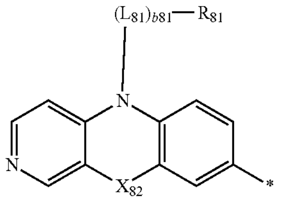
CY71-4(24)
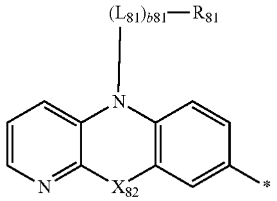
CY71-4(25)
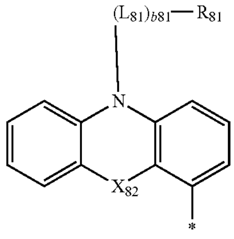
CY71-4(26)
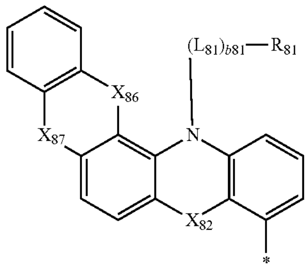
CY71-4(27)
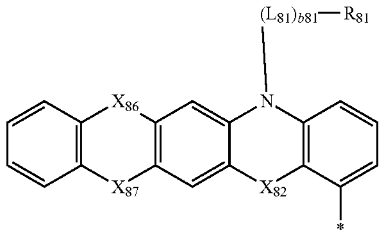
CY71-4(28)
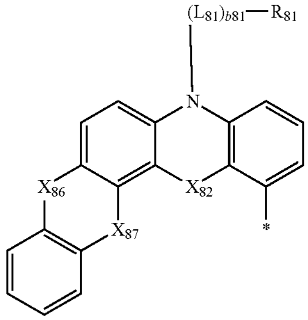
-continued
CY71-4(29)
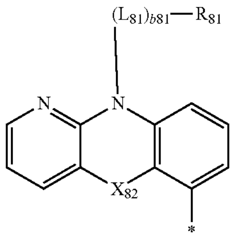
CY71-4(30)
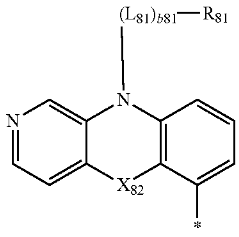
CY71-4(31)
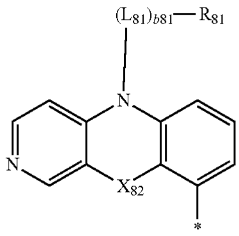
CY71-4(32)
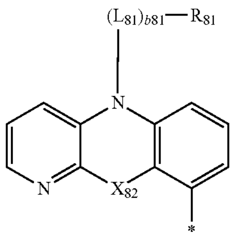
CY71-5(1)
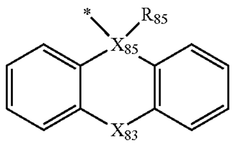
CY71-5(2)
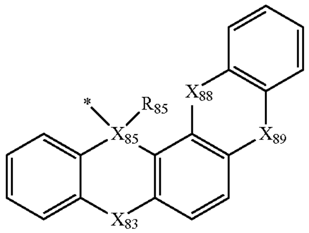
CY71-5(3)
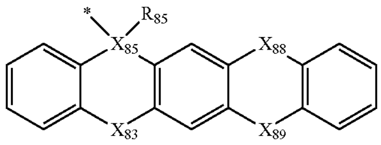

-continued

CY71-5(4)

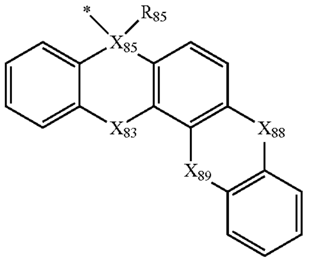

CY71-5(5)

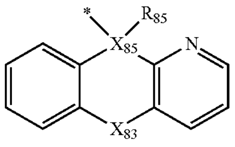

CY71-5(6)

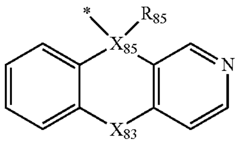

CY71-5(7)

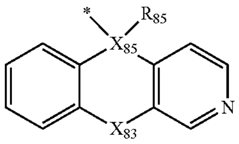

CY71-5(8)

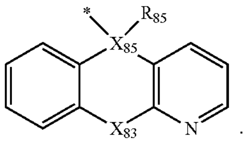

wherein in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, $b_{81}$, $R_{81}$, and $R_{85}$ may respectively be the same as described herein, $X_{86}$ may be a single bond, O, S, $N(R_{86})$, $B(R_{86})$, $C(R_{86a})(R_{86b})$, or Si $(R_{86a})(R_{86b})$, $X_{87}$ may be a single bond, O, S, $N(R_{87})$, $B(R_{87})$, $C(R_{87a})(R_{87b})$, or Si $(R_{87a})(R_{87b})$, in Formulae CY71-1(1) to CY71-1(8) and CY71-4(1) to CY71-4(32), $X_{86}$ and $X_{87}$ may not each be a single bond at the same time, $X_{88}$ may be a single bond, O, S, $N(R_{88})$, $B(R_{88})$, $C(R_{88a})(R_{88b})$, or Si $(R_{88a})(R_{88b})$, $X_{89}$ may be a single bond, O, S, $N(R_{89})$, $B(R_{89})$, $C(R_{89a})(R_{89b})$, or Si $(R_{89a})(R_{89b})$, in Formulae CY71-2(1) to CY71-2(8), CY71-3(1) to CY71-3(32), and CY71-5(1) to CY71-5(8), $X_{88}$ and $X_{89}$ may not each be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each independently be the same as described in connection with $R_{81}$ as described herein.

[Examples of Second Compound, Third Compound, and Fourth Compound]

In an embodiment, the second compound may include at least one of Compounds ETH1 to ETH85:

ETH1

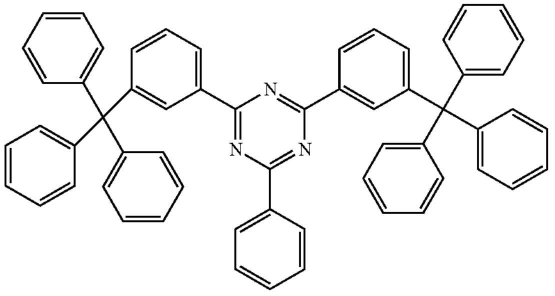

ETH2

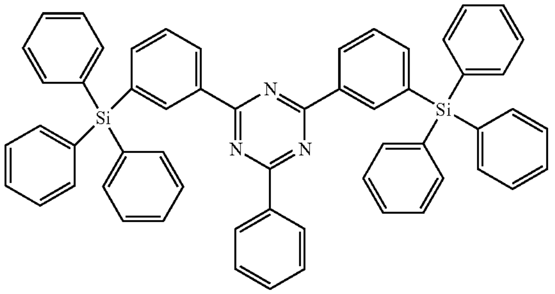

ETH3

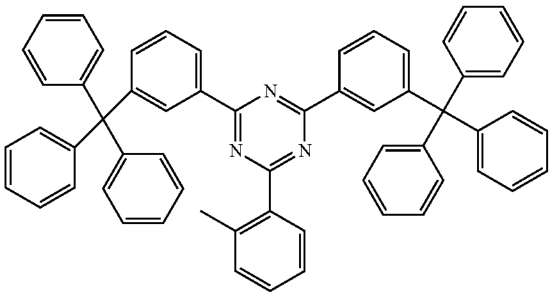

ETH4

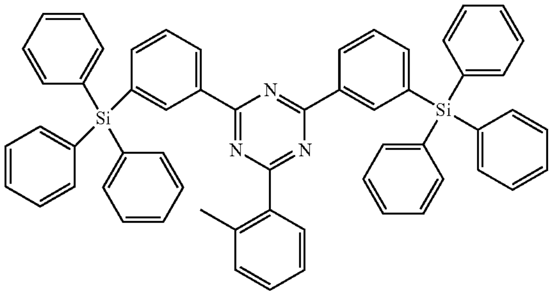

-continued
ETH5
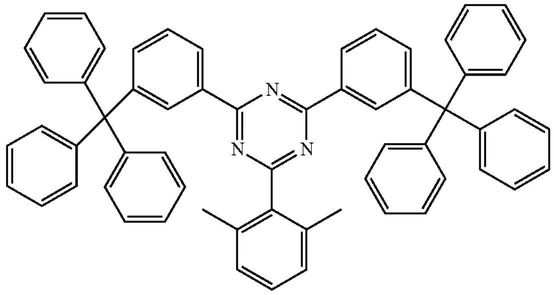
ETH6
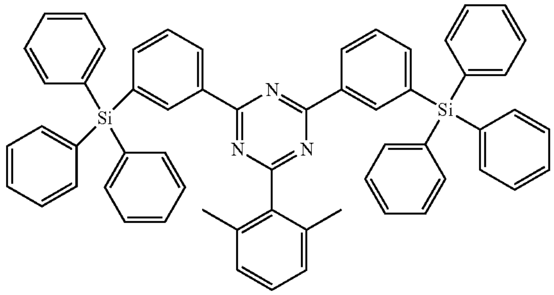
ETH7
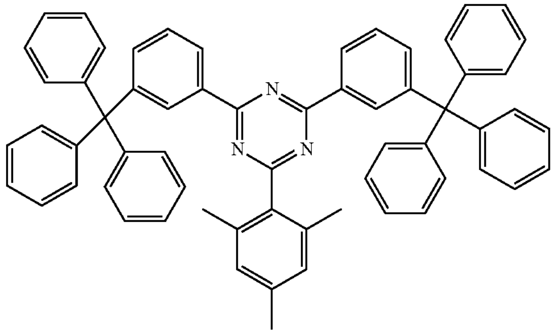
ETH8
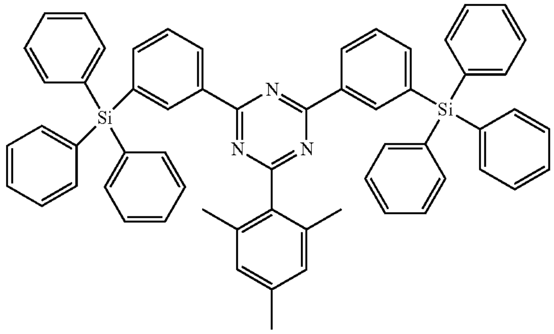
-continued
ETH9
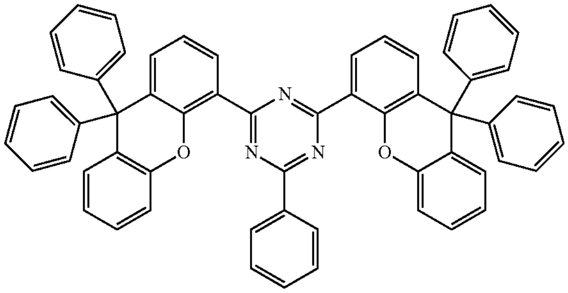
ETH10
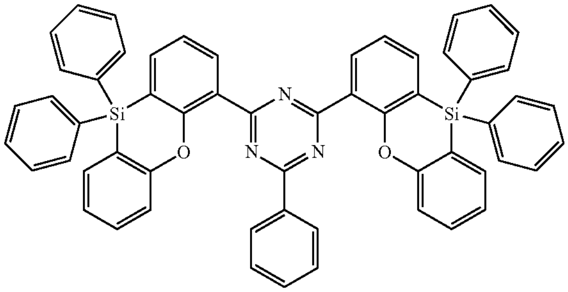
ETH11
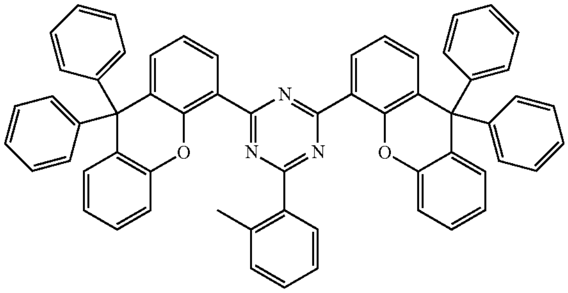
ETH12
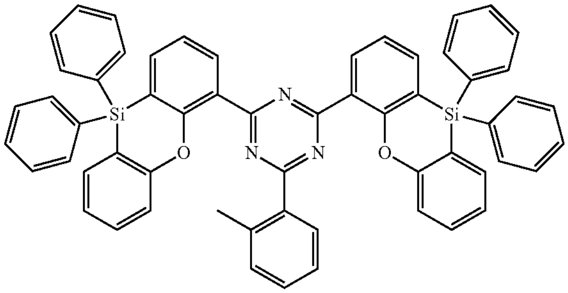
ETH13
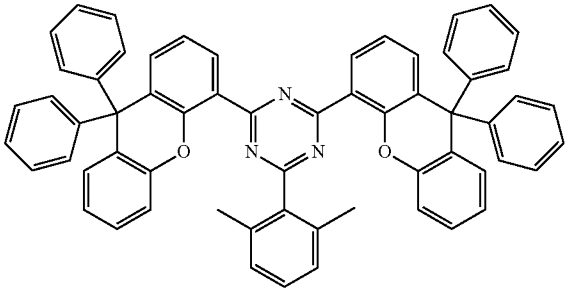

-continued
ETH14
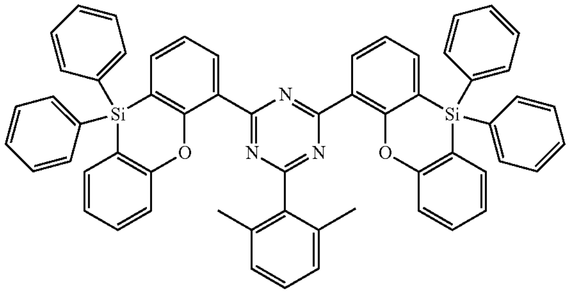
ETH15
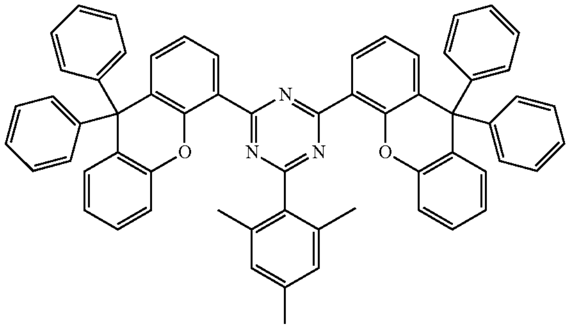
ETH16
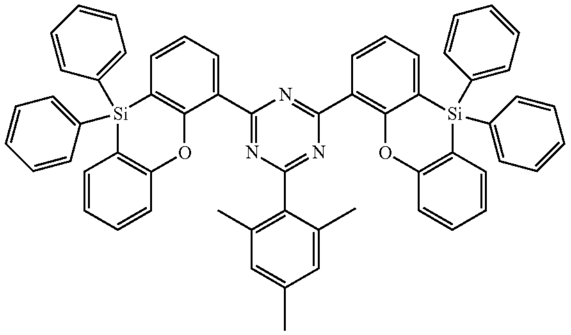
ETH17
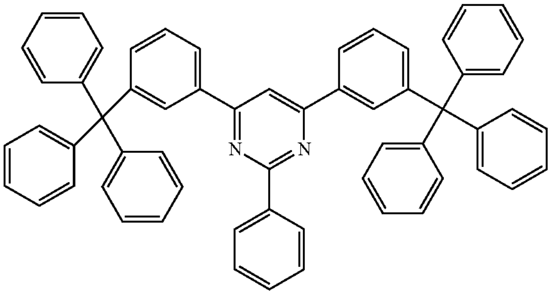
-continued
ETH18
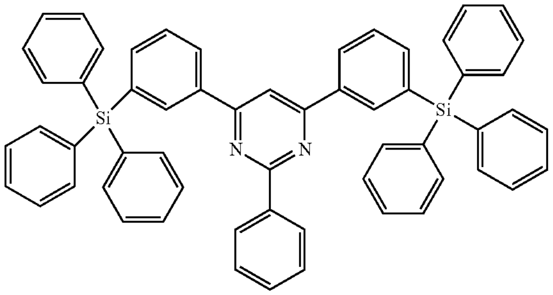
ETH19
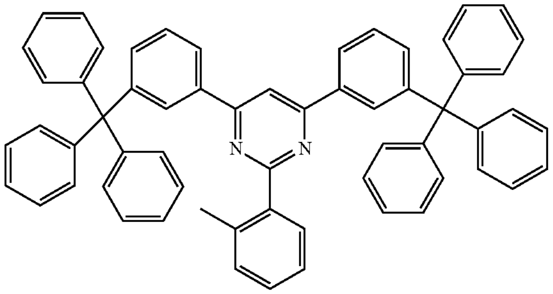
ETH20
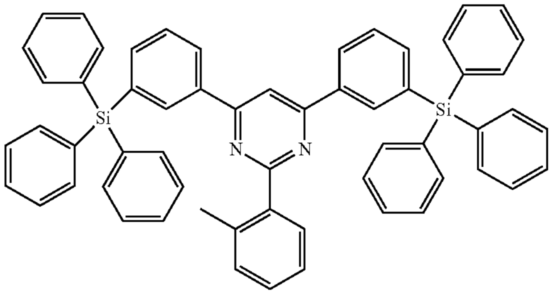
ETH21
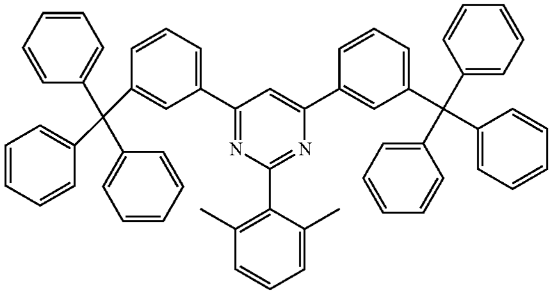
ETH22
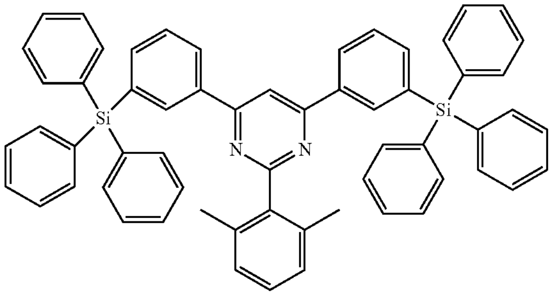

-continued
ETH23
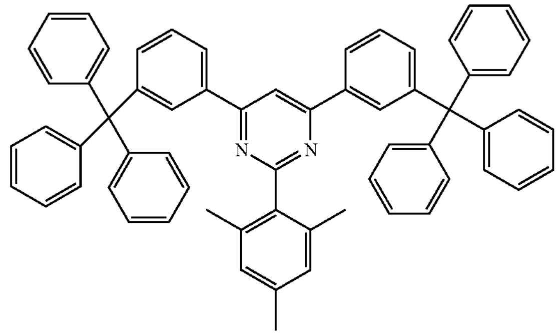
ETH24
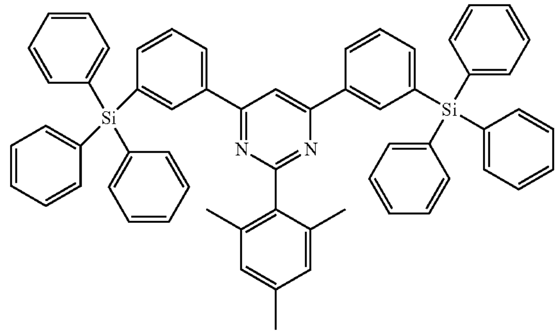
ETH25
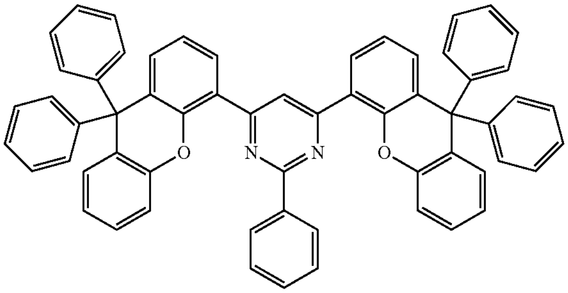
ETH26
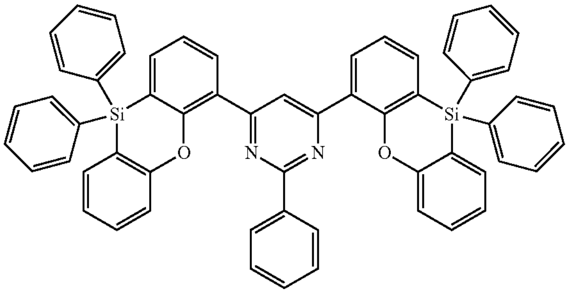
-continued
ETH27
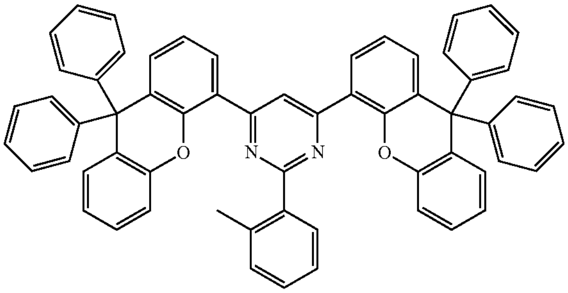
ETH28
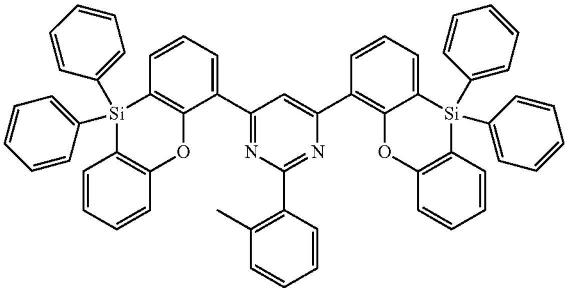
ETH29
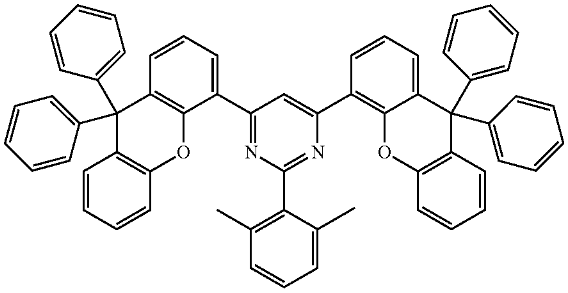
ETH30
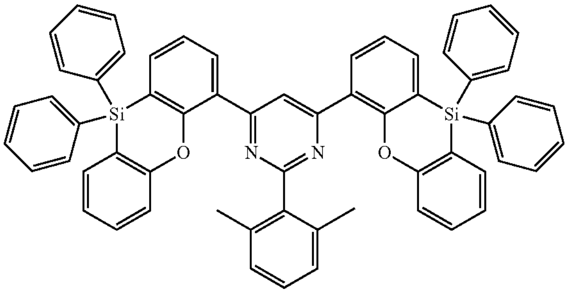
ETH31
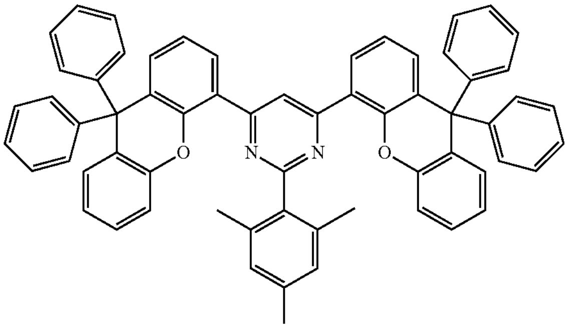

ETH32
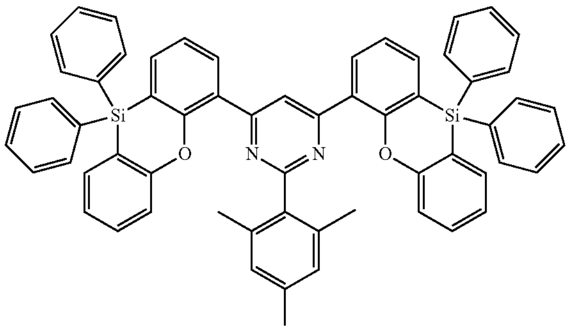
ETH33
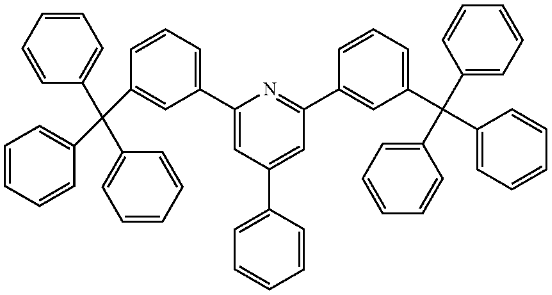
ETH34
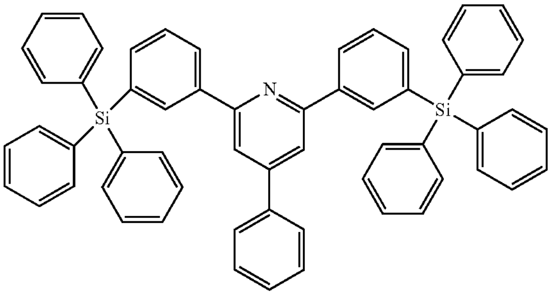
ETH35
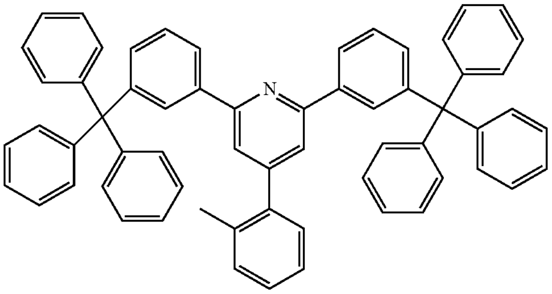
ETH36
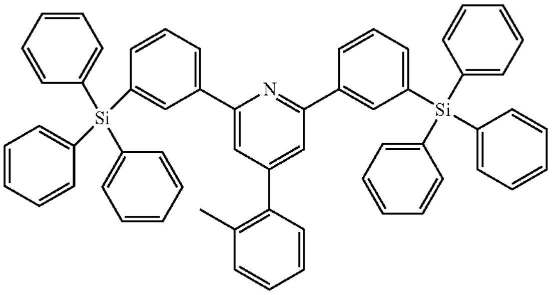
ETH37
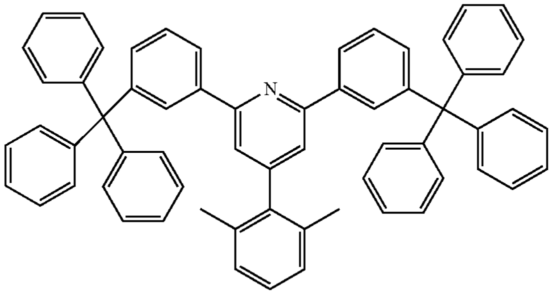
ETH38
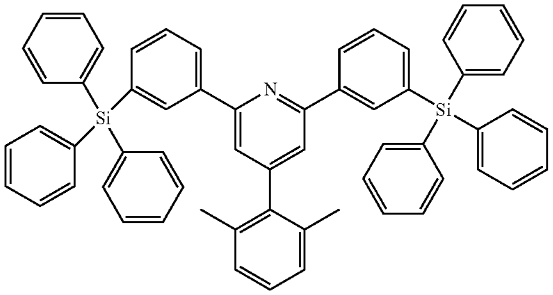
ETH39
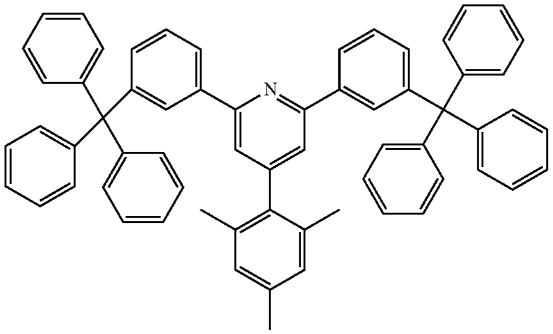
ETH40
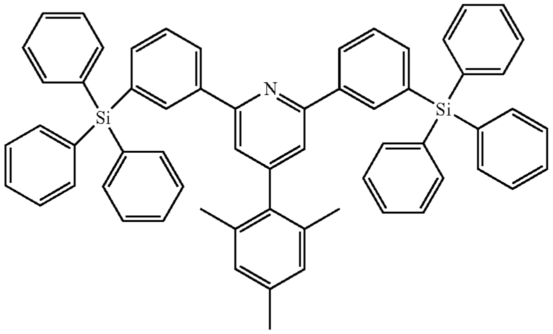

-continued
ETH41
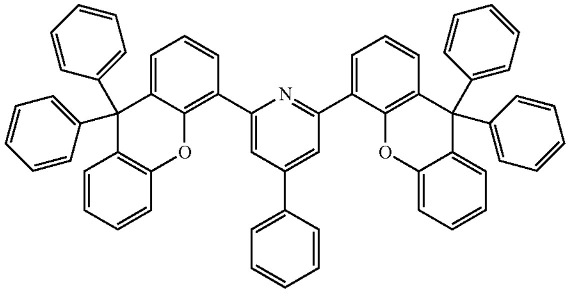
ETH42
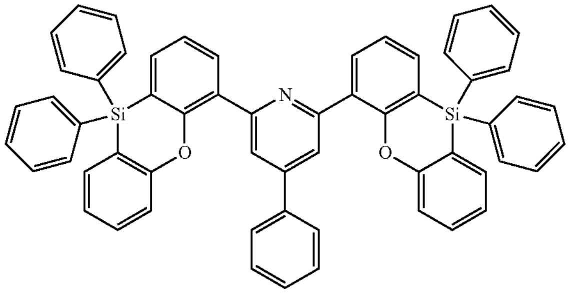
ETH43
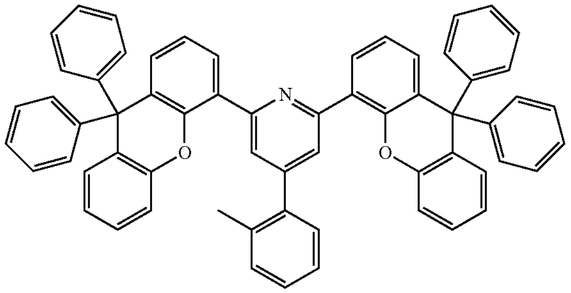
ETH44
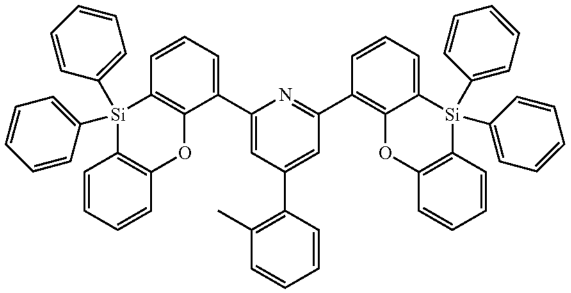
ETH45
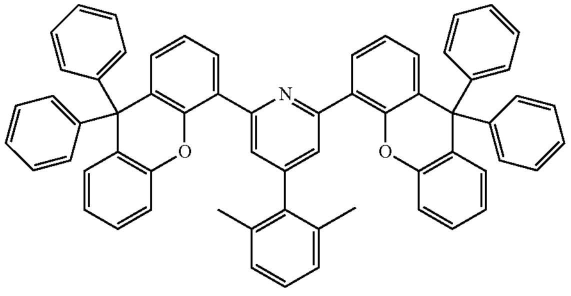
-continued
ETH46
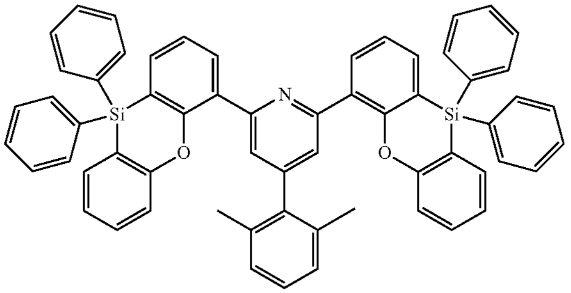
ETH47
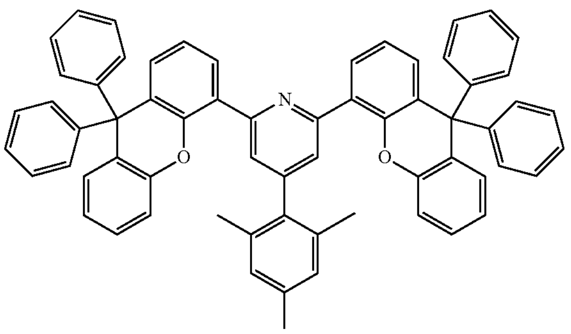
ETH48
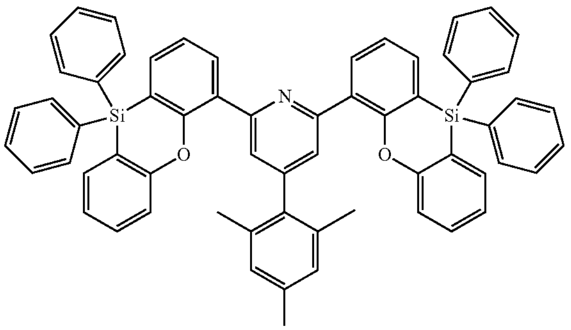
ETH49
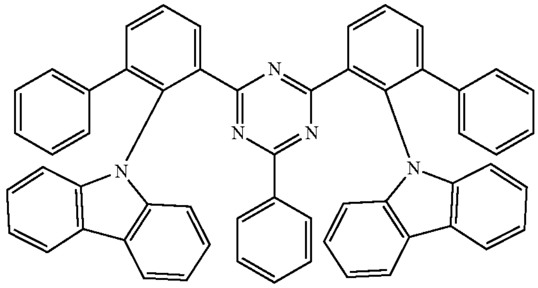

-continued
ETH50
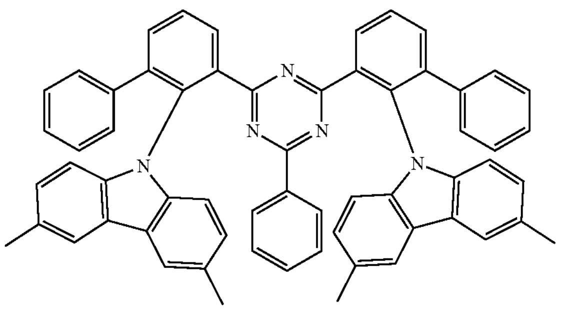
ETH51
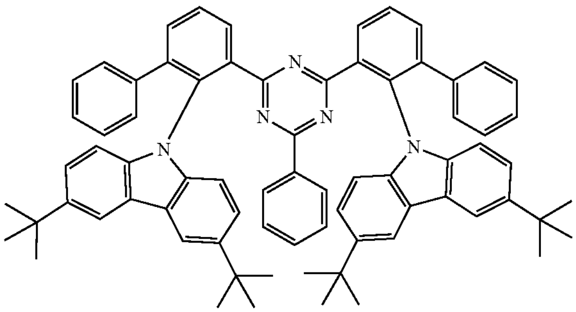
ETH52
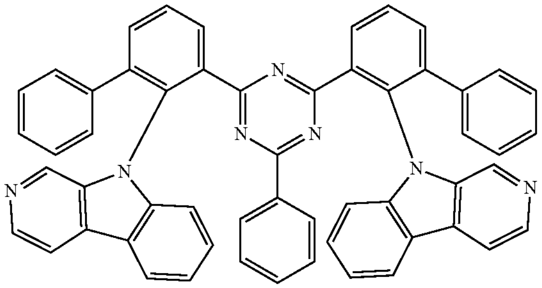
ETH53
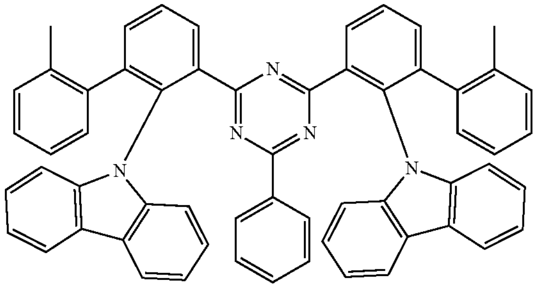
ETH54
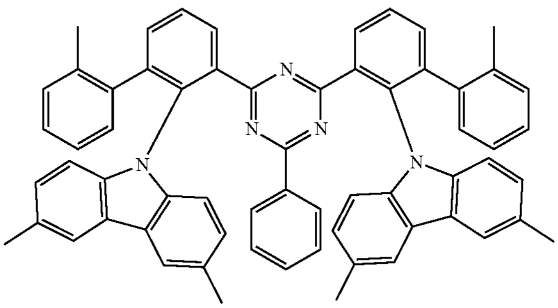
-continued
ETH55
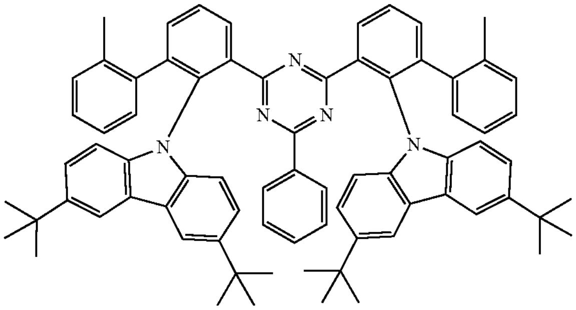
ETH56
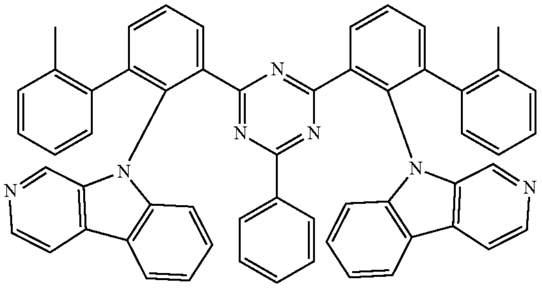
ETH57
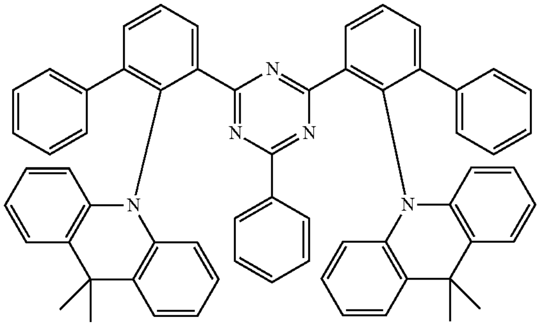
ETH58
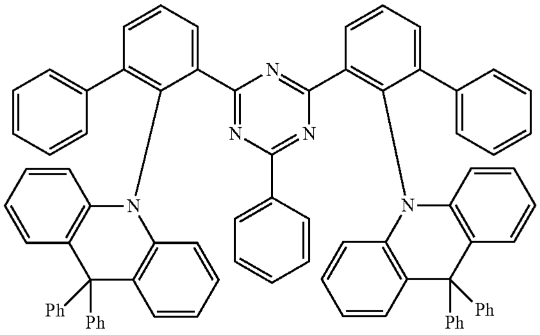

-continued
ETH59
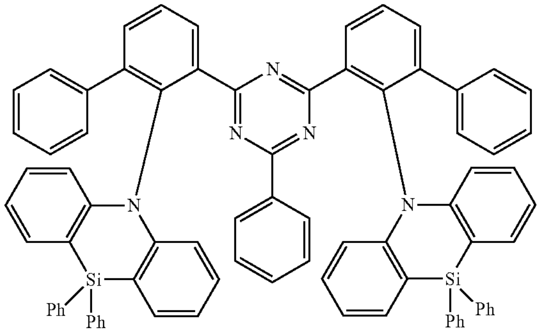
ETH60
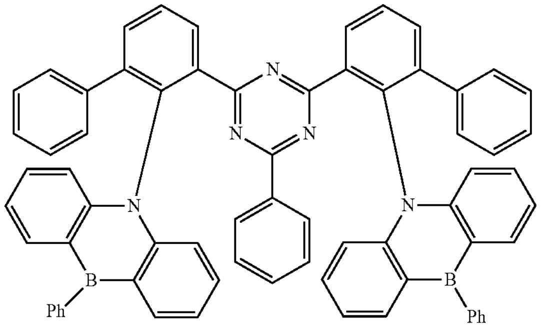
ETH61
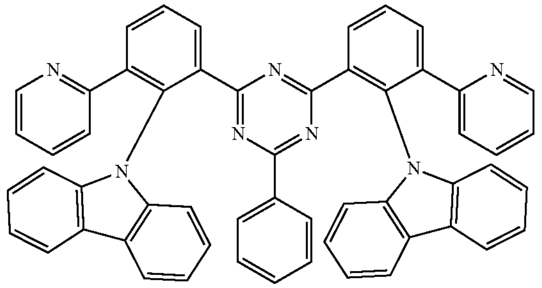
ETH62
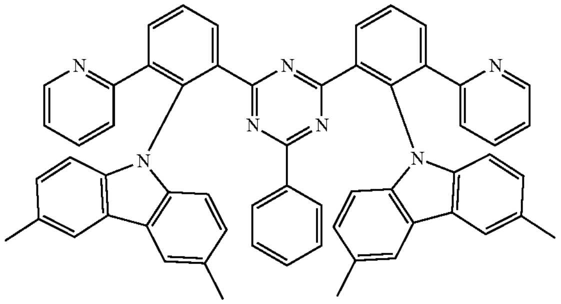
-continued
ETH63
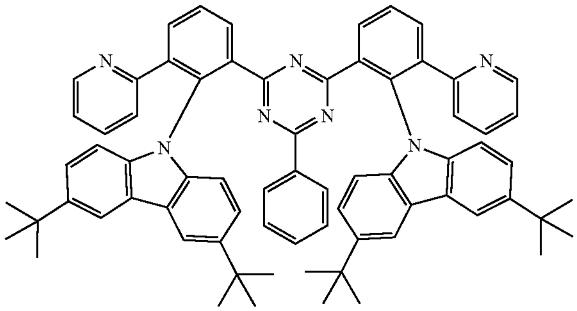
ETH64
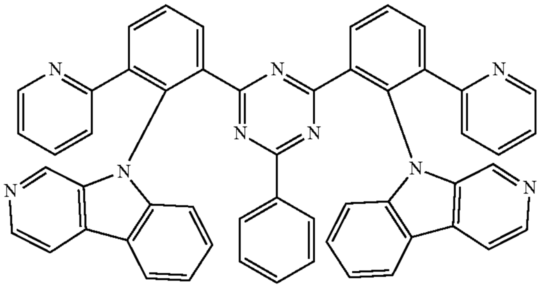
ETH65
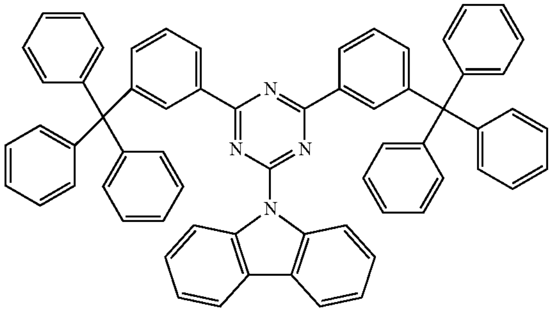
ETH66
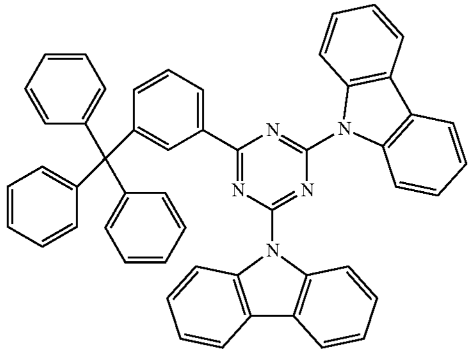

ETH67
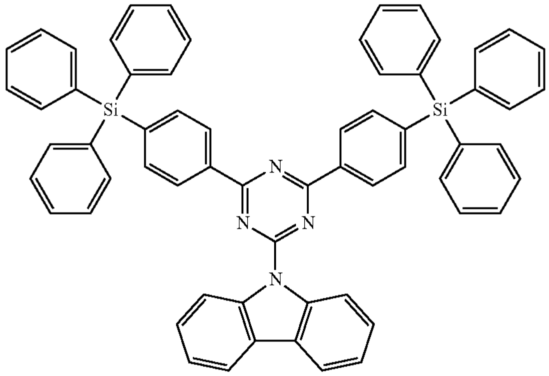
ETH68
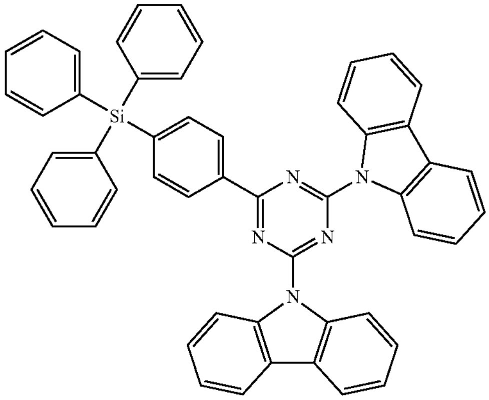
ETH65
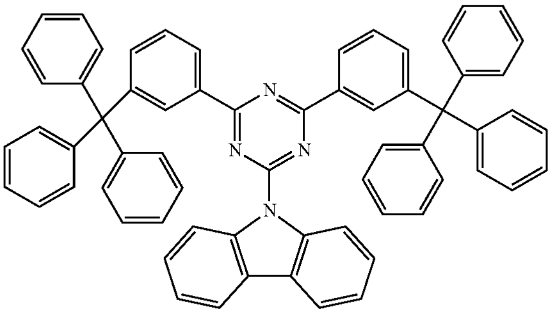
ETH66
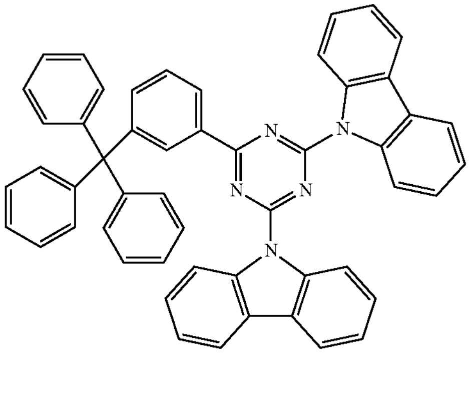
ETH67
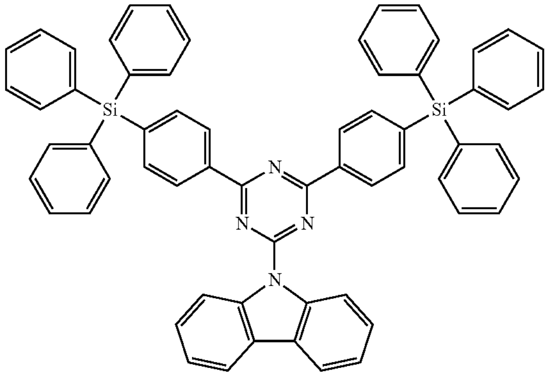
ETH68
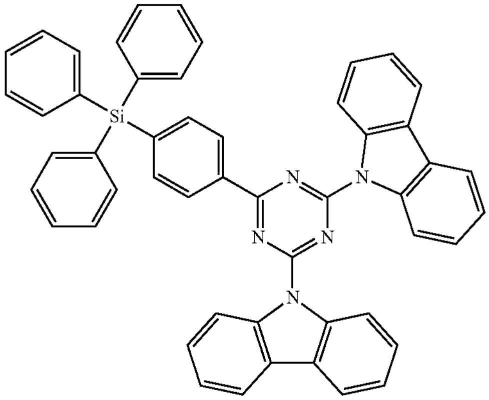
ETH69
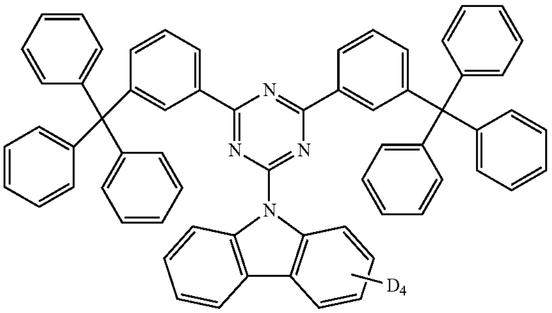
ETH70
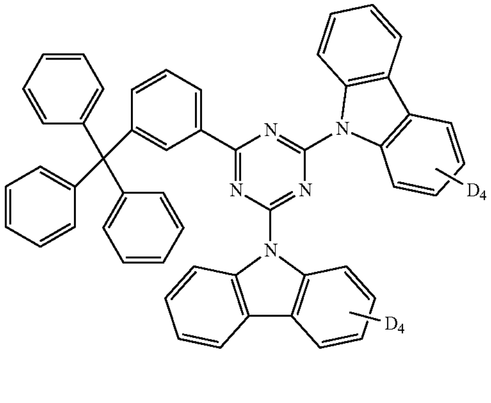

ETH71
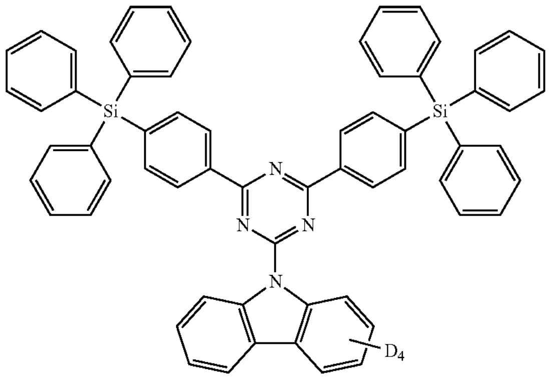
ETH72
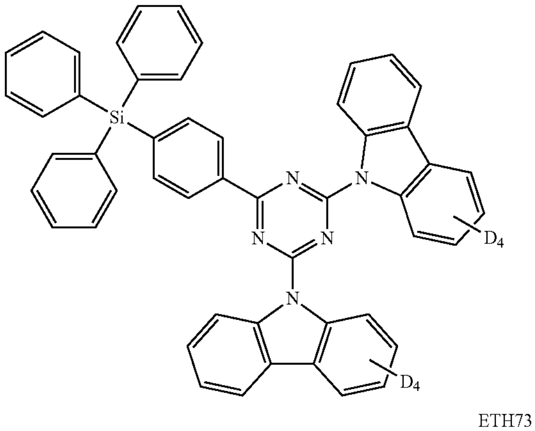
ETH73
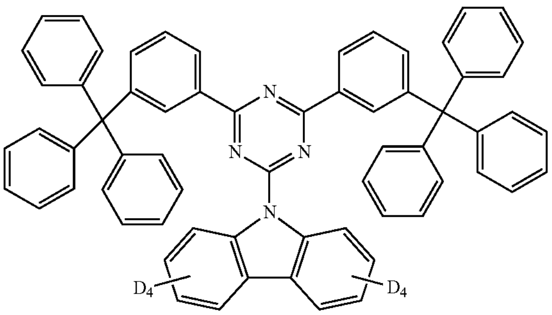
ETH74
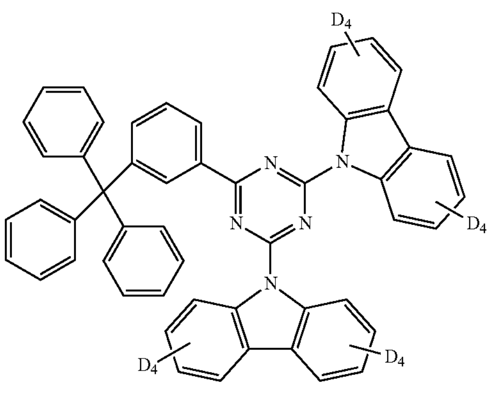
ETH75
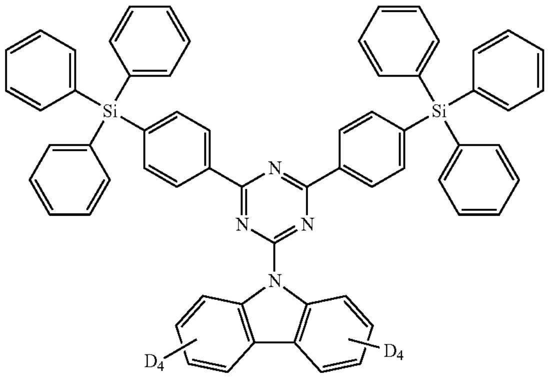
ETH76
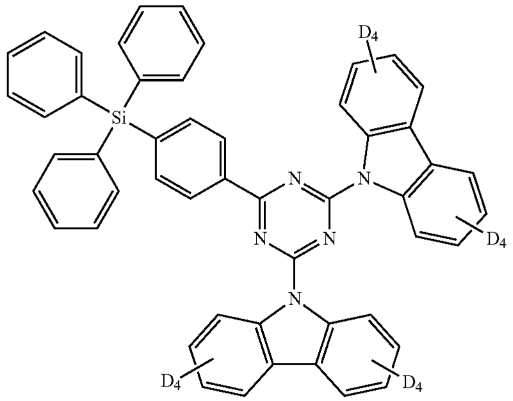
ETH77
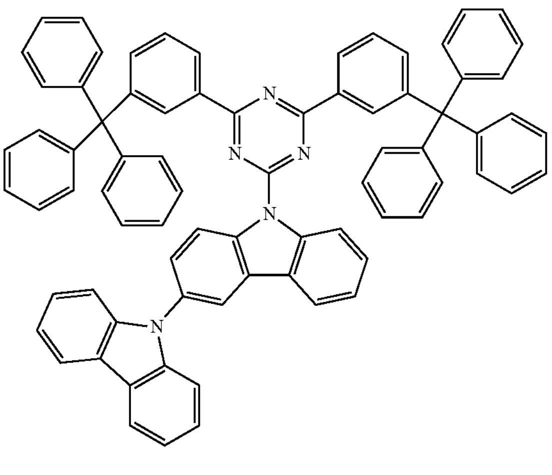

-continued
ETH78
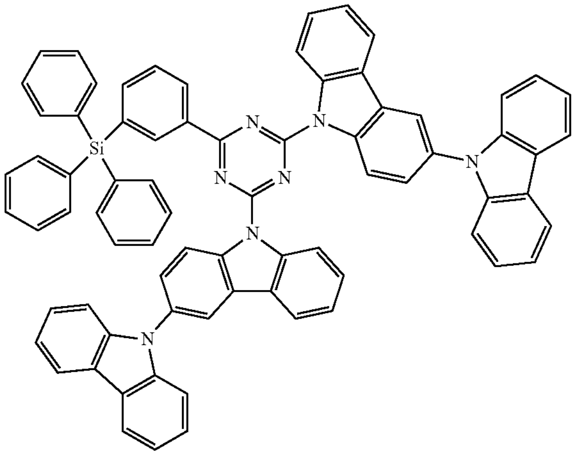
ETH79
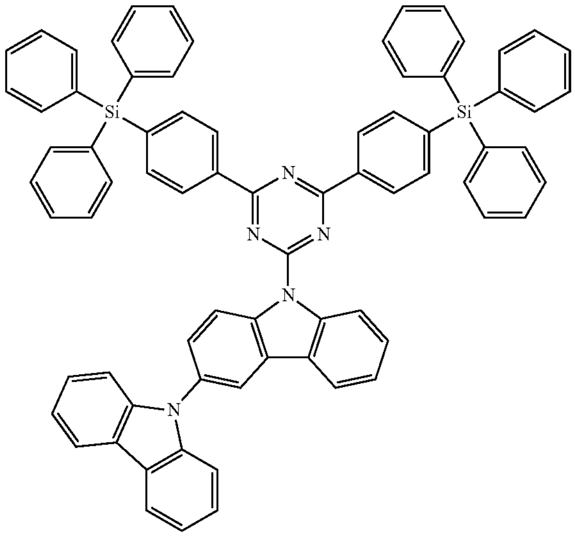
ETH80
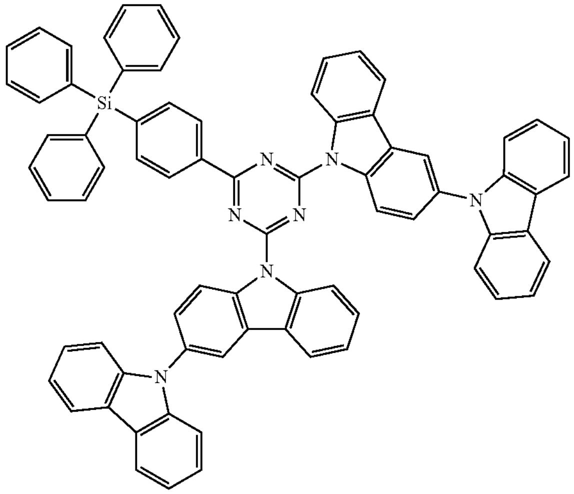
-continued
ETH81
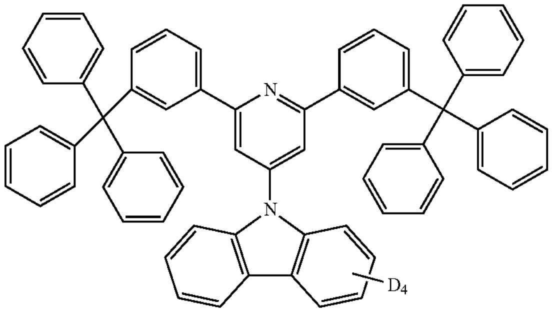
ETH82
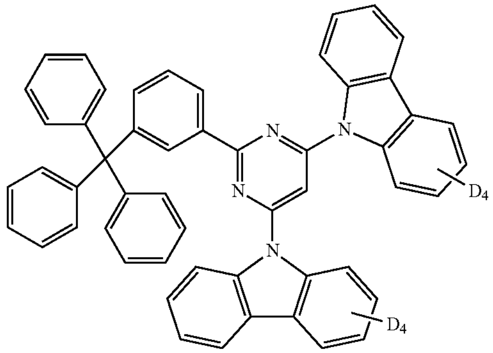
ETH83
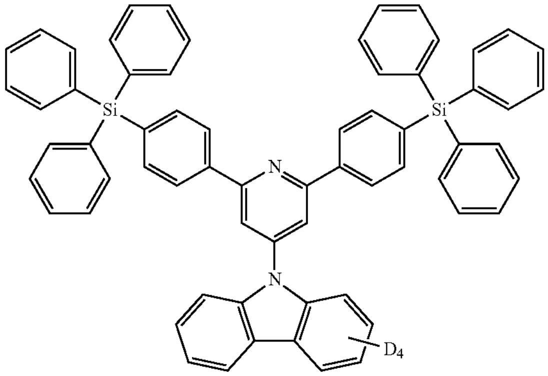
ETH84
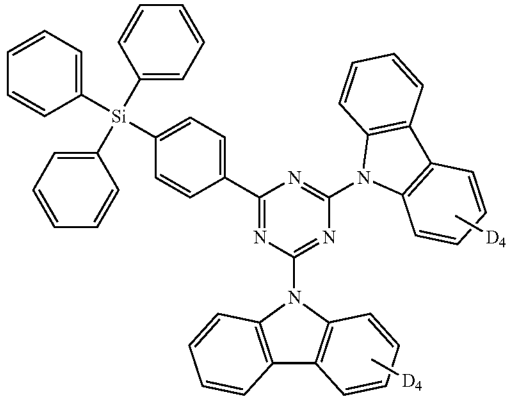

-continued
ETH85
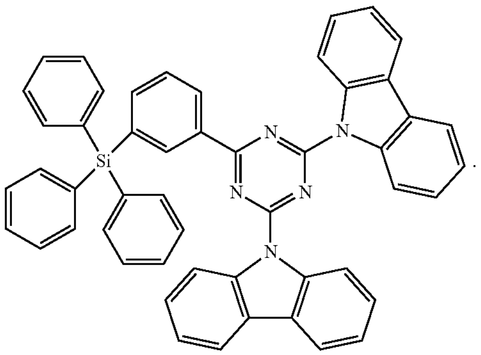
In embodiments, the third compound may include at least one of Compounds HTH1 to HTH52:
HTH1
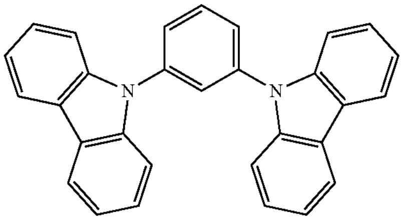
HTH2
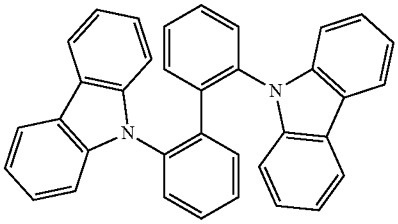
HTH3
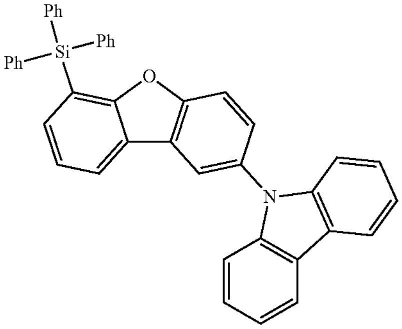
HTH4
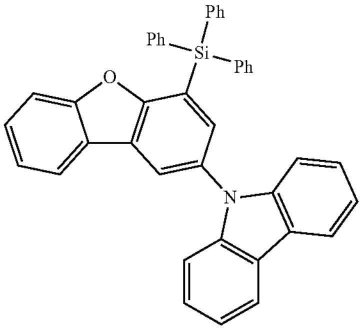
-continued
HTH5
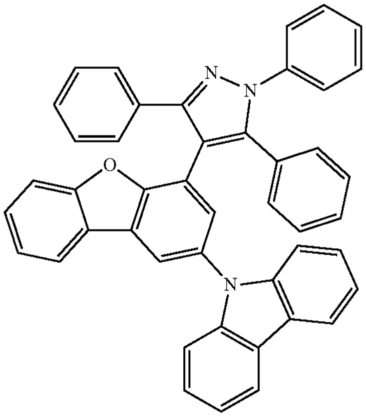
HTH6
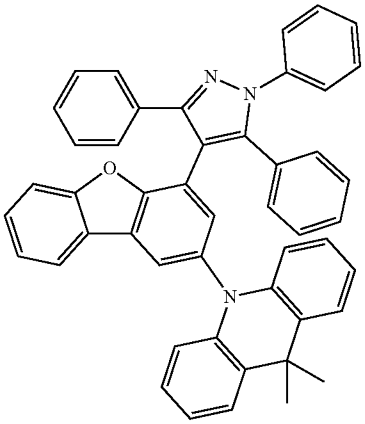
HTH7
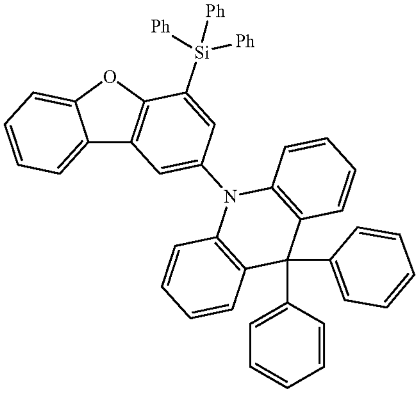
HTH8
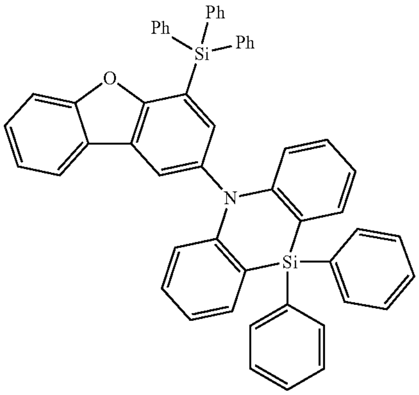

-continued
HTH9
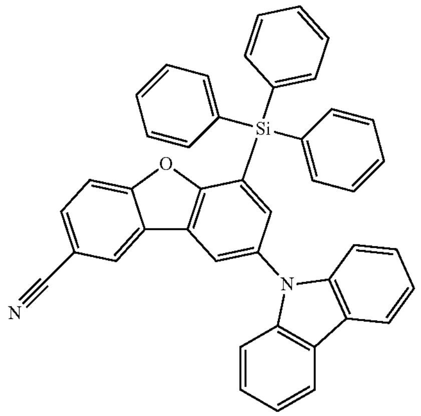
HTH10
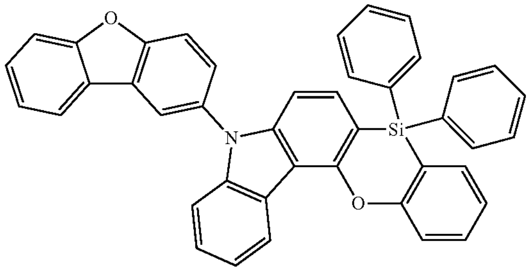
HTH11
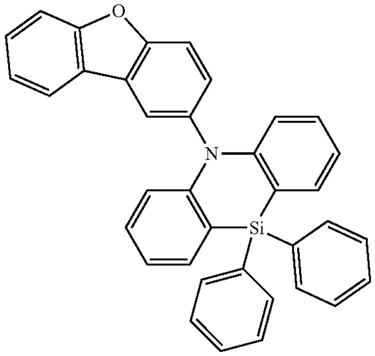
HTH12
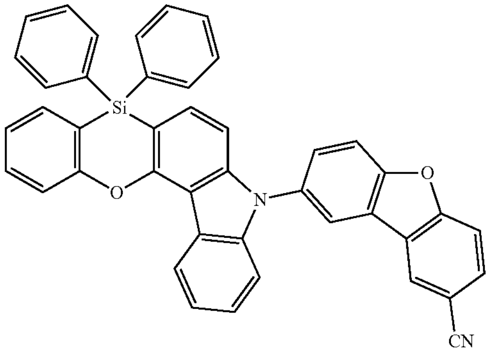
-continued
HTH13
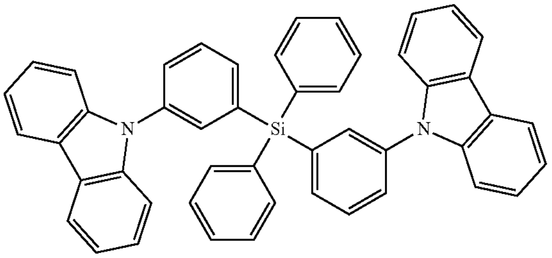
HTH14
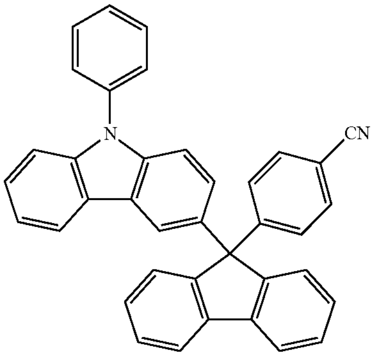
HTH15
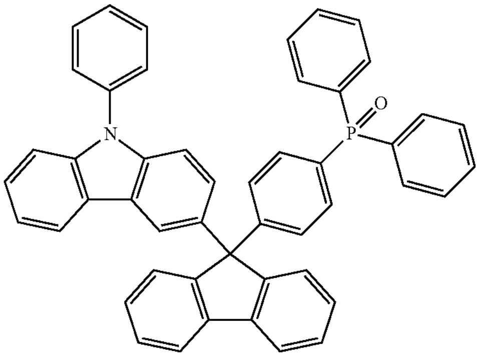
HTH16
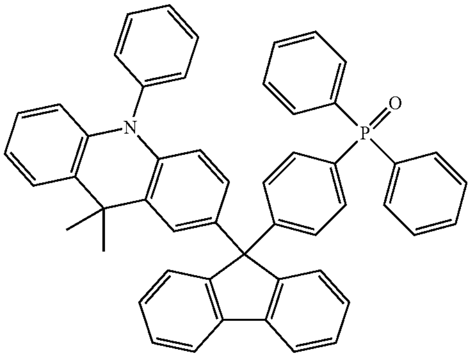

-continued
HTH17
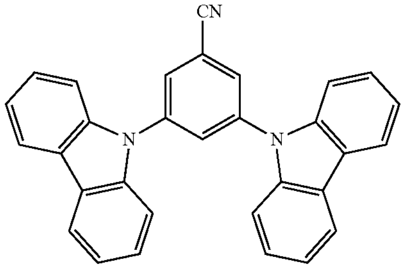
HTH18
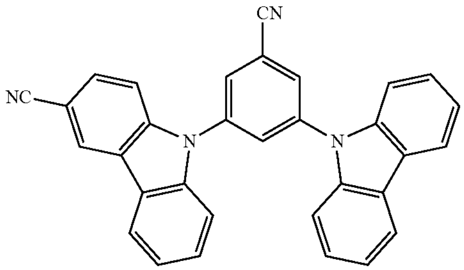
HTH19
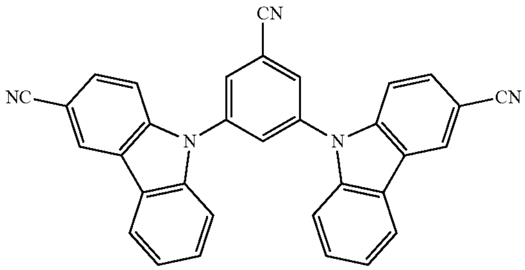
HTH20
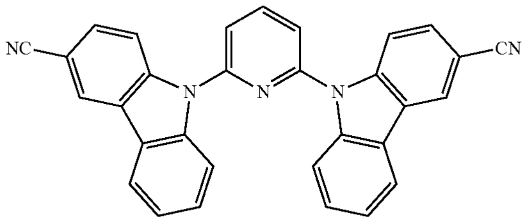
HTH21
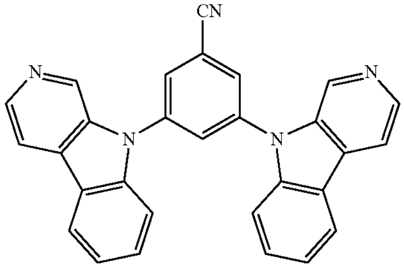
-continued
HTH22
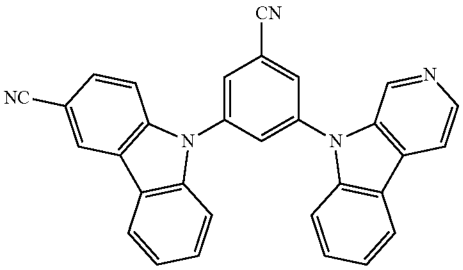
HTH23
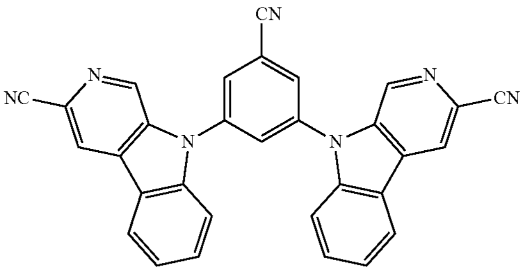
HTH24
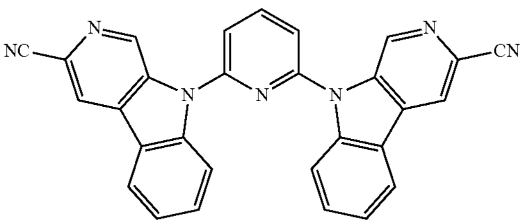
HTH25
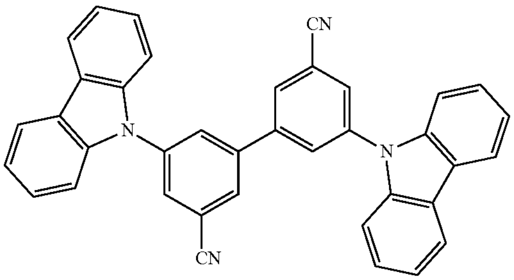
HTH26
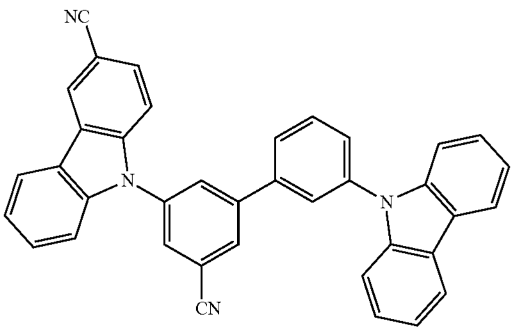

-continued
HTH27
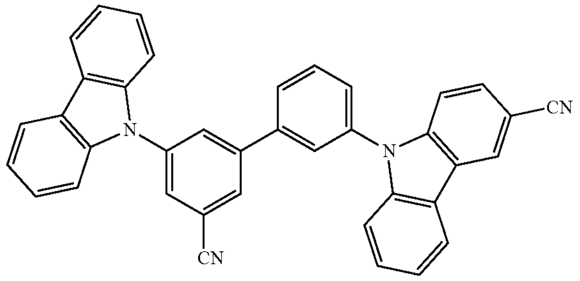
HTH28
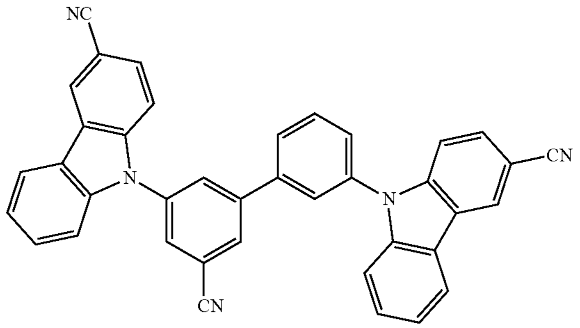
HTH29
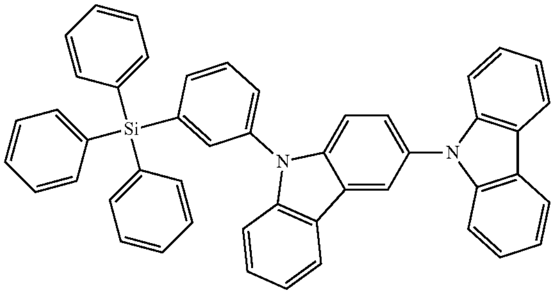
HTH30
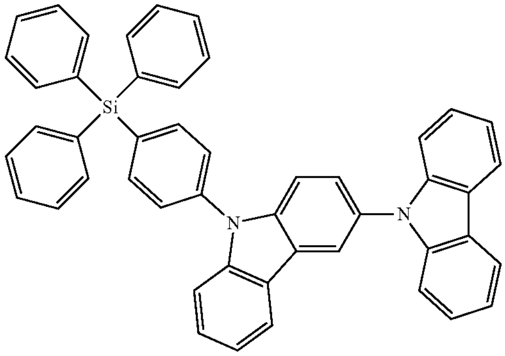
-continued
HTH31
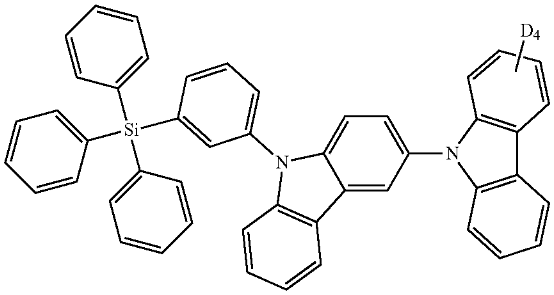
HTH32
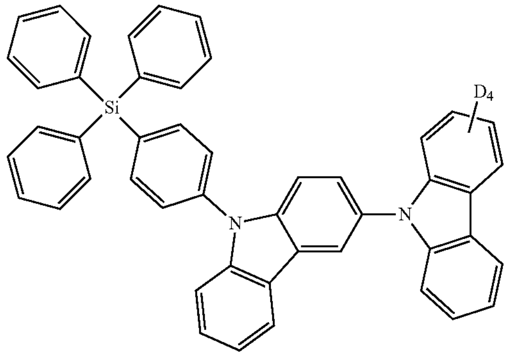
HTH33
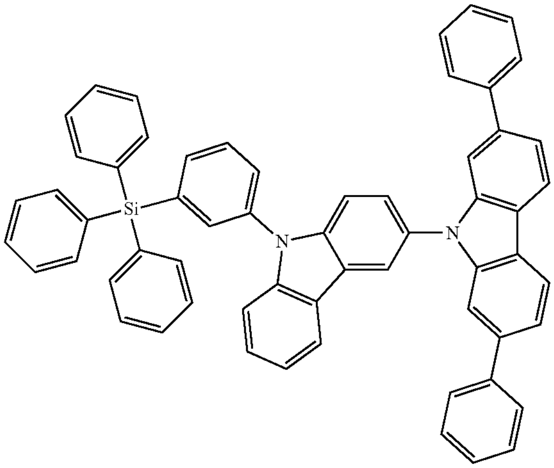

-continued
HTH34
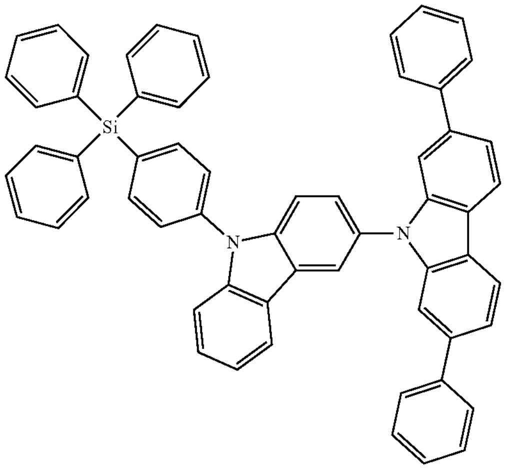
HTH35
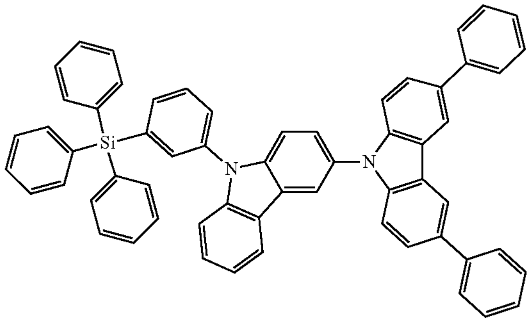
HTH36
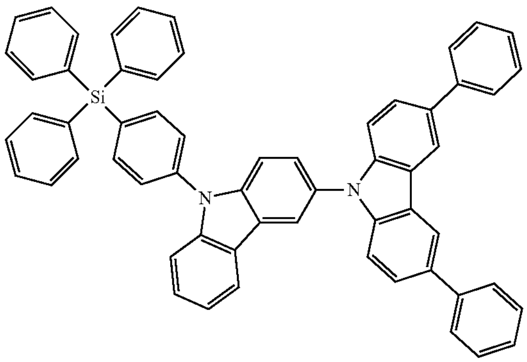
HTH37
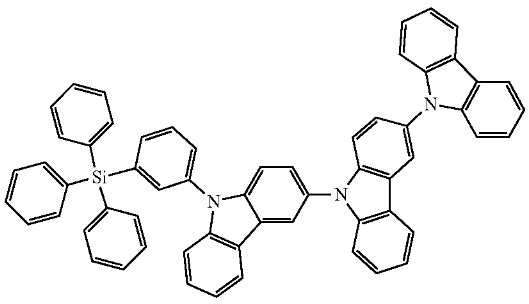
-continued
HTH38
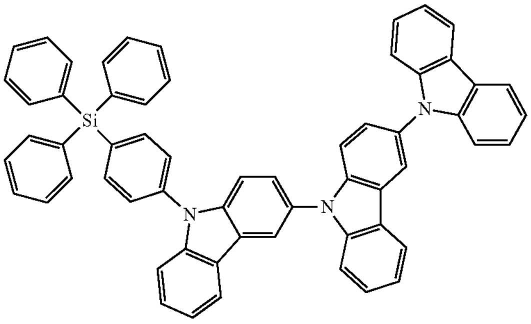
HTH39
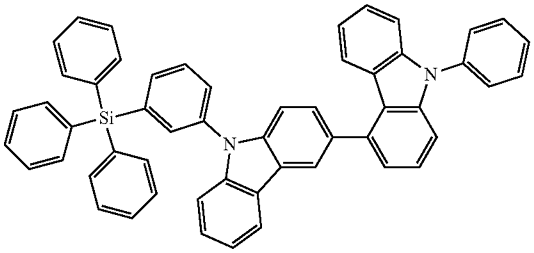
HTH40
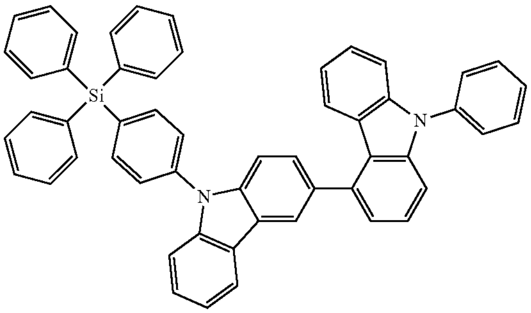
HTH41
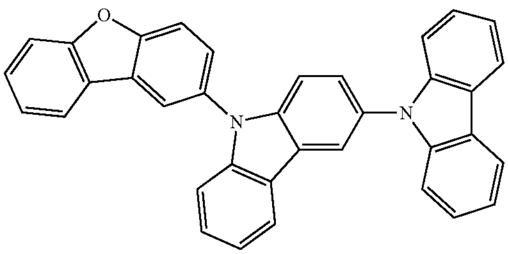
HTH42
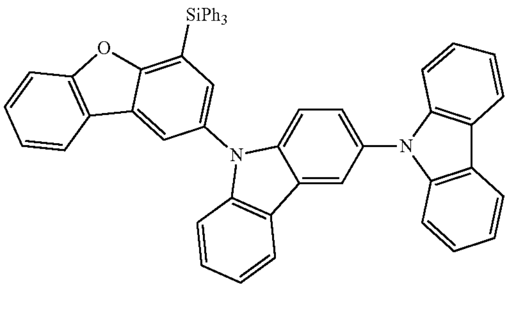

-continued
HTH43
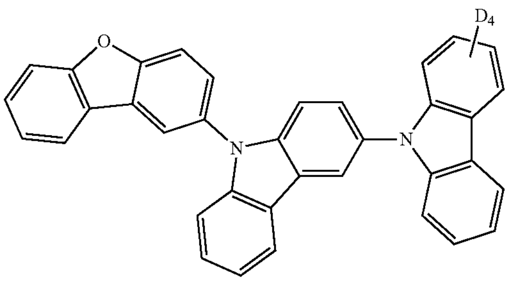
HTH44
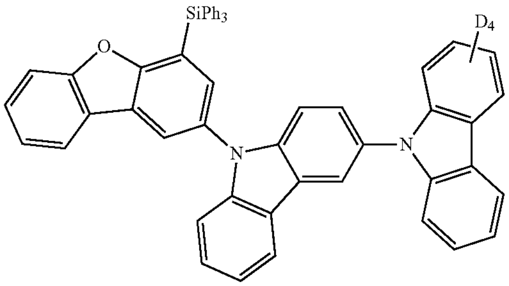
HTH45
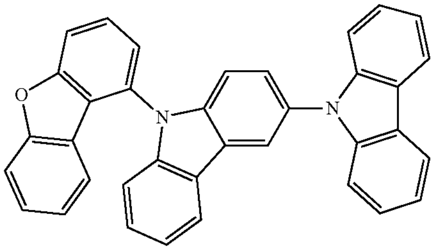
HTH46
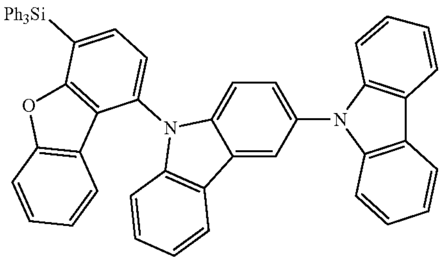
HTH47
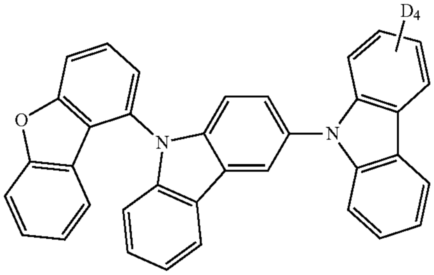
-continued
HTH48
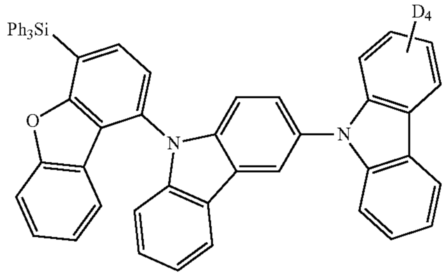
HTH49
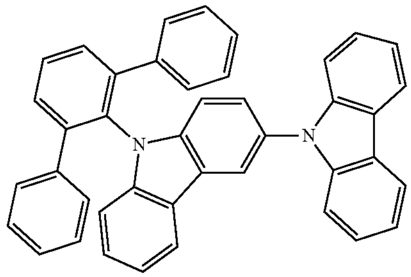
HTH50
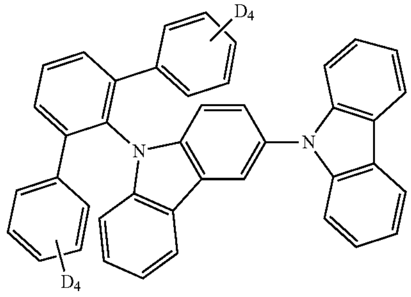
HTH51
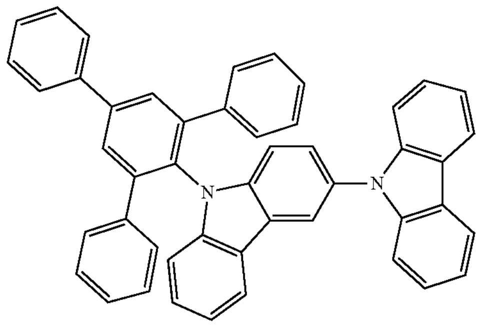
HTH52
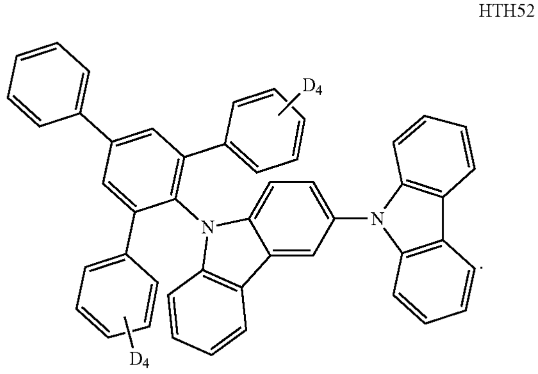
.

In embodiments, the fourth compound may include at least one of Compounds DFD1 to DFD12:
DFD1
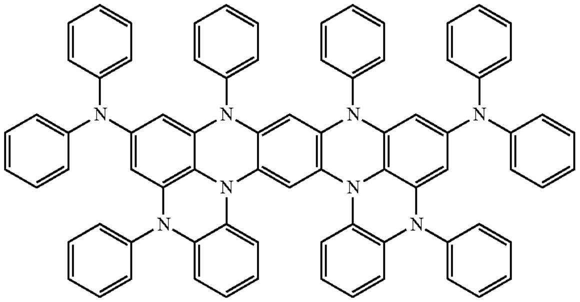
DFD2
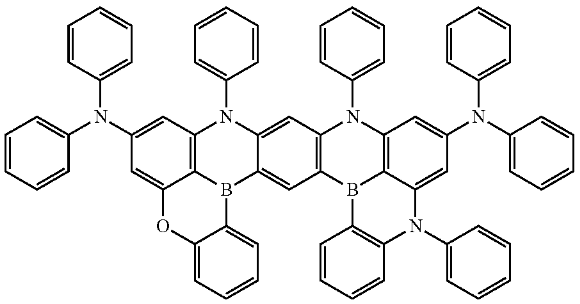
DFD3
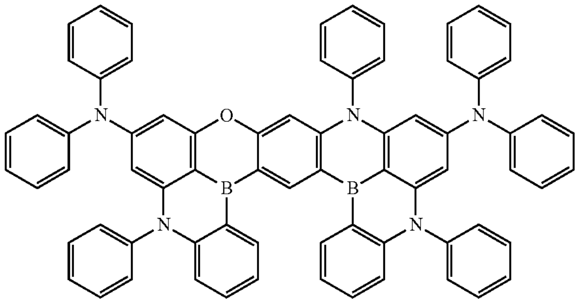
DFD4
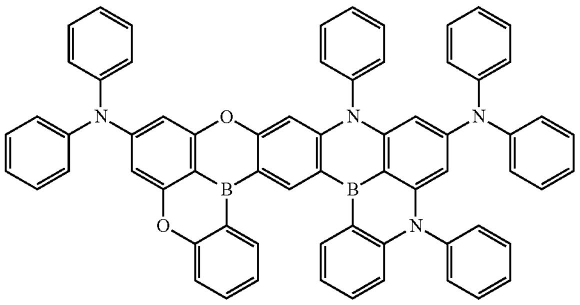
-continued
DFD5
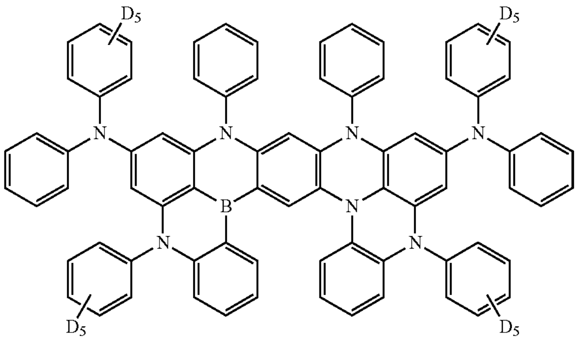
DFD6
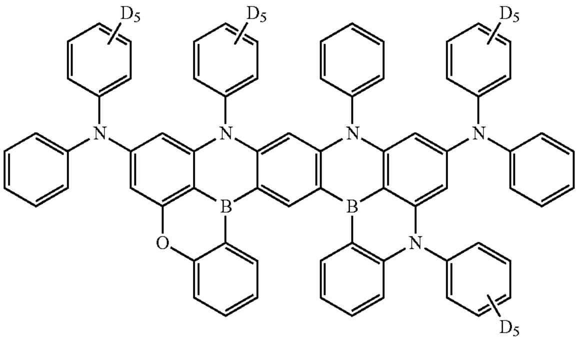
DFD7
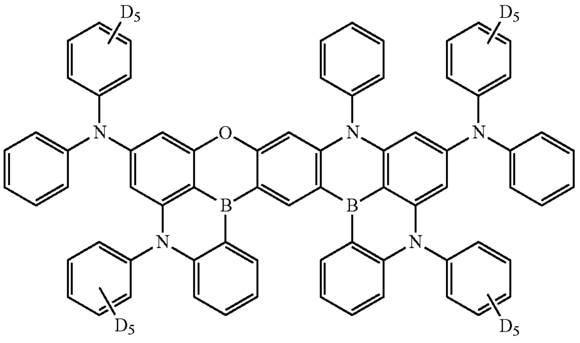
DFD8
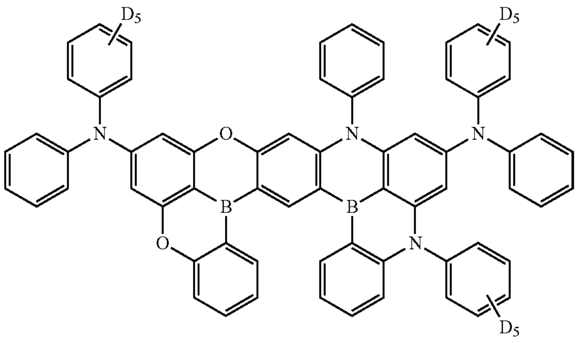

-continued

DFD9

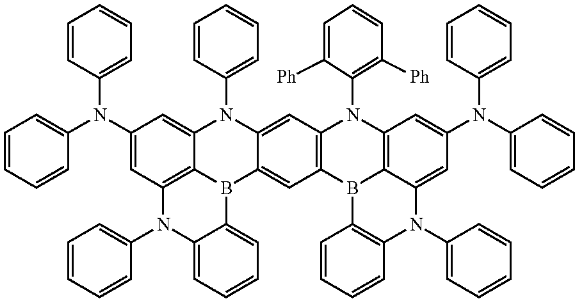

DFD10

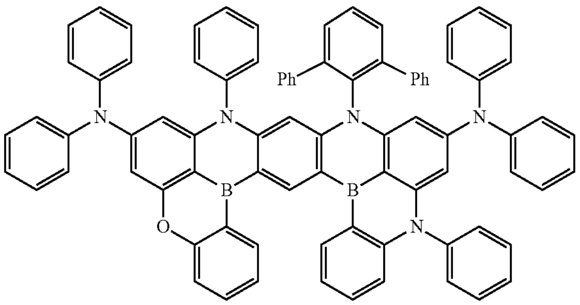

DFD11

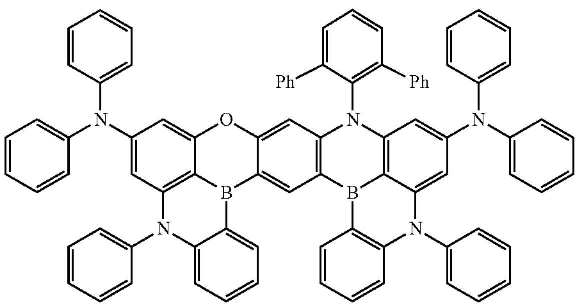

DFD12

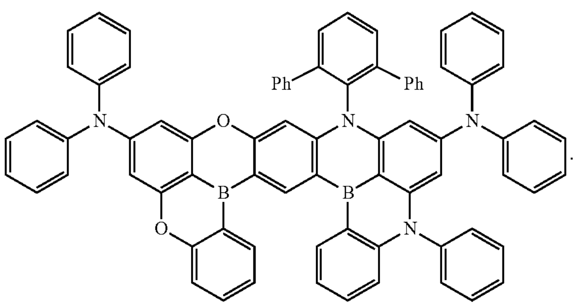

In Compounds ETH1 to ETH85, HTH1 to HTH52, and DFD1 to DFD12, "Ph" represents a phenyl group, "$D_5$" represents substitution with five deuterium atoms, and "$D_4$" represents substitution with four deuterium atoms. For example, a group represented by

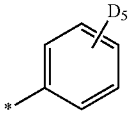

may be identical to a group represented by

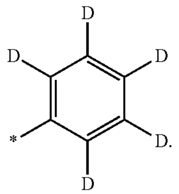

In an embodiment, the light-emitting device may satisfy at least one of Conditions 1 to 4:

[Condition 1]

lowest unoccupied molecular orbital (LUMO) energy level (eV) of the third compound>LUMO energy level (eV) of the first compound

[Condition 2]

LUMO energy level (eV) of the first compound>LUMO energy level (eV) of the second compound

[Condition 3]

highest occupied molecular orbital (HOMO) energy level (eV) of the first compound>HOMO energy level (eV) of the third compound

[Condition 4]

HOMO energy level (eV) of the third compound>HOMO energy level (eV) of the second compound A HOMO energy level and a LUMO energy level of each of the first compound, the second compound, and the third compound may each be a negative value, and may be measured according to a method of the related art.

In embodiments, an absolute value of a difference between a LUMO energy level of the first compound and a LUMO energy level of the second compound may be in a range of about 0.1 eV to about 1.0 eV; or an absolute value of a difference between a LUMO energy level of the first compound and a LUMO energy level of the third compound may be in a range of about 0.1 eV to about 1.0 eV or lower; or an absolute value of a difference between a HOMO energy level of the first compound and a HOMO energy level of the second compound may be equal to or less than about 1.25 eV (e.g., in a range of about 0.2 eV to about 1.25 eV); or an absolute value of a difference between a HOMO energy level of the first compound and a HOMO energy level of the third compound may be equal to or less than about 1.25 eV (e.g., in a range of about 0.2 eV to about 1.25 eV).

When the relationships between LUMO energy level and HOMO energy level satisfy the conditions as described above, a balance between holes and electrons injected into the emission layer can be achieved.

The light-emitting device may have a structure of a first embodiment or a second embodiment.

[Description of First Embodiment]

According to a first embodiment, the first compound may be included in an emission layer in the interlayer of a light-emitting device, wherein the emission layer may further include a host, the first compound may be different from the host, and the emission layer may emit phosphorescence or fluorescence from the first compound. For example, according to the first embodiment, the first compound may be a dopant or an emitter. In an embodiment, the first compound may be a phosphorescent dopant or a phosphorescence emitter.

Phosphorescence or fluorescence emitted from the first compound may be blue light.

The emission layer may further include an auxiliary dopant. The auxiliary dopant may improve luminescence efficiency from the first compound by effectively transferring to the first compound as a dopant or an emitter.

The auxiliary dopant may be different from the first compound and the host.

In embodiments, the auxiliary dopant may be a delayed fluorescence-emitting compound.

In embodiments, the auxiliary dopant may be a compound including at least one cyclic group including boron (B) and nitrogen (N) as ring-forming atoms.

[Description of Second Embodiment]

According to a second embodiment, the first compound may be included in an emission layer in the interlayer of a light-emitting device, wherein the emission layer may further include a host and a dopant, and the first compound, the host, and the dopant may be different from one another, and the emission layer may emit phosphorescence or fluorescence (e.g., delayed fluorescence) emitted from the dopant.

In an embodiment, the first compound in the second embodiment may serve not as a dopant, but may serve as an auxiliary dopant that transfers energy to a dopant (or an emitter).

In embodiments, the first compound in the second embodiment may serve as an emitter and may also serve as an auxiliary dopant that transfers energy to a dopant (or an emitter).

For example, phosphorescence or fluorescence emitted from the dopant (or the emitter) in the second embodiment may be blue phosphorescence or blue fluorescence (e.g., blue delayed fluorescence).

The dopant (or the emitter) in the second embodiment may be a phosphorescent dopant material (e.g., an organometallic compound represented by Formula 1, an organometallic compound represented by Formula 401, or any combination thereof) or any fluorescent dopant material (e.g., a compound represented by Formula 501, a compound represented by Formula 502, a compound represented by Formula 503, or any combination thereof).

In the first embodiment and the second embodiment, the blue light may have a maximum emission wavelength in a range of about 430 nm to about 480 nm. For example, the blue light may have a maximum emission wavelength in a range of about 430 nm to about 475 nm. For example, the blue light may have a maximum emission wavelength in a range of about 440 nm to about 475 nm. For example, the blue light may have a maximum emission wavelength in a range of about 455 nm to about 470 nm.

The auxiliary dopant in the first embodiment may include, e.g., a fourth compound represented by Formula 502 or Formula 503.

The host in the first embodiment and in the second embodiment may be any host material (e.g., a compound represented by Formula 301, a compound represented by 301-1, a compound represented by Formula 301-2, or any combination thereof).

In an embodiment, the host in the first embodiment and the second embodiment may be the second compound, the third compound, or any combination thereof.

Another embodiment provides an electronic apparatus which may include the light-emitting device. The electronic apparatus may further include a thin-film transistor. In an embodiment, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. Further details on the electronic apparatus may be the same as provided herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. In an embodiment, the substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates the injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layer structure of ITO/Ag/ITO.

[Interlayer 130]

The interlayer 130 is arranged on the first electrode 110. The interlayer 130 may include an emission layer.

The interlayer 130 may further include a hole transport region between the first electrode 110 and the emission layer, and an electron transport region between the emission layer and the second electrode 150.

In an embodiment, the interlayer 130 may further include, in addition to various organic materials, a metal-containing compound such as an organometallic compound, an inorganic material such as a quantum dot, and the like.

In an embodiment, the interlayer 130 may include two or more emitting units stacked between the first electrode 110 and the second electrode 150, and at least one charge generation layer between the two or more emitting units. When the interlayer 130 includes the two or more emitting units and the at least one charge generation layer, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or any combination thereof.

For example, the hole transport region may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

[Formula 201]

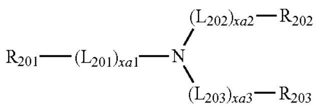

[Formula 202]

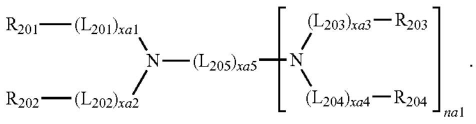

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$(for example, Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, the compound represented by Formula 201 and the compound represented by Formula 202 may each independently include at least one of groups represented by Formulae CY201 to CY217:

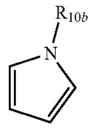

CY201

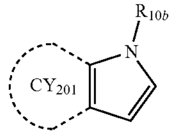

CY202

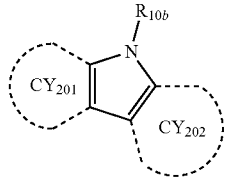

CY203

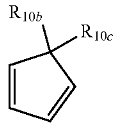

CY204

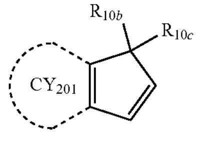

CY205

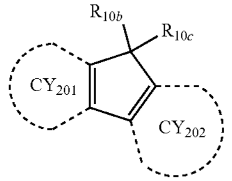

CY206

-continued

CY207

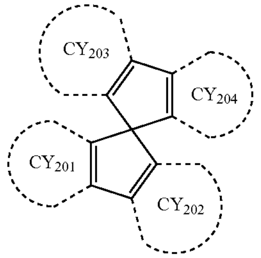

CY208

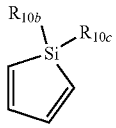

CY209

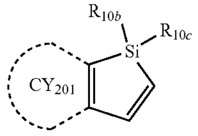

CY210

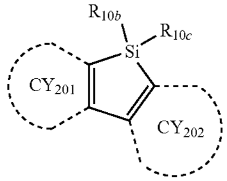

CY211

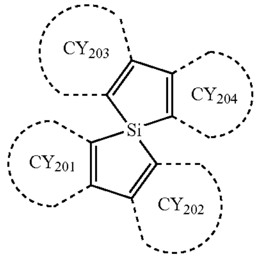

CY212

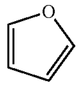

CY213

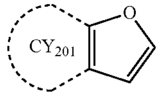

CY214

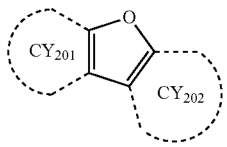

-continued

CY215

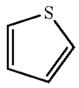

CY216

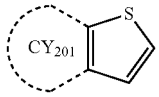

CY217

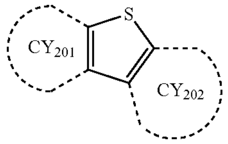

.

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring CY201 to ring CY204 may each independently be a benzene group, a naphthalene group, a phenanthrene group, or an anthracene group.

In embodiments, the compound represented by Formula 201 and the compound represented by Formula 202 may each independently include at least one of groups represented by Formulae CY201 to CY203.

In embodiments, the compound represented by Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, the compound represented by Formula 201 and the compound represented by Formula 202 may each not include groups represented by Formulae CY201 to CY203.

In embodiments, the compound represented by Formula 201 and the compound represented by Formula 202 may each not include groups represented by Formulae CY201 to CY203, and may each independently include at least one of groups represented by Formulae CY204 to CY217.

In embodiments, the compound represented by Formula 201 and the compound represented by Formula 202 may each not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
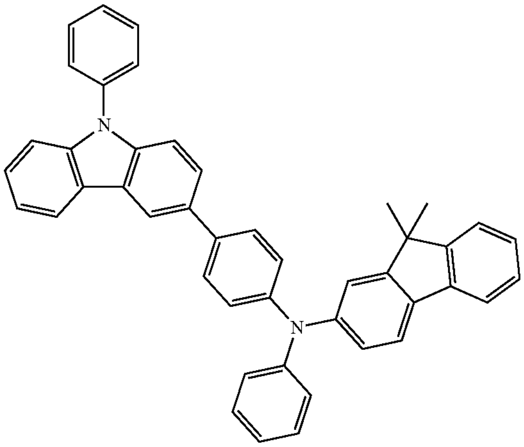
HT2
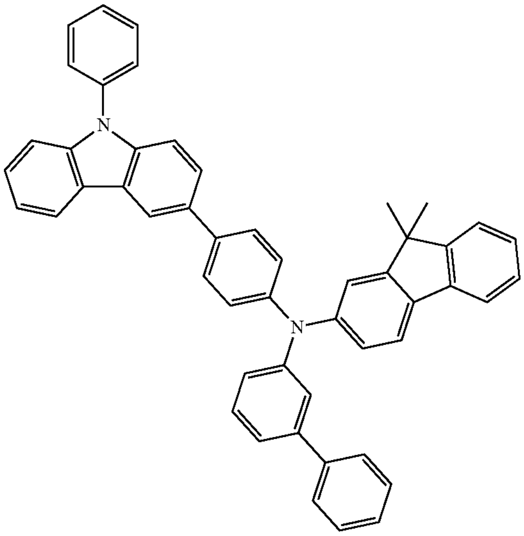
HT3
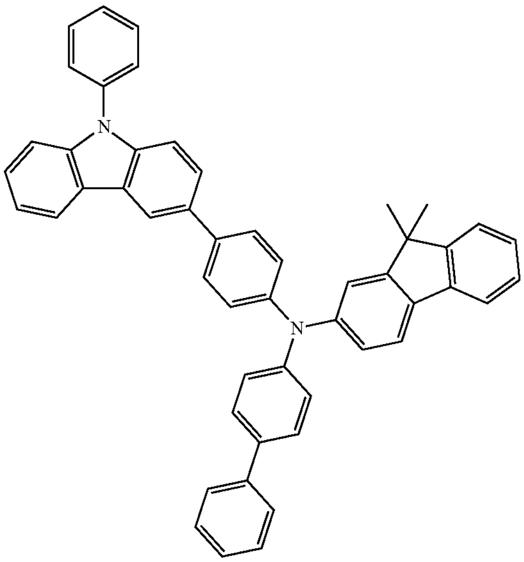
HT4
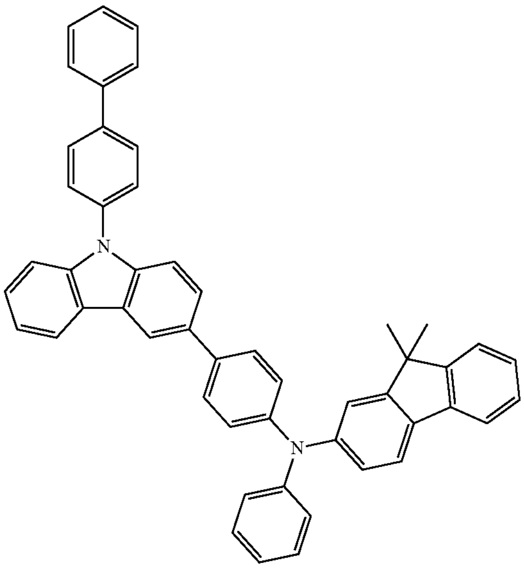

-continued
HT5
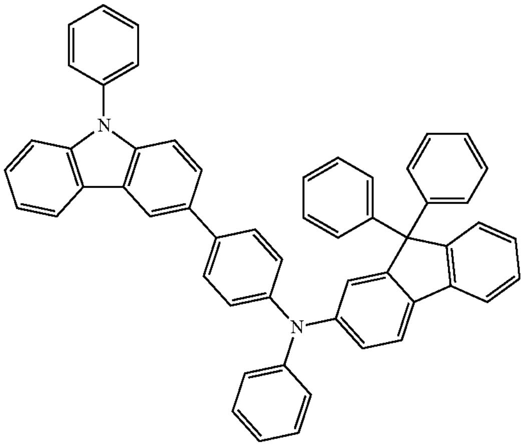
HT6
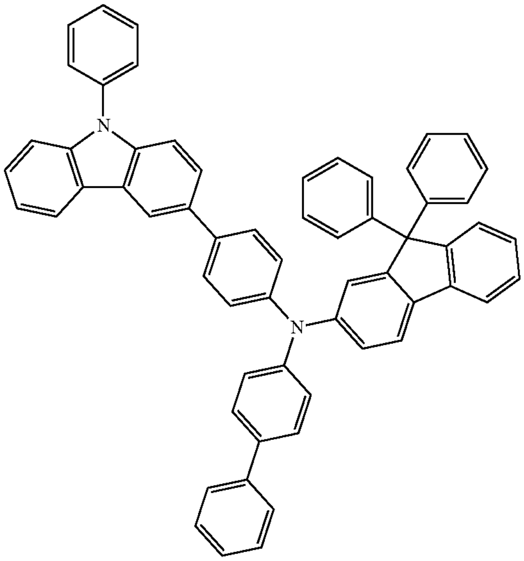
HT7
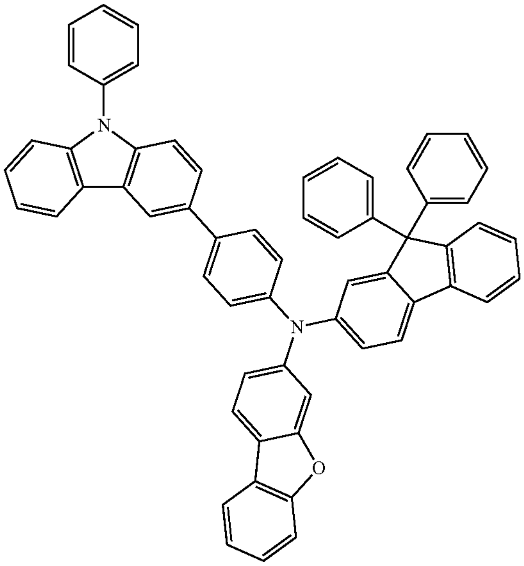
HT8
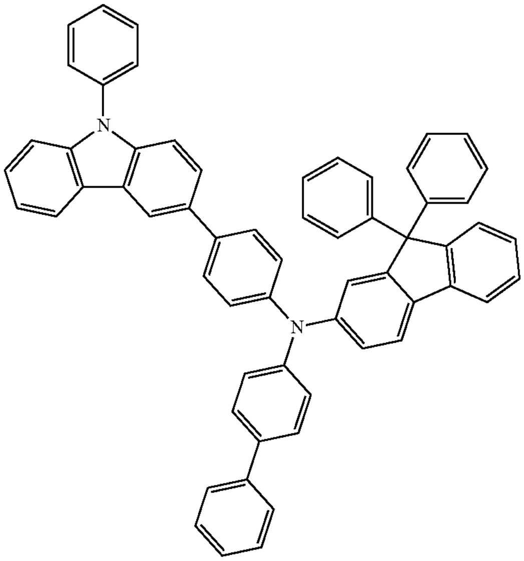

-continued
HT9
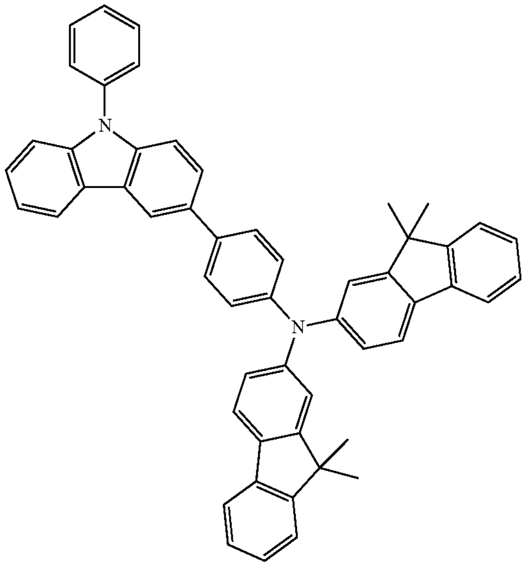
HT10
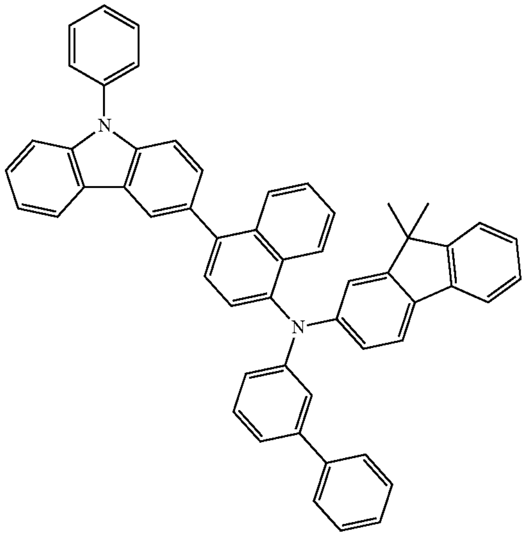
HT11
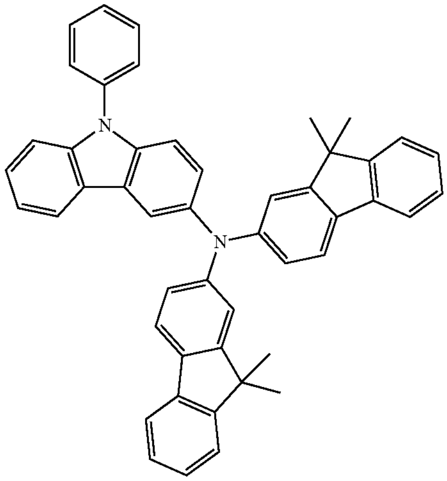
HT12
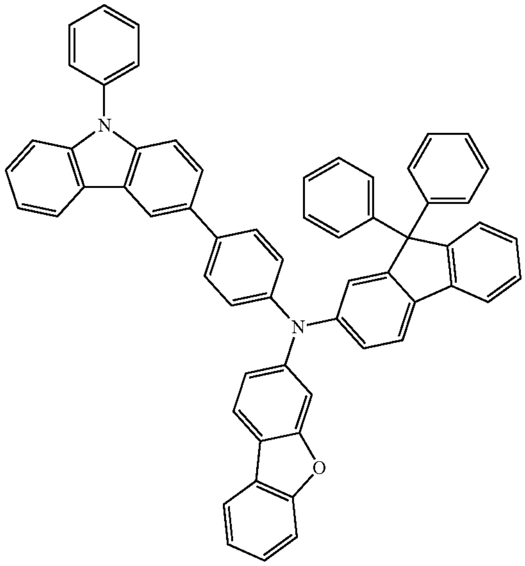

-continued
HT13
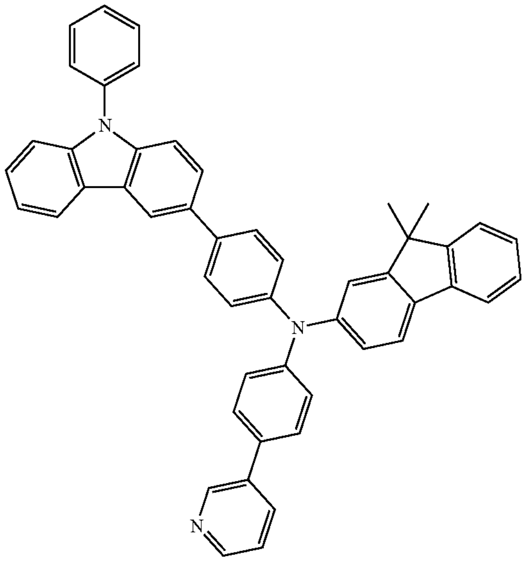
HT14
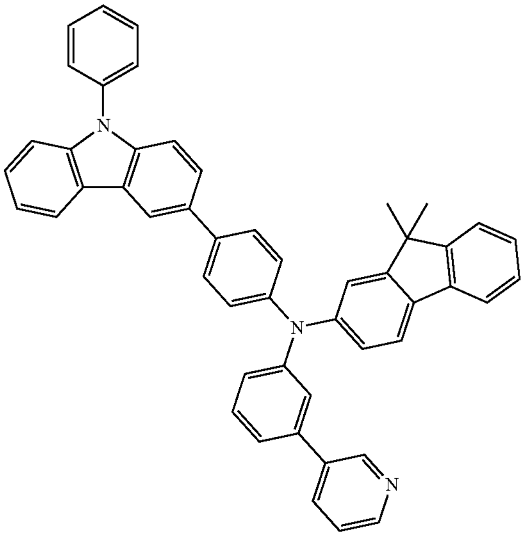
HT15
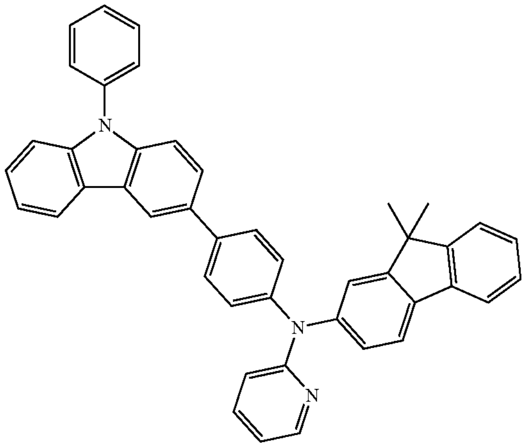
HT16
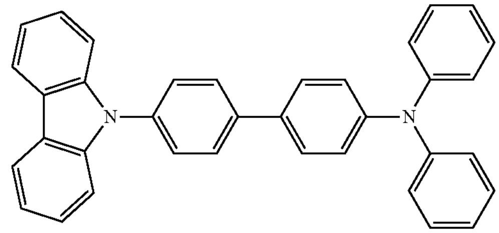
HT17
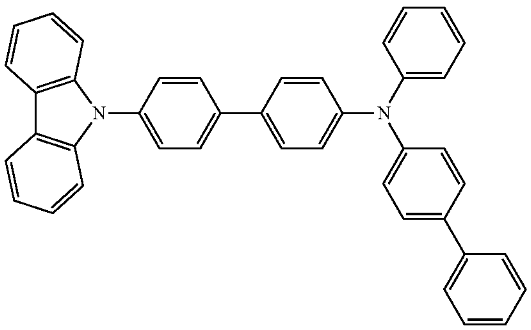
HT18
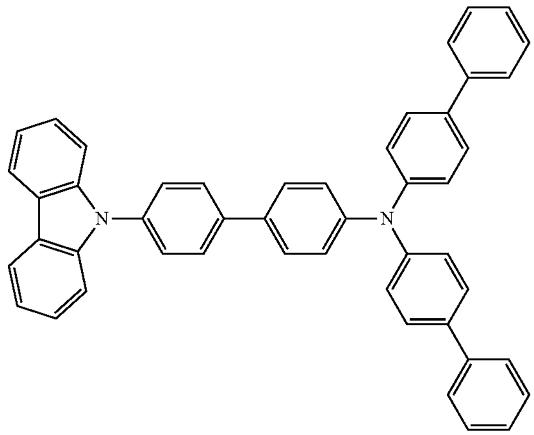

-continued
HT19
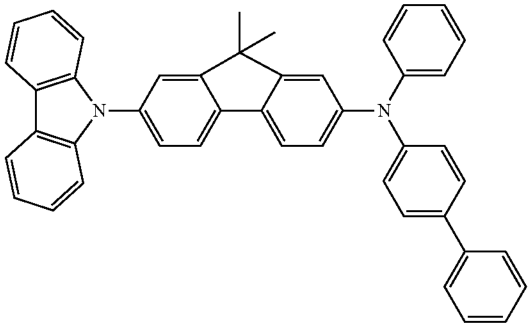
HT20
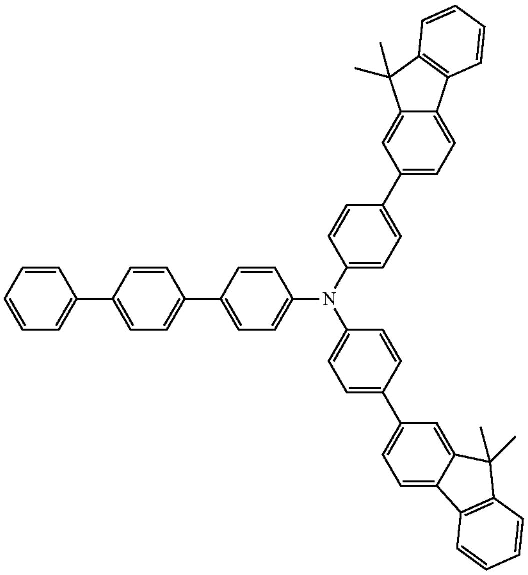
HT21
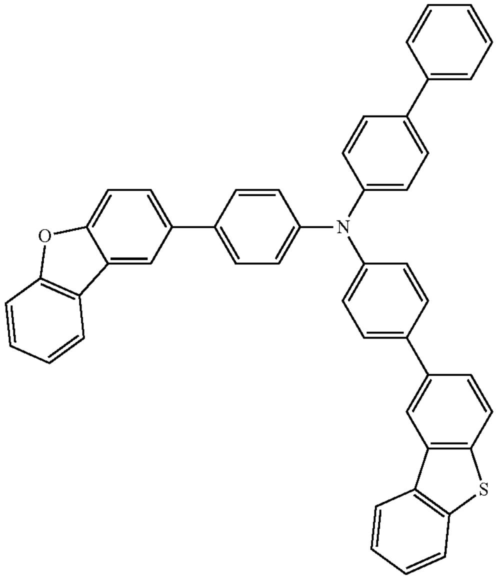
HT22
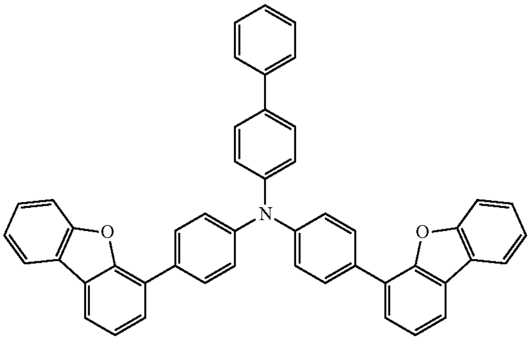
HT23
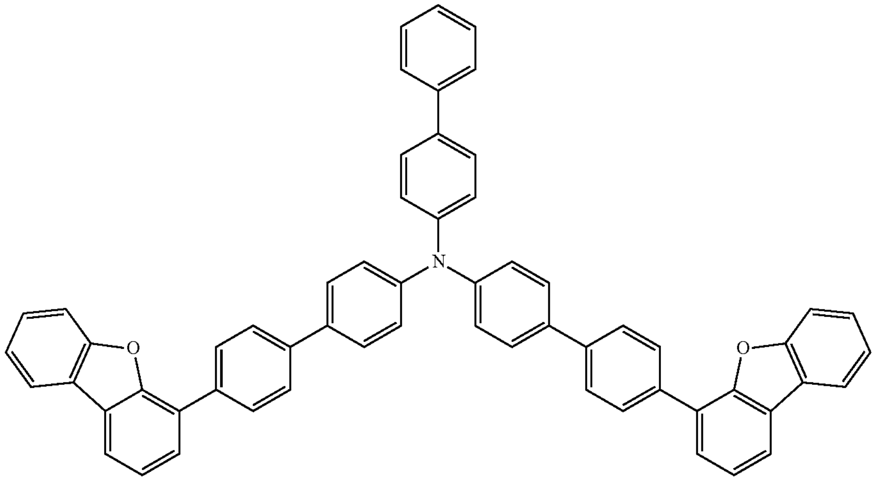

-continued
HT24
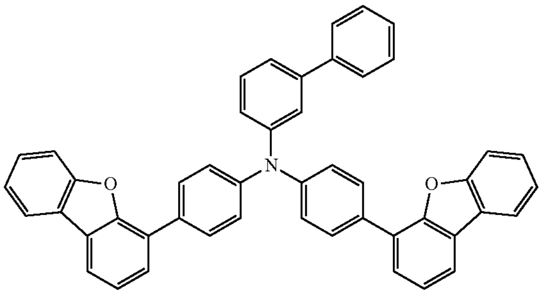
HT25
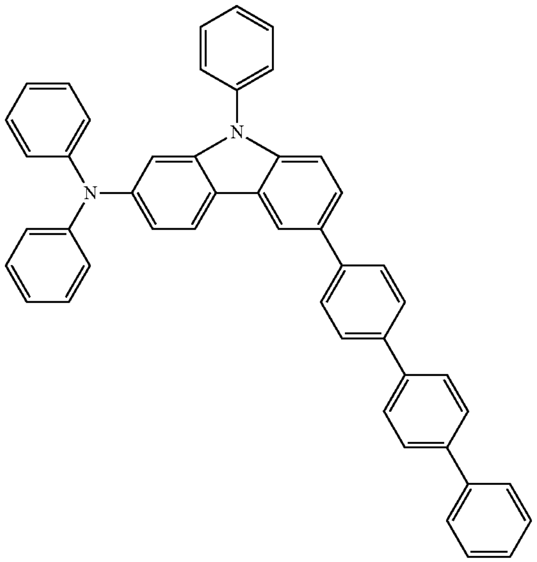
HT26
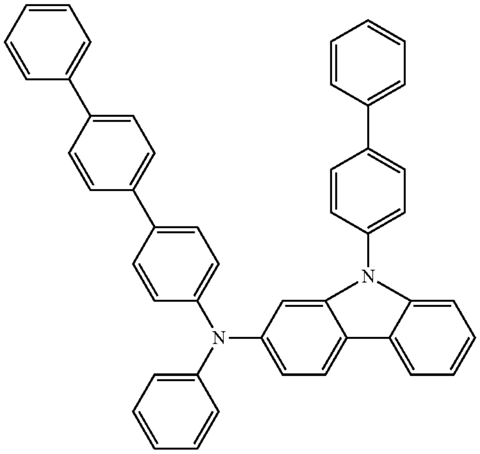
HT27
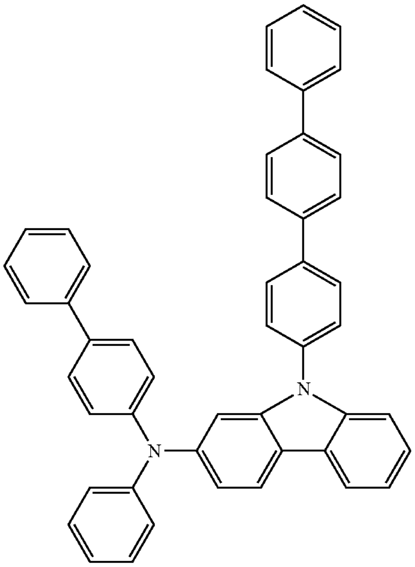
HT28
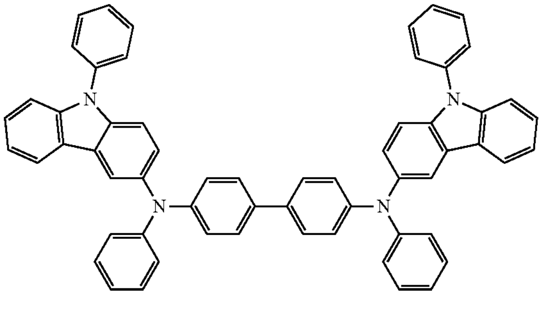
HT29
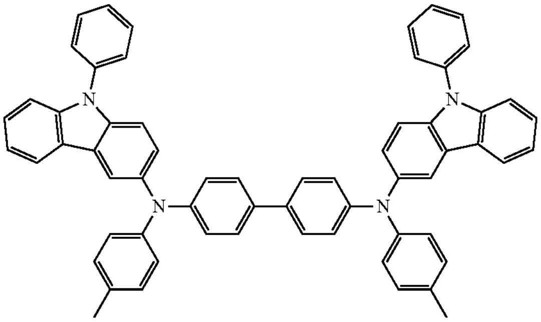

-continued
HT30
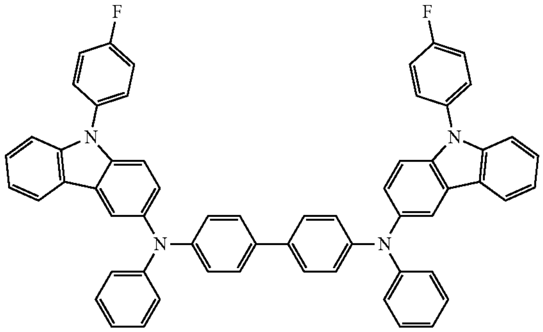
HT31
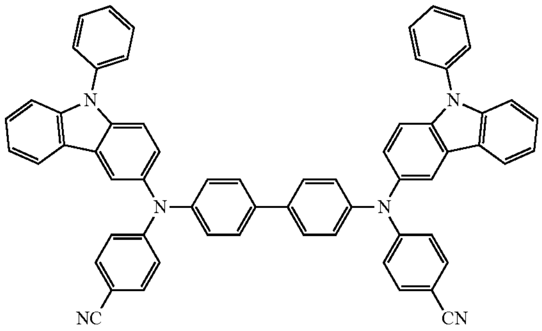
HT32
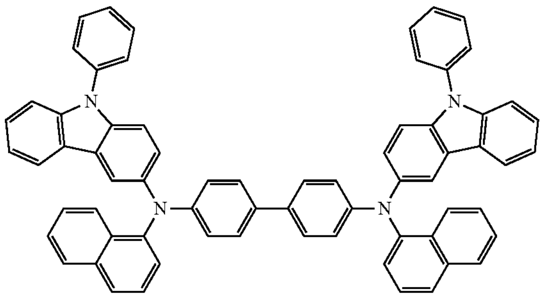
HT33
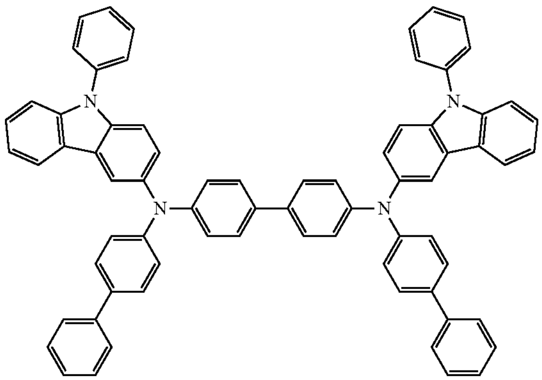
HT34
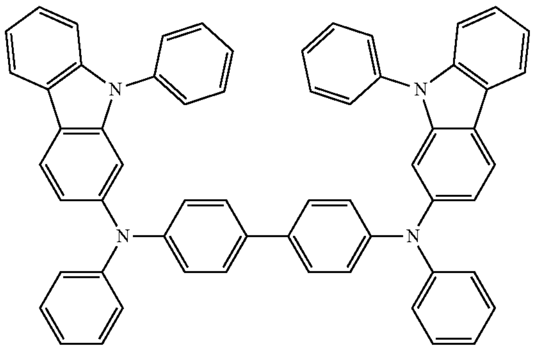
HT35
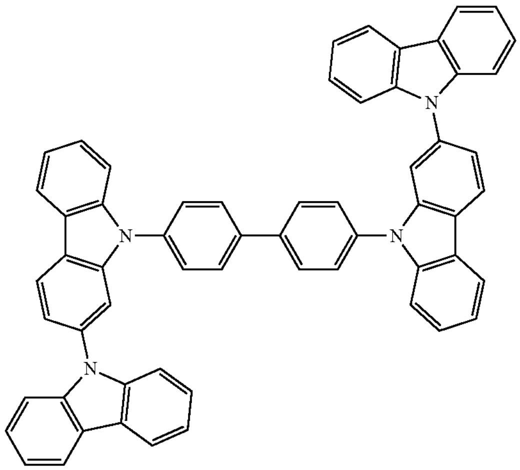

-continued
HT36
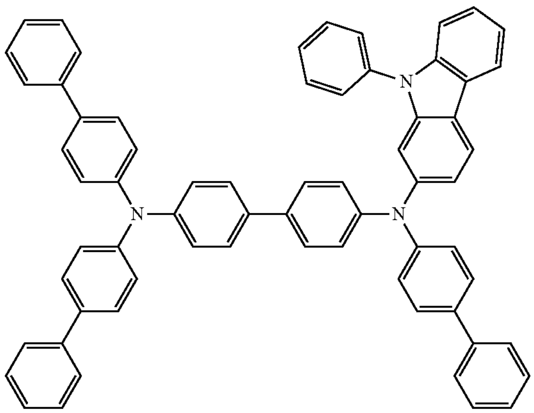
HT37
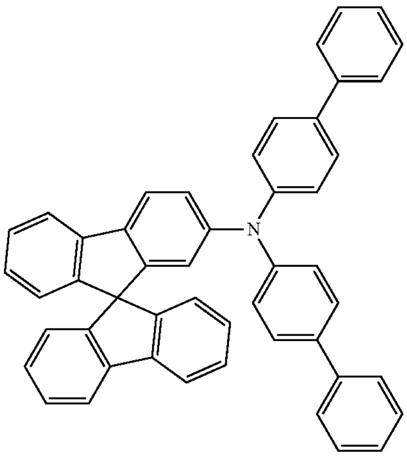
HT38
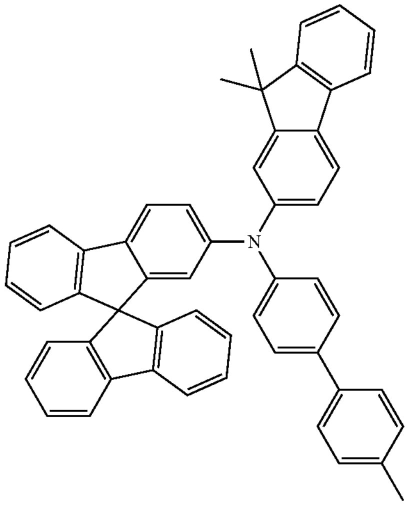
HT39
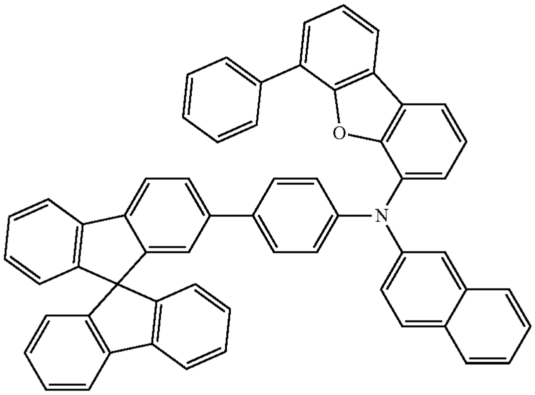
HT40
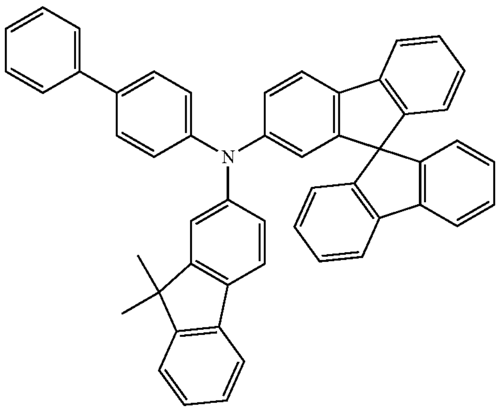
HT41
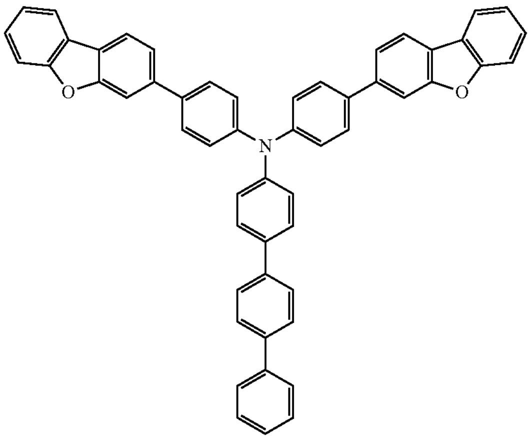

-continued
HT42
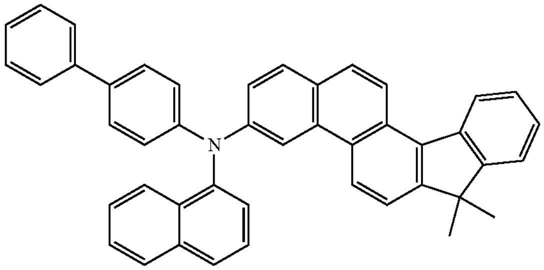
HT43
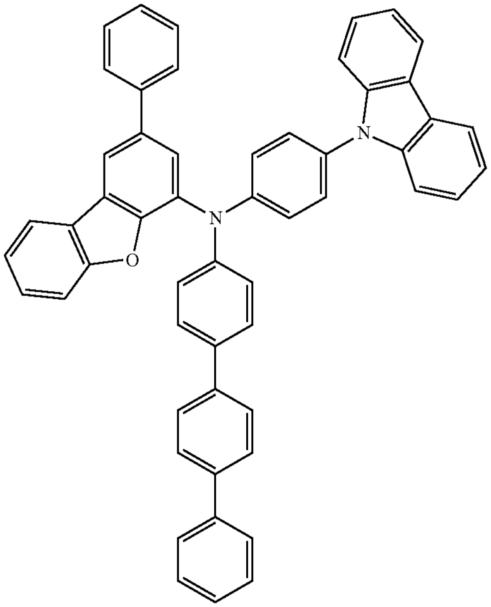
HT44
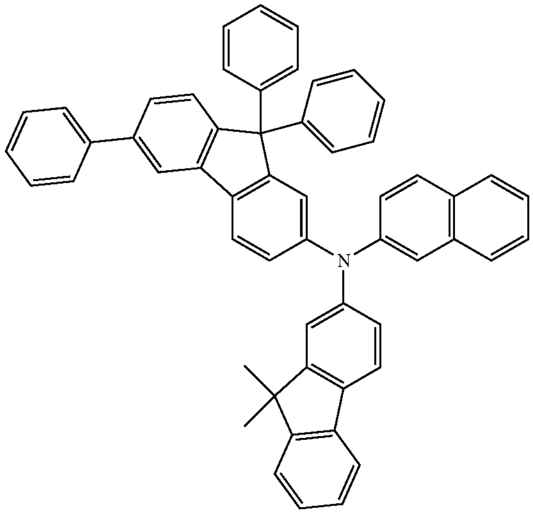
HT45
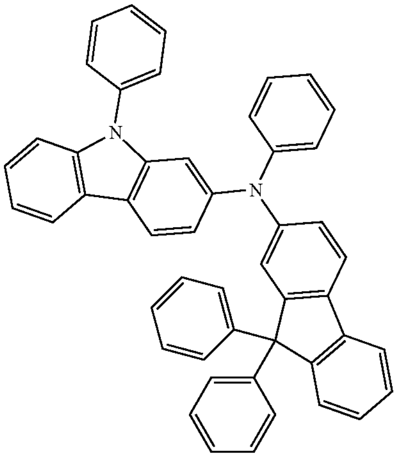

-continued
HT46
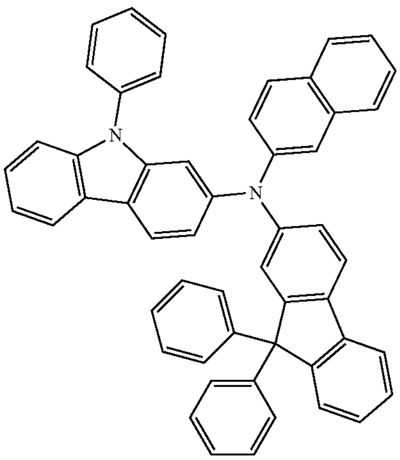
m-MTDATA
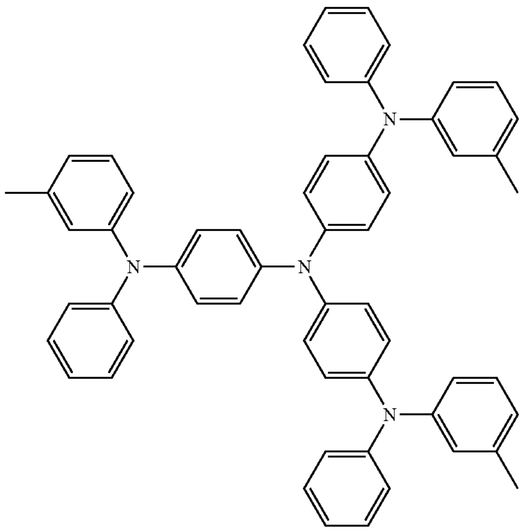
TDATA
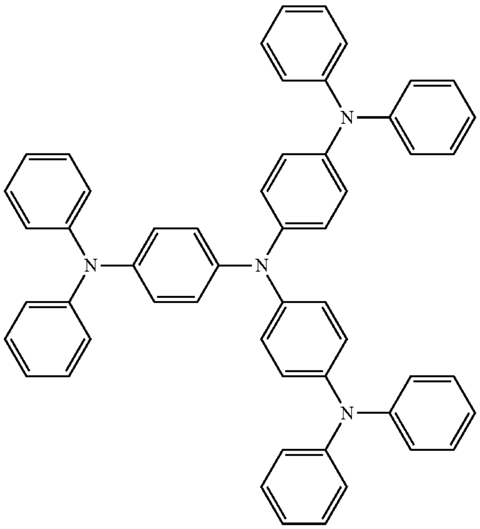
2-TNATA
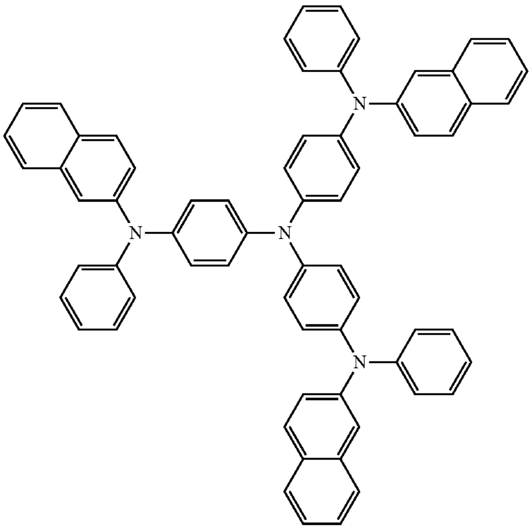
NPB
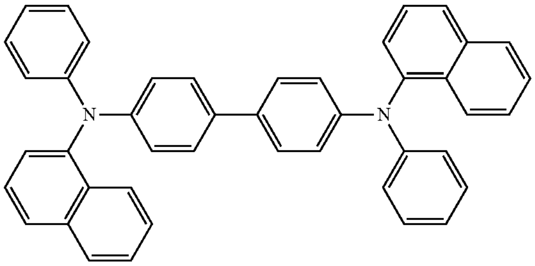
β-NPB
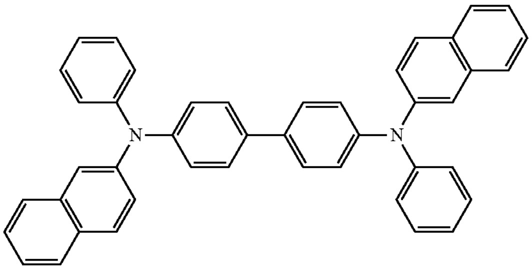

-continued

TPD

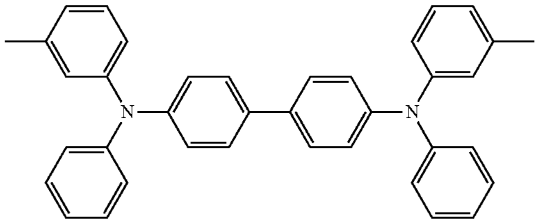

Spiro-TPD

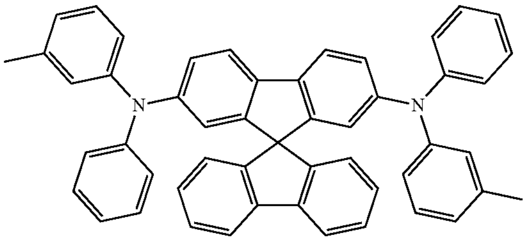

Spiro-NPB

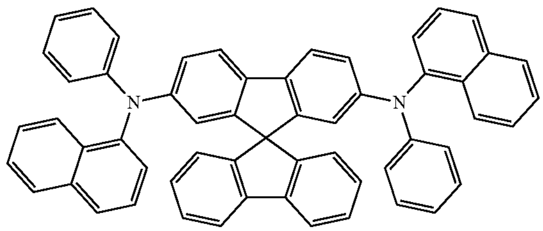

methylated-NPB

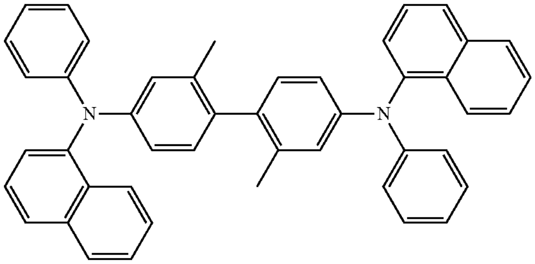

TAPC

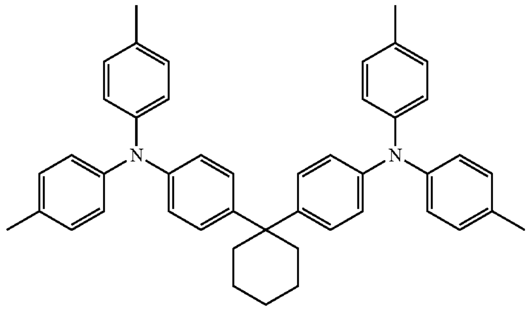

HMTPD

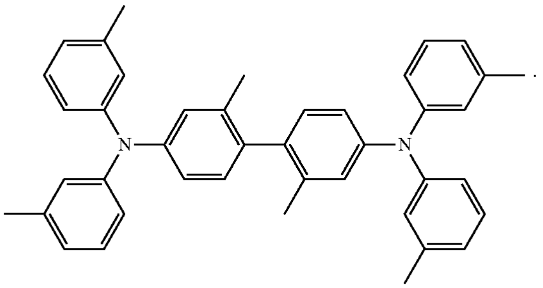

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be less than or equal to about −3.5 eV.

In an embodiment, the p-dopant may include a quinone derivative, a cyano group-containing compound, a compound including element EL1 and element EL2, or any combination thereof.

Examples of a quinone derivative may include TCNQ, F4-TCNQ, and the like.

Examples of a cyano group-containing compound may include HAT-CN, a compound represented by Formula 221, and the like:

[Formula 221]

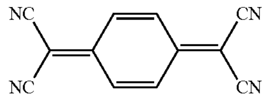

TCNQ

-continued

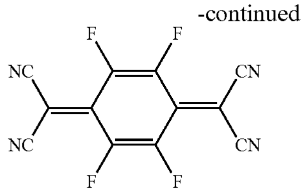

F4-TCNQ

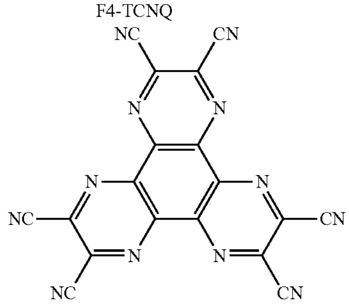

HAT-CN

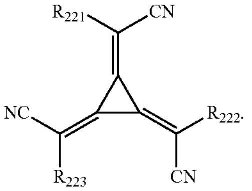

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non metal, a metalloid, or any combination thereof.

Examples of a metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of a metalloid may include silicon (Si), antimony (Sb), tellurium (Te), and the like.

Examples of a non-metal may include oxygen (O), a halogen (for example, F, Cl, Br, I, etc.), and the like.

Examples of a compound including element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of a metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of a metal halide may include an alkali metal halide, an alkaline earth metal halide, a transition metal halide, a post-transition metal halide, a lanthanide metal halide, and the like.

Examples of an alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of an alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, Belt, $MgI_2$, $CaI_2$, $SrI_2$, $BaI_2$, and the like.

Examples of a transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, Felt, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, Nile, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of a post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of a lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and the like.

Examples of a metalloid halide may include an antimony halide (for example, $SbCl_5$, etc.) and the like.

Examples of a metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers contact each other or are separated from each other to emit white light. In embodiments, the emission layer may include two or more materials of a red light-emitting material, a green light-emitting material, and a blue light-emitting material, in which the two or more materials are mixed with each other in a single layer to emit white light.

In an embodiment, the emission layer may include a host and a dopant. The dopant may include a phosphorescent dopant, a fluorescent dopant, or any combination thereof.

An amount of the dopant in the emission layer may be in a range of about 0.01 parts by weight to about 15 parts by weight, based on 100 parts by weight of the host.

In embodiments, the emission layer may include a quantum dot.

In embodiments, the emission layer may include a delayed fluorescence material. The delayed fluorescence material may serve as a host or as a dopant in the emission layer.

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each independently be the same as described in connection with $Q_1$.

In an embodiment, in Formula 301, when xb11 is 2 or more, two or more of $Ar_{301}$ may be linked to each other via a single bond.

In embodiments, the host may include a compound represented by Formula 301-1, a compound represented by Formula 301-2, or any combination thereof:

[Formula 301-1]

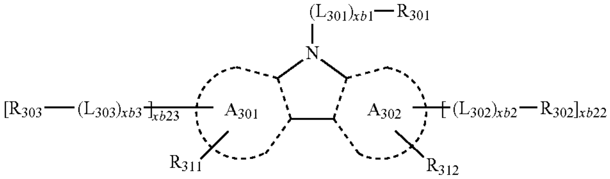

[Formula 301-2]

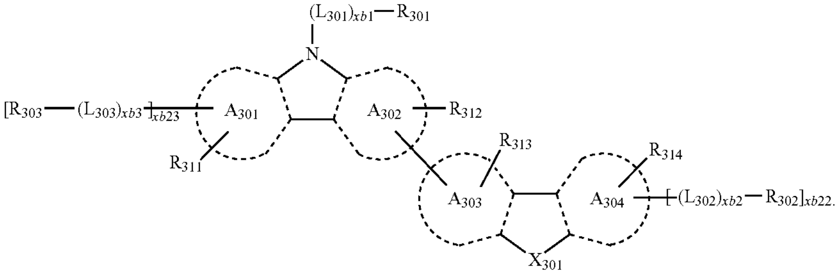

A thickness of the emission layer may be in a range of about 100 Å to about 1,000 Å. For example, the thickness of the emission layer may be in a range of about 200 Å to about 600 Å. When the thickness of the emission layer is within these ranges, excellent luminescence characteristics may be obtained without a substantial increase in driving voltage.

[Host]

The host in the emission layer may include the second compound or the third compound described in the specification, or any combination thereof.

In an embodiment, the host may include a compound represented by Formula 301:

$$[Ar_{301}]_{xb11}\text{-}[(L_{301})_{xb1}\text{-}R_{301}]_{xb21} \quad \text{[Formula 301]}$$

In Formula 301-1 and 301-2, ring A301 to ring A304 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In embodiments, the host may include an alkali earth metal complex, a post-transition metal complex, or any combination thereof. In embodiments, the host may include a Be complex (for example, Compound H55), an Mg complex, a Zn complex, or any combination thereof.

In embodiments, the host may include one of Compounds H1 to H128, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(carbazole-9-yl)biphenyl (CBP), 1,3-di-9-carbazolylbenzene (mCP), 1,3,5-tri(carbazol-9-yl)benzene (TCP), or any combination thereof:

H1

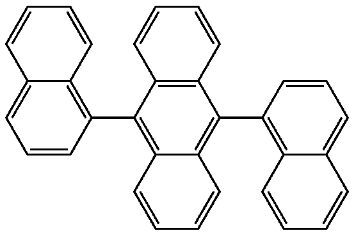

H2

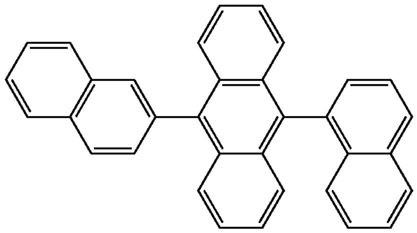

H3

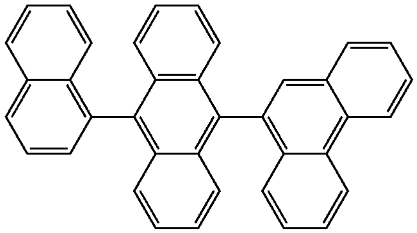

H4

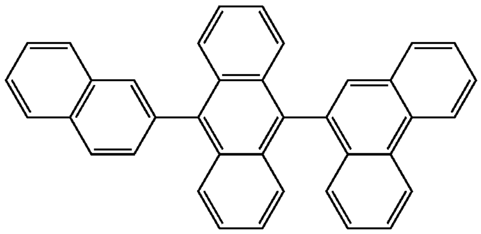

H5

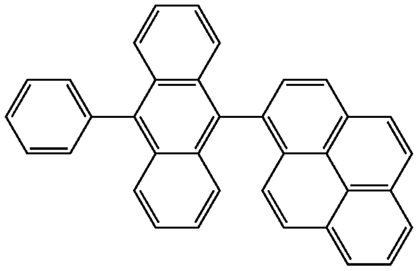

-continued

H6

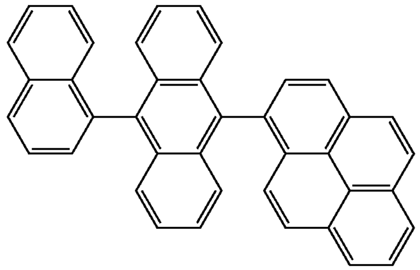

H7

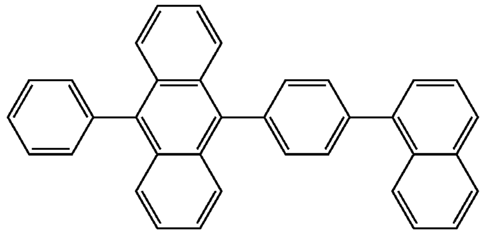

H8

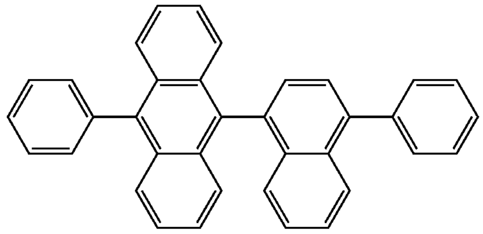

H9

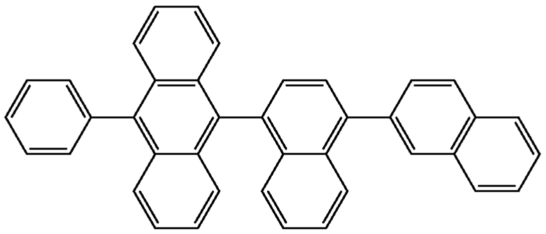

H10

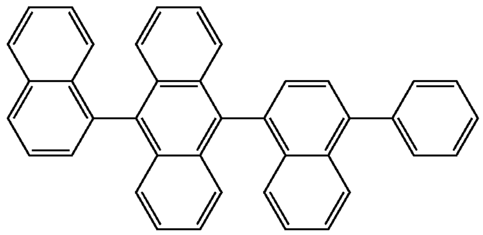

H11

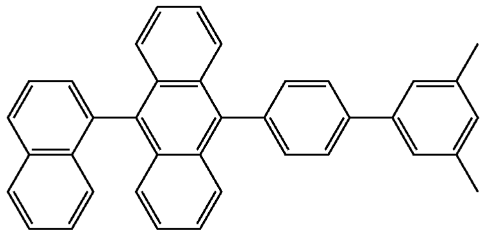

-continued
H12
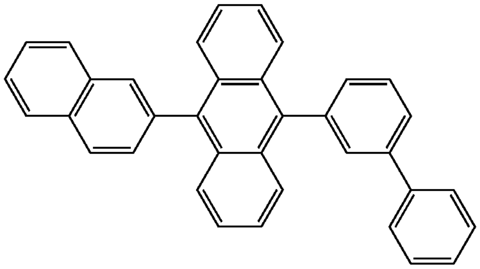
H13
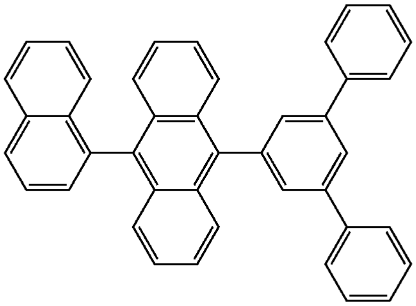
H14
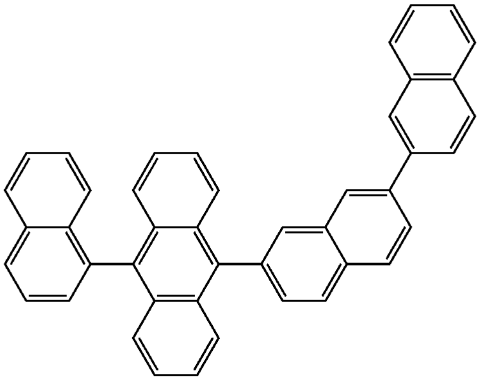
H15
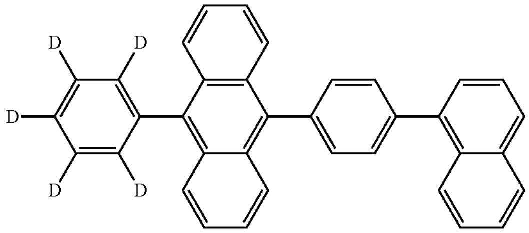
H16
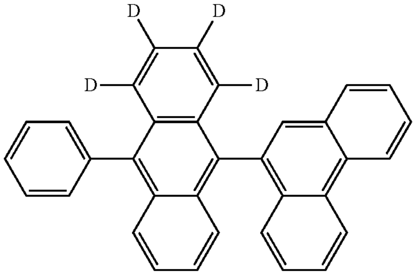
-continued
H17
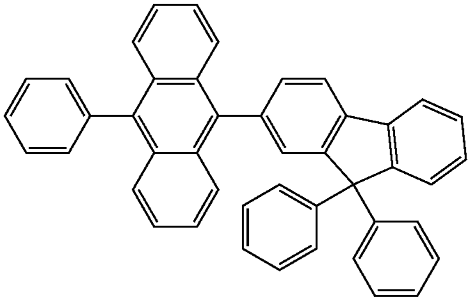
H18
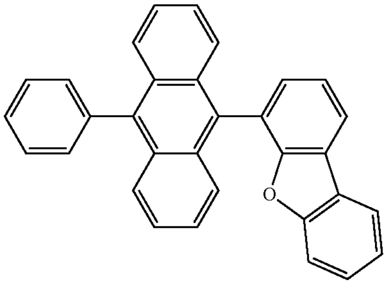
H19
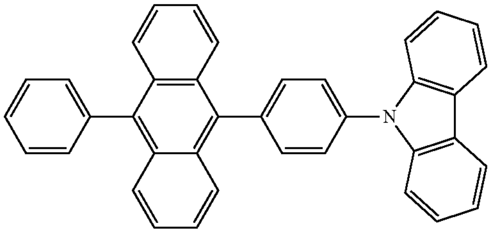
H20
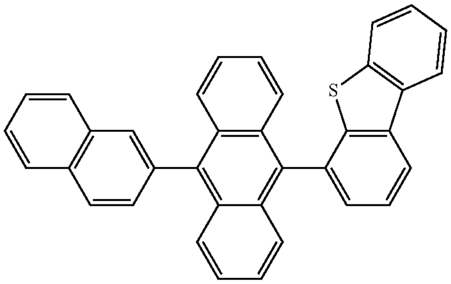
H21
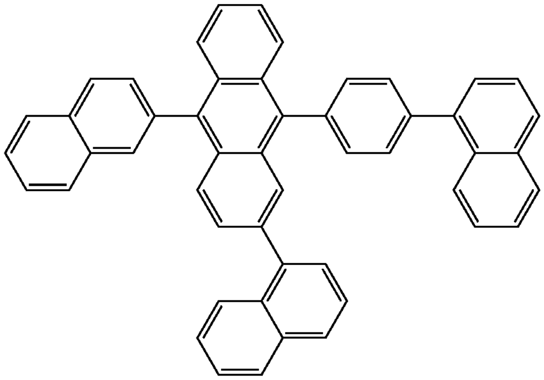

-continued
H22
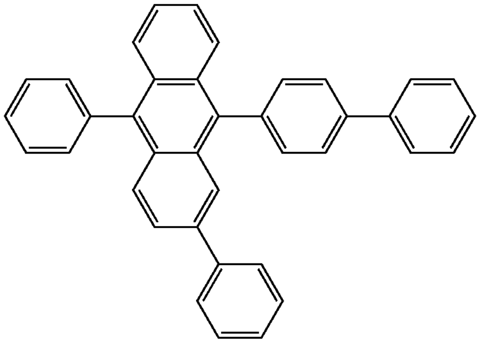
H23
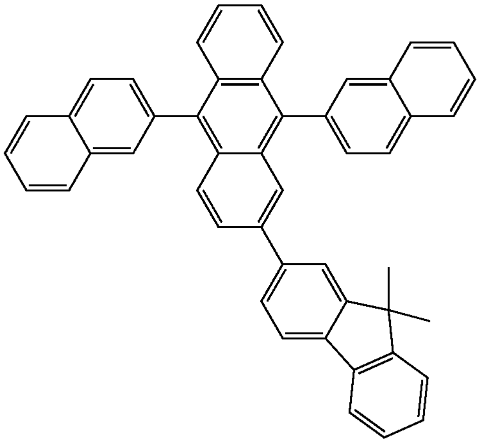
H24
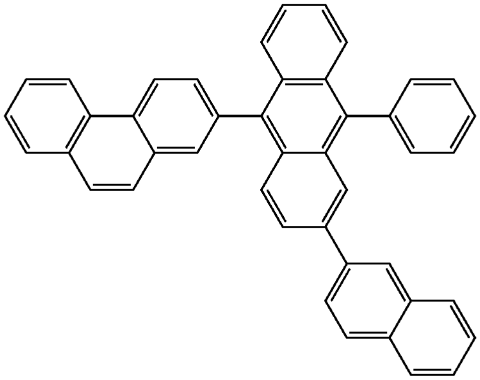
-continued
H25
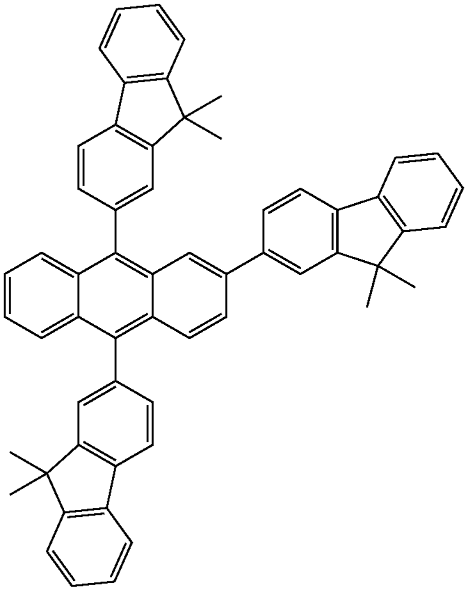
H26
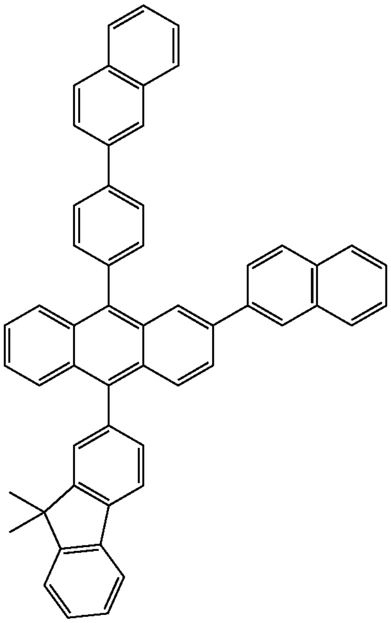

-continued
H27
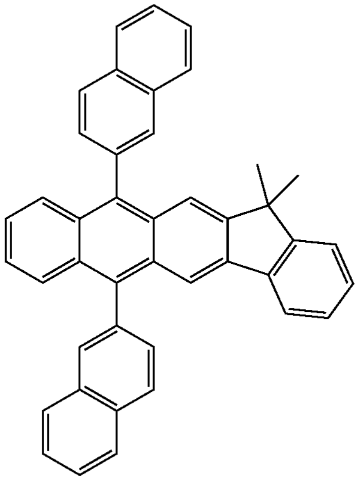
H28
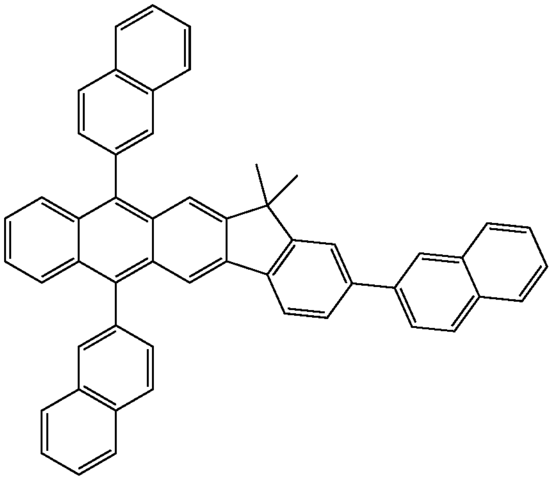
H29
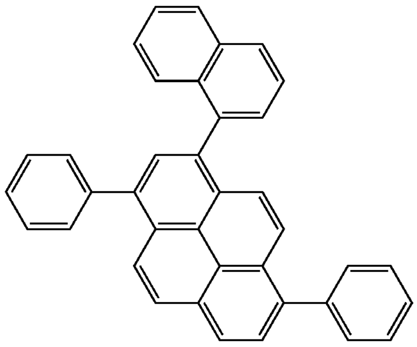
-continued
H30
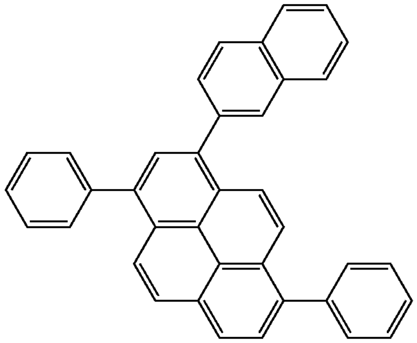
H31
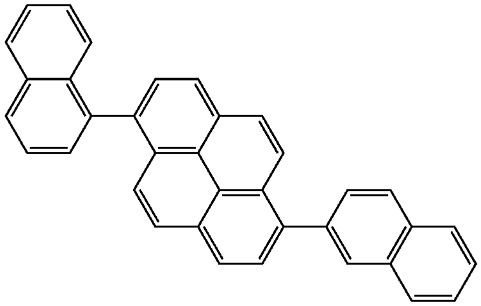
H32
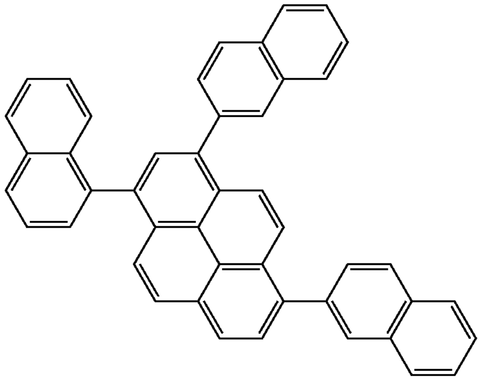
H33
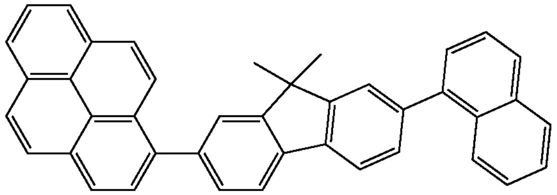
H34
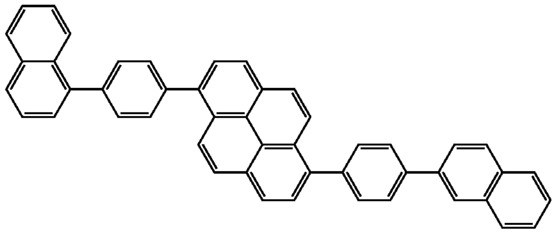

-continued
H35
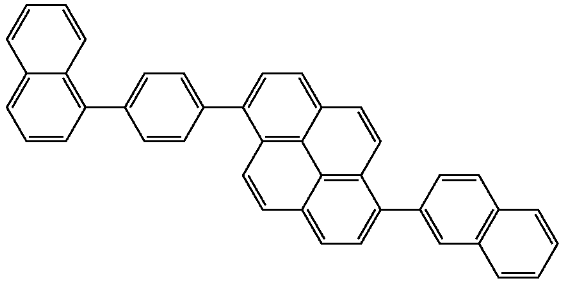
H36
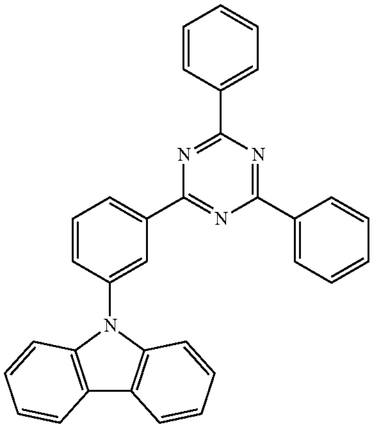
H37
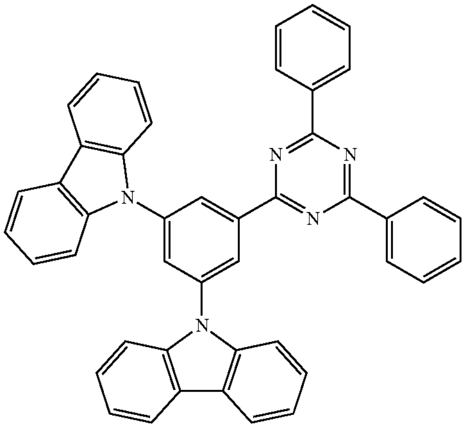
H38
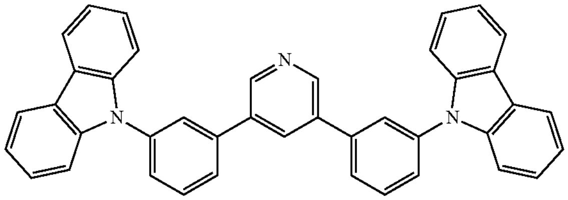
-continued
H39
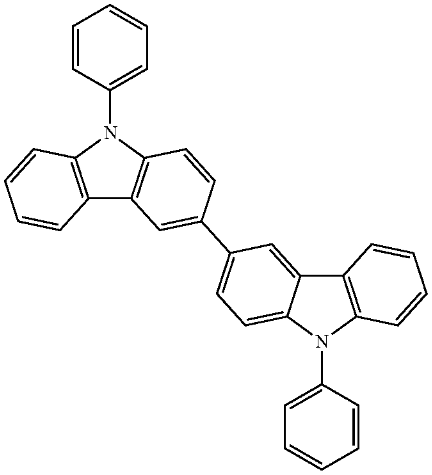
H40
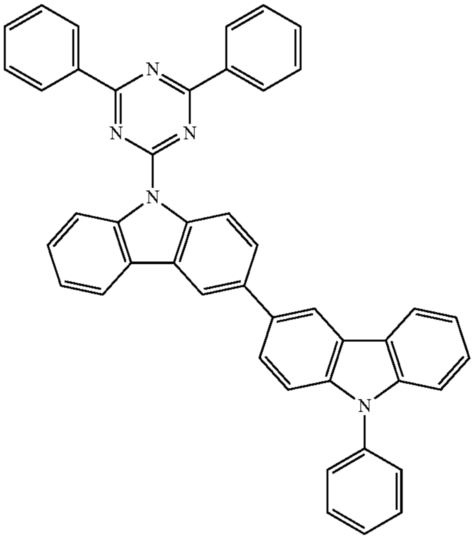
H41
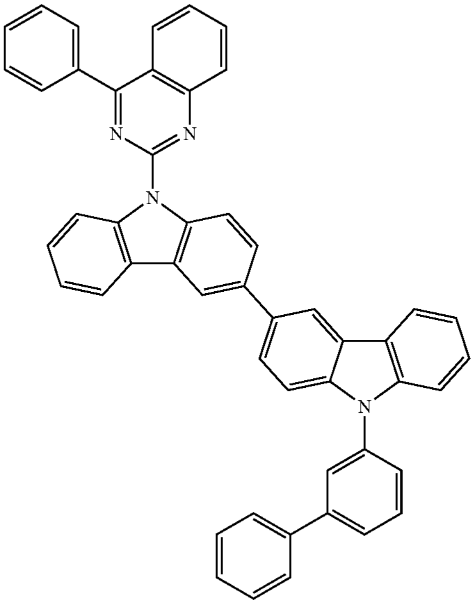

H42
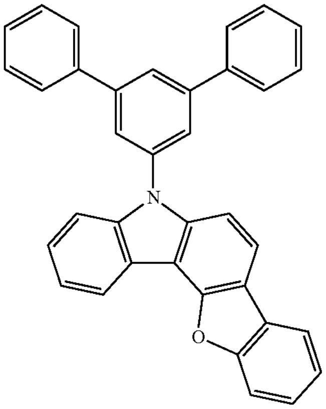
H43
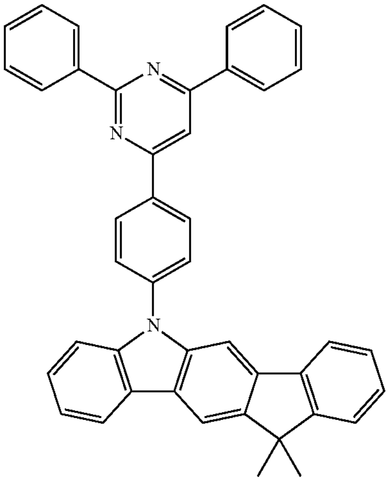
H44
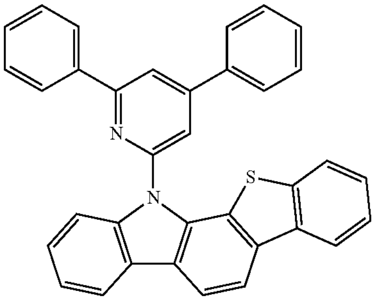
H45
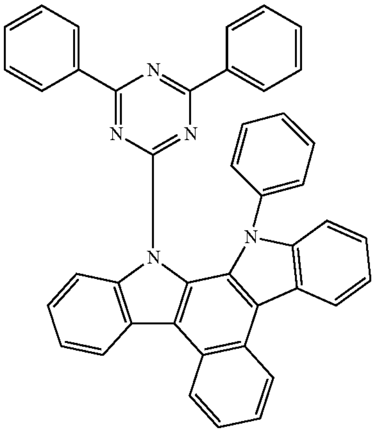
H46
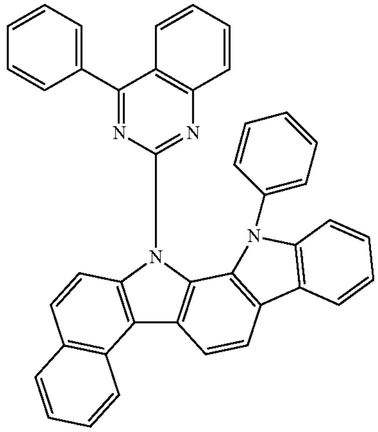
H47
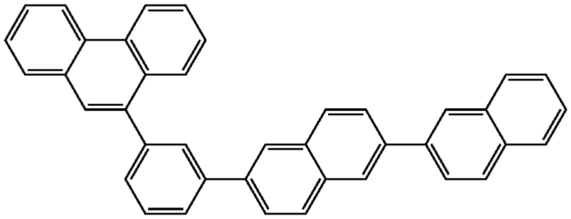
H48
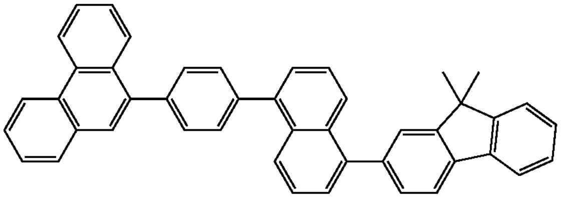
H49
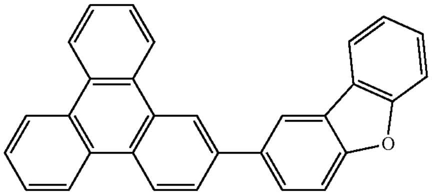
H50
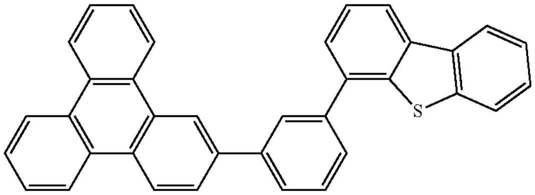
H51
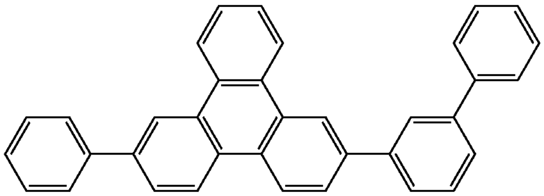

-continued
H52
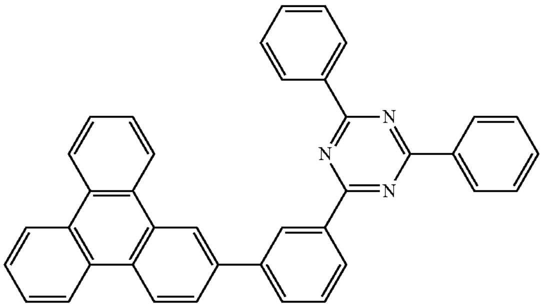
H53
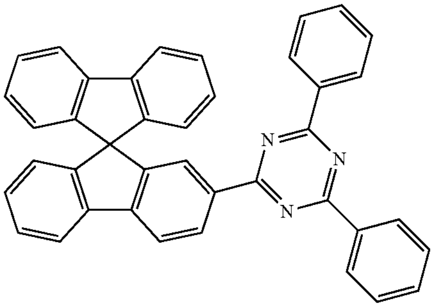
H54
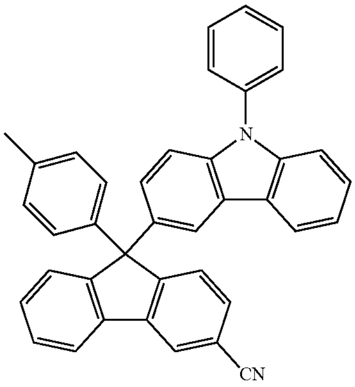
H55
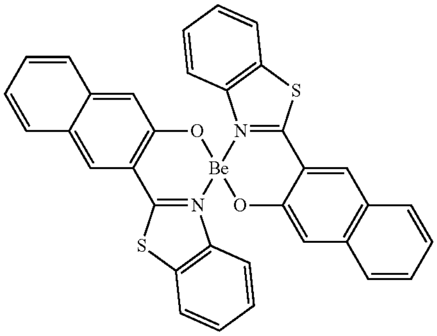
-continued
H56
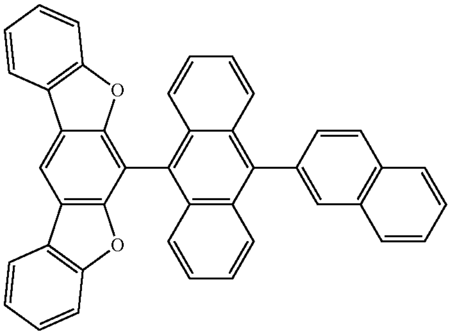
H57
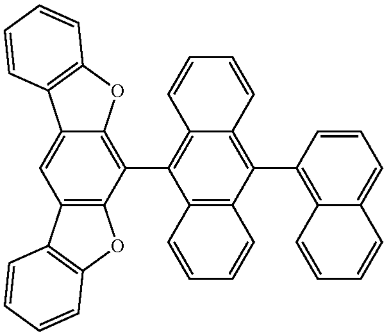
H58
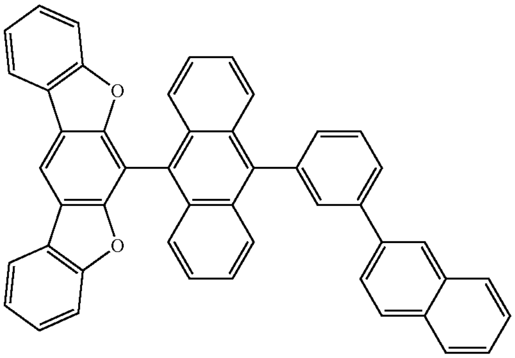
H59
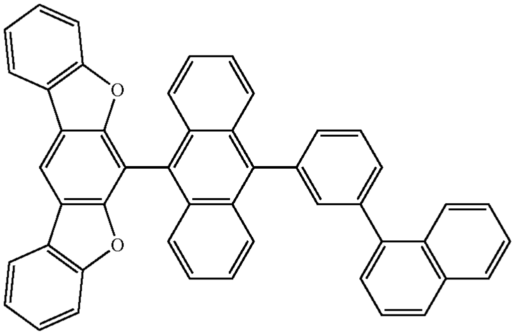

-continued
H60
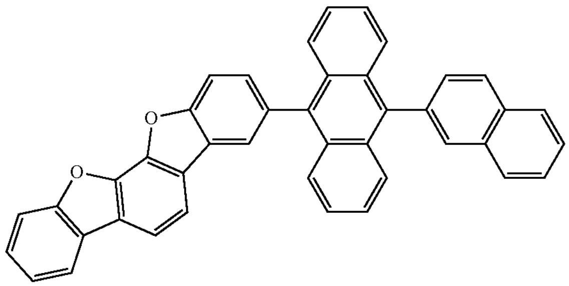
H61
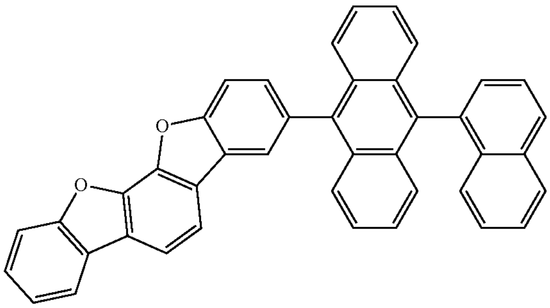
H62
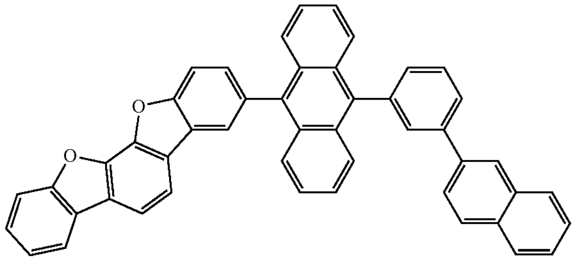
H63
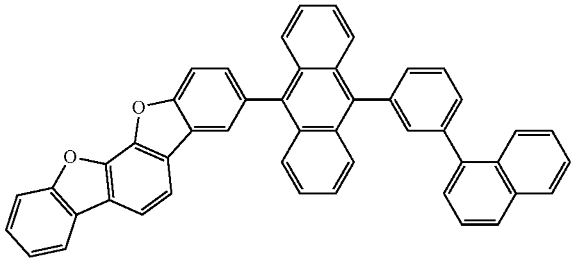
H64
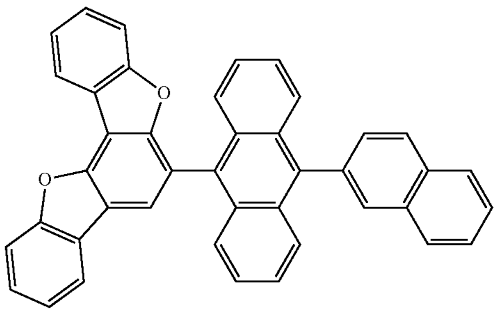
-continued
H65
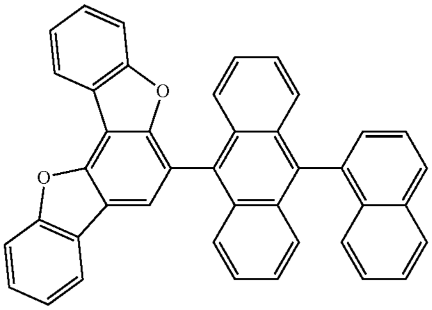
H66
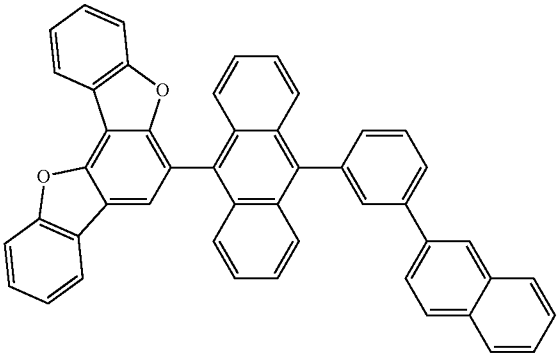
H67
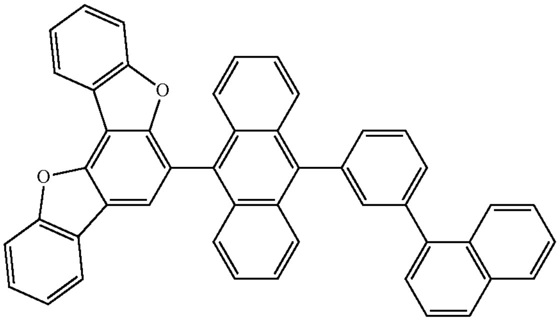
H68
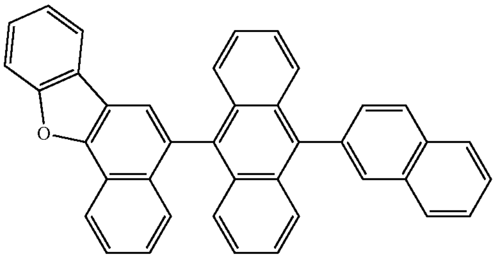
H69
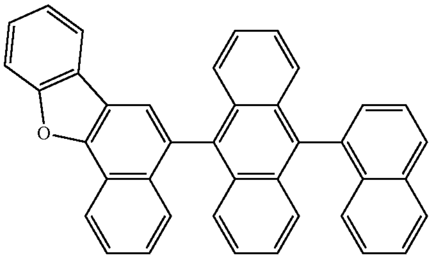

-continued
H70
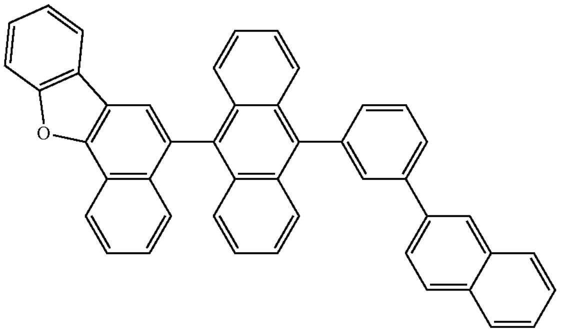
H71
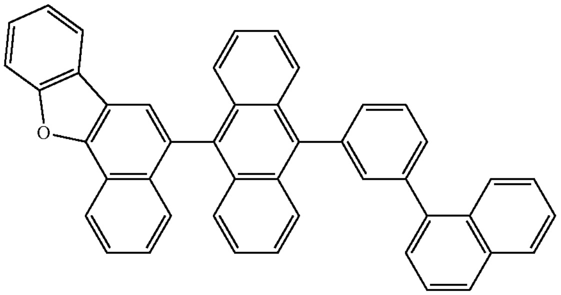
H72
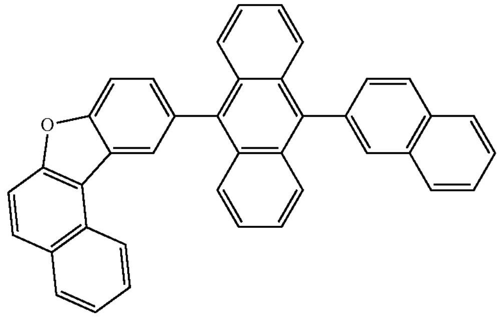
H73
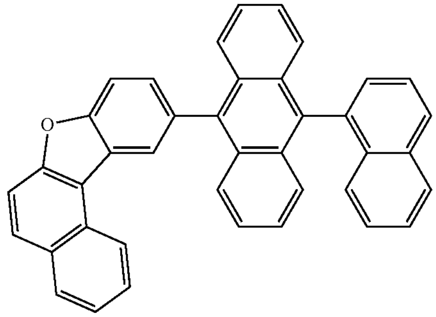
-continued
H74
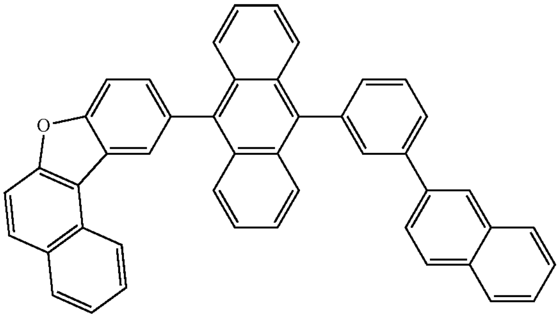
H75
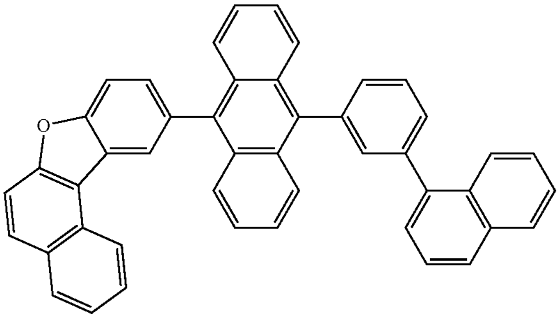
H76
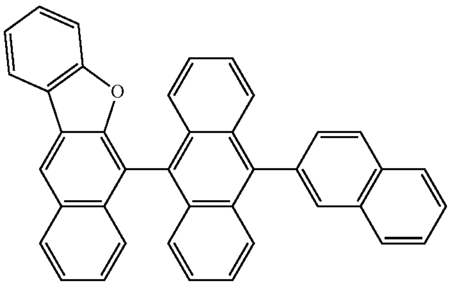
H77
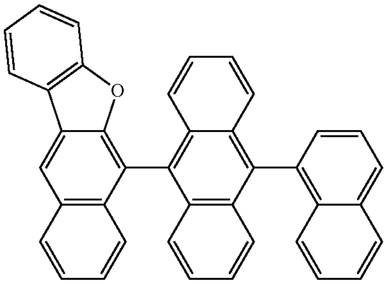
H78
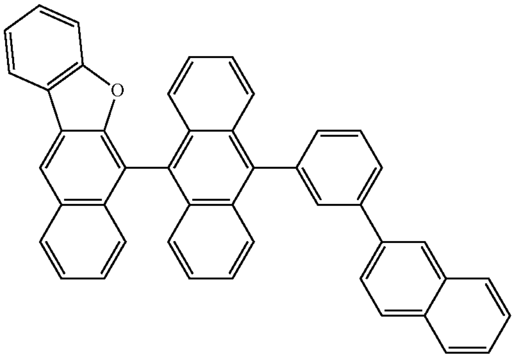

-continued
H79
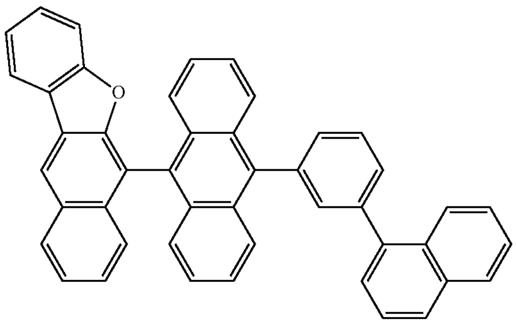
H80
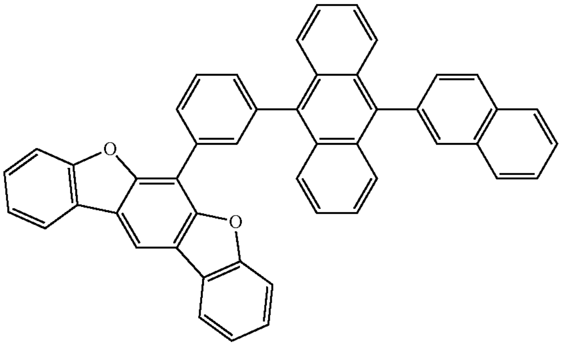
H81
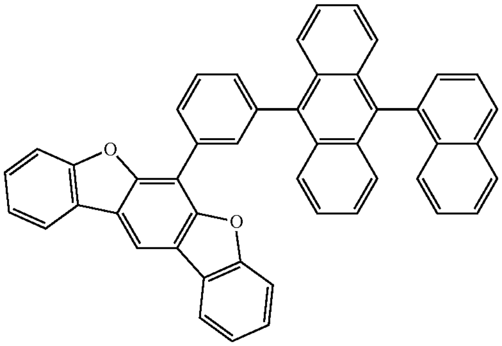
H82
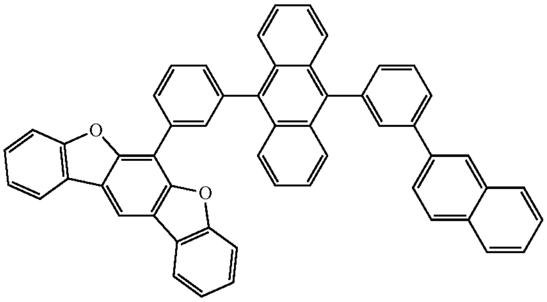
-continued
H83
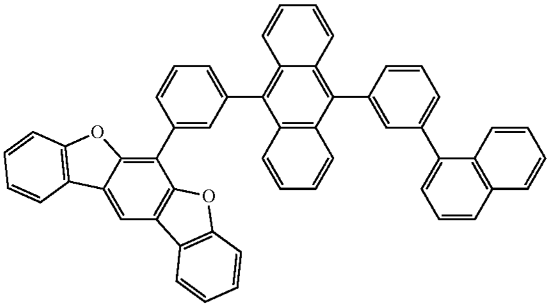
H84
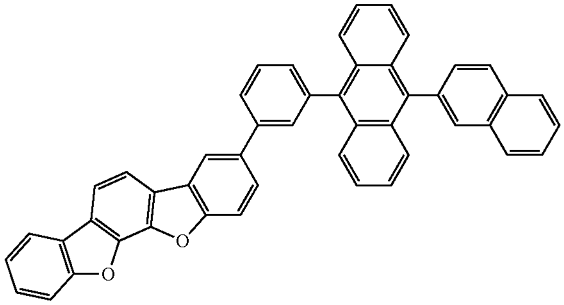
H85
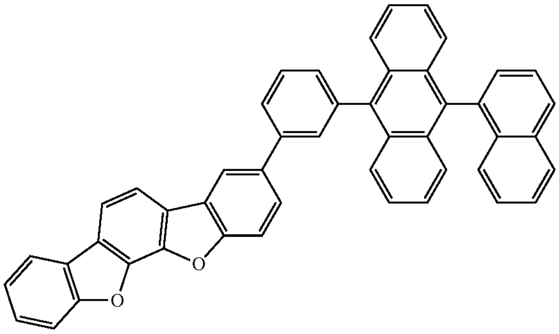
H86
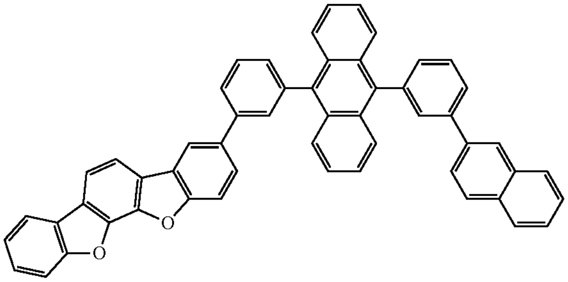
H87
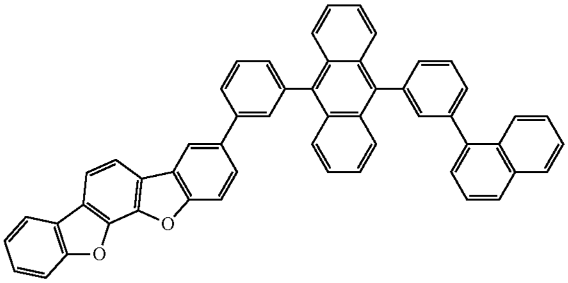

-continued
H88
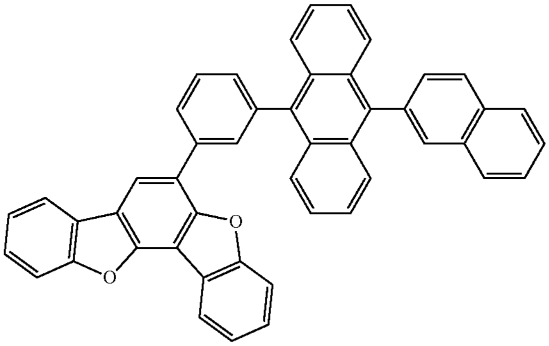
H89
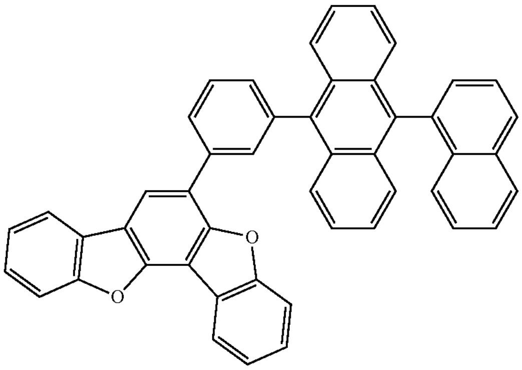
H90
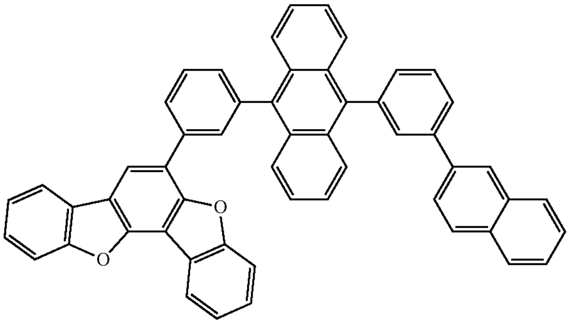
H91
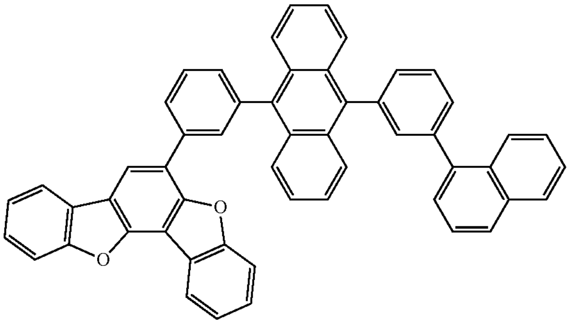
-continued
H92
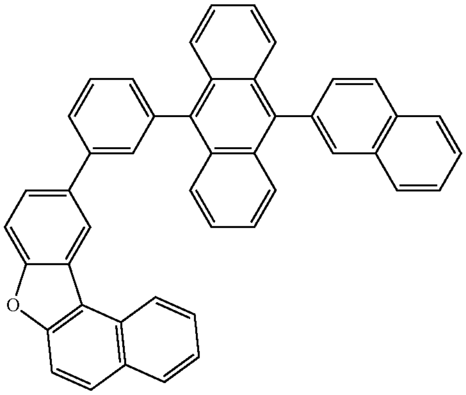
H93
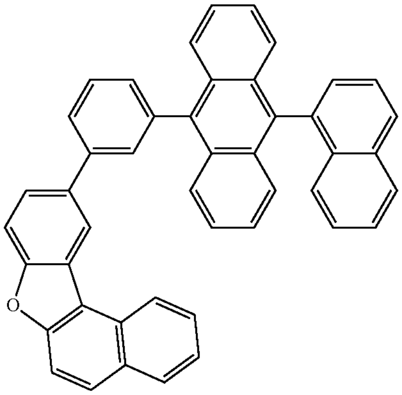
H94
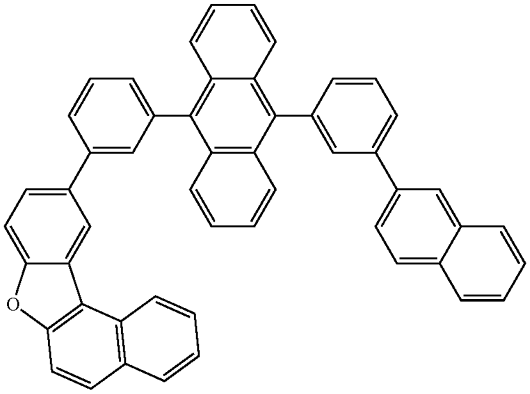
H95
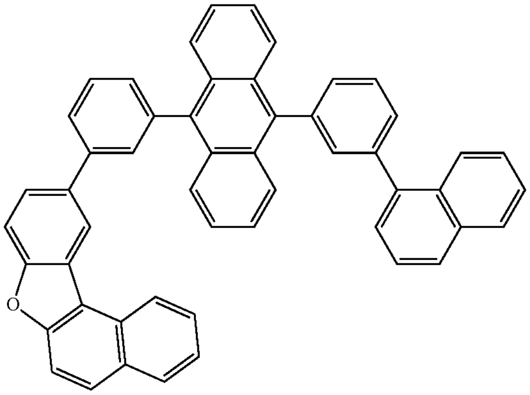

-continued
H96
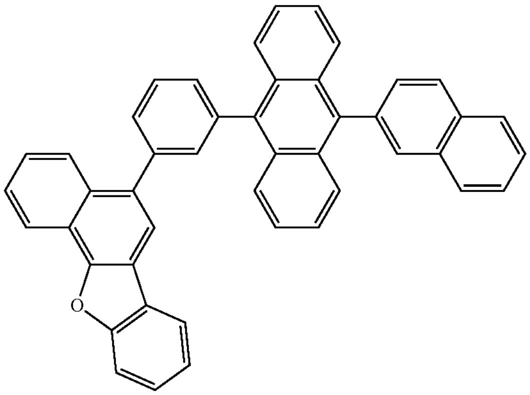
H97
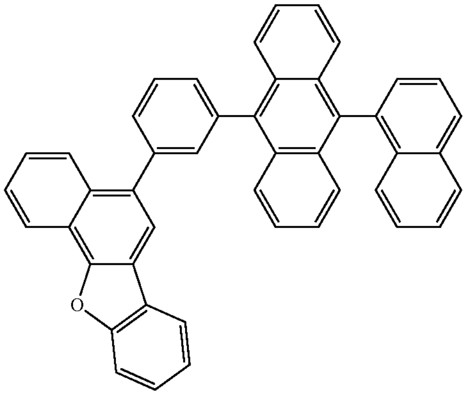
H98
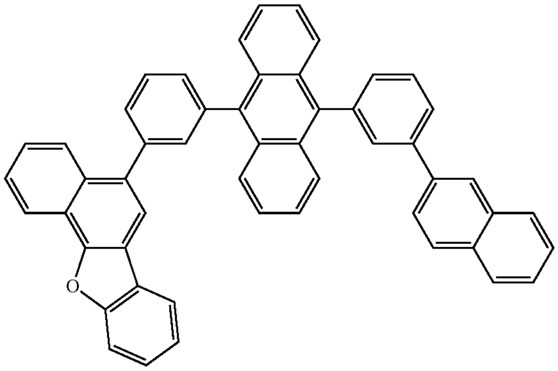
H99
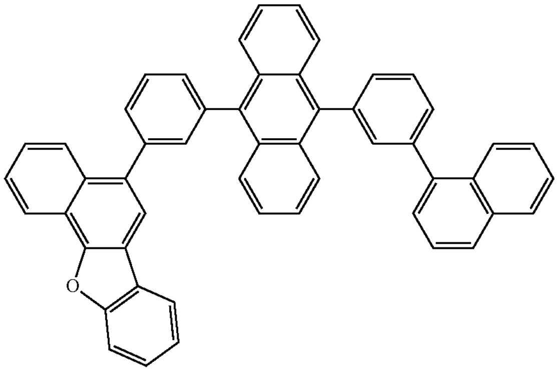
-continued
H100
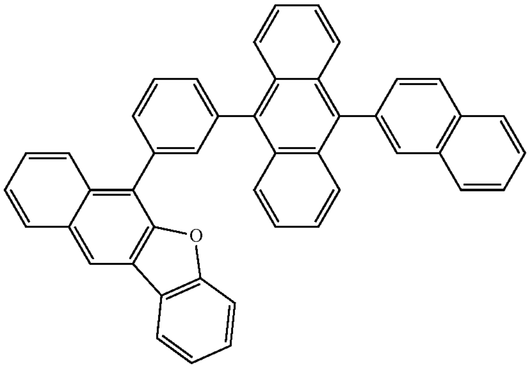
H101
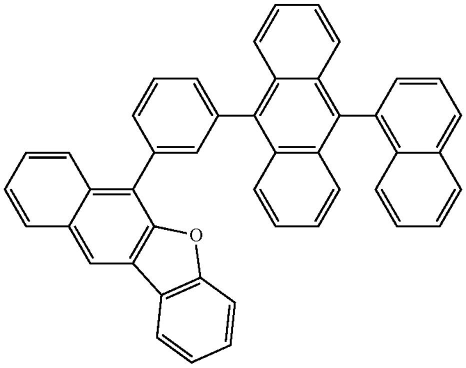
H102
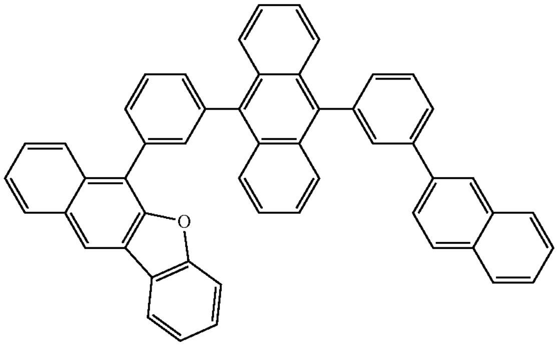
H103
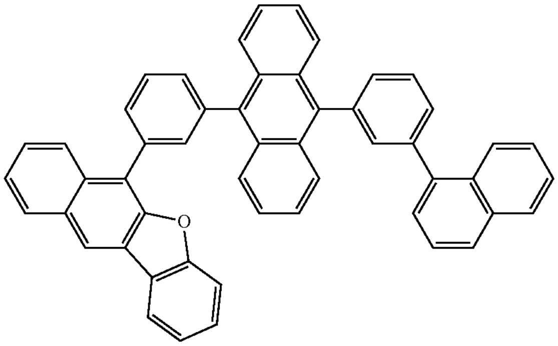

-continued
H104
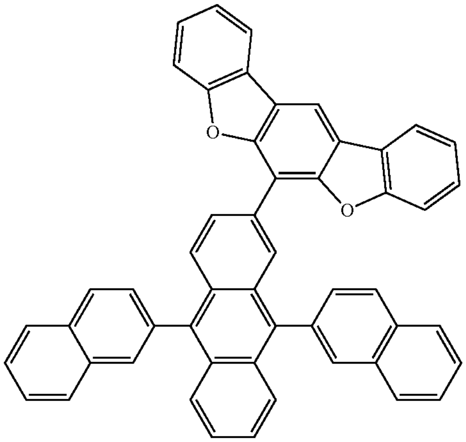
H105
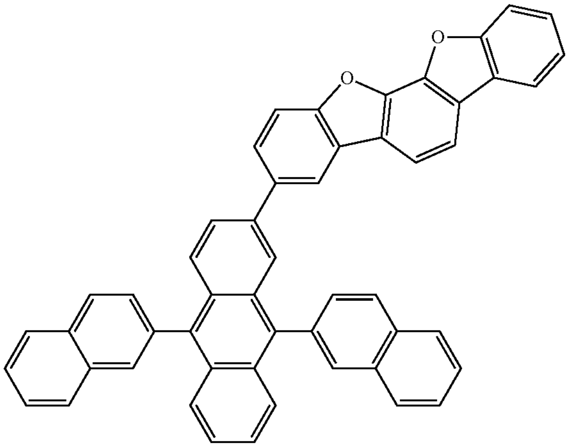
H106
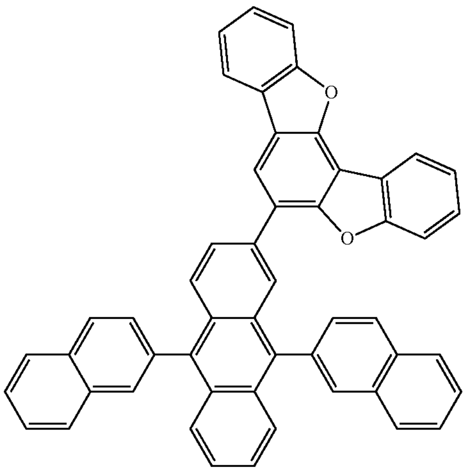
-continued
H107
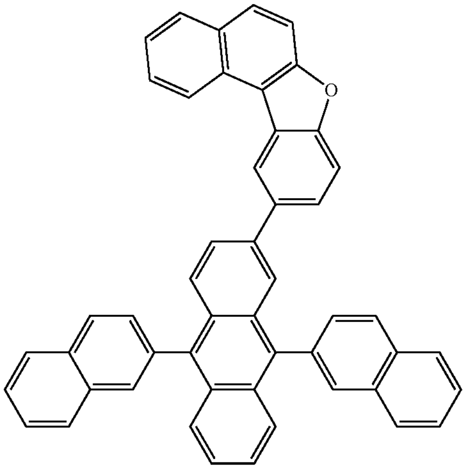
H108
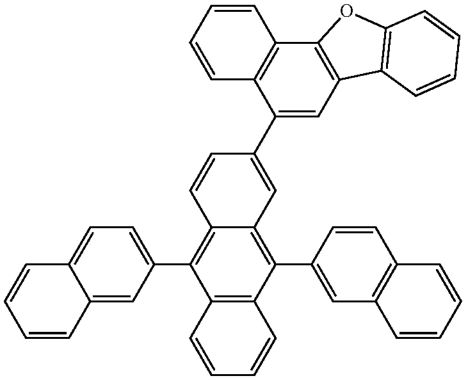
H109
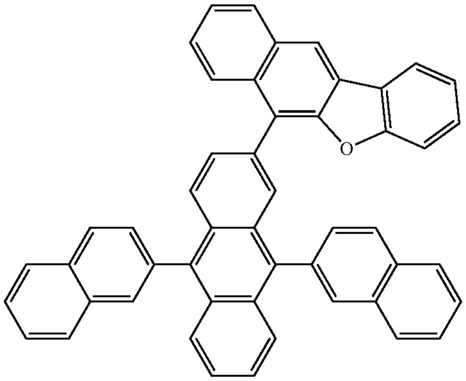
H110
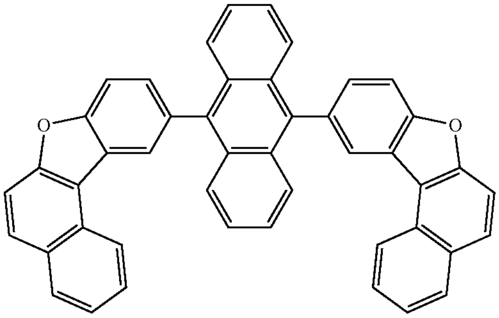

-continued
H111
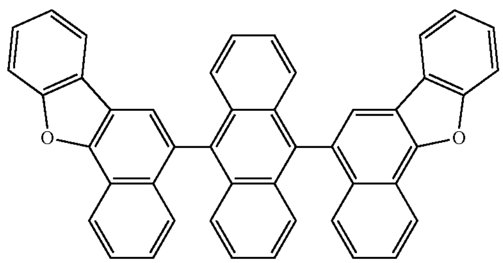
H112
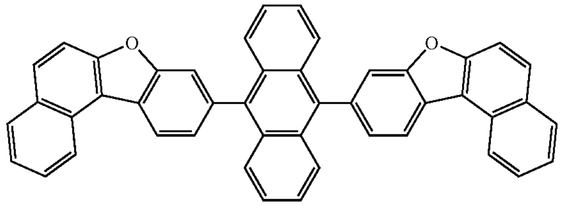
H113
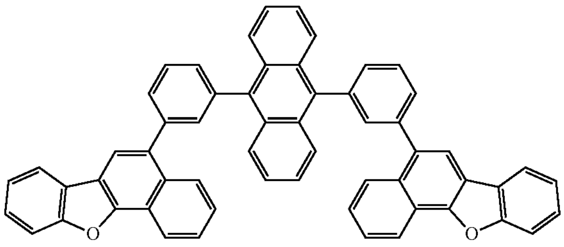
H114
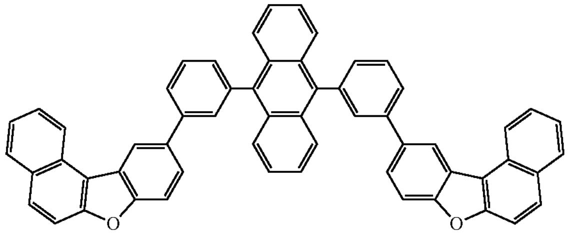
H115
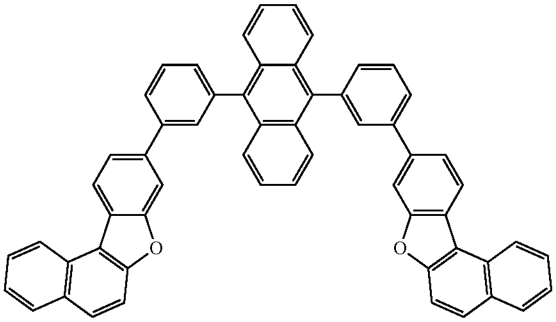
-continued
H116
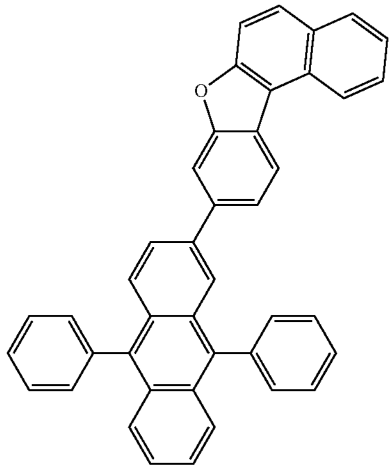
H117
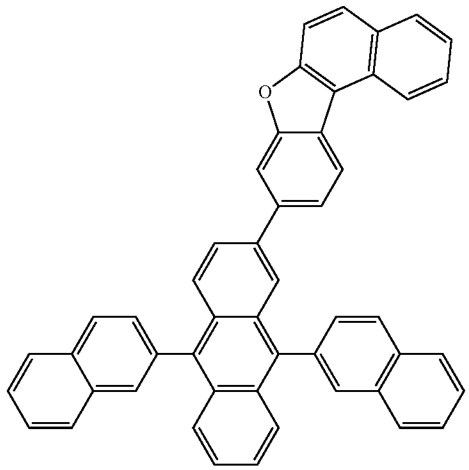
H118
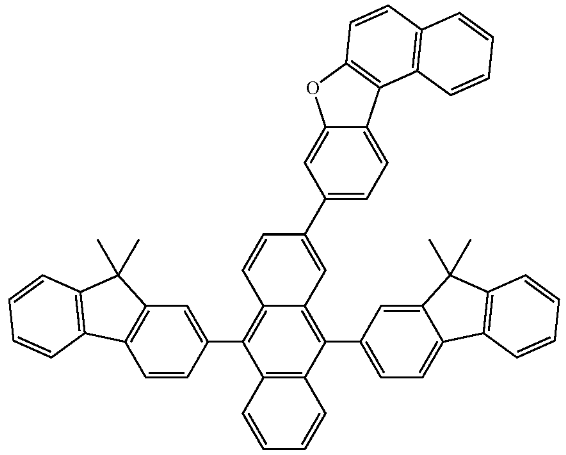

H119
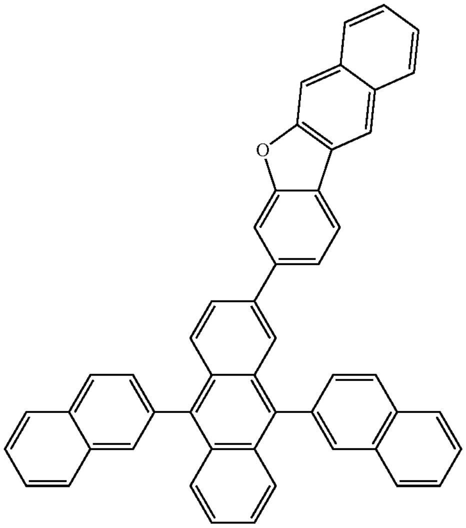
H120
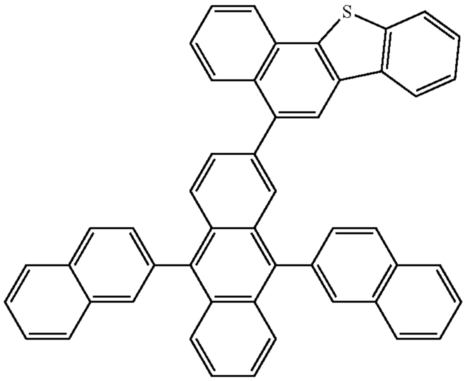
H121
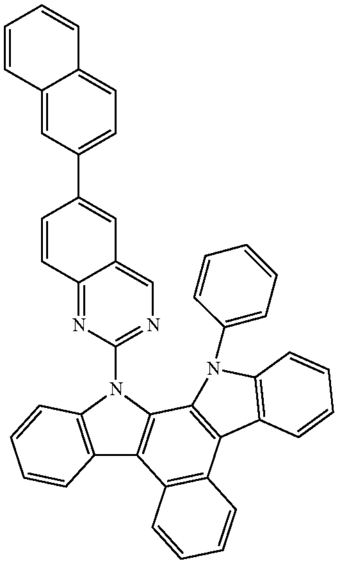
H122
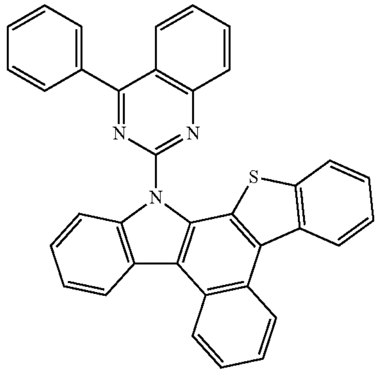
H123
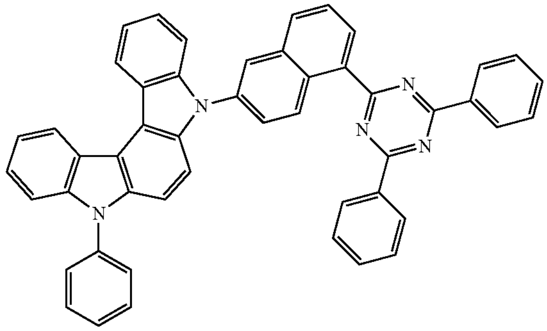
H124
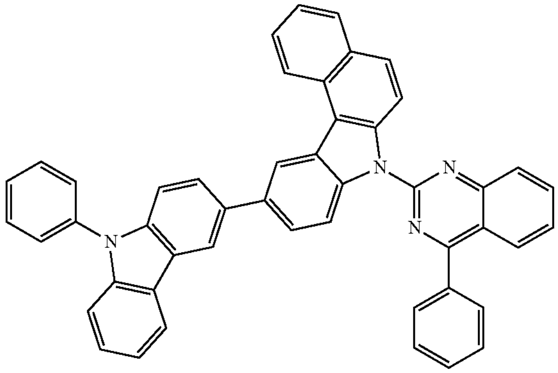
H125
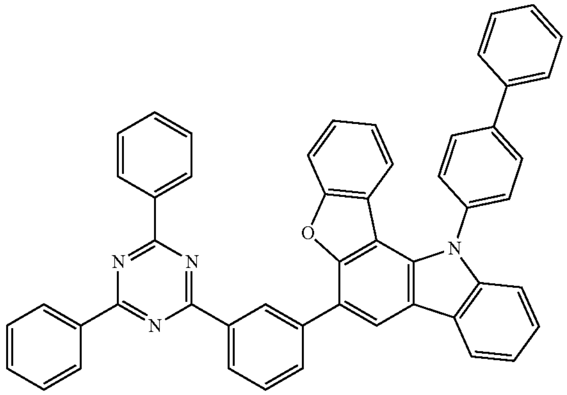

-continued

H126

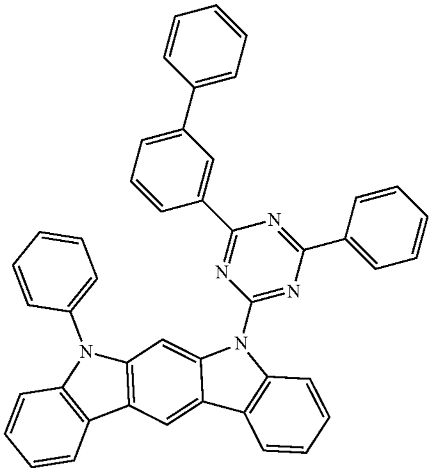

H127

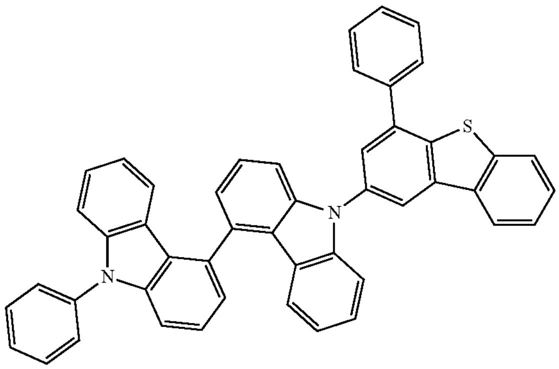

H128

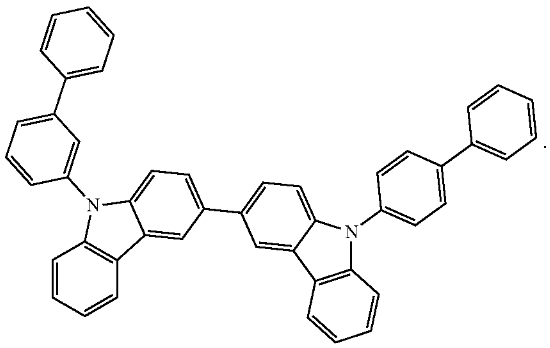

The host may have various modifications. For example, the host may include only one kind of compound, or may include two or more kinds of different compounds.

[Phosphorescent Dopant]

The emission layer may include the first compound as described in the specification, as a phosphorescent dopant.

In an embodiment, when the emission layer includes the first compound as described in the specification and the first compound serves as an auxiliary dopant, the emission layer may include a phosphorescent dopant.

The phosphorescent dopant may be the organometallic compound represented by Formula 1.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

[Formula 401]

$$M(L_{401})_{xc1}(L_{402})_{xc2}$$

[Formula 402]

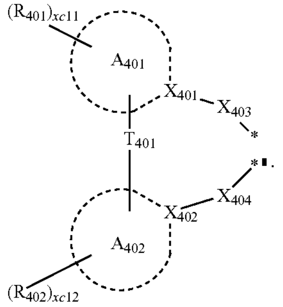

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$ may be identical to or different from each other, $L_{402}$ may be an organic ligand, and xc2 may be 0, 1, 2, 3, or 4, wherein when xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*'*—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicates a binding site to M in Formula 401.

In an embodiment, in Formula 402, $X_{401}$ may be nitrogen and $X_{402}$ may be carbon, or $X_{401}$ and $X_{402}$ may each be nitrogen.

In an embodiment, in Formula 401, when xc1 is 2 or more, two ring $A_{401}$(s) among two or more of $L_{401}$ may optionally be linked to each other via $T_{402}$, which is a linking group, and two ring $A_{402}$(s) among two or more of $L_{401}$ may optionally be linked to each other via $T_{403}$, which is a linking group (see Compounds PD1 to PD4 and PD7). $T_{402}$ and $T_{403}$ may each independently be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(═O), an isonitrile group, a —CN group, a phosphorus group (for example, a phosphine group, a phosphite group, etc.), or any combination thereof.

The phosphorescent dopant may include, for example, one of Compounds PD1 to PD39, or any combination thereof:

PD1

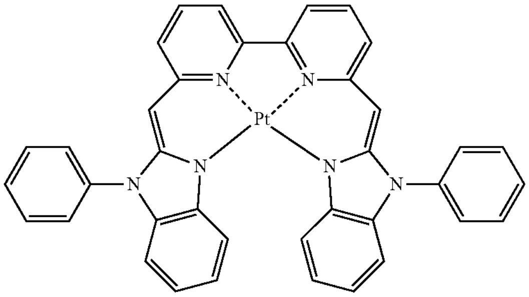

PD2

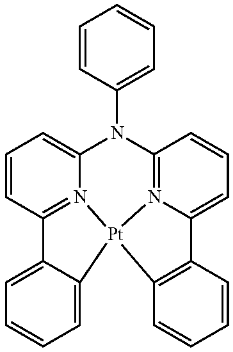

PD3

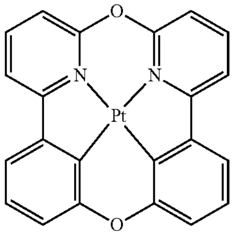

-continued

PD4

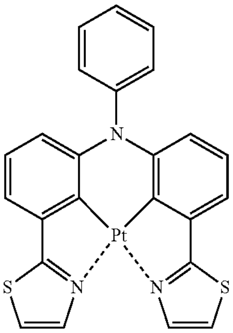

PD5

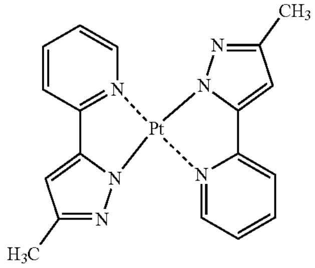

PD6

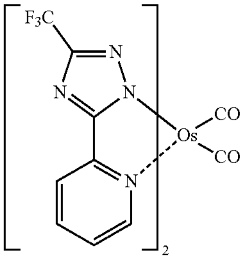

PD7

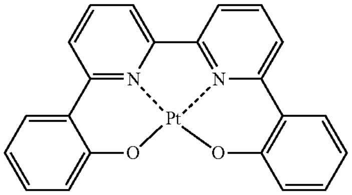

PD8

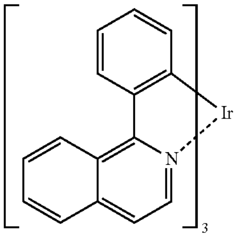

PD9

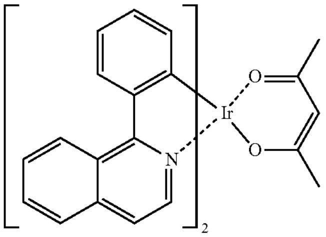

-continued
PD10
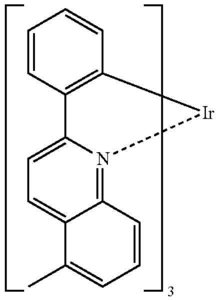
PD11
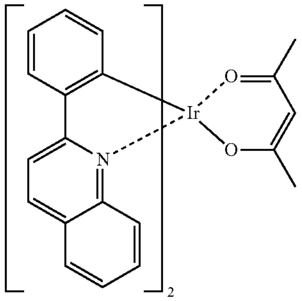
PD12
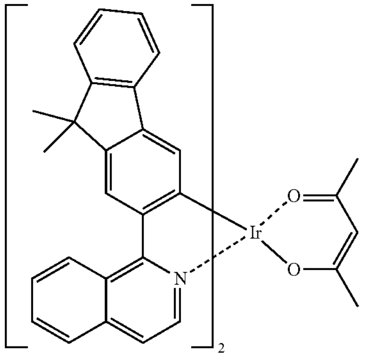
PD13
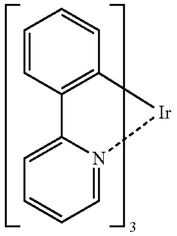
PD14
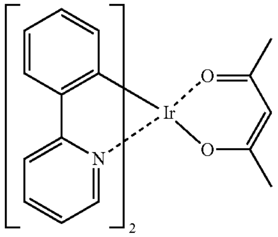
-continued
PD15
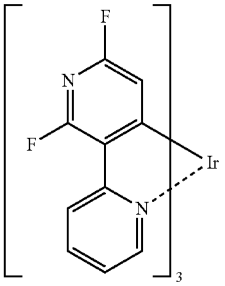
PD16
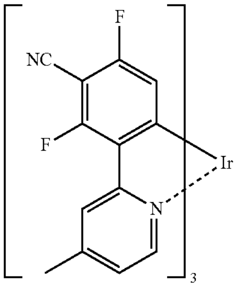
PD17
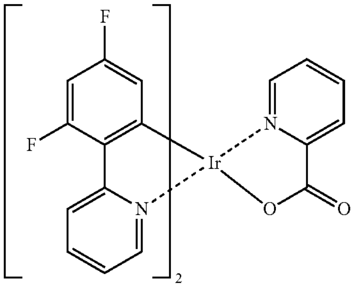
PD18
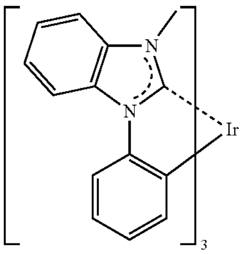
PD19
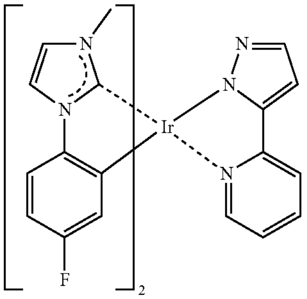

-continued
PD20
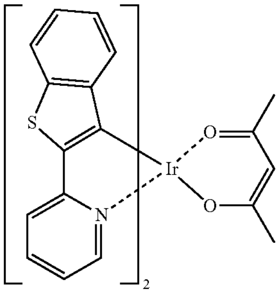
PD21
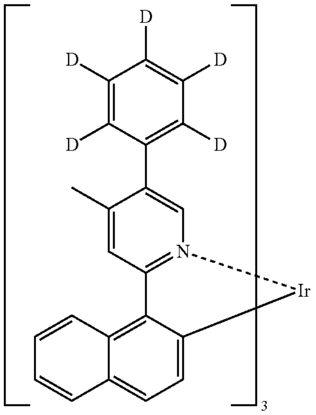
PD22
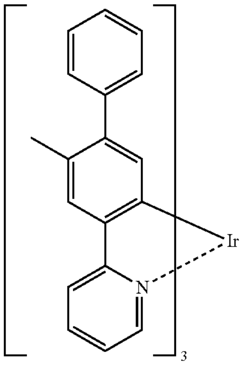
PD23
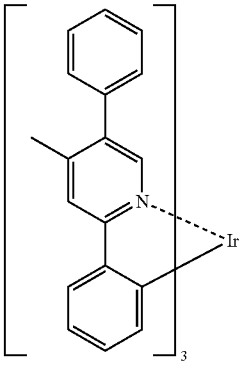
-continued
PD24
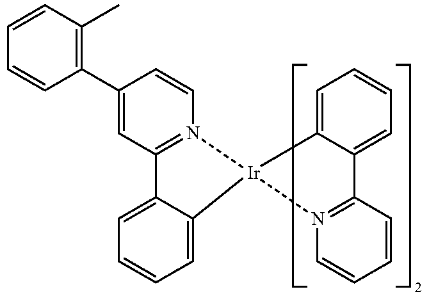
PD25
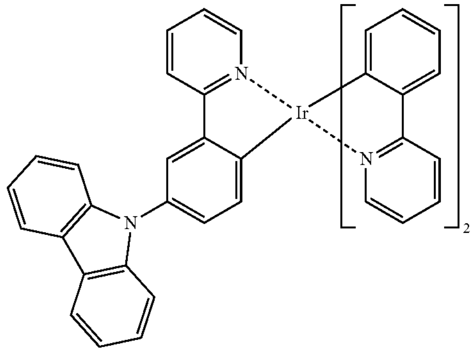
PD32
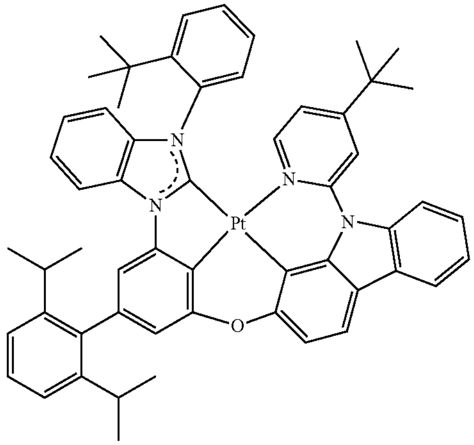
PD33
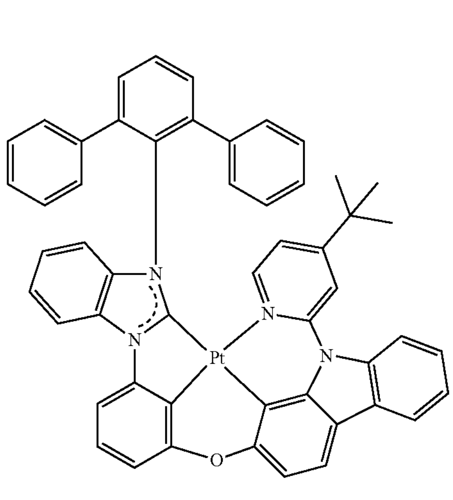

-continued

PD34

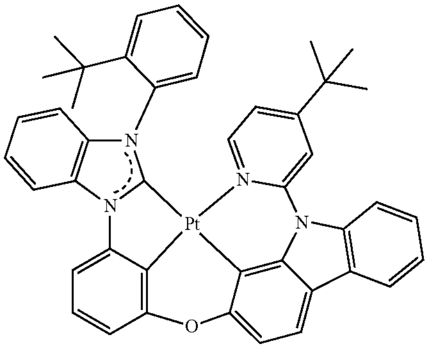

PD35

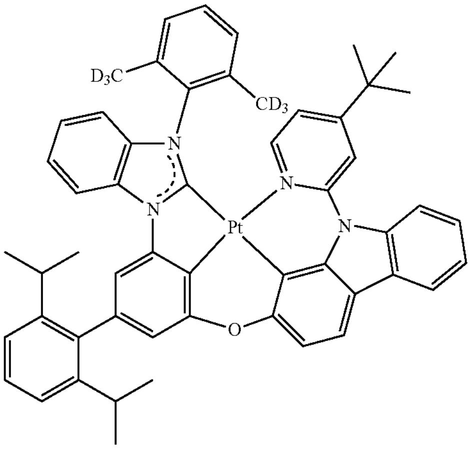

PD36

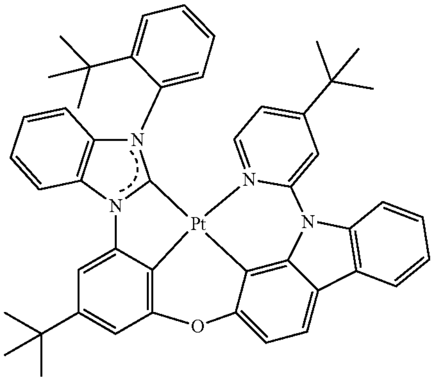

PD37

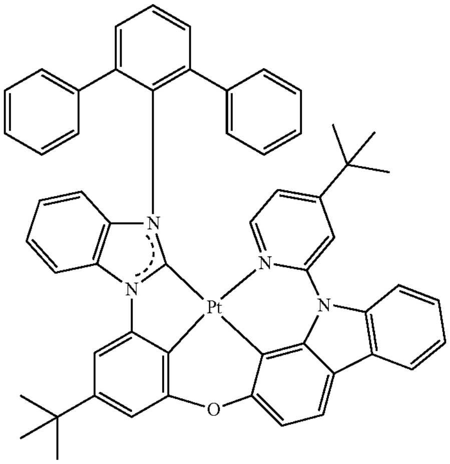

-continued

PD38

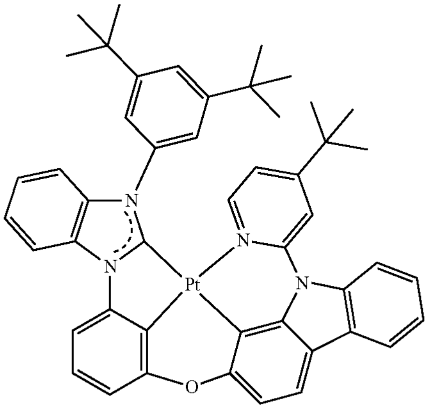

PD39

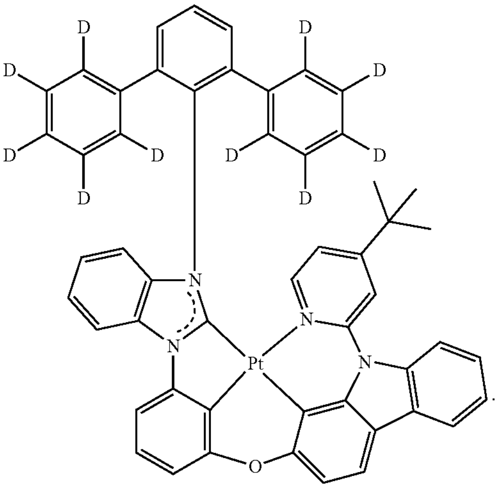

[Fluorescent Dopant]

When the emission layer includes the first compound as described in the specification and the first compound serves as an auxiliary dopant, the emission layer may further include a fluorescent dopant.

In an embodiment, when the emission layer includes the first compound as described in the specification and the first compound serves as a phosphorescent dopant, the emission layer may further include an auxiliary dopant.

The fluorescent dopant and the auxiliary dopant may each independently include an amine group-containing compound, a styryl group-containing compound, or any combination thereof.

In an embodiment, the fluorescent dopant and the auxiliary dopant may each independently include a compound represented by Formula 501:

[Formula 501]

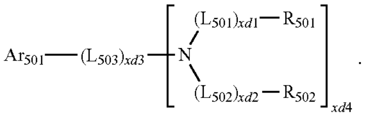

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, a pyrene group, etc.) in which three or more monocyclic groups are condensed together.

In an embodiment, in Formula 501, xd4 may be 2.

In an embodiment, the fluorescent dopant and the auxiliary dopant may each independently include one of Compounds FD1 to FD37, DPVBi, DPAVBi, or any combination thereof:

FD1

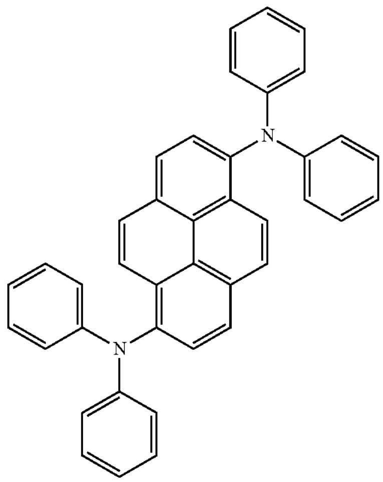

FD2

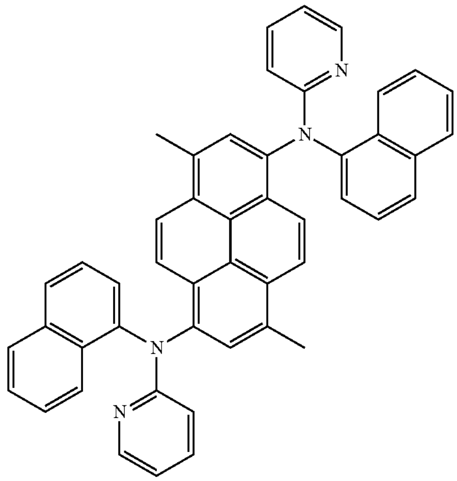

-continued
FD3
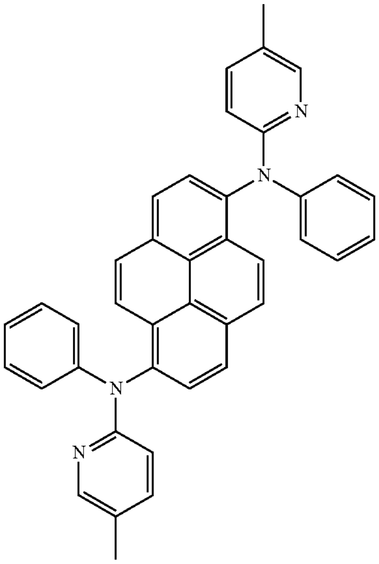
FD4
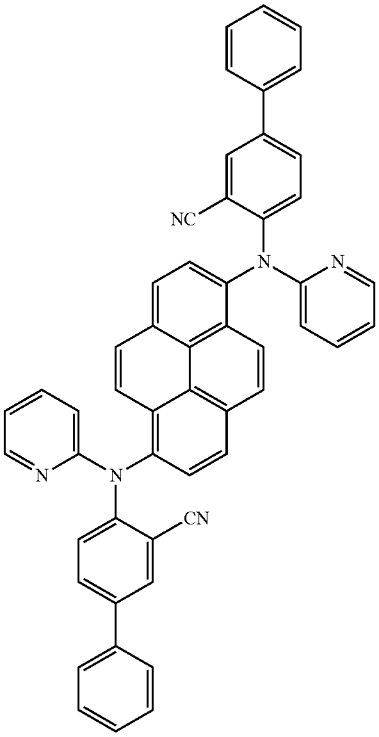

-continued
FD5
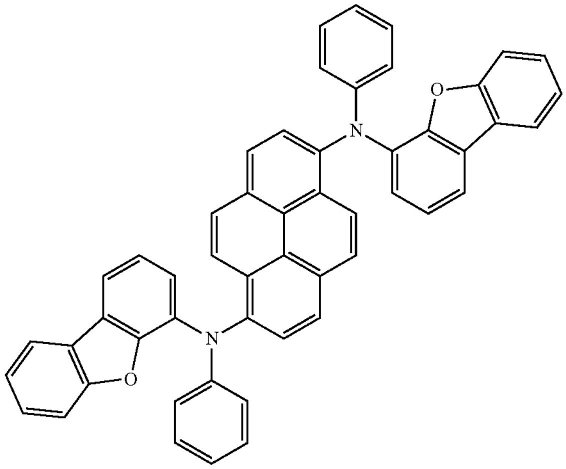
FD6
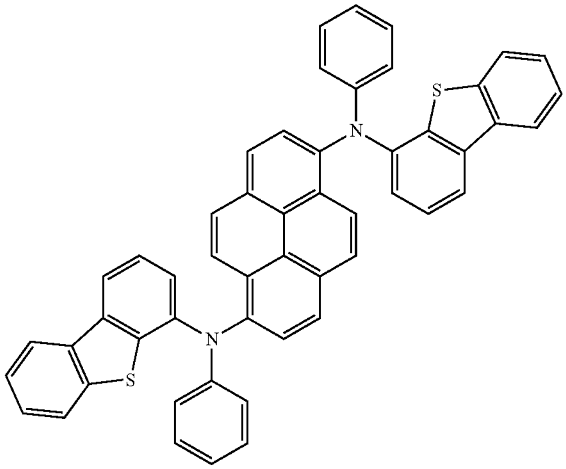
FD7
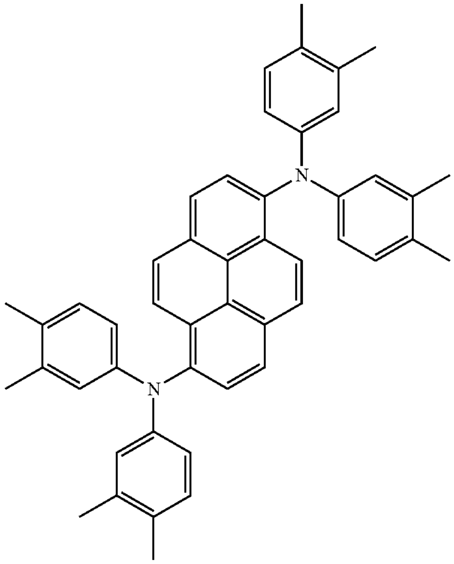

-continued
FD8
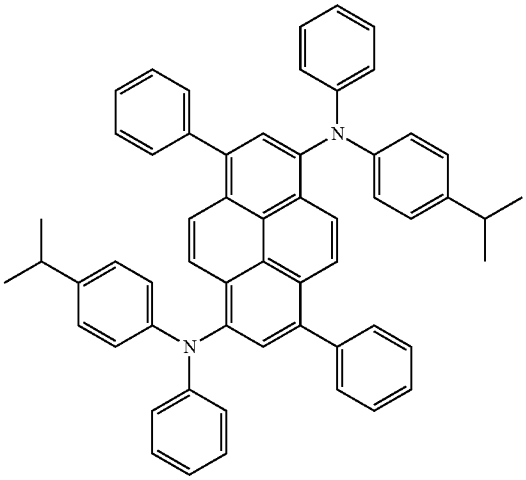
FD9
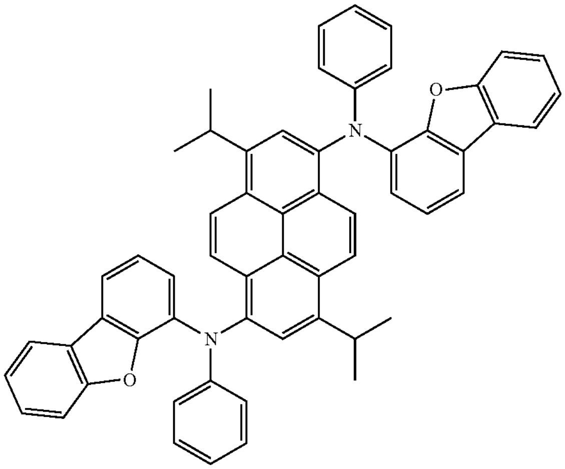
FD10
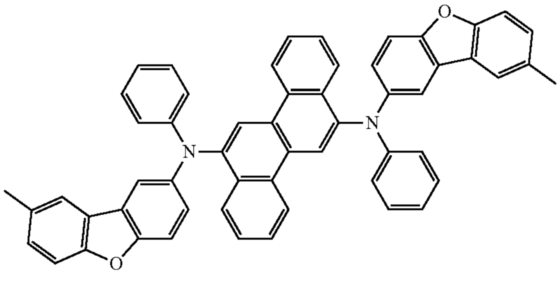
FD11
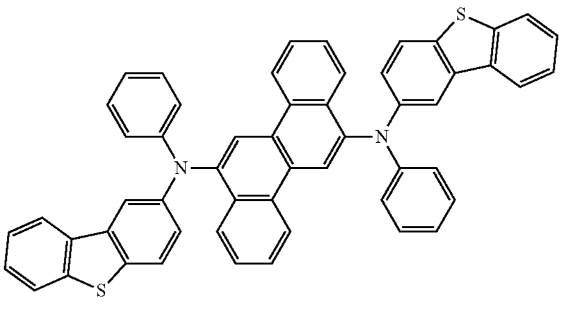

-continued
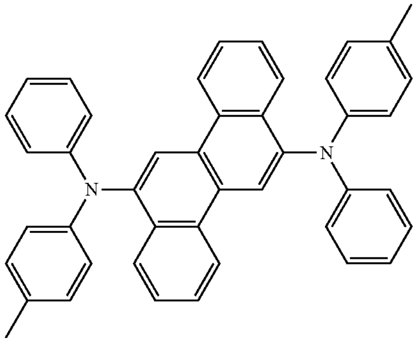
FD12
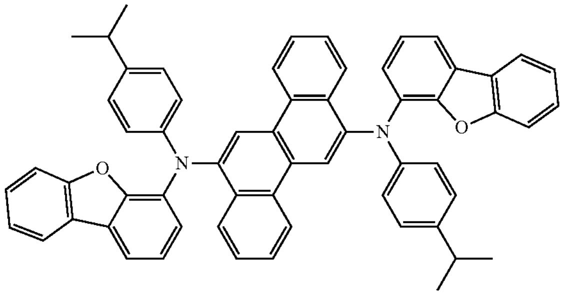
FD13
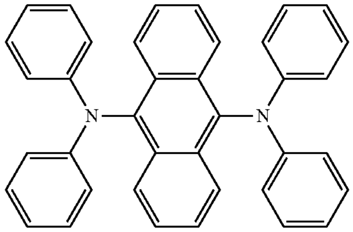
FD14
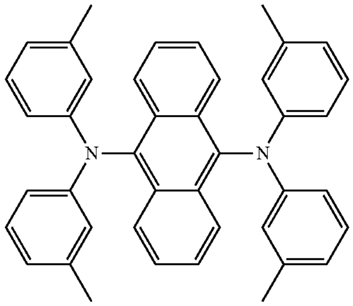
FD15
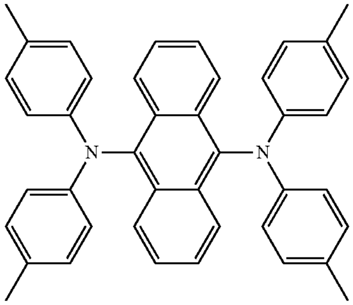
FD16

-continued
FD17
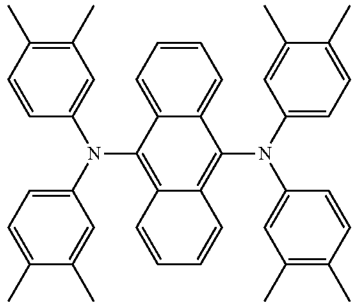
FD18
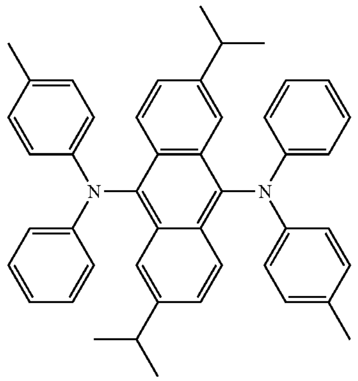
FD19
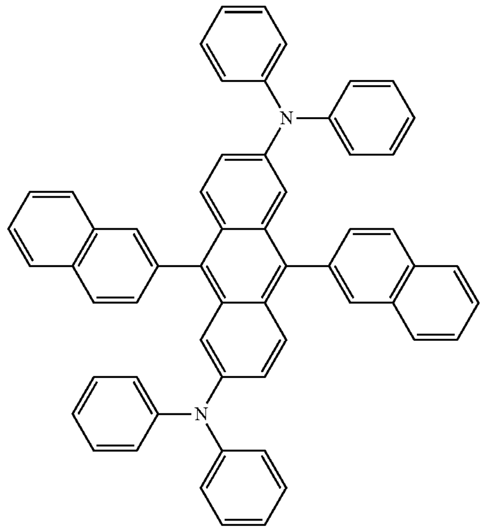
FD20
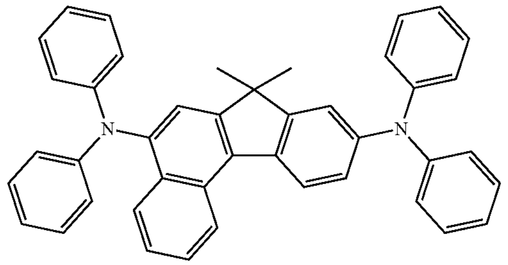

-continued
FD21
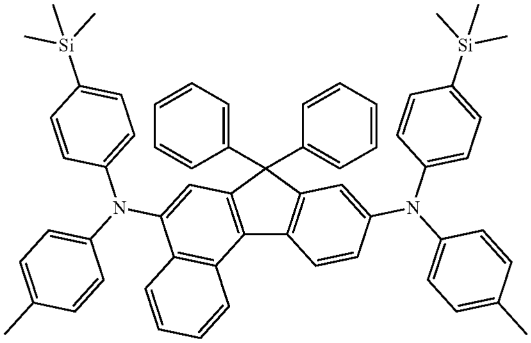
FD22
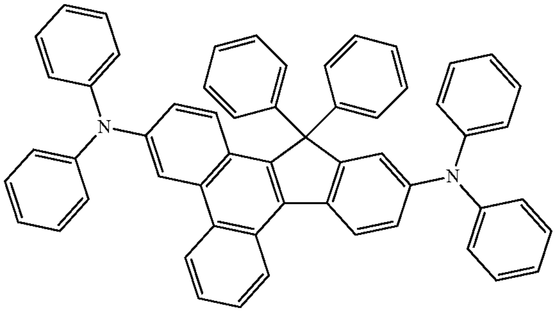
FD23
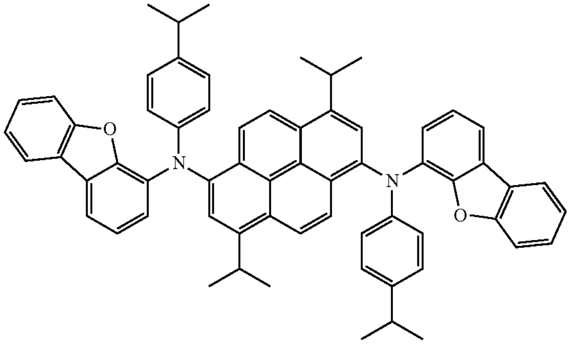
FD24
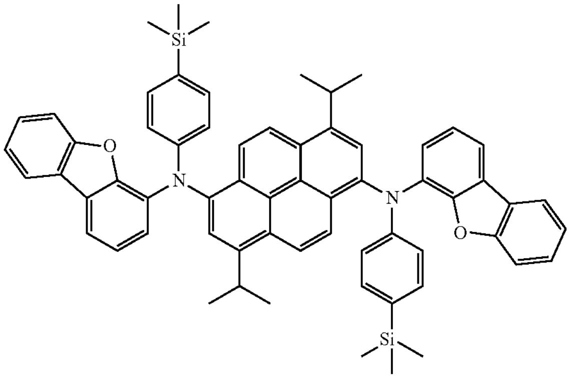

-continued
FD25
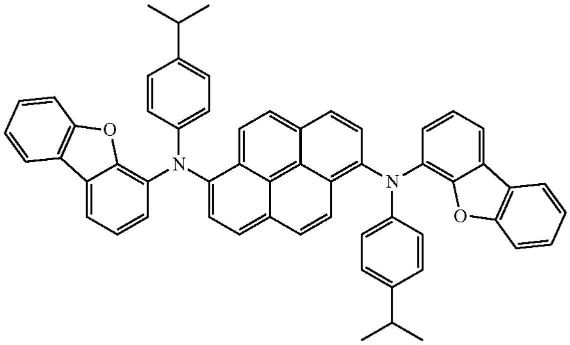
FD26
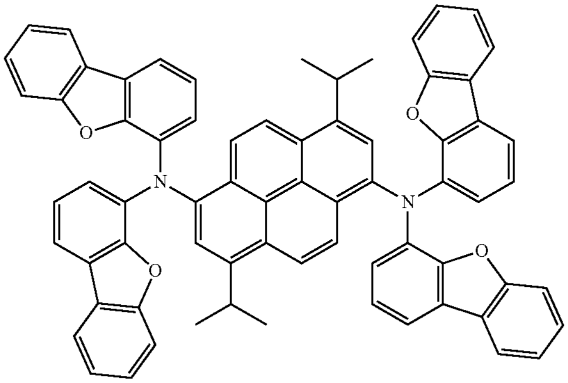
FD27
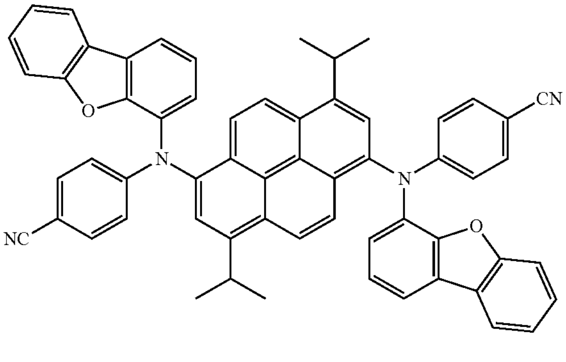
FD28
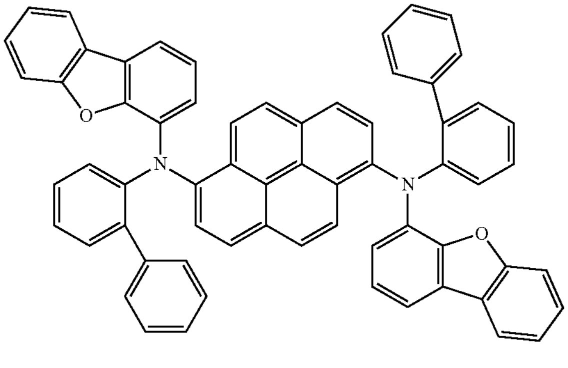

-continued
FD29
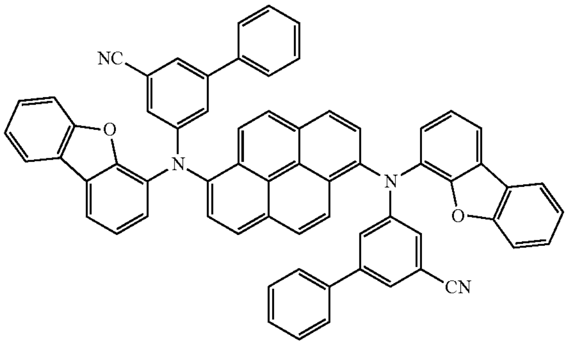
FD30
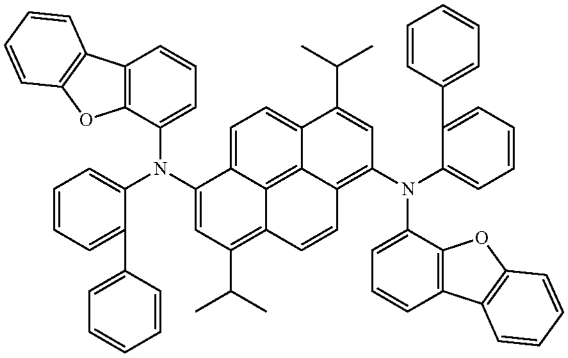
FD31
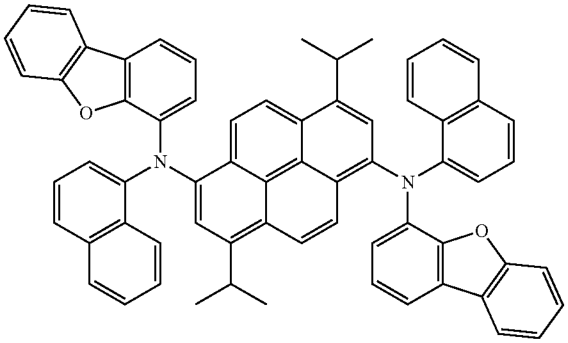
FD32
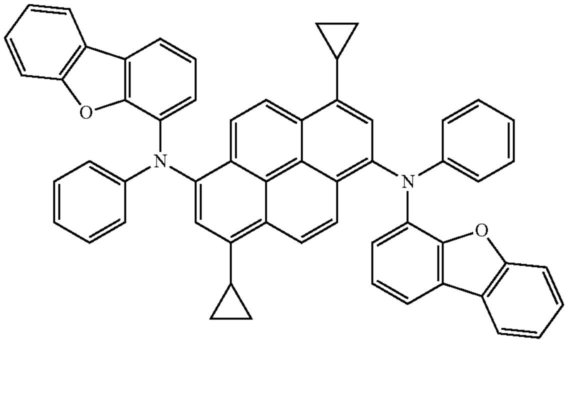

-continued
FD33
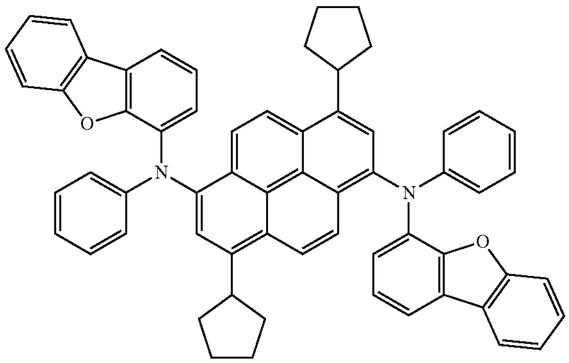
FD34
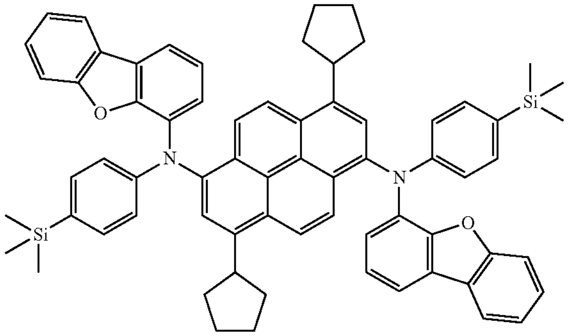
FD35
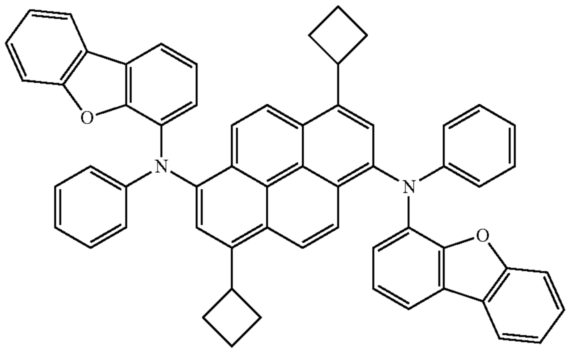
FD36
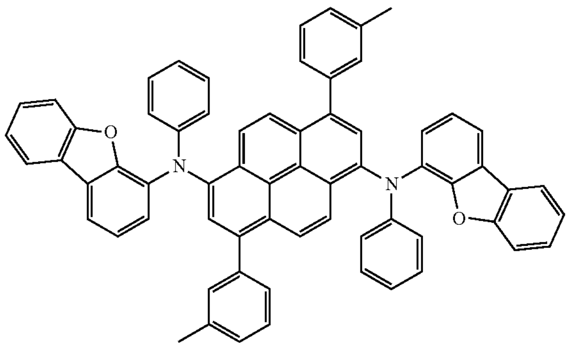

-continued

FD37

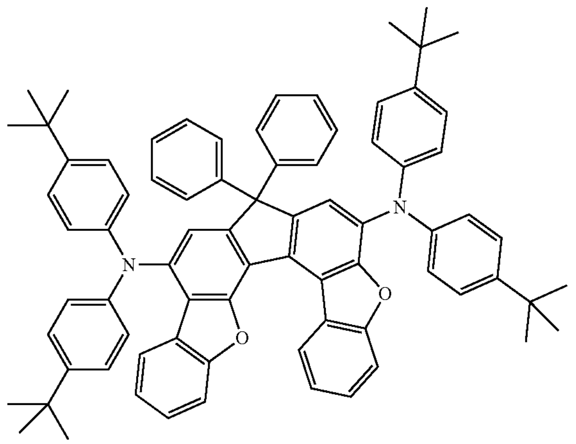

DPVBi

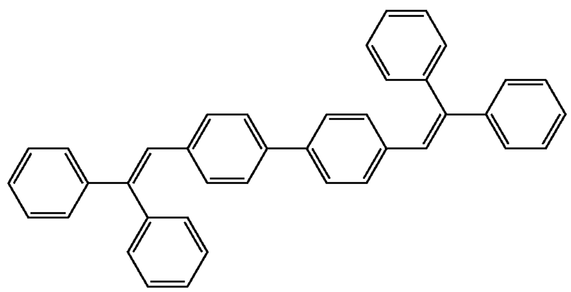

DPAVBi

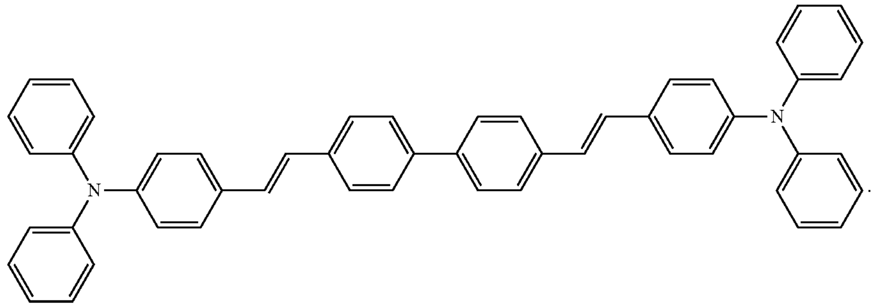

In an embodiment, the fluorescent dopant and the auxiliary dopant may each independently include the fourth compound represented by Formula 502 or Formula 503 as described herein.

[Delayed Fluorescence Material]

The emission layer may include, as a delayed fluorescence material, the fourth compound as described herein.

In an embodiment, the emission layer may include the fourth compound, and may further include a delayed fluorescence material.

In the specification, a delayed fluorescence material may be selected from compounds capable of emitting delayed fluorescence based on a delayed fluorescence emission mechanism.

The delayed fluorescence material included in the emission layer may serve as a host or as a dopant, depending on the types of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When a difference between a triplet energy level (eV) of the delayed fluorescence material and a singlet energy level (eV) of the delayed fluorescence material satisfies the range above, up-conversion from the triplet state to the singlet state of the delayed fluorescence materials may effectively occur, and thus, the light-emitting device 10 may have improved luminescence efficiency.

In embodiments, the delayed fluorescence material may include: a material including at least one electron donor (for example, a π electron-rich $C_3$-$C_{60}$ cyclic group and the like, such as a carbazole group) and at least one electron acceptor (for example, a sulfoxide group, a cyano group, a π electron-deficient nitrogen-containing $C_1$-$C_{60}$ cyclic group, and the like); or a material including a $C_8$-$C_{60}$ polycyclic group including at least two cyclic groups condensed to each other while sharing boron (B); or the like.

Examples of a delayed fluorescence material may include at least one of Compounds DF1 to DF14:
DF1(ONAC-DPS)
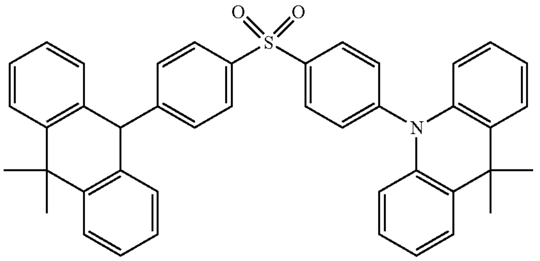
DF2(ACRFLCN)
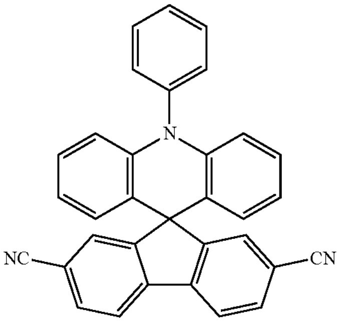
DF3(ACRSA)
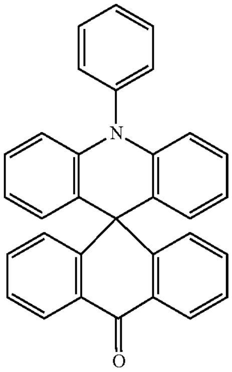
DF4(CCZTA)
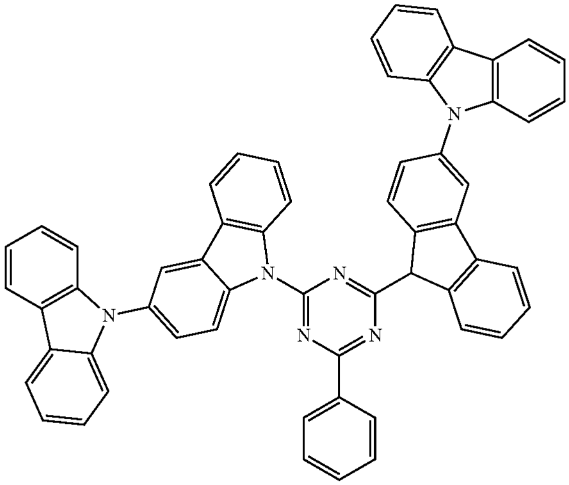
-continued
DF5(PIC-TRZ)
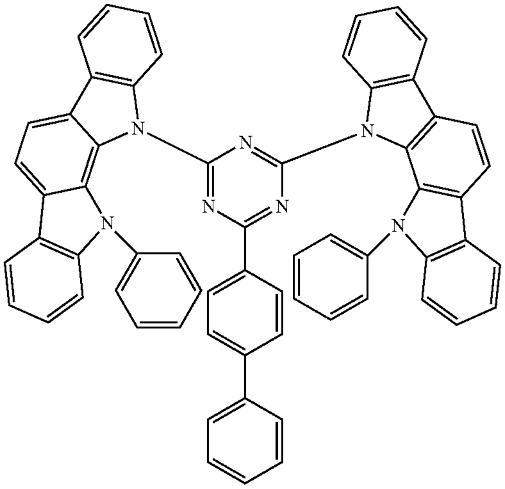
DF6(PIC-TR22)
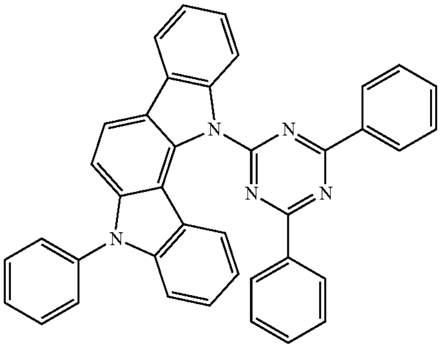
DF7(PXZ-TRZ)
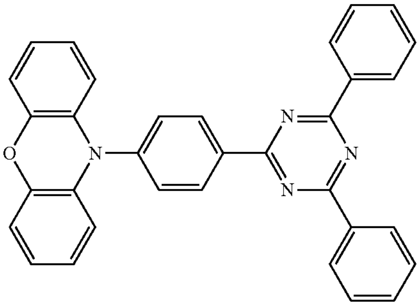
DF8(DABNA-1)
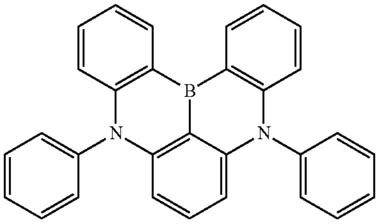

-continued

DF9(DABNA-2)

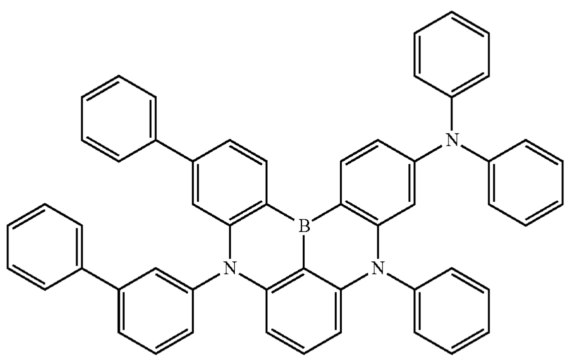

DF10

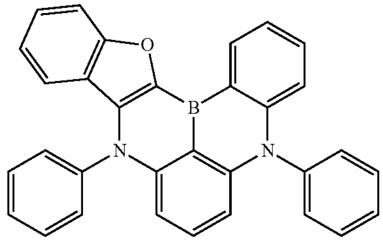

DF11

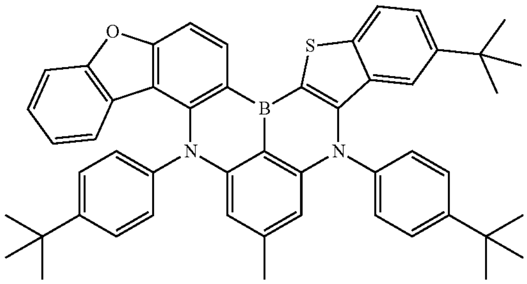

DF12

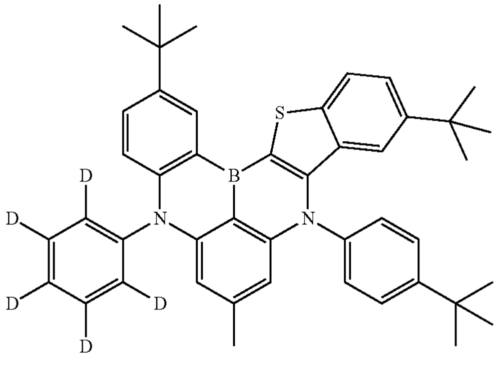

-continued

DF13

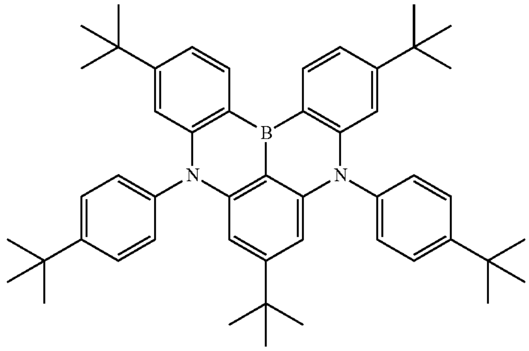

DF14

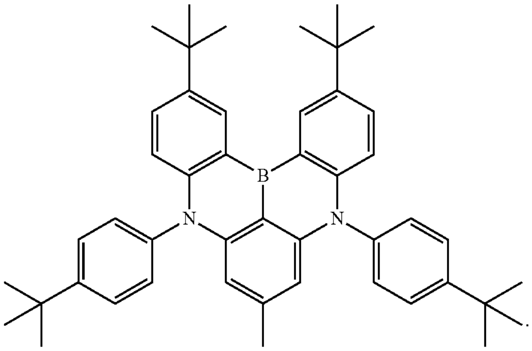

[Quantum Dot]

The emission layer may include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method that includes mixing a precursor material with an organic solvent and growing quantum dot particle crystals. When the crystal grows, the organic solvent naturally acts as a dispersant coordinated on the surface of the quantum dot crystal and controls the growth of the crystal so that the growth of quantum dot particles can be controlled through a process which costs less, and may be more readily performed than vapor deposition methods, such as metal organic chemical vapor deposition (MOCVD) or molecular beam epitaxy (MBE).

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of a Group II-VI semiconductor compound may include: a binary compound, such as CdS, CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of a Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, INSb, InPAs, IPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. In an embodiment, the Group III-V semiconductor compound may further include a Group II element. Examples of a Group III-V semiconductor compound further including the Group II element may include InZnP, InGaZnP, InAlZnP, and the like.

Examples of a Group III-VI semiconductor compound may include: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of a Group I-III-VI semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of a Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of a Group IV element or compound may include: a single element material, such as Si, Ge, and the like; a binary compound, such as SiC, SiGe, and the like; or any combination thereof.

Each element included in a multi-element compound, such as a binary compound, a ternary compound, or a quaternary compound, may be present in a particle at a uniform concentration or at a non-uniform concentration.

In an embodiment, the quantum dot may have a single structure in which the concentration of each element in the quantum dot is uniform, or the quantum dot may have a core-shell structure. In an embodiment, in case that the quantum dot has a core-shell structure, a material included in the core and a material included in the shell may be different from each other.

The shell of the quantum dot may serve as a protective layer that prevents chemical denaturation of the core to maintain semiconductor characteristics, and/or may serve as a charging layer that imparts electrophoretic characteristics to the quantum dot. The shell may be single-layered or multi-layered. An interface between the core and the shell may have a concentration gradient in which the concentration of a material that is present in the shell decreases toward the core.

Examples of a shell of the quantum dot may include a metal oxide, a metalloid oxide, a non-metal oxide, a semiconductor compound, or any combination thereof. Examples of a metal oxide, a metalloid oxide, or a non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, NiO, and the like; a ternary compound, such as $MgAl_2O_4$, $CoFe_2O_4$, $NiFe_2O_4$, $CoMn_2O_4$, and the like; or any combination thereof.

Examples of a semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of a semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of an emission wavelength spectrum of less than or equal to about 45 nm. For example, the quantum dot may have a FWHM of an emission wavelength spectrum of less than or equal to about 40 nm. For example, the quantum dot may have a FWHM of an emission wavelength spectrum of less than or equal to about 30 nm. When the FWHM of the quantum dot is within these ranges, the quantum dot may have improved color purity or improved color reproducibility. Light emitted through a quantum dot may be emitted in all directions, so that a wide viewing angle may be improved.

In embodiments, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from a quantum dot emission layer. Accordingly, by using quantum dots of different sizes, a light-emitting device that emits light of various wavelengths may be implemented. In an embodiment, the size of the quantum dot may be selected to emit red light, green light, and/or blue light. In an embodiment, the size of the quantum dot may be configured to emit white light by a combination of light of various colors.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, a buffer layer, a hole blocking layer, an electron control layer, or an electron transport layer in the electron transport region) may include a metal-free compound including at least one n electron-deficient nitrogen-containing $C_1$-$C_{60}$ cyclic group.

In embodiments, the electron transport region may include a compound represented by Formula 601:

$[Ar_{601}]_{xe11}-[(L_{601})_{xe1}-R_{601}]_{xe21}$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be air electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$ may be linked to each other via a single bond.

In embodiments, in Formula 601, $Ar_{601}$ may be an anthracene group unsubstituted or substituted with at least one $R_{10a}$.

In embodiments, the electron transport region may include a compound represented by Formula 601-1:

[Formula 601-1]

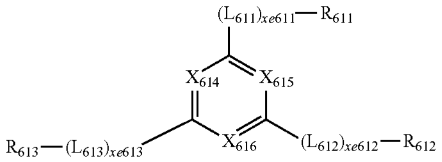

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In embodiments, in Formulae 601 and 601-1, xe1 and xe611 to xe613 may each independently be 0, 1, or 2.

In embodiments, the electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

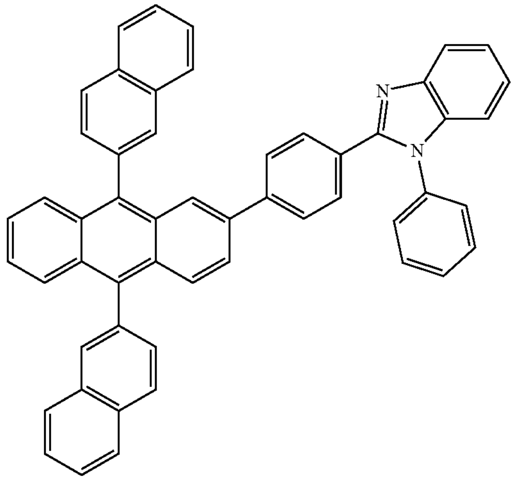

ET2

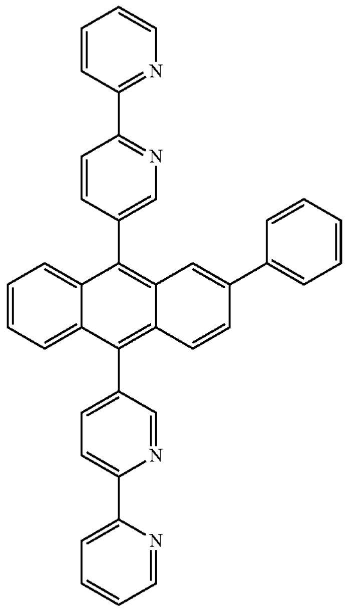

ET3

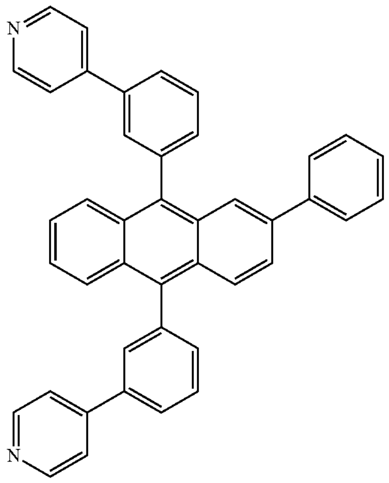

-continued
ET4
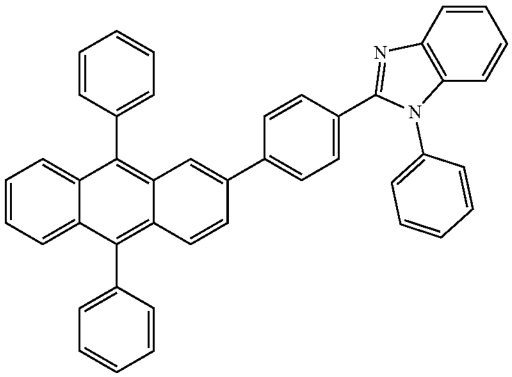
ET5
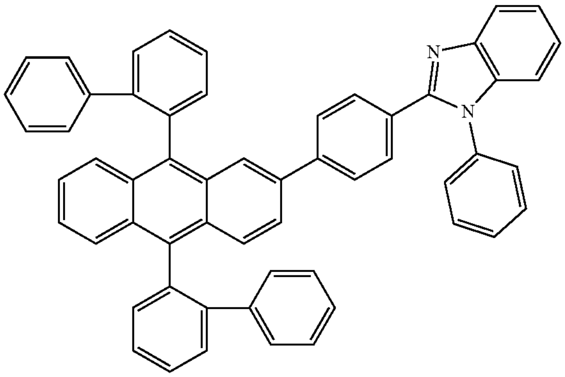
ET6
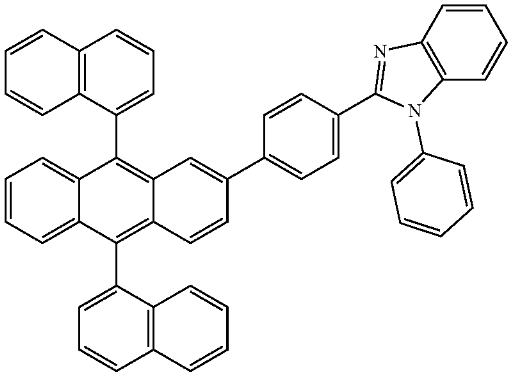
-continued
ET7
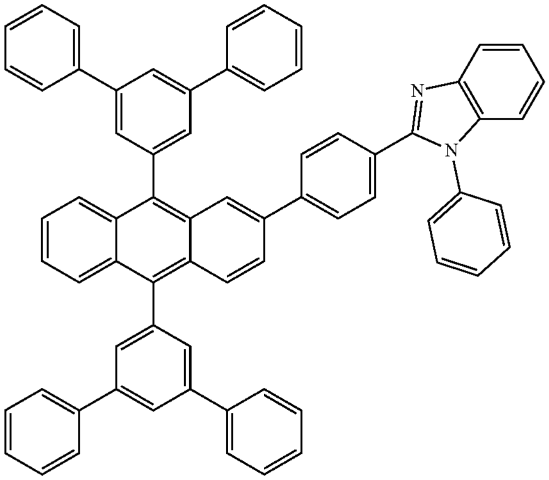
ET8
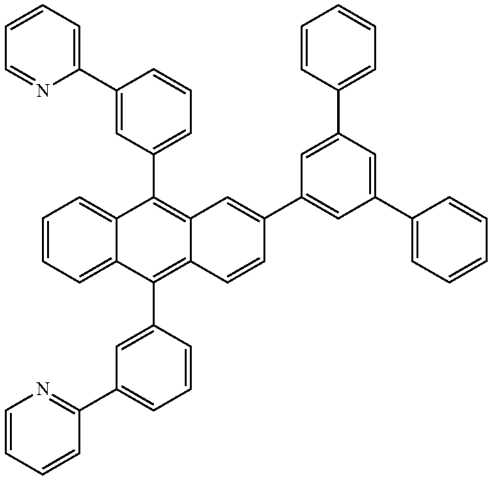
ET9
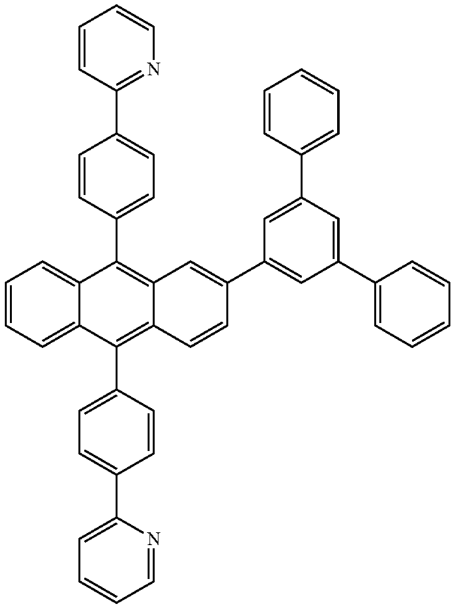

ET10
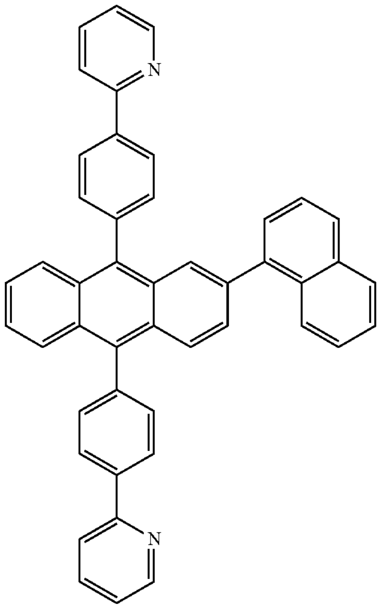
ET11
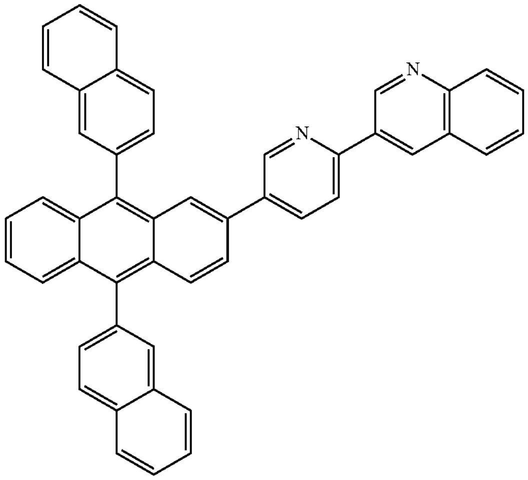
ET12
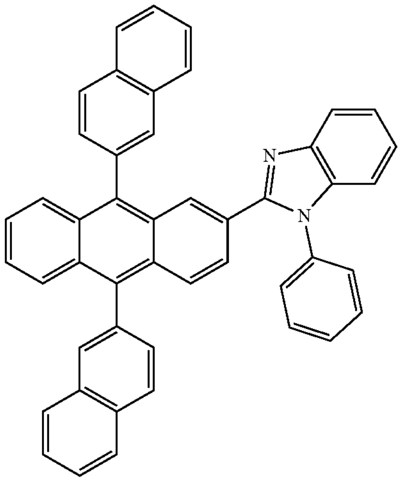
ET13
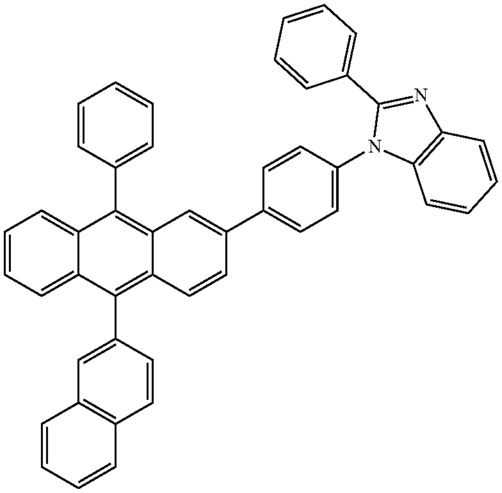
ET14
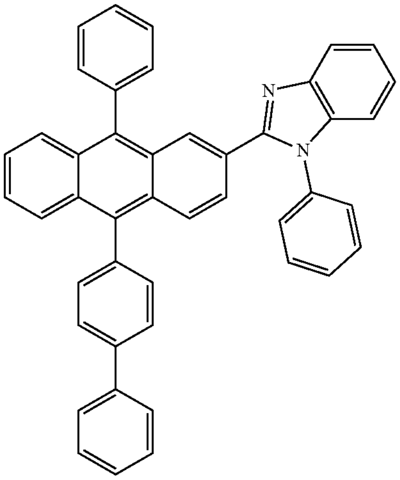
ET15
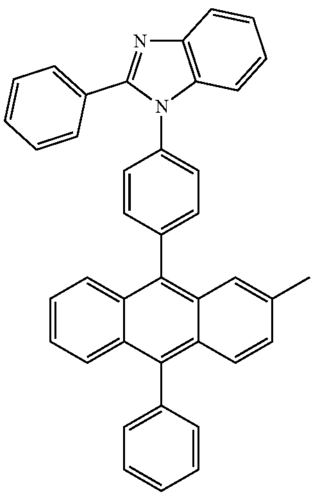

-continued
ET16
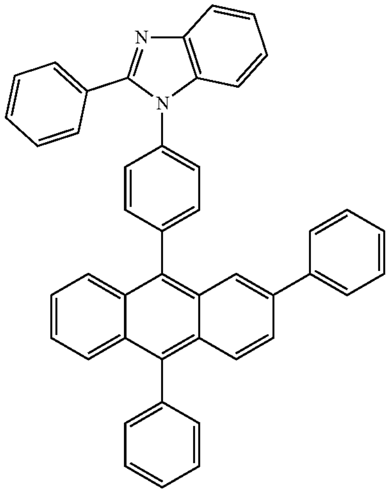
ET17
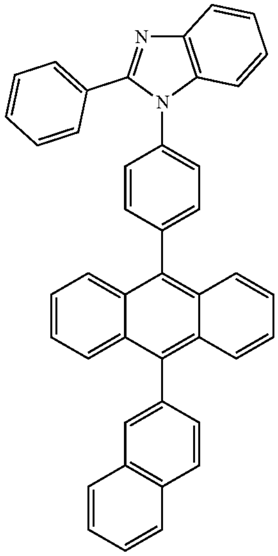
ET18
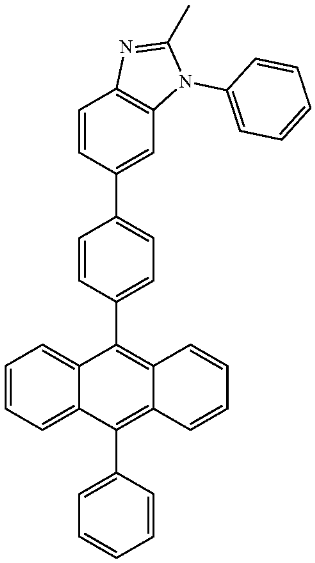
-continued
ET19
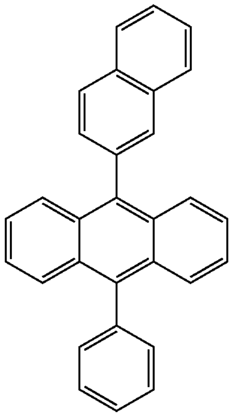
ET20
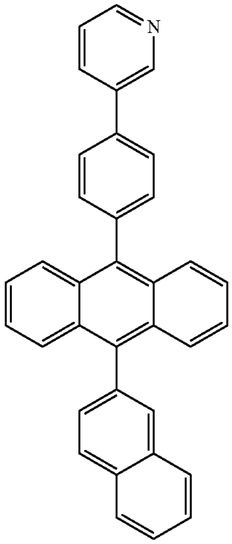
ET21
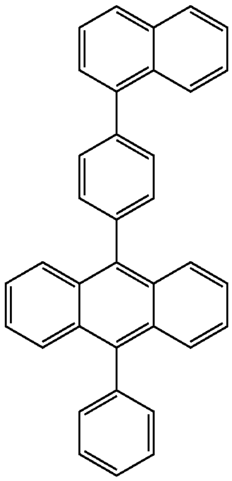

-continued
ET22
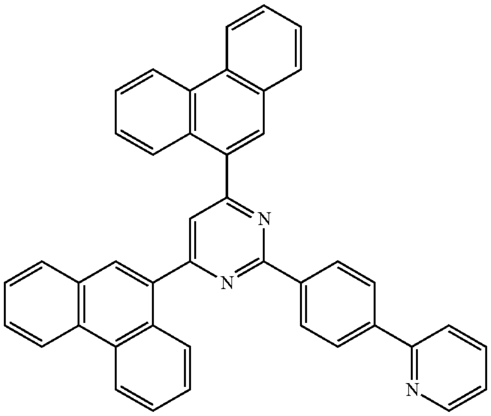
ET23
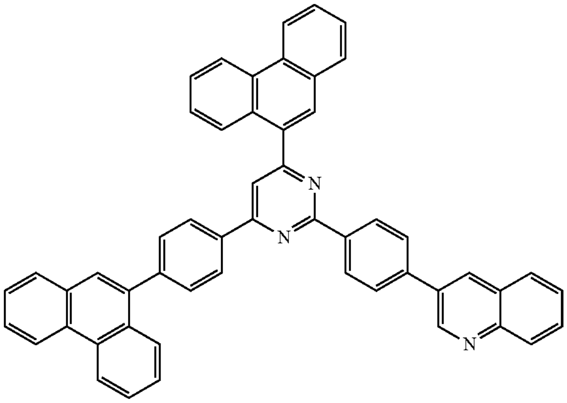
ET24
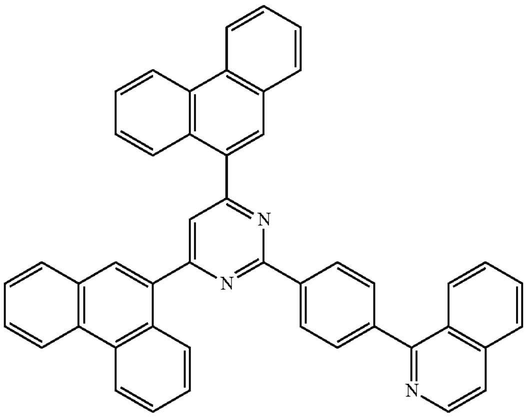
-continued
ET25
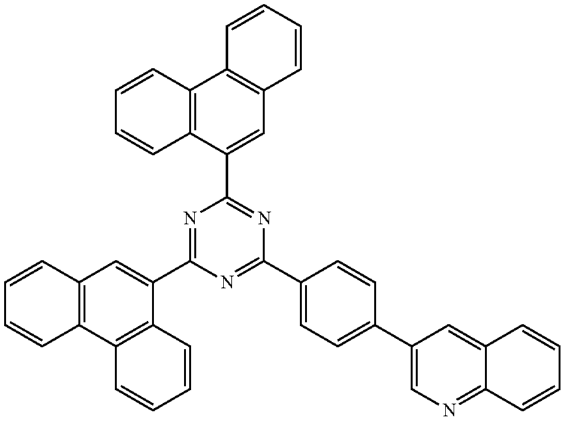
ET26
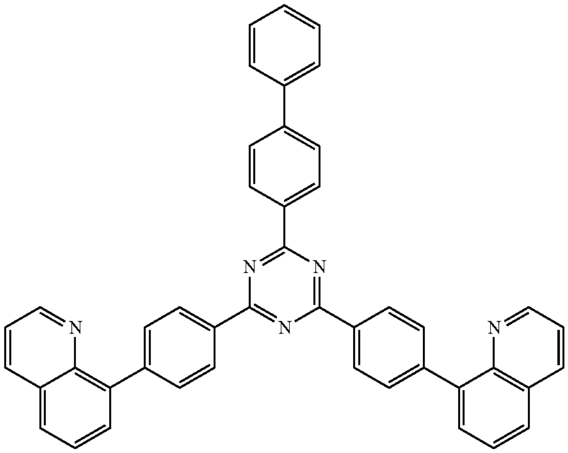
ET27
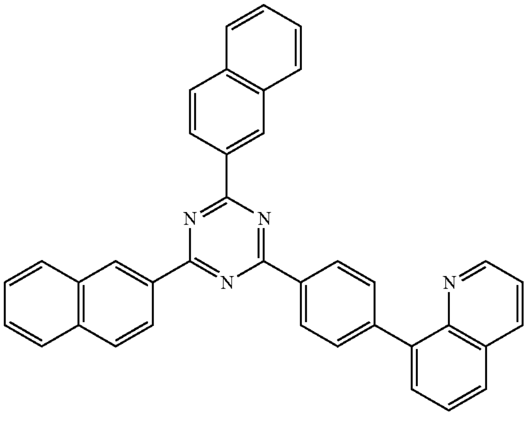

-continued
ET28
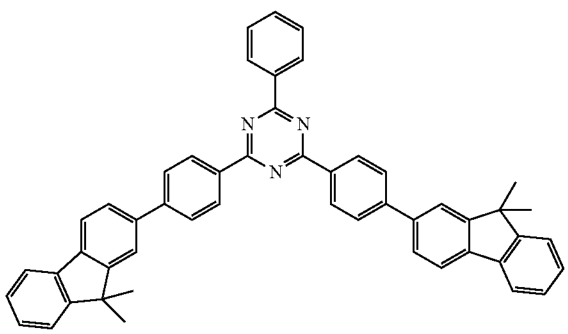
ET29
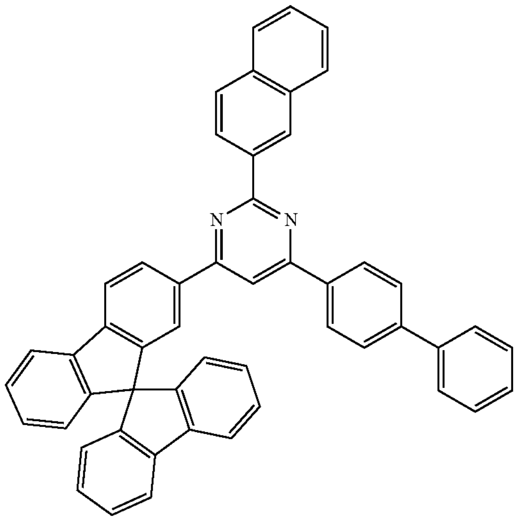
ET30
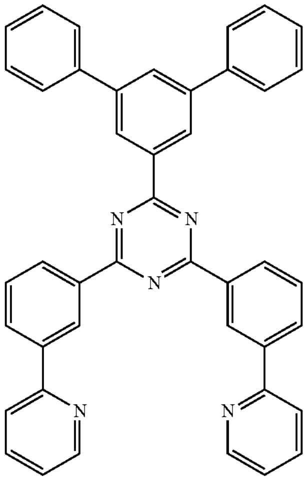
-continued
ET31
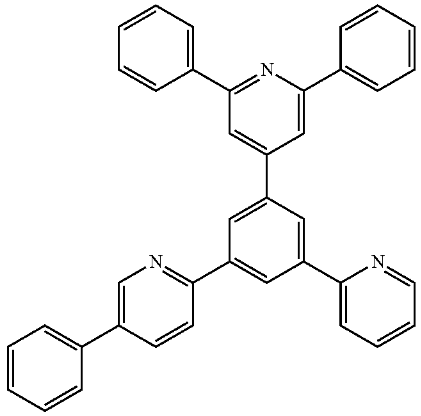
ET32
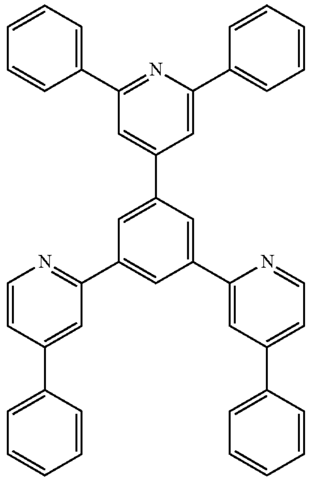
ET33
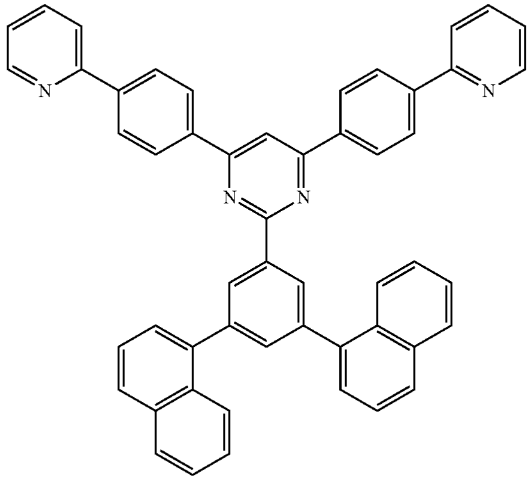

-continued
ET34
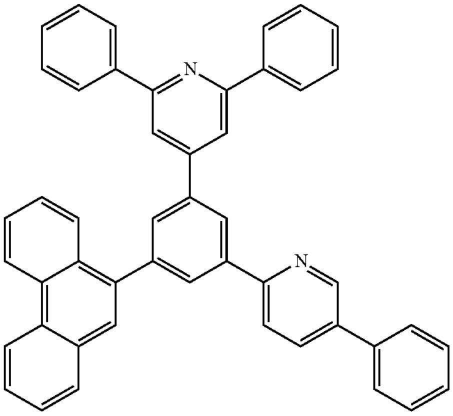
ET35
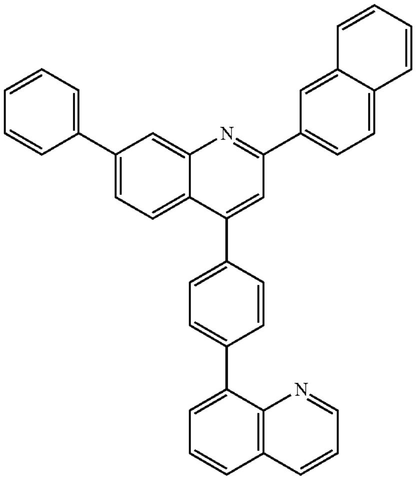
ET36
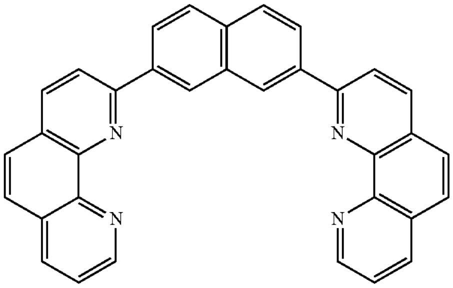
ET37
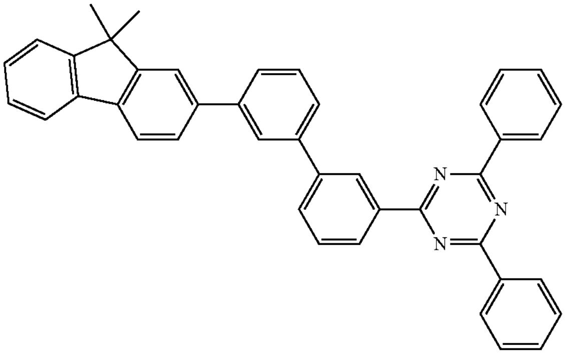
-continued
ET38
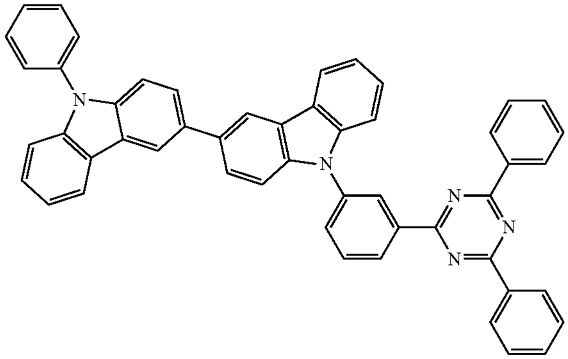
ET39
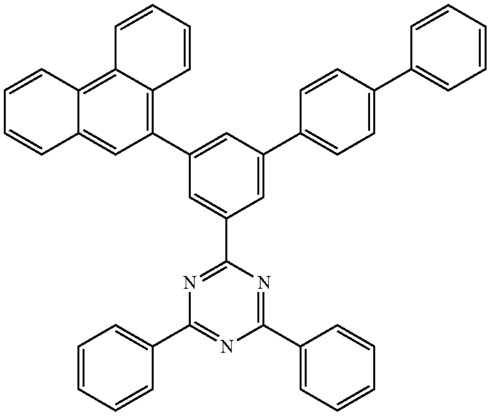
ET40
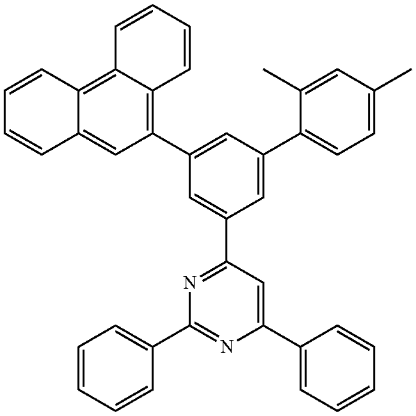

-continued
ET41
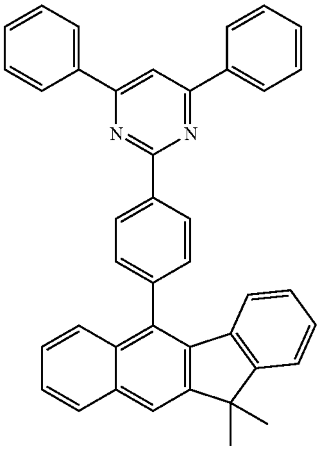
ET42
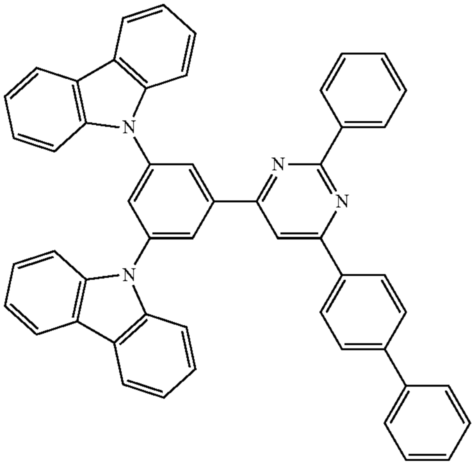
ET43
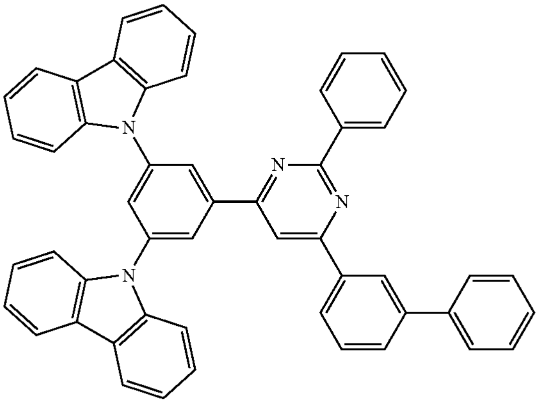
-continued
ET44
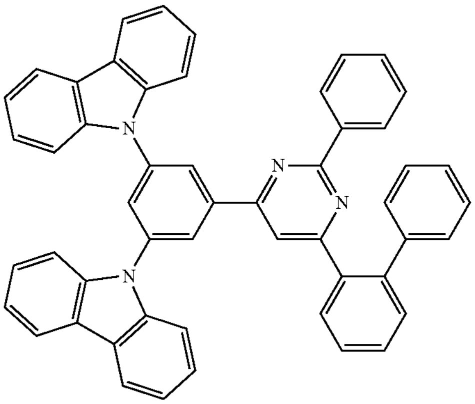
ET45
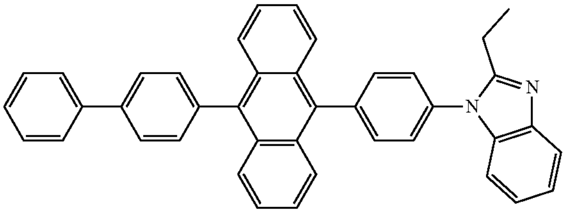
$Alq_3$
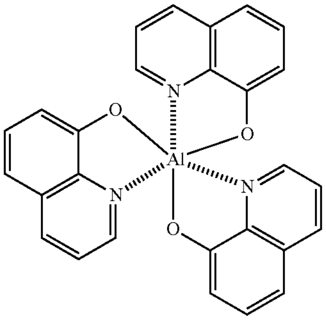
BAlq
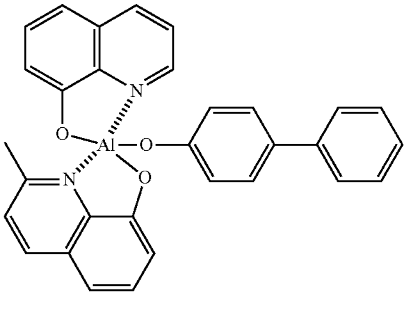
TAZ
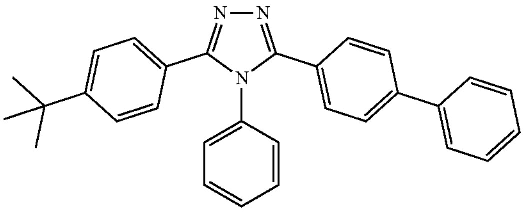

-continued

NTAZ

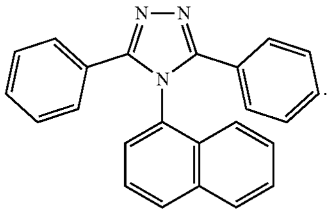

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion.

A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or Compound ET-D2:

ET-D1

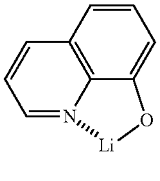

-continued

ET-D2

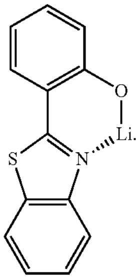

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of a lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include one of an alkali metal ion, an alkaline earth metal ion, and a rare earth metal ion, and a ligand bonded to the metal ion (for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof).

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, alkali metal halide); or the electron injection layer may consist of an alkali metal-containing compound (for example, alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges above, satisfactory electron injection characteristics may be obtained without a substantial increase in driving voltage.

[Second Electrode 150]

The second electrode 150 may be arranged on the interlayer 130 having a structure as described above. The second electrode 150 may be a cathode, which is an electron injection electrode. A material for forming the second electrode 150 may be a material having a low work function, such as a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layer structure or a multi-layer structure.

[Capping Layer]

The light-emitting device 10 may include a first capping layer outside the first electrode 110, and/or a second capping layer outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer in the interlayer 130 of the light-emitting device 10 may be extracted toward the outside through the first electrode 110, which may be a semi-transmissive electrode or a transmissive electrode, and through the first capping layer. Light generated in an emission layer in the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 is increased, so that the luminescence efficiency of the light-emitting device 10 may be improved.

The first capping layer and the second capping layer may each include a material having a refractive index of greater than or equal to about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

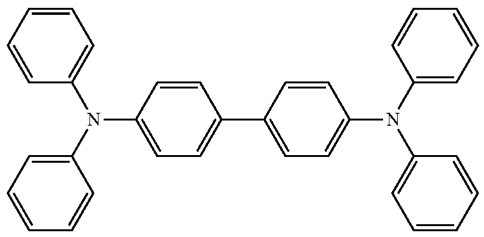

CP2

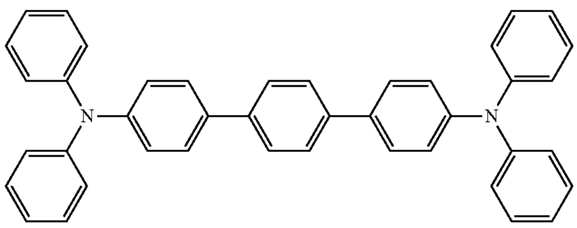

-continued

CP3

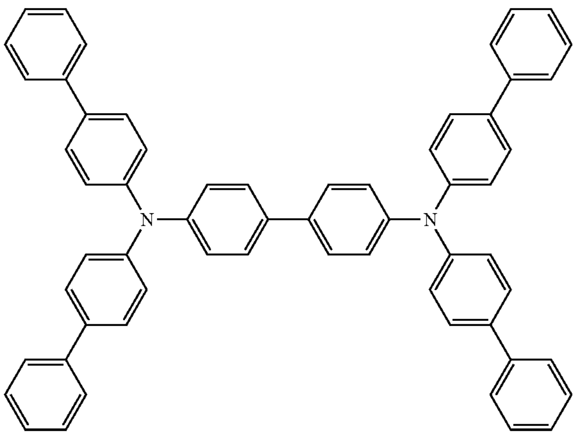

CP4

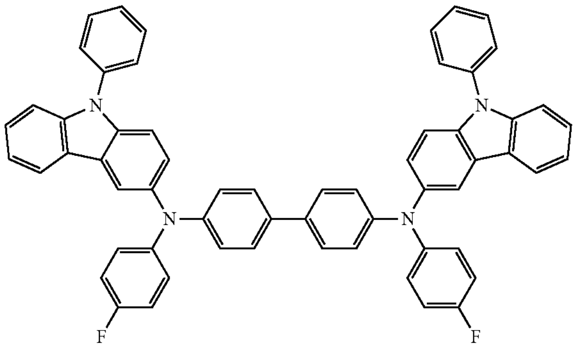

CP5

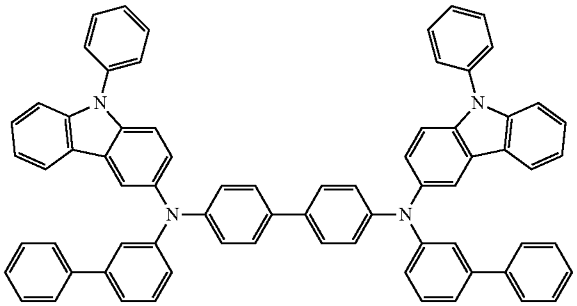

CP6

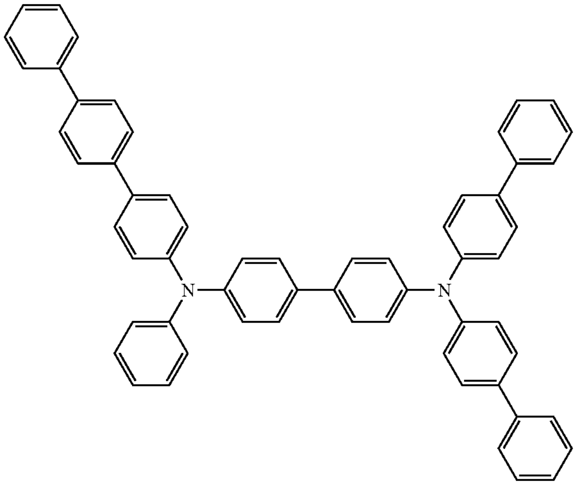

-continued

β-NPB

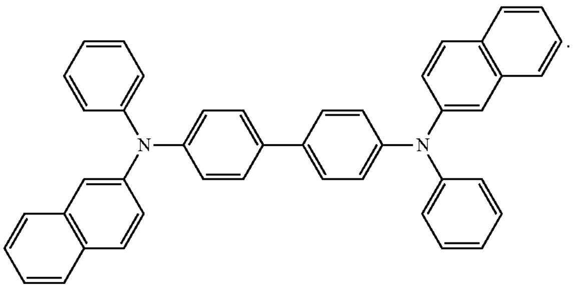

[Film]

The organometallic compound represented by Formula 1 may be included in various films. Accordingly, another embodiment provides a film which may include an organometallic compound represented by Formula 1. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. In embodiments, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. In embodiments, the light emitted from the light-emitting device may be blue light or white light. The light-emitting device may be the same as described herein. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each subpixel.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. For example, the color filter areas (or the color conversion areas) may include quantum dots. For example, the first area may include a red quantum dot, the second area may include a green quantum dot, and the third area may not include a quantum dot. The quantum dot may be a quantum dot as described herein. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. In this regard, the first-first color light, the second-first color light, and the third-first color light may have different maximum emission wavelengths from one another. For example, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be arranged between the color filter and/or the color conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin-film encapsulation layer, the electronic apparatus may be flexible.

Various functional layers may be further included on the sealing portion, in addition to the color filter and/or the color conversion layer, according to the use of the electronic apparatus. Examples of a functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

[Electronic Equipment]

The light-emitting device may be included in various electronic equipment.

In embodiments, an electronic equipment including the light-emitting device may be a flat panel display, a curved display, a computer monitor, a medical monitor, a television (TV), an advertisement board, an indoor light, an outdoor light, a signal light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a 3D display, a virtual reality display, an augmented reality display, a vehicle, a video wall including multiple displays tiled together, a theater screen, a stadium screen, a phototherapy device, and a sign.

The light-emitting device may have excellent effects in terms of luminescence efficiency and long lifespan, and thus the electronic equipment including the light-emitting device may have characteristics such as high luminance, high resolution, and low power consumption.

Figure 2:
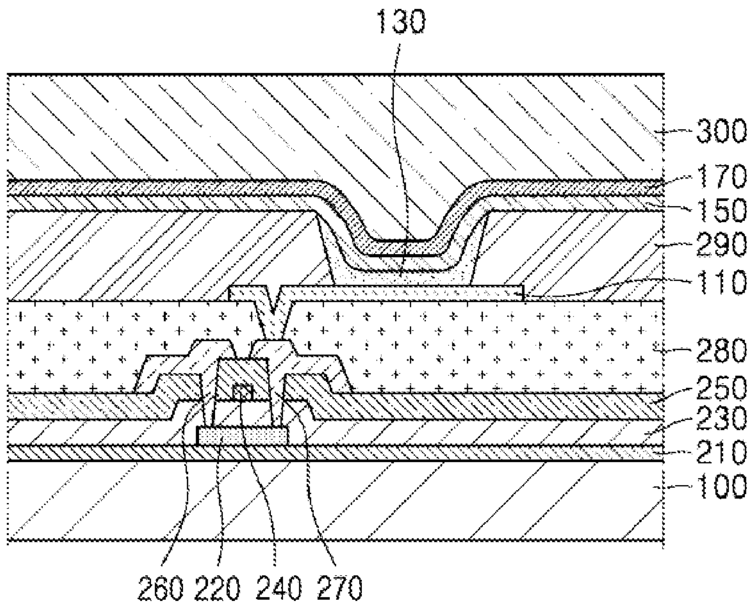
FIG. 2 is a schematic cross-sectional view of an electronic apparatus according to an embodiment.
Figure 3:
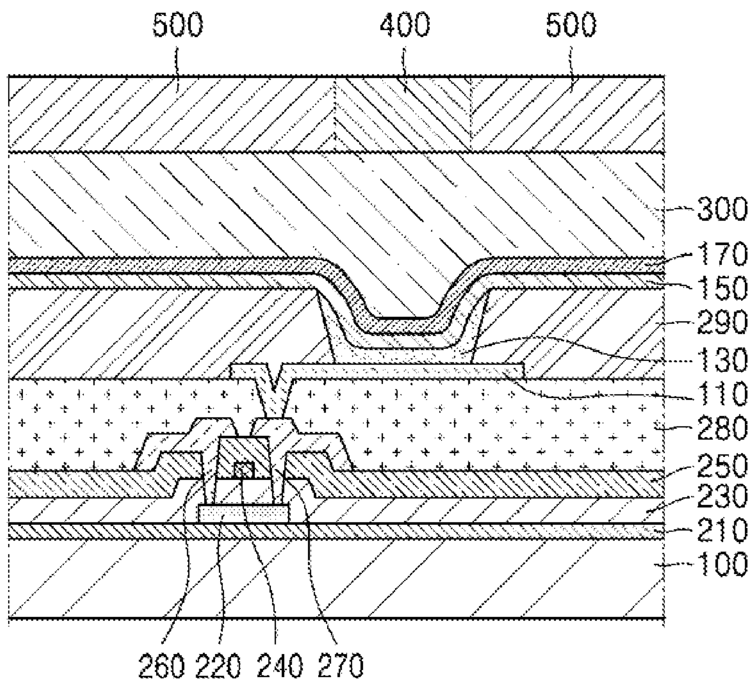
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus (e.g., a light-emitting apparatus) of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be arranged on the interlayer insulating film 250. The interlayer insulating film 250 and the gate insulating film 230 may be formed to expose a source region and a drain region of the active layer 220, and the source electrode 260 and the drain electrode 270 may respectively contact the exposed portions of the source region and the drain region of the active layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. The light-emitting device may be provided on the passivation layer 280. The light-emitting device may include a first electrode 110, an interlayer 130, and a second electrode 150.

The first electrode 110 may be arranged on the passivation layer 280. The passivation layer 280 may not completely cover the drain electrode 270 and may expose a portion of the drain electrode 270. The first electrode 110 may be electrically connected to the exposed portion of the drain electrode 270.

A pixel defining layer 290 including an insulating material may be arranged on the first electrode 110. The pixel defining layer 290 may expose a selected region of the first electrode 110, and an interlayer 130 may be formed in the exposed region of the first electrode 110. The pixel defining layer 290 may be a polyimide-based organic film or a polyacrylic-based organic film. Although not shown in FIG. 2, at least some layers of the interlayer 130 may extend beyond the upper portion of the pixel defining layer 290 to be provided in the form of a common layer.

The second electrode 150 may be arranged on the interlayer 130, and a capping layer 170 may be further included on the second electrode 150. The capping layer 170 may be formed to cover the second electrode 150.

The encapsulation portion 300 may be arranged on the capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 3 is a schematic cross-sectional view of an electronic apparatus according to another embodiment.

The electronic apparatus (e.g., a light-emitting apparatus) of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
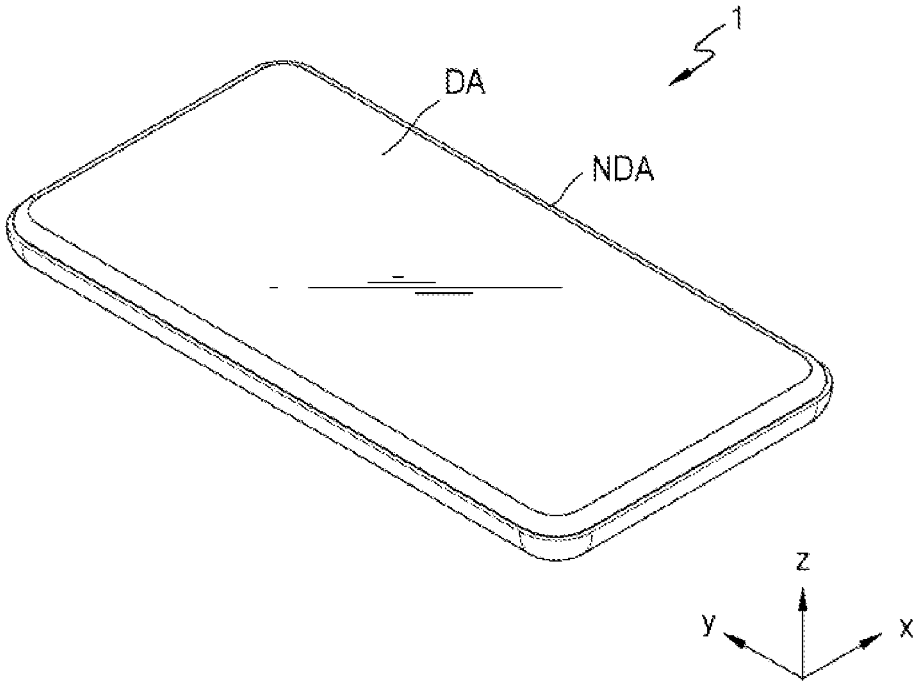
FIG. 4 is a schematic perspective view of an electronic equipment including a light-emitting device according to an embodiment.

[Description of FIG. 4]

FIG. 4 is a schematic perspective view of an electronic equipment 1 including a light-emitting device according to an embodiment.

The electronic equipment 1, which may be a device or apparatus that displays a moving image or still image, may be not only a portable electronic equipment, such as a mobile phone, a smartphone, a tablet personal computer (PC), a mobile communication terminal, an electronic notebook, an electronic book, a portable multimedia player (PMP), a navigation device, or an ultra-mobile PC (UMPC), but may also be various products, such as a television (TV), a laptop computer, a monitor, an advertisement board, or an Internet of things (IOT). The electronic equipment 1 may be such a product as above or a part thereof.

The electronic equipment 1 may be a wearable device, such as a smart watch, a watch phone, a glasses-type display, or a head mounted display (HMD), or a part of the wearable device. However, embodiments are not limited thereto.

For example, the electronic equipment 1 may be a dashboard of a vehicle, a center fascia of a vehicle, a center information display arranged on a dashboard of a vehicle, a room mirror display replacing a side mirror of a vehicle, an entertainment display for a rear seat of a vehicle or a display arranged on the back of a front seat, a head up display (HUD) installed in the front of a vehicle or projected on a front window glass, or a computer generated hologram augmented reality head up display (CGH AR HUD). FIG. 4 illustrates an embodiment in which the electronic equipment 1 is a smartphone, for convenience of explanation.

The electronic equipment 1 may include a display area DA and a non-display area NDA outside the display area DA. A display device may implement an image through a two-dimensional array of pixels that are arranged in the display area DA.

The non-display area NDA is an area that does not display an image, and may surround the display area DA. A driver for providing electrical signals or power to display devices arranged on the display area DA may be arranged in the non-display area NDA. A pad, which is an area to which an electronic element or a printing circuit board may be electrically connected, may be arranged in the non-display area NDA.

In the electronic equipment 1, a length in an x-axis direction and a length in a y-axis direction may be different from each other. In an embodiment, as shown in FIG. 4, the length in the x-axis direction may be shorter than the length in the y-axis direction. In embodiments, the length in the x-axis direction may be the same as the length in the y-axis direction. In still other embodiments, the length in the x-axis direction may be longer than the length in the y-axis direction.

[Descriptions of FIGS. 5 and 6A to 6C]

Figure 5:
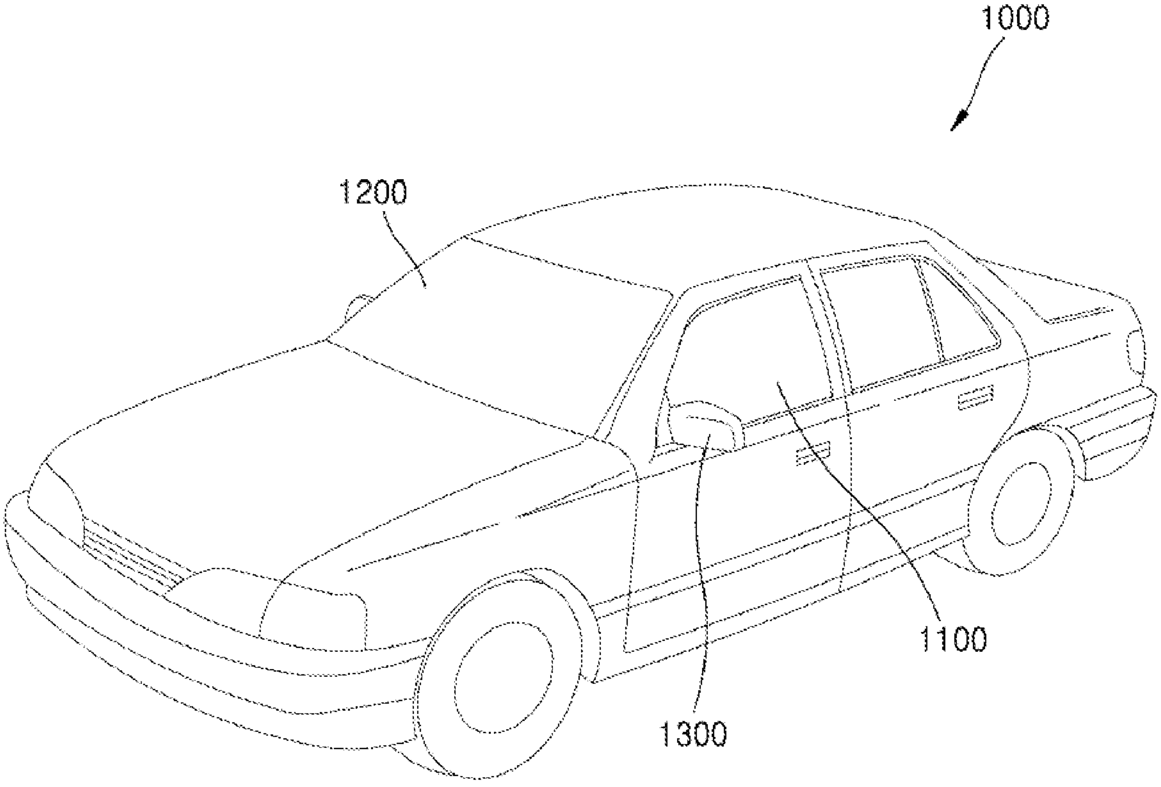
FIG. 5 is a schematic perspective view of the exterior of a vehicle as an electronic equipment including a light-emitting device according to an embodiment.

FIG. 5 is a schematic perspective view of an exterior of a vehicle 1000 as an electronic equipment including a light-emitting device according to an embodiment.

Figure 6A:
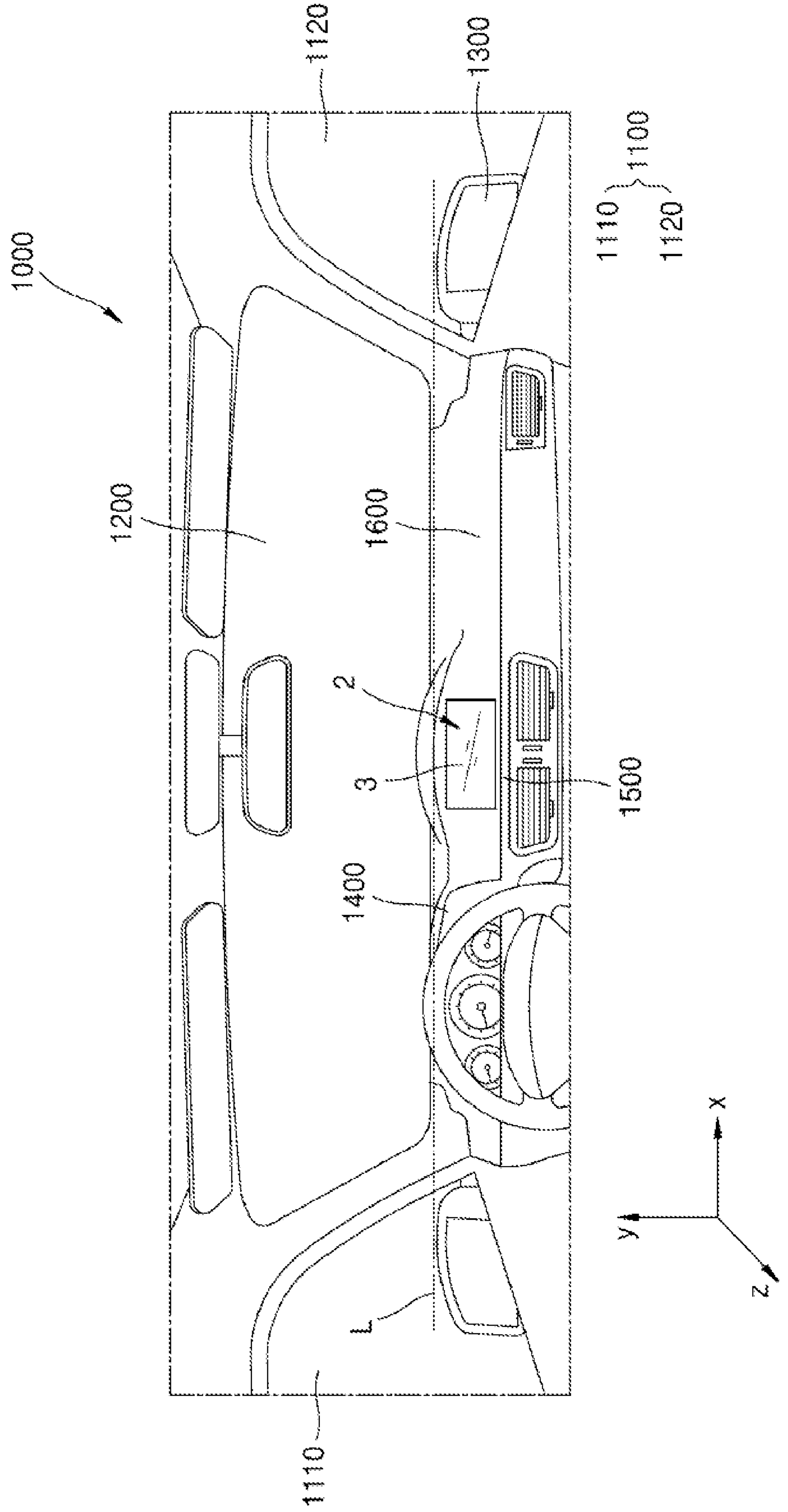
FIG. 6A to FIG. 6C are each a schematic diagram of the interior of a vehicle, according to embodiments.
Figure 6B:
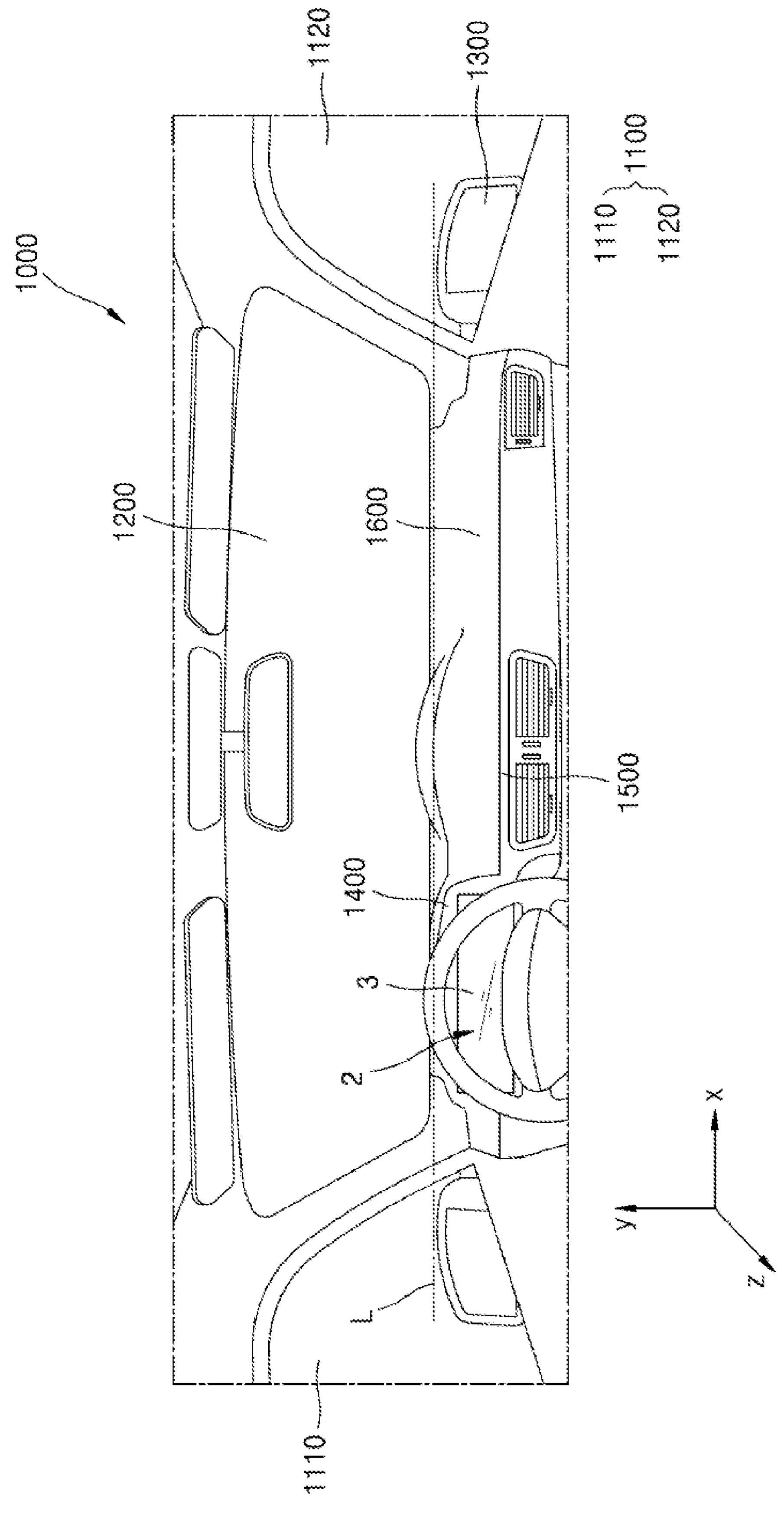
Figure 6C:
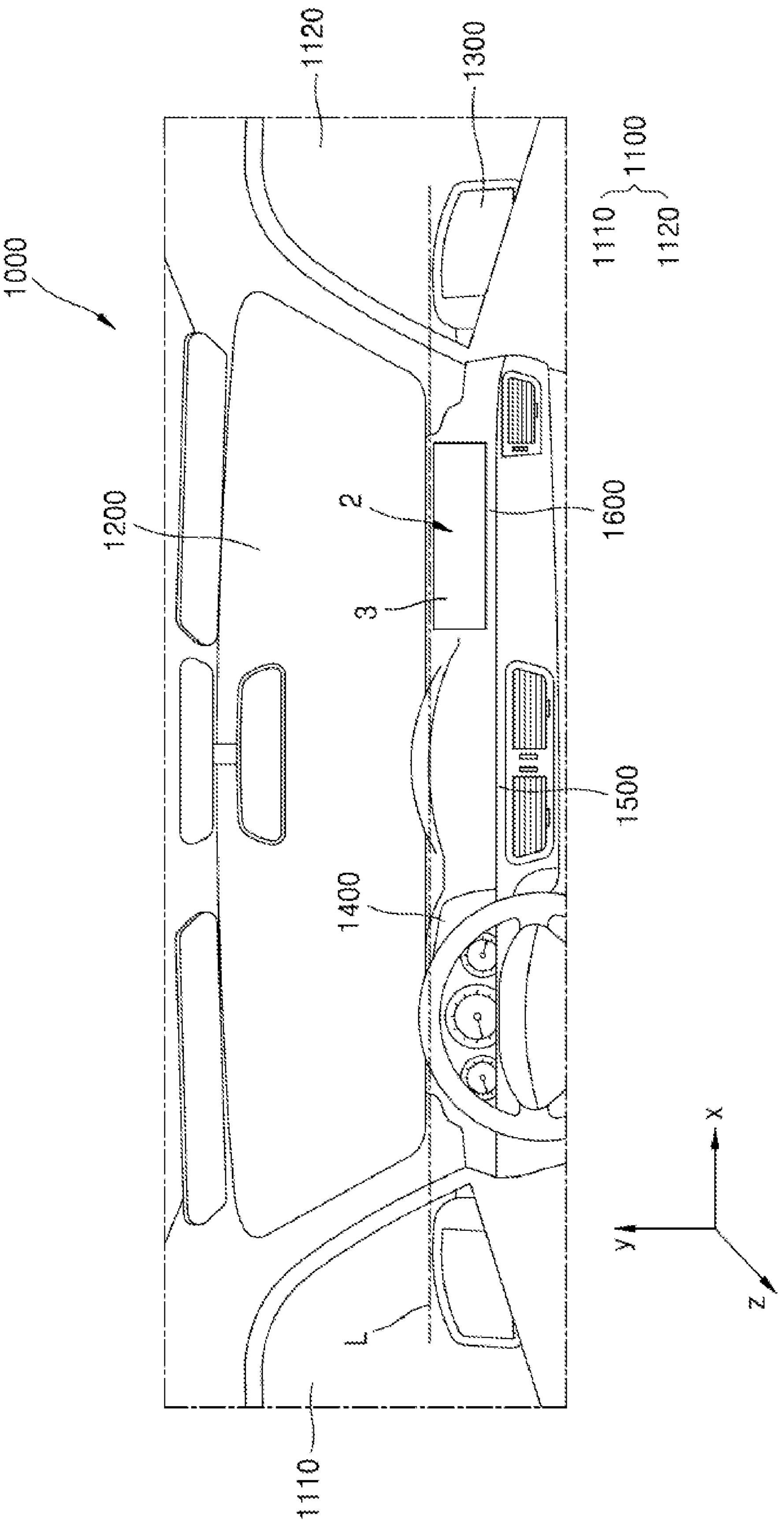

FIGS. 6A to 6C are each a schematic diagram of an interior of a vehicle 1000 according to embodiments.

Referring to FIGS. 5, 6A, 6B, and 6C, the vehicle 1000 may refer to various apparatuses for moving a subject to be transported, such as a person, an object, or an animal, from a departure point to a destination point. Examples of the vehicle 1000 may include a vehicle traveling on a road or track, a vessel moving over a sea or river, an airplane flying in the sky using the action of air, and the like.

The vehicle 1000 may travel on a road or a track. The vehicle 1000 may move in a given direction according to the rotation of at least one wheel. Examples of the vehicle 1000 may include a three-wheeled or four-wheeled vehicle, a construction machine, a two-wheeled vehicle, a prime mover, a bicycle, and a train running on a track.

The vehicle 1000 may include a body having an interior and an exterior, and a chassis that is a portion excluding the body in which mechanical apparatuses necessary for driving are installed. The exterior of the body may include a front panel, a bonnet, a roof panel, a rear panel, a trunk, a pillar provided at a boundary between doors, and the like. The chassis of the vehicle 1000 may include a power generating device, a power transmitting device, a driving device, a steering device, a braking device, a suspension device, a transmission device, a fuel device, front, rear, left, and right wheels, and the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a pillar arranged between the side window glass 1100 and the front window glass 1200.

The side window glass 1100 may be installed on the side of the vehicle 1000. In an embodiment, the side window glass 1100 may be installed in a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400, and the second side window glass 1120 may be arranged adjacent to the passenger seat dashboard 1600.

In an embodiment, the side window glasses 1100 may be spaced apart from each other in an x-direction or in a −x-direction. For example, the first side window glass 1110 and the second side window glass 1120 may be spaced apart from each other in the x direction or in the −x direction. An imaginary straight line L connecting the side window glasses 1100 may extend in the x-direction or in the −x-direction. For example, an imaginary straight line L connecting the first side window glass 1110 and the second side window glass 1120 to each other may extend in the x direction or in the −x direction.

The front window glass 1200 may be installed on the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In an embodiment, multiple side mirrors 1300 may be provided. Any one of the side mirrors 1300 may be arranged outside the first side window glass 1110. Another one of the side mirrors 1300 may be arranged outside the second side window glass 1120.

The cluster 1400 may be arranged in front of a steering wheel. The cluster 1400 may include a tachometer, a speedometer, a coolant thermometer, a fuel gauge, a turn signal indicator, a high beam indicator, a warning light, a seat belt warning light, an odometer, a driving record system, an automatic shift selector indicator light, a door open warning light, an engine oil warning light, and/or a low fuel warning light.

The center fascia 1500 may include a control panel on which buttons for adjusting an audio device, an air conditioning device, and a seat heater are disposed. The center fascia 1500 may be arranged on a side of the cluster 1400.

A passenger seat dashboard 1600 may be spaced apart from the cluster 1400 with the center fascia 1500 arranged therebetween. In an embodiment, the cluster 1400 may be arranged to correspond to a driver seat (not shown), and the passenger seat dashboard 1600 may be disposed to correspond to a passenger seat (not shown). In an embodiment, the cluster 1400 may be adjacent to the first side window glass 1110, and the passenger seat dashboard 1600 may be adjacent to the second side window glass 1120.

In an embodiment, the display device 2 may include a display panel 3, and the display panel 3 may display an image. The display device 2 may be arranged inside the vehicle 1000. In an embodiment, the display device 2 may be arranged between the side window glasses 1100 facing each other. The display device 2 may be arranged in at least one of the cluster 1400, the center fascia 1500, and the passenger seat dashboard 1600.

The display device 2 may include an organic light-emitting display device, an inorganic EL display device, a quantum dot display device, or the like. Hereinafter, as the display device 2 according to an embodiment, an organic light-emitting display device display including the light-emitting device according to the disclosure will be described as an example, but various types of display devices as described herein may be used as embodiments.

Referring to FIG. 6A, the display device 2 may be arranged in the center fascia 1500. In an embodiment, the display device 2 may display navigation information. In an embodiment, the display device 2 may display information regarding audio settings, video settings, or vehicle settings.

Referring to FIG. 6B, the display device 2 may be arranged in the cluster 1400. When the display device 2 is arranged in the cluster 1400, the cluster 1400 may display driving information and the like through the display device 2. For example, the cluster 1400 may be digitally implement driving information. The cluster 1400 may digitally display vehicle information and driving information as images. For example, a needle and a gauge of a tachometer and various warning lights or icons may be displayed by a digital signal.

Referring to FIG. 6C, the display device 2 may be arranged in the passenger seat dashboard 1600. The display device 2 may be embedded in the passenger seat dashboard 1600 or arranged on the passenger seat dashboard 1600. In an embodiment, the display device 2 arranged on the passenger seat dashboard 1600 may display an image related to information displayed on the cluster 1400 and/or information displayed on the center fascia 1500. In embodiments, the display device 2 arranged on the passenger seat dashboard 1600 may display information that is different from information displayed on the cluster 1400 and/or different from information displayed on the center fascia 1500.

[Manufacturing Method]

Respective layers included in the hole transport region, the emission layer, and respective layers included in the electron transport region may be formed in a selected region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100 °C to about 500 °C, a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon atoms as the only ring-forming atoms and having three to sixty carbon atoms, and the term "$C_1$-$C_{60}$ heterocyclic group" as used herein may be a cyclic group that has one to sixty carbon atoms and further has, in addition to a carbon atom, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, a $C_1$-$C_{60}$ heterocyclic group may have 3 to 61 ring-forming atoms.

The term "cyclic group" as used herein may be a $C_3$-$C_{60}$ carbocyclic group or a $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, a $C_3$-$C_{60}$ carbocyclic group may be a $T_1$ group or a group in which two or more $T_1$ groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), a $C_1$-$C_{60}$ heterocyclic group may be a T2 group, a group in which at least two T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), a π electron-rich $C_3$-$C_{60}$ cyclic group may be a T1 group, a group in which at least two T1 groups are condensed with each other, a T3 group, a group in which at least two T3 groups are condensed with each other, or a group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), a π electron-deficient nitrogen-containing $C_1$-$C_{60}$ cyclic group may be a T4 group, a group in which at least two T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by $-O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of a $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of a monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of a monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —$O(A_{102})$ (wherein $A_{102}$ may be a $C_6$-$C_{60}$ aryl group), and the term "$C_6$-$C_{60}$ arylthio group" as used herein may be a group represented by —$S(A_{103})$ (wherein $A_{103}$ may be a $C_6$-$C_{60}$ aryl group).

The term "$C_7$-$C_{60}$ arylalkyl group" as used herein may be a group represented by -$(A_{104})(A_{105})$ (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -$(A_{106})(A_{107})$ (wherein $A_{106}$ may be a $C_1$-$C_{59}$ alkylene group, and $A_{107}$ may be a $C_1$-$C_{59}$ heteroaryl group).

In the specification, the group "$R_{10a}$" may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein may be any atom other than a carbon atom or a hydrogen atom. Examples of a heteroatom may include O, S, N, P, Si, B, Ge, Se, and any combination thereof.

In the specification, the term "third-row transition metal" as used herein may be hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the terms "tert-Bu" or "But" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols *, *', and *" as used herein, unless defined otherwise, each refer to a binding site to a neighboring atom in a corresponding formula or moiety.

In the specification, the terms "x-axis", "y-axis", and "z-axis" are not limited to three axes in an orthogonal coordinate system (e.g., a Cartesian coordinate system), and may be interpreted in a broader sense than the aforementioned three axes in an orthogonal coordinate system. For example, the x-axis, y-axis, and z-axis may describe axes that are orthogonal to each other, or may describe axes that are in different directions that are not orthogonal to each other.

Hereinafter, compounds according to embodiments and light-emitting devices according to embodiments will be described in detail with reference to the following Synthesis Examples and Examples. The wording "B was used instead of A" used in describing Synthesis Examples refers to that an identical molar equivalent of B was used in place of A.

EXAMPLES

Synthesis Examples

Synthesis Example 1: Synthesis of Compound 38

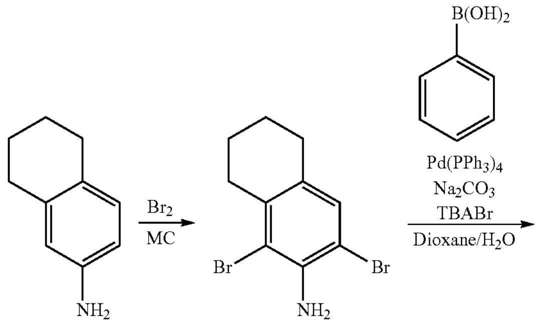

38-a

-continued

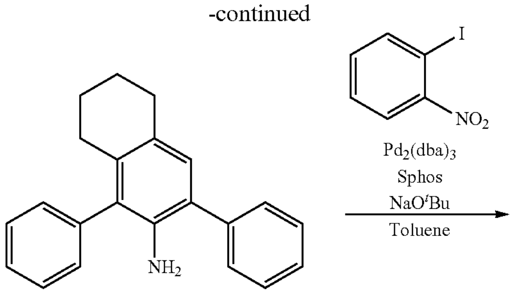

38-b

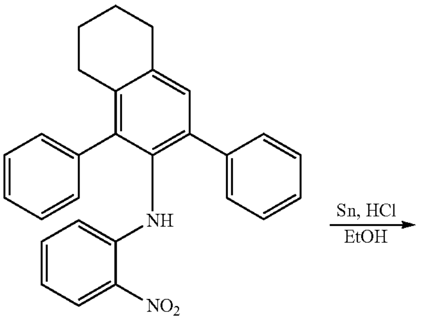

38-c

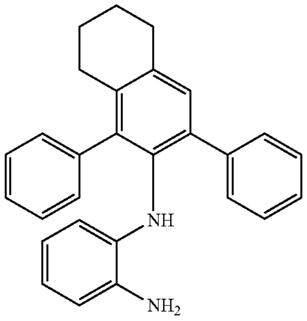

38-d

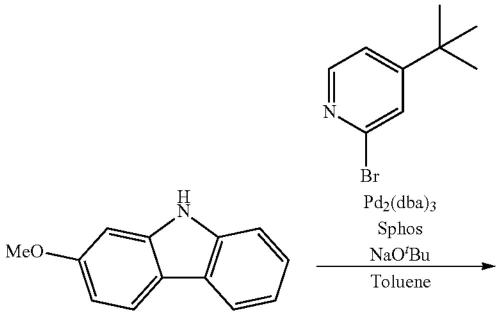

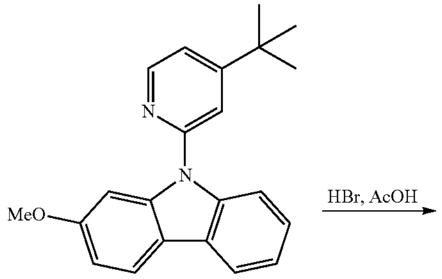

38-e

-continued
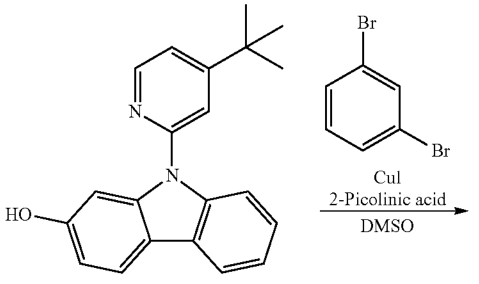
38-f
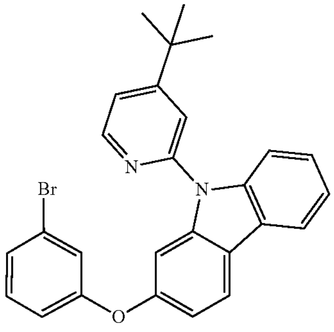
38-g
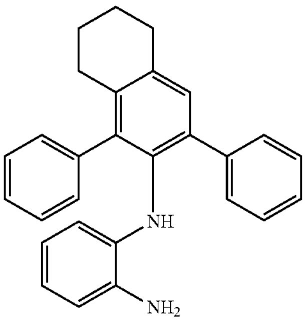
38-d
+
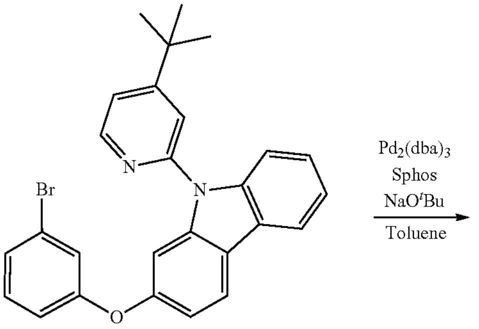
38-g
-continued
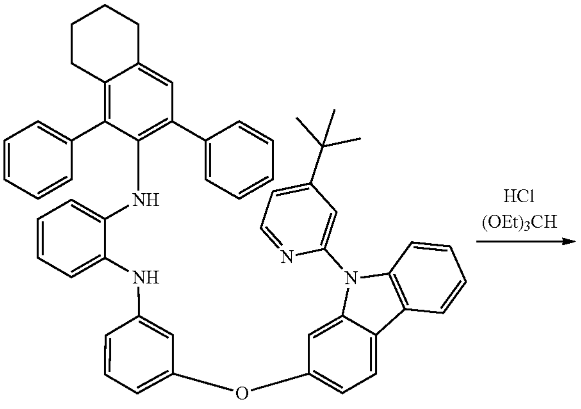
38-h
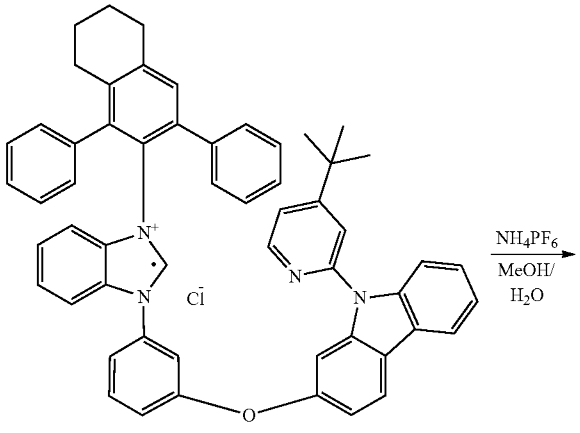
38-i
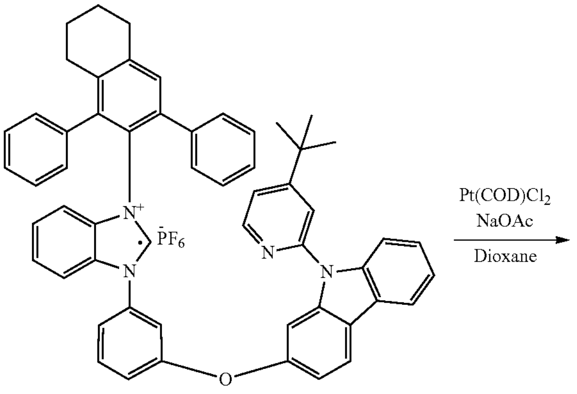
38-j -continued

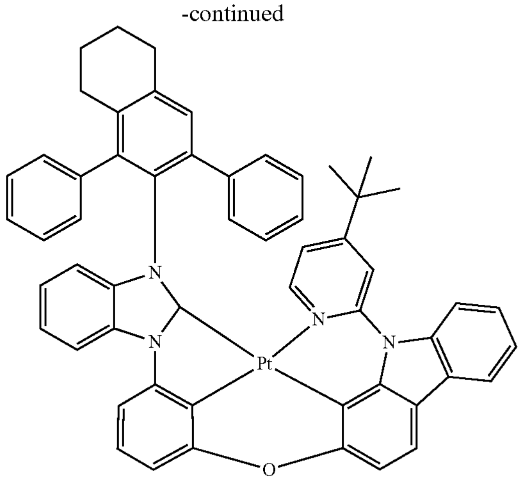

38

(1) Synthesis of Intermediate Compound 38-a

To a solution in which 5,6,7,8-tetrahydronaphthalen-2-amine (1.0 eq) was dissolved in methylene chloride (MC) (0.05 M), a solution in which bromine (2.5 eq) was dissolved in MC (0.25 M) was slowly added, and the mixed solution was stirred at room temperature for 16 hours to prepare a reaction mixture. $H_2O$ (0.05 M) was added at 0 °C to the reaction mixture, and stirred for 1 hour. A 1 M sodium bicarbonate (0.05 M) solution was added thereto, and an extraction process was performed thereon by using MC and water three times to obtain an organic layer. The organic layer thus obtained was dried by using magnesium sulfate, concentrated, and subjected to column chromatography (a volume ratio of ethyl acetate (EA):hexane was 1:20), so as to synthesize Intermediate Compound 38-a (yield of 98%).

(2) Synthesis of Intermediate Compound 38-b

Intermediate Compound 38-1 (1.0 eq), phenyl boronic acid (2.7 eq), $Pd(PPh_3)_4$ (10 mol %), sodium carbonate (3.0 eq), and tetrabutylammonium bromide (20 mol %) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:20), so as to synthesize Intermediate Compound 38-b (yield of 90%).

(3) Synthesis of Intermediate Compound 38-c 1-iodo-2-nitrobenzene (1.2 eq), Intermediate Compound 38-b (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 38-c (yield of 72%).

(4) Synthesis of Intermediate Compound 38-d

Intermediate Compound 38-c (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 38-d (yield of 91%).

(5) Synthesis of Intermediate Compound 38-e 2-methoxy-9H-carbazole (1.0 eq), 2-bromo-4-(tert-butyl) pyridine (1.1 eq), $Pd_2(dba)_3$ (5 mol %), Sphos (7 mol %), and sodium tert-butoxide (2.0 eq) were dissolved in toluene (0.1 M), and stirred at 110 °C for 12 hours. The reaction mixture was cooled at room temperature, and the solvent was removed under reduced pressure. An extraction process was performed thereon by using dichloromethane and water three times to obtain an organic layer. The organic layer thus obtained was dried by using magnesium sulfate, concentrated, and subjected to column chromatography (a volume ratio of EA:hexane was 1:10), so as to synthesize Intermediate Compound 38-e (yield of 92%).

(6) Synthesis of Intermediate Compound 38-f

Intermediate Compound 38-e (1.0 eq), HBr (0.5 M), and acetic acid (0.5 M) were stirred at 120 °C for 16 hours. The reaction mixture was cooled at room temperature, and neutralized to pH 7 by using a NaOH aqueous solution. An extraction process was performed thereon by using EA and water three times to obtain an organic layer. The organic layer thus obtained was dried by using magnesium sulfate, and filtered through silica gel, so as to synthesize Intermediate Compound 38-f (yield of 88%).

(7) Synthesis of Intermediate Compound 38-g 1,3-dibromobenzene (1.2 eq), Intermediate Compound 38-f (1.0 eq), CuI (10 mol %), 2-picolinic acid (20 mol %), and potassium phosphate tribasic (2.0 eq) were dissolved in DMSO (0.1 M), and stirred at 110 °C for 4 hours. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:4), so as to synthesize Intermediate Compound 38-g (yield of 60%).

(8) Synthesis of Intermediate Compound 38-h

Intermediate Compound 38-d (1.2 eq), Intermediate Compound 38-g (1.0 eq), $Pd_2(dba)_3$ (5 mol %), Sphos (7 mol %), and sodium tert-butoxide (2.0 eq) were dissolved in toluene (0.1 M), and stirred at 110 °C for 3 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:9), so as to synthesize Intermediate Compound 38-h (yield of 88%).

(9) Synthesis of Intermediate Compound 38-i

Intermediate Compound 38-h (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 38-i (yield of 91%).

(10) Synthesis of Intermediate Compound 38-j

Intermediate Compound 38-i (1.0 eq) and ammonium hexafluorophosphate (3.0 eq) were dissolved in methanol (0.5 M), and distilled water was added thereto, followed by stirring at room temperature for 3 hours to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated, so as to synthesize Intermediate Compound 38-j (yield of 93%).

(11) Synthesis of Compound 38

Intermediate Compound 38-j, dichloro(1,5-cyclooctadiene)platinum (II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 38 (yield of 23%).

Synthesis Example 2: Synthesis of Compound 47

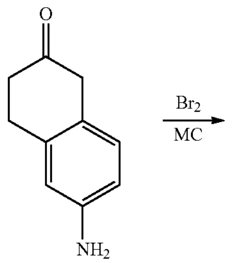

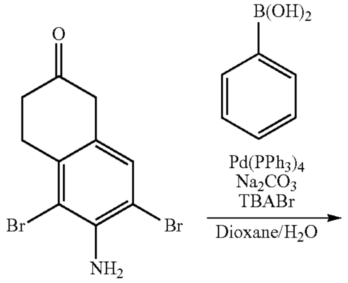

47-a

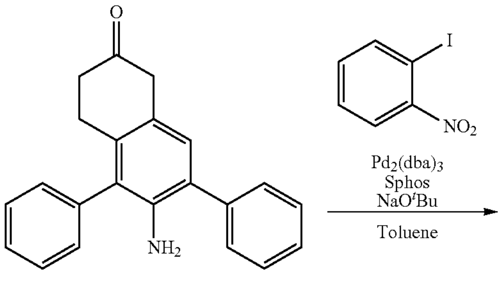

47-b

-continued

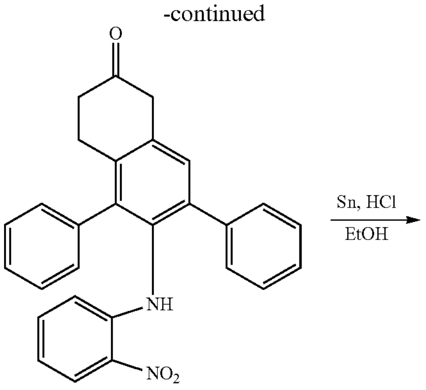

47-c

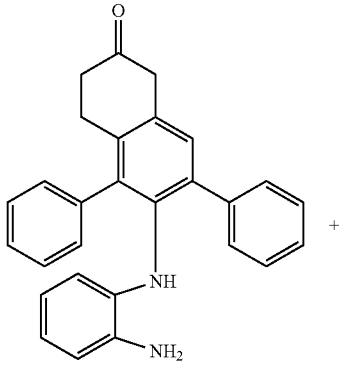

47-d

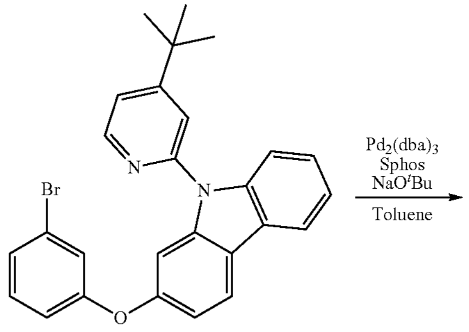

38-g

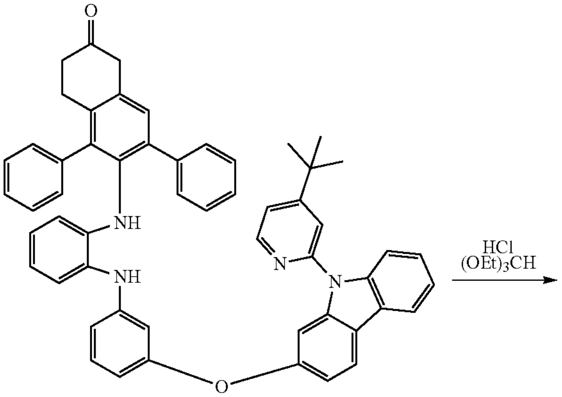

47-e

-continued

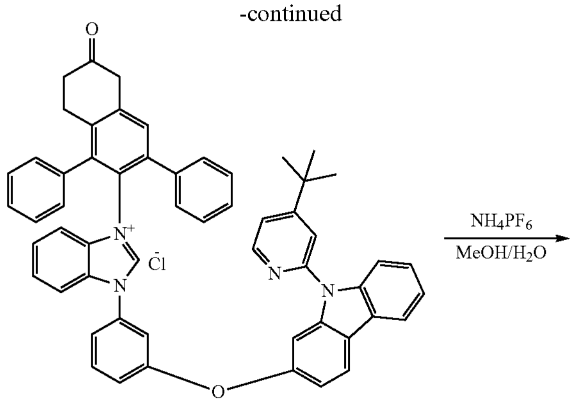

47-f

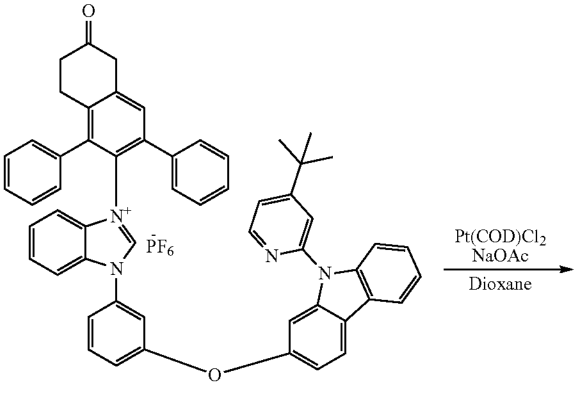

47-g

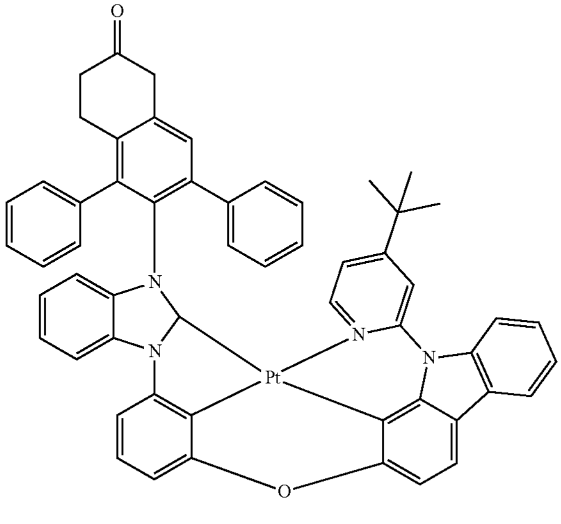

47

(1) Synthesis of Intermediate Compound 47-a

To a solution in which 6-amino-3,4-dihydronaphthalen-2(1H)-one (1.0 eq) was dissolved in MC (0.05 M), a solution in which bromine (2.5 eq) was dissolved in MC (0.25 M) was slowly added, and the mixed solution was stirred at room temperature for 16 hours to prepare a reaction mixture. $H_2O$ (0.05 M) was added at 0 °C to the reaction mixture, and stirred for 1 hour. A 1 M sodium bicarbonate (0.05 M) solution was added thereto, and an extraction process was performed thereon by using MC and water three times to obtain an organic layer. The organic layer thus obtained was dried by using magnesium sulfate, concentrated, and subjected to column chromatography (a volume ratio of EA:hexane was 1:20), so as to synthesize Intermediate Compound 47-a (yield of 97%).

(2) Synthesis of Intermediate Compound 47-b

Intermediate Compound 47-a (1.0 eq), phenyl boronic acid (2.7 eq), $Pd(PPh_3)_4$ (10 mol %), sodium carbonate (3.0 eq), and tetrabutylammonium bromide (20 mol %) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:20), so as to synthesize Intermediate Compound 47-b (yield of 84%).

(3) Synthesis of Intermediate Compound 47-c 1-iodo-2-nitrobenzene (1.2 eq), Intermediate Compound 47-b (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesis of Intermediate Compound 47-c (yield of 75%).

(4) Synthesis of Intermediate Compound 47-d

Intermediate Compound 47-c (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 47-d (yield of 90%).

(5) Synthesis of Intermediate Compound 47-e

Intermediate Compound 47-d (1.2 eq), Intermediate Compound 38-g (1.0 eq), $Pd_2(dba)_3$ (5 mol %), Sphos (7 mol %), and sodium tert-butoxide (2.0 eq) were dissolved in toluene (0.1 M), and stirred at 110 °C for 4 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 47-e (yield of 85%).

(6) Synthesis of Intermediate Compound 47-f

Intermediate Compound 47-e (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 47-f (yield of 91%).

(7) Synthesis of Intermediate Compound 47-g

Intermediate Compound 47-f (1.0 eq) and ammonium hexafluorophosphate (3.0 eq) were dissolved in methanol (0.5 M), and distilled water was added thereto, followed by stirring at room temperature for 1 hour to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 47-g (yield of 91%).

8) Synthesis of Compound 47

Intermediate Compound 47-g, dichloro(1,5-cyclooctadiene)platinum(II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 47 (yield of 22%).

Synthesis Example 3: Synthesis of Compound 82

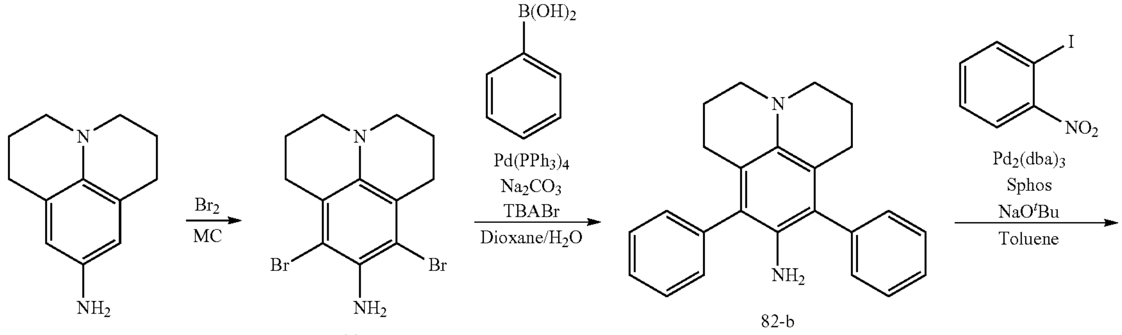

82-a 82-b

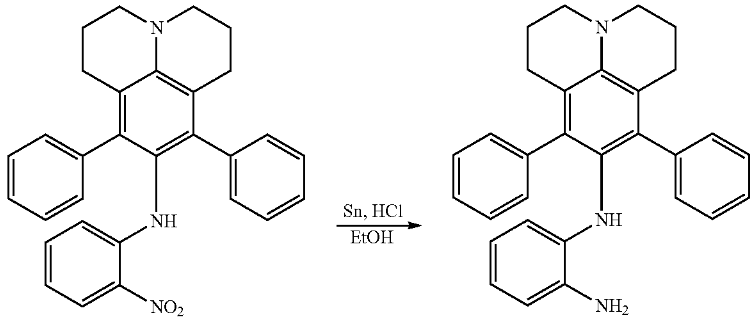

82-c 82-d

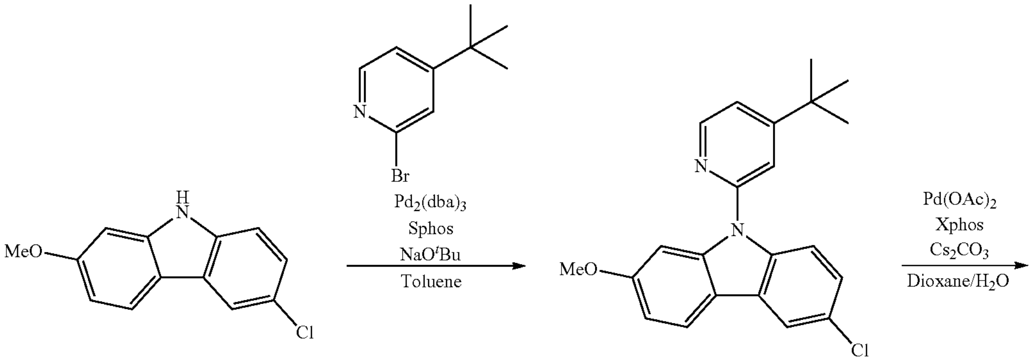

82-e

-continued
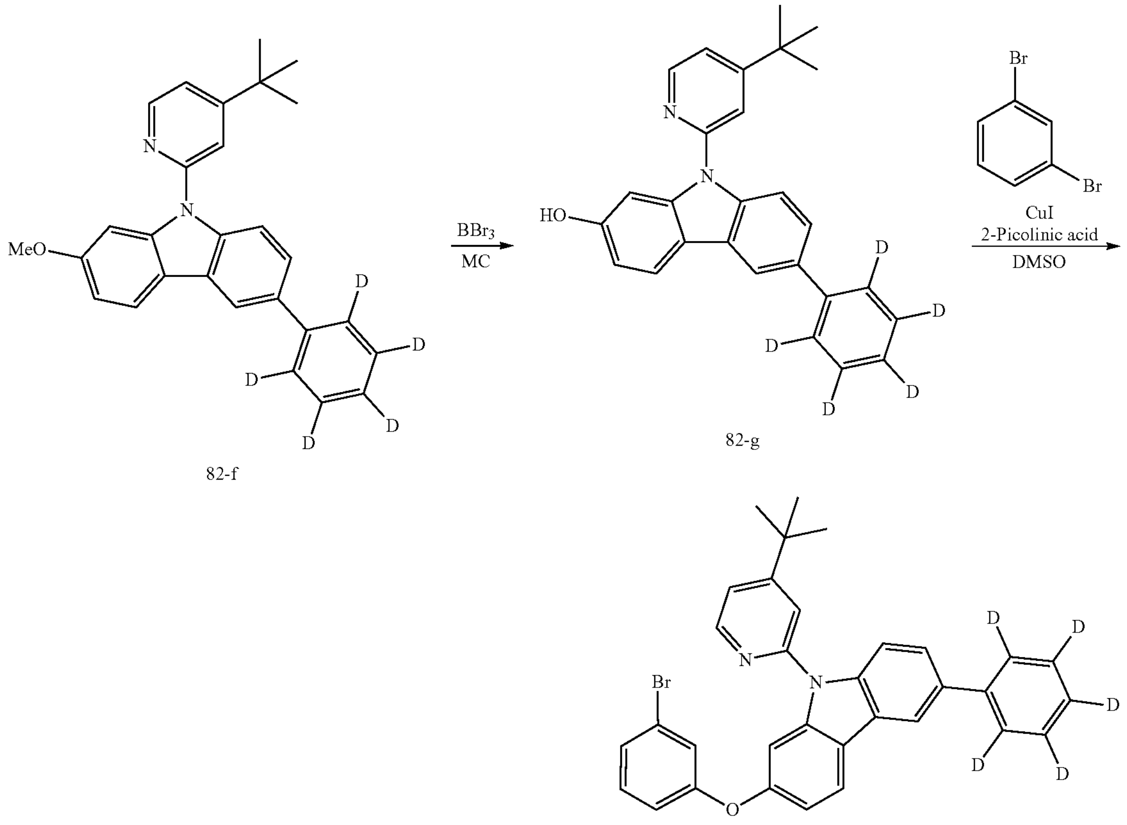
82-f 82-g 82-h
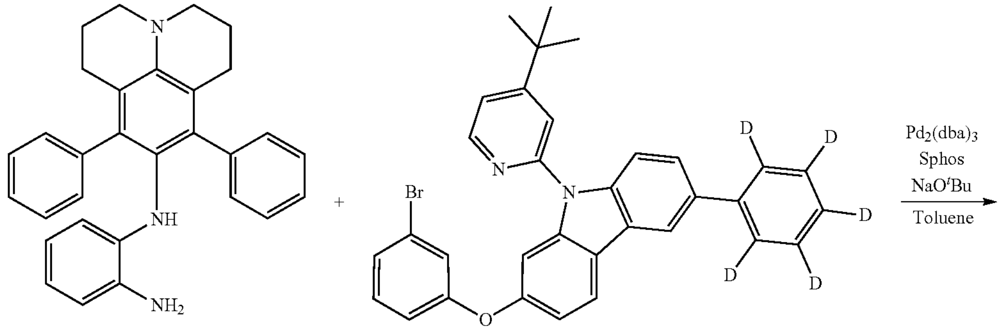
82-d 82-h
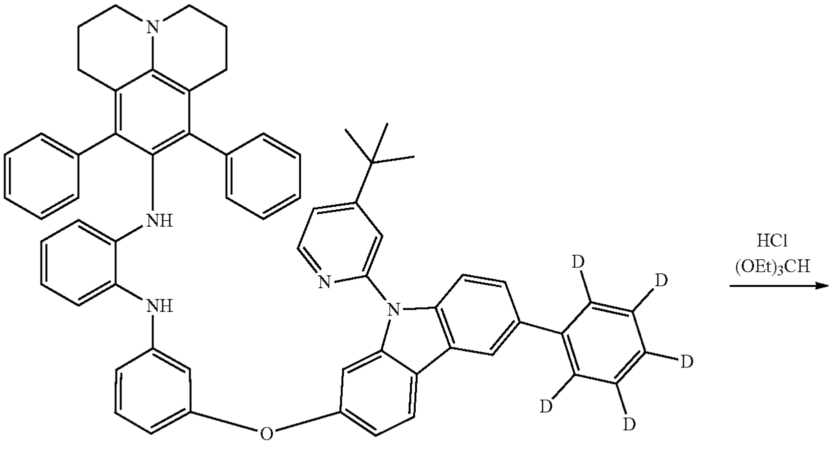
82-i

-continued
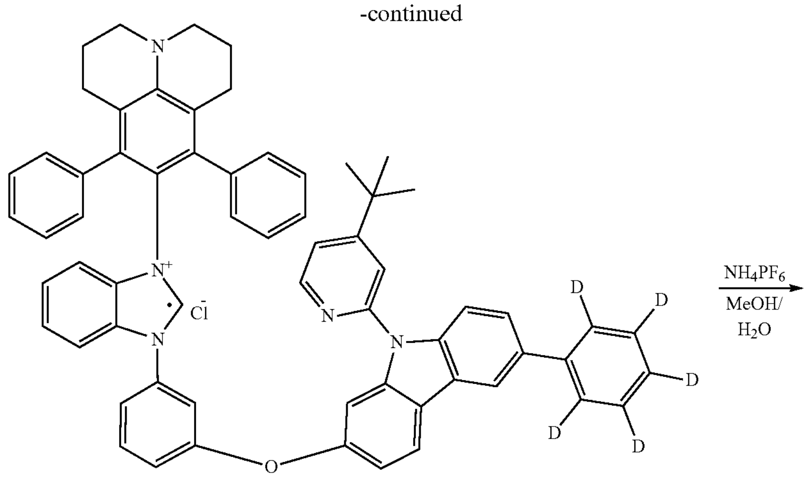
82-j
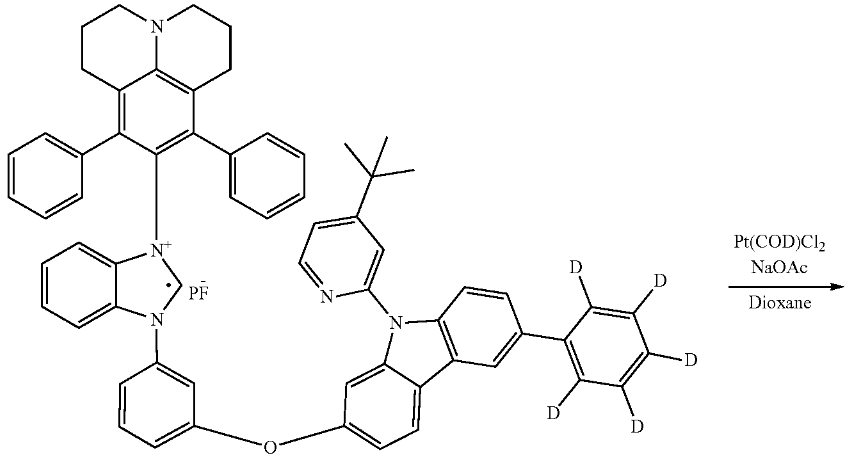
82-k
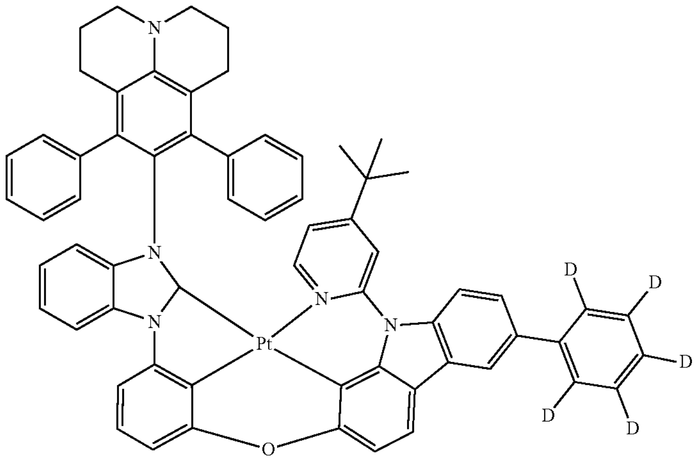
82

(1) Synthesis of Intermediate Compound 82-a

To a solution in which 2,3,6,7-tetrahydro-1H,5H-pyrido[3,2,1-ij]quinolin-9-amine (1.0 eq) was dissolved in MC (0.05 M), a solution in which bromine (2.5 eq) was dissolved in MC (0.25 M) was slowly added, and the mixed solution was stirred at room temperature for 16 hours. Distilled water (0.05 M) was added at 0 °C to the reaction mixture, and stirred for 1 hour. A 1 M sodium bicarbonate (0.05 M) solution was added thereto, and an extraction process was performed thereon by using MC and water three times to obtain an organic layer. The organic layer thus obtained was dried by using magnesium sulfate, concentrated, and subjected to column chromatography (a volume ratio of EA:hexane was 1:10), so as to synthesize Intermediate Compound 82-a (yield of 95%).

(2) Synthesis of Intermediate Compound 82-b

Intermediate Compound 82-a (1.0 eq), phenyl boronic acid (3.0 eq), $Pd(PPh_3)_4$ (10 mol %), sodium carbonate (4.0 eq), and tetrabutylammonium bromide (20 mol %) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:4), so as to synthesize Intermediate Compound 82-b (yield of 79%).

(3) Synthesis of Intermediate Compound 82-c 1-iodo-2-nitrobenzene (1.2 eq), Intermediate Compound 82-b (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 82-c (yield of 70%).

(4) Synthesis of Intermediate Compound 82-d

Intermediate Compound 82-c (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 82-d (yield of 89%).

(5) Synthesis of Intermediate Compound 82-e 6-chloro-2-methoxy-9H-carbazole (1.0 eq), 2-bromo-4-(tert-butyl)pyridine (1.1 eq), $Pd_2(dba)_3$ (5 mol %), Sphos (7 mol %), and sodium tert-butoxide (2.0 eq) were dissolved in toluene (0.1 M), and stirred at 110 °C for 12 hours. The reaction mixture was cooled at room temperature, and the solvent was removed under reduced pressure. An extraction process was performed thereon by using dichloromethane and water three times to obtain an organic layer. The organic layer thus obtained was dried by using magnesium sulfate, concentrated, and subjected to column chromatography (a volume ratio of EA:hexane was 1:10), so as to synthesize Intermediate Compound 82-e (yield of 88%).

(6) Synthesis of Intermediate Compound 82-f

Intermediate Compound 82-e (1.0 eq), phenyl-d5-boronic acid (1.4 eq), $Pd(OAc)_2$ (20 mol %), Sphos (10 mol %), and $Cs_2CO_3$ (2.0 eq) were dissolved in a mixed solution of dioxane and $H_2O$ (at a volume ratio of 3:1) (0.1 M), and stirred at 100 °C for hours. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:4), so as to synthesize Intermediate Compound 82-f (yield of 71%).

(7) Synthesis of Intermediate Compound 82-g

To a solution in which Intermediate Compound 82-f (1.0 eq) was dissolved in MC (0.1 M), a 1.0 M $BBr_3$ solution in MC (2.0 eq) was slowly added, and the mixed solution was stirred for 1 hour, and stirred again at room temperature for 2 hours. Distilled water (0.1 M) was added thereto, and the reaction solution was stirred at room temperature for 1 hour. An extraction process was performed thereon by using MC and water three times to obtain an organic layer. The organic layer thus obtained was dried by using magnesium sulfate, and filtered through silica gel, so as to synthesize Intermediate Compound 82-g (yield of 67%).

(8) Synthesis of Intermediate Compound 82-h 1,3-dibromobenzene (1.2 eq), Intermediate Compound 82-g (1.0 eq), CuI (10 mol %), 2-picolinic acid (20 mol %), and potassium phosphate tribasic (2.0 eq) were dissolved in DMSO (0.1 M), and stirred at 110 °C for 4 hours. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:4), so as to synthesize Intermediate Compound 82-h (yield of 65%).

(9) Synthesis of Intermediate Compound 82-i

Intermediate Compound 82-d (1.2 eq), Intermediate Compound 82-h (1.0 eq), $Pd_2(dba)_3$ (5 mol %), Sphos (7 mol %), and sodium tert-butoxide (2.0 eq) were dissolved in toluene (0.1 M), and stirred at 110 °C for 2 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:9), so as to synthesize Intermediate Compound 82-i (yield of 70%).

(10) Synthesis of Intermediate Compound 82-j

Intermediate Compound 82-i (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 82-j (yield of 89%).

(11) Synthesis of Intermediate Compound 82-k

Intermediate Compound 82-j (1.0 eq) and ammonium hexafluorophosphate (3.0 eq) were dissolved in methanol (0.5 M), and distilled water was added thereto, followed by stirring at room temperature for 3 hours to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated, so as to synthesize Intermediate Compound 82-k (yield of 92%).

(12) Synthesis of Compound 82

Intermediate Compound 82-k, dichloro(1,5-cyclooctadiene)platinum(II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 82 (yield of 21%).

Synthesis Example 4: Synthesis of Compound 101

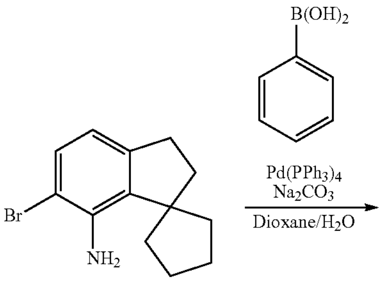

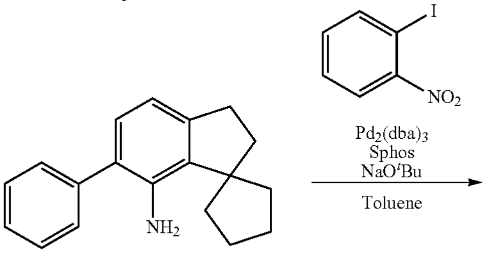

101-a

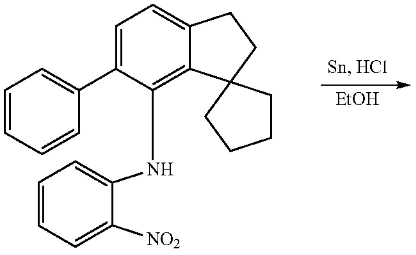

101-b

-continued

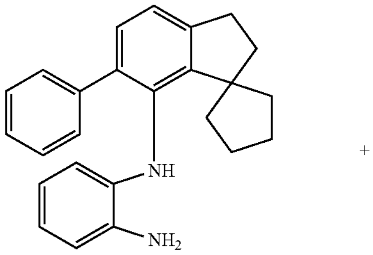

101-c

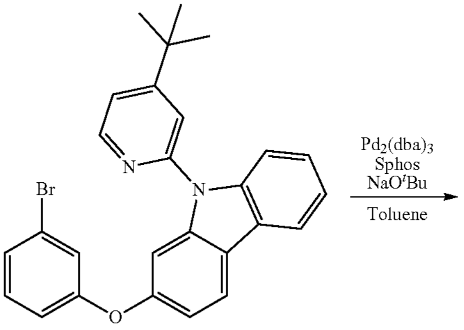

38-g

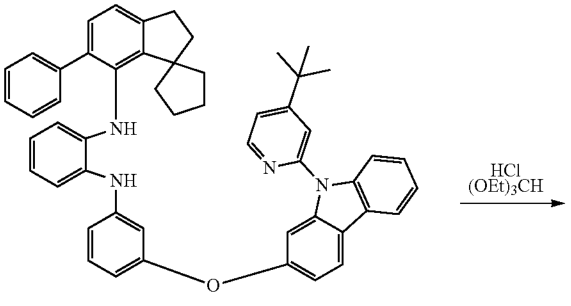

101-d

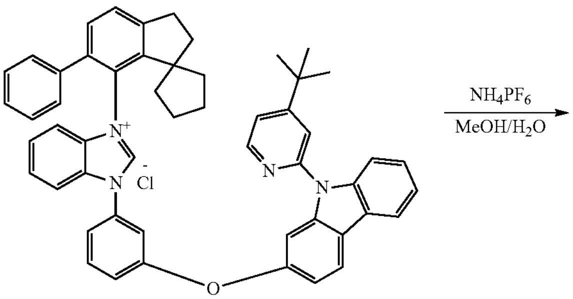

101-e

-continued

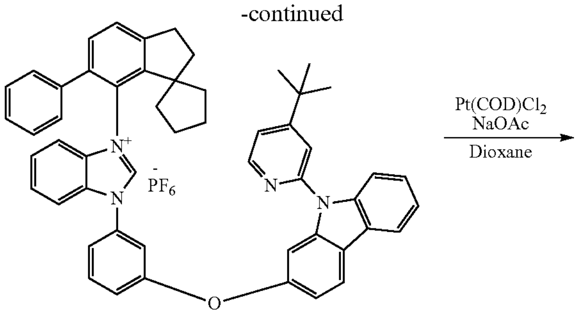

101-f

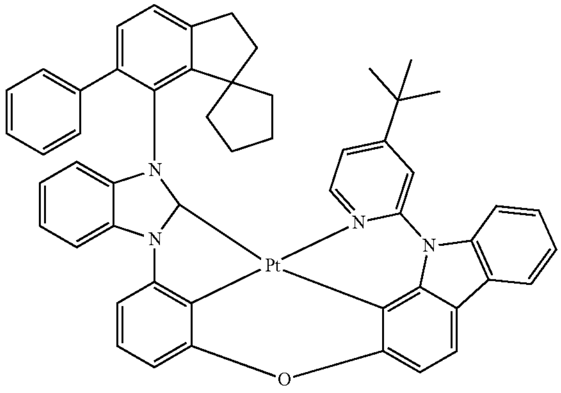

101

(1) Synthesis of Intermediate Compound 101-a 6-bromo-2,2',3,3'-tetrahydro-1,1'-spirobi[inden]-7-amine (1.0 eq), phenyl boronic acid (1.2 eq), $Pd(PPh_3)_4$ (5 mol %), and sodium carbonate (3.0 eq) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:10), so as to synthesize Intermediate Compound 101-a (yield of 82%).

(2) Synthesis of Intermediate Compound 101-b 1-iodo-2-nitrobenzene (1.2 eq), Intermediate Compound 101-a (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 101-b (yield of 70%).

(3) Synthesis of Intermediate Compound 101-c

Intermediate Compound 101-b (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 101-d (yield of 85%).

(4) Synthesis of Intermediate Compound 101-d

Intermediate Compound 101-c (1.2 eq), Intermediate Compound 38-g (1.0 eq), $Pd_2(dba)_3$ (5 mol %), Sphos (7 mol %), and sodium tert-butoxide (2.0 eq) were dissolved in toluene (0.1 M), and stirred at 110 °C for 4 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:10), so as to synthesize Intermediate Compound 101-d (yield of 92%).

(5) Synthesis of Intermediate Compound 101-e

Intermediate Compound 101-i (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 101-e (yield of 93%).

(6) Synthesis of Intermediate Compound 101-f

Intermediate Compound 101-e (1.0 eq) and ammonium hexafluorophosphate (3.0 eq) were dissolved in methanol (0.5 M), and distilled water was added thereto, followed by stirring at room temperature for 1 hour to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 101-f (yield of 90%).

(3) Synthesis of Compound 101

Intermediate Compound 101-f, dichloro(1,5-cyclooctadiene)platinum (II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 101 (yield of 22%).

Synthesis Example 5: Synthesis of Compound 73
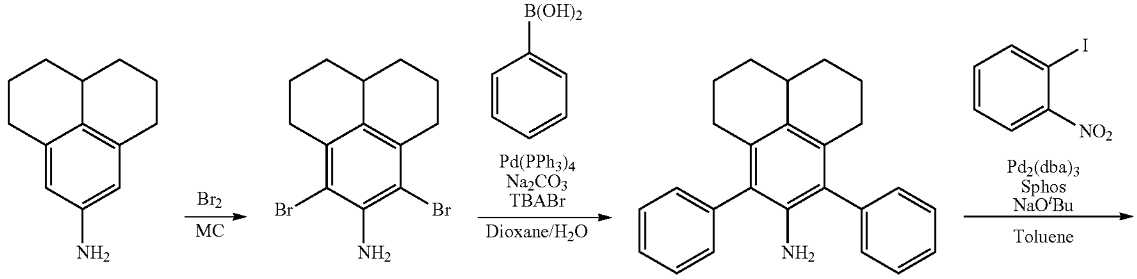
73-a
73-b
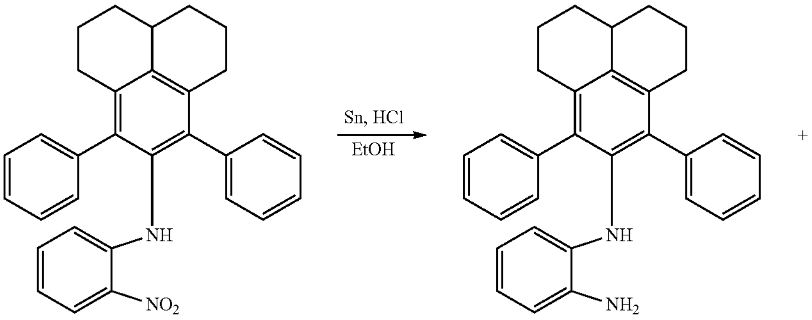
73-c
73-d
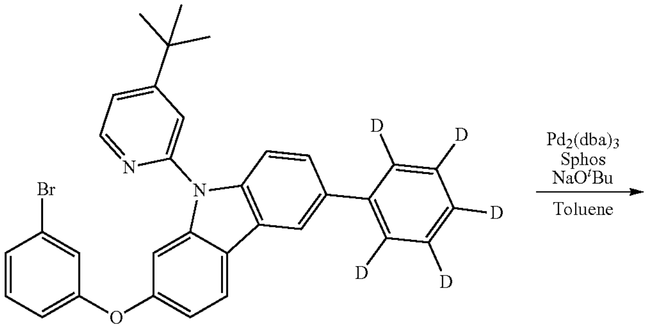
82-h
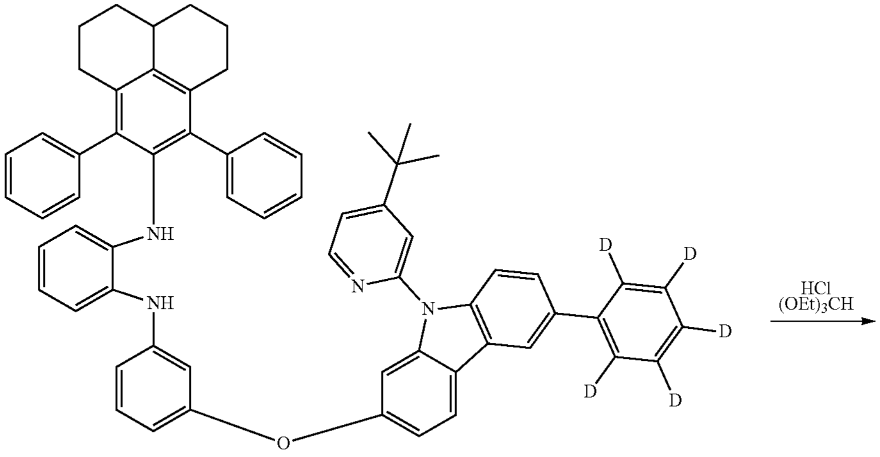
73-e -continued

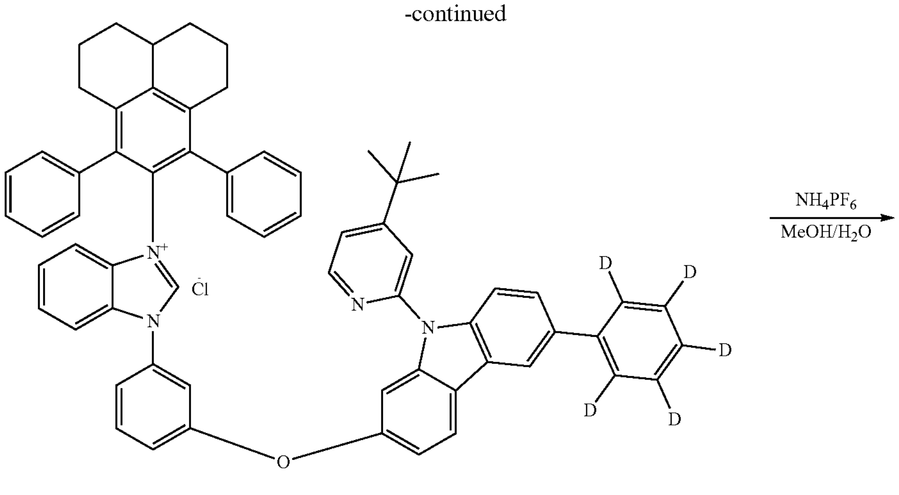

73-f

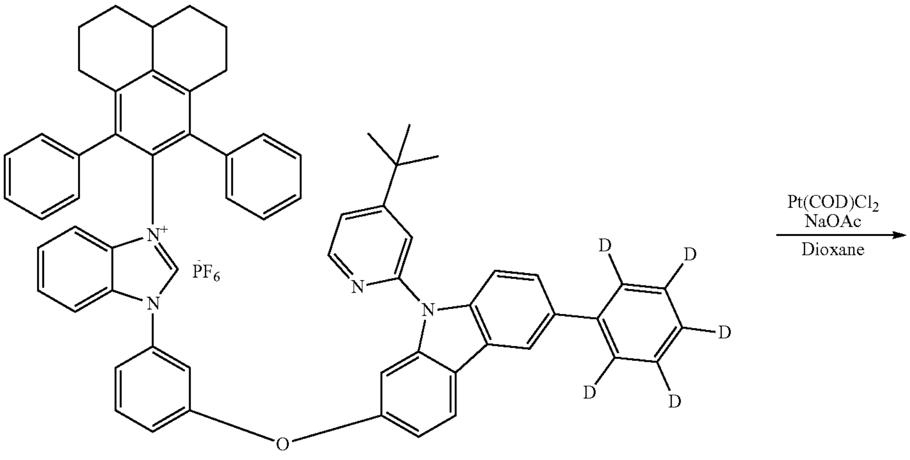

73-g

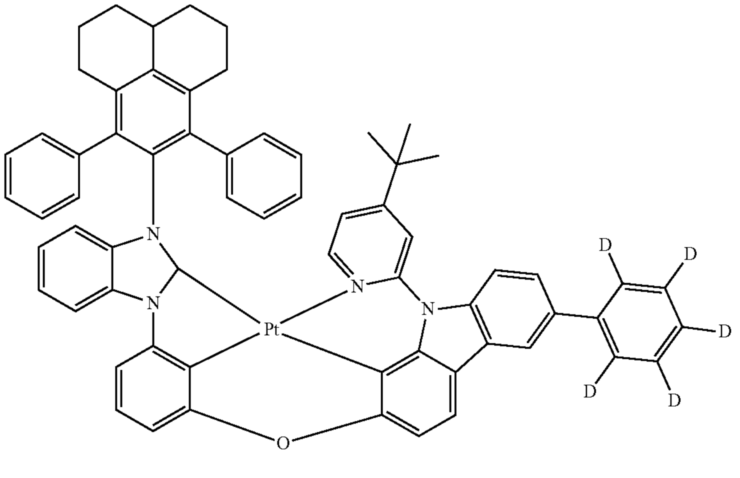

73

(1) Synthesis of Intermediate Compound 73-a

To a solution in which 2,3,6,7-tetrahydro-1H,5H-pyrido[3,2,1-ij]quinolin-9-amine (1.0 eq) was dissolved in MC (0.05 M), a solution in which bromine (2.5 eq) was dissolved in MC (0.25 M) was slowly added, and the mixed solution was stirred at room temperature for 16 hours. $H_2O$ (0.05 M) was added at 0 °C to the reaction mixture, and stirred for 1 hour. A 1 M sodium bicarbonate (0.05 M) solution was added thereto, and an extraction process was performed thereon by using MC and water three times to obtain an organic layer. The organic layer thus obtained was dried by using magnesium sulfate, concentrated, and subjected to column chromatography (a volume ratio of EA:hexane was 1:20), so as to synthesize Intermediate Compound 73-a (yield of 96%).

(2) Synthesis of Intermediate Compound 73-b

Intermediate Compound 73-a (1.0 eq), phenyl boronic acid (2.7 eq), $Pd(PPh_3)_4$ (10 mol %), sodium carbonate (3.0 eq), and tetrabutylammonium bromide (20 mol %) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:20), so as to synthesize Intermediate Compound 73-b (yield of 86%).

(3) Synthesis of Intermediate Compound 73-c 1-iodo-2-nitrobenzene (1.2 eq), Intermediate Compound 73-b (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesis of Intermediate Compound 73-c (yield of 70%).

(2) Synthesis of Intermediate Compound 73-d

Intermediate Compound 73-c (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 73-d (yield of 80%).

(5) Synthesis of Intermediate Compound 73-e

Intermediate Compound 73-d (1.2 eq), Intermediate Compound 82-h (1.0 eq), $Pd_2(dba)_3$ (5 mol %), Sphos (7 mol %), and sodium tert-butoxide (2.0 eq) were dissolved in toluene (0.1 M), and stirred at 110 °C for 4 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 73-e (yield of 88%).

(6) Synthesis of Intermediate Compound 73-f

Intermediate Compound 73-e (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 73-f (yield of 89%).

(7) Synthesis of Intermediate Compound 73-g

Intermediate Compound 73-f (1.0 eq) and ammonium hexafluorophosphate (3.0 eq) were dissolved in methanol (0.5 M), and distilled water was added thereto, followed by stirring at room temperature for 1 hour to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 73-g (yield of 93%).

(8) Synthesis of Compound 73

Intermediate Compound 73-g, dichloro(1,5-cyclooctadiene)platinum(II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 73 (yield of 20%).

Synthesis Example 6: Synthesis of Compound 74

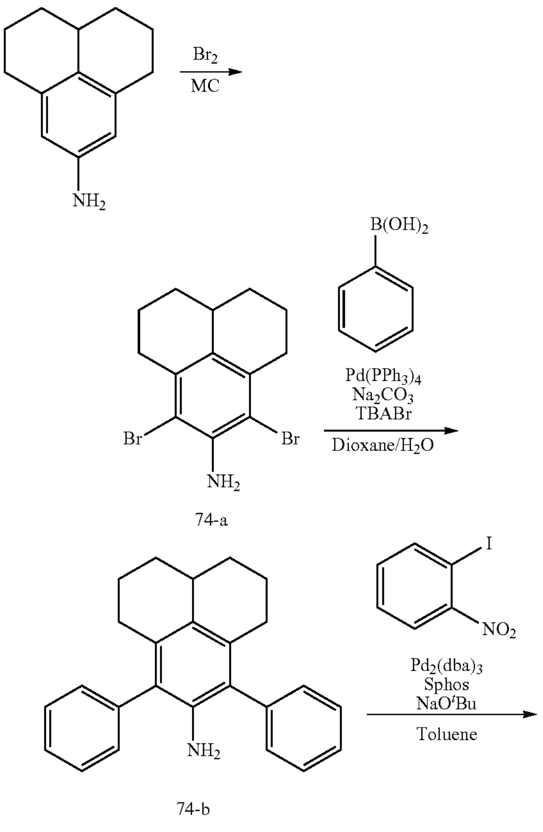

74-a 74-b

-continued

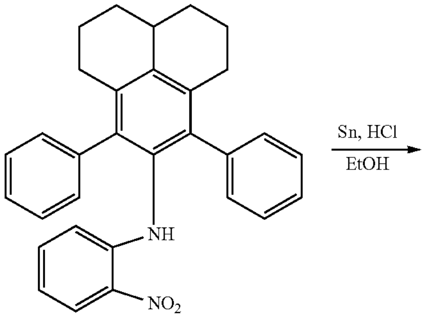

74-c

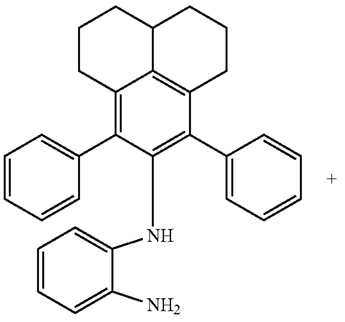

74-d

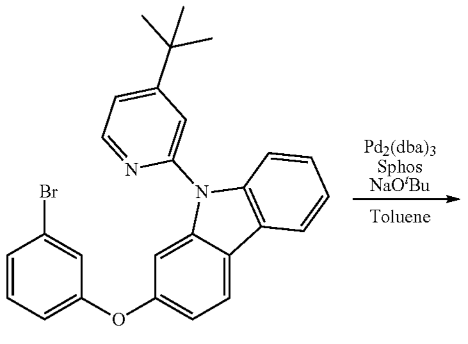

38-g

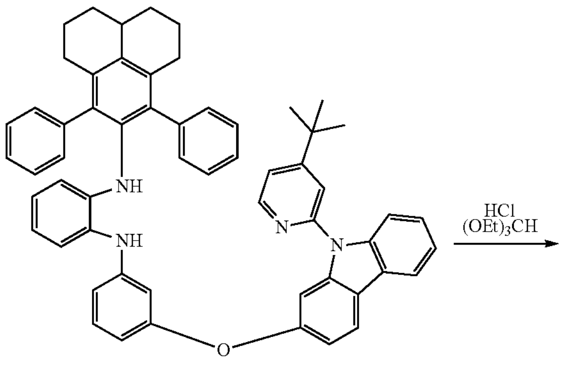

74-e

-continued

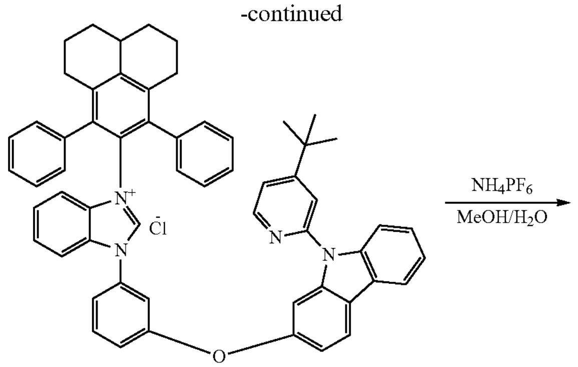

74-f

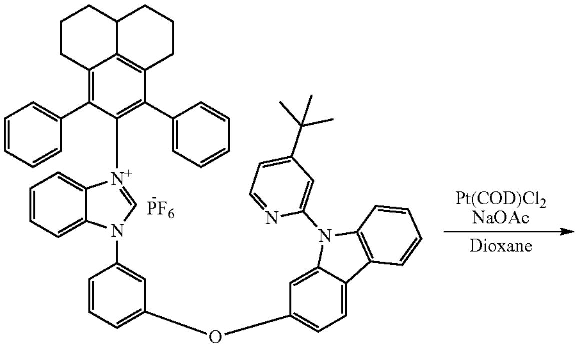

74-g

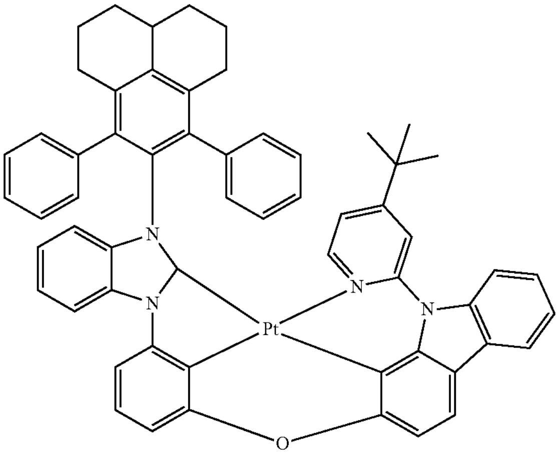

74

(1) Synthesis of Intermediate Compound 74-a

To a solution in which 2,3,6,7-tetrahydro-1H,5H-pyrido [3,2,1-ij]quinolin-9-amine (1.0 eq) was dissolved in MC (0.05 M), a solution in which bromine (2.5 eq) was dissolved in MC (0.25 M) was slowly added, and the mixed solution was stirred at room temperature for 16 hours. $H_2O$ (0.05 M) was added at 0 °C to the reaction mixture, and stirred for 1 hour. A 1 M sodium bicarbonate (0.05 M) solution was added thereto, and an extraction process was performed thereon by using MC and water three times to obtain an organic layer. The organic layer thus obtained was dried by using magnesium sulfate, concentrated, and subjected to column chromatography (a volume ratio of EA:hexane was 1:20), so as to synthesize Intermediate Compound 74-a (yield of 96%).

(2) Synthesis of Intermediate Compound 74-b

Intermediate Compound 74-a (1.0 eq), phenyl boronic acid (2.7 eq), $Pd(PPh_3)_4$ (10 mol %), sodium carbonate (3.0 eq), and tetrabutylammonium bromide (20 mol %) were dissolved in a mixed solution of 1,4-dioxane and $H_2O$ (at a volume ratio of 4:1) (0.1 M), and stirred at 100 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:20), so as to synthesize Intermediate Compound 74-b (yield of 86%).

(3) Synthesis of Intermediate Compound 74-c 1-iodo-2-nitrobenzene (1.2 eq), Intermediate Compound 74-b (1.0 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesis of Intermediate Compound 74-c (yield of 70%).

(4) Synthesis of Intermediate Compound 74-d

Intermediate Compound 74-c (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 74-d (yield of 80%).

(5) Synthesis of Intermediate Compound 74-e

Intermediate Compound 74-d (1.2 eq), Intermediate Compound 38-g (1.0 eq), $Pd_2(dba)_3$ (5 mol %), Sphos (7 mol %), and sodium tert-butoxide (2.0 eq) were dissolved in toluene (0.1 M), and stirred at 110 °C for 4 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 74-e (yield of 65%).

(6) Synthesis of Intermediate Compound 74-f

Intermediate Compound 74-e (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 74-f (yield of 88%).

(7) Synthesis of Intermediate Compound 74-g

Intermediate Compound 74-f (1.0 eq) and ammonium hexafluorophosphate (3.0 eq) were dissolved in methanol (0.5 M), and distilled water was added thereto, followed by stirring at room temperature for 1 hour to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 74-g (yield of 91%).

(8) Synthesis of Compound 74

Intermediate Compound 74-g, dichloro(1,5-cyclooctadiene)platinum(II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 74 (yield of 21%).

Synthesis Example 7: Synthesis of Compound 109

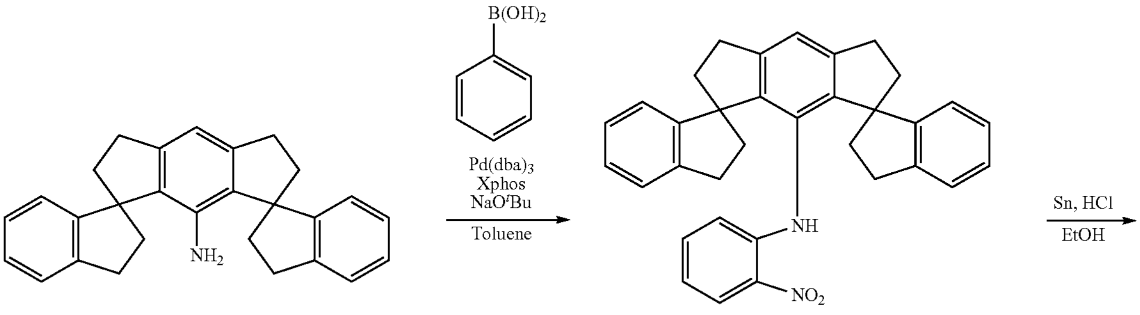

109-a

-continued
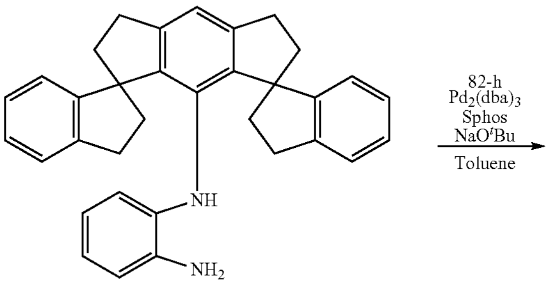
109-b
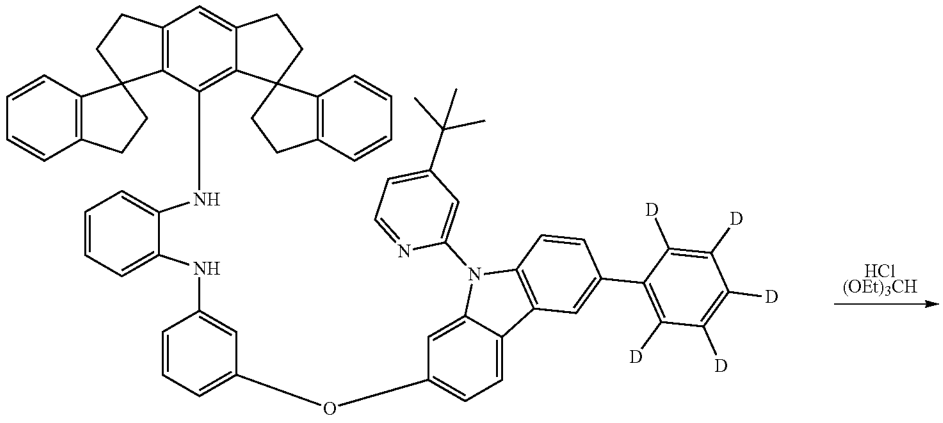
109-c
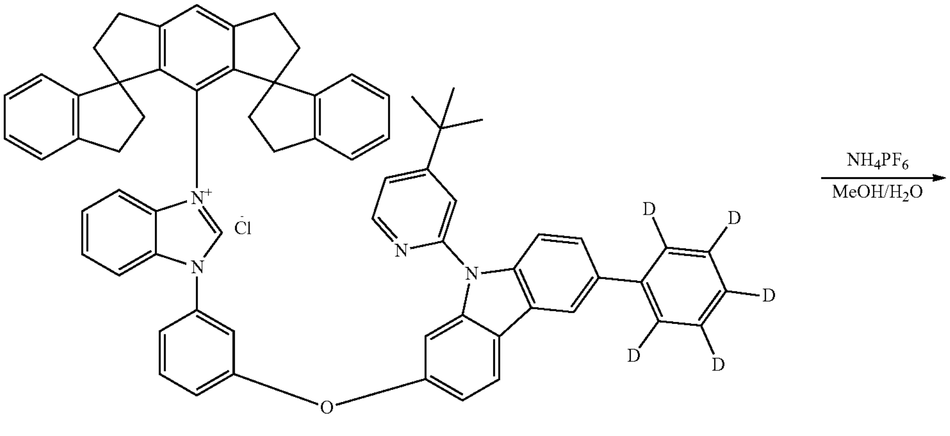
109-d

-continued

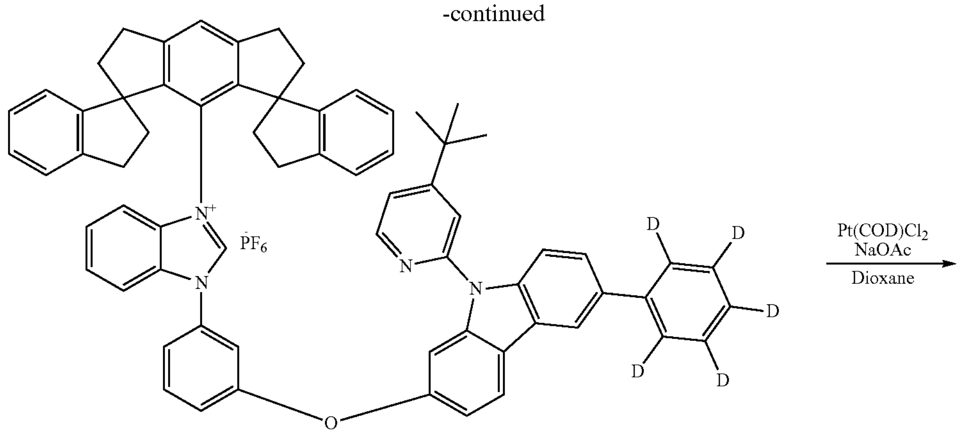

109-e

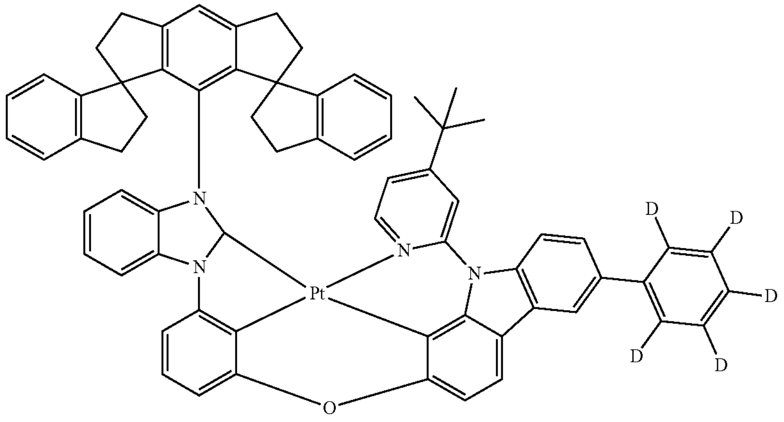

109

(1) Synthesis of Intermediate Compound 109-a 2,2',2",3,3',3",5',6'-octahydrodispiro[indene-1,1'-s-indacene-7',1"-inden]-8'-amine (1.0 eq), 1-bromo-2-nitrobenzene (1.2 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 109-a (yield of 69%).

(2) Synthesis of Intermediate Compound 109-b

Intermediate Compound 109-a (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 109-b (yield of 81%).

(3) Synthesis of Intermediate Compound 109-c

Intermediate Compound 109-b (1.2 eq), Intermediate Compound 82-h (1.0 eq), $Pd_2(dba)_3$ (5 mol %), Sphos (7 mol %), and sodium tert-butoxide (2.0 eq) were dissolved in toluene (0.1 M), and stirred at 110 °C for 2 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 109-c (yield of 85%).

(4) Synthesis of Intermediate Compound 109-d

Intermediate Compound 109-c (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 109-d (yield of 85%).

(5) Synthesis of Intermediate Compound 109-e

Intermediate Compound 109-d (1.0 eq) and ammonium hexafluorophosphate (3.0 eq) were dissolved in methanol (0.5 M), and distilled water was added thereto, followed by stirring at room temperature for 6 hours to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 109-e (yield of 91%).

(6) Synthesis of Compound 109

Intermediate Compound 109-e, dichloro(1,5-cyclooctadiene)platinum (II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 109 (yield of 20%).

Synthesis Example 8: Synthesis of Compound 110

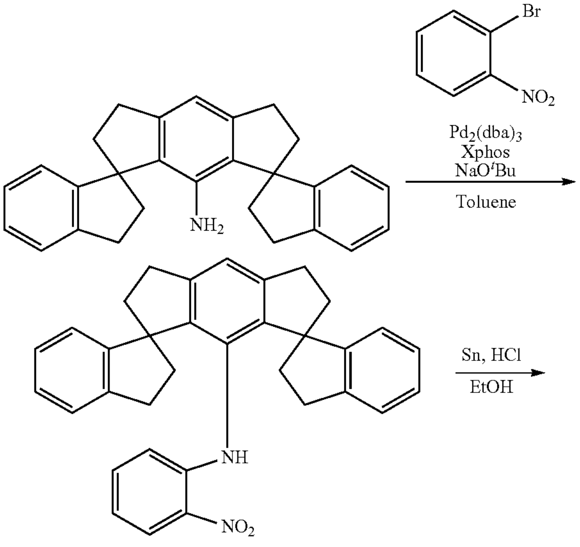

110-a

-continued

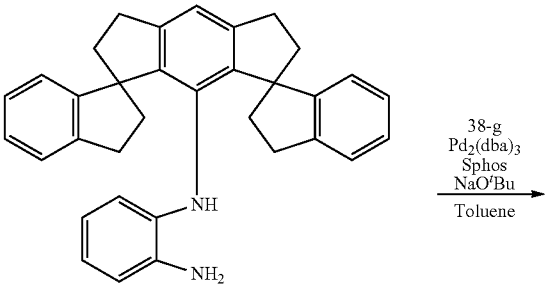

110-b

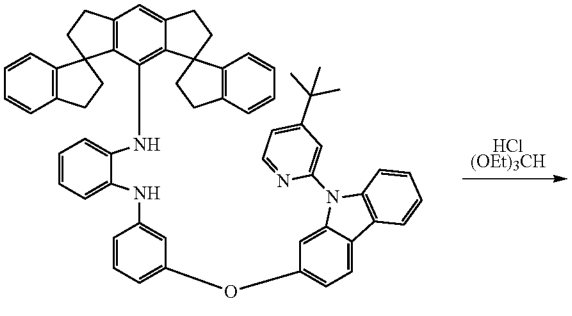

110-c

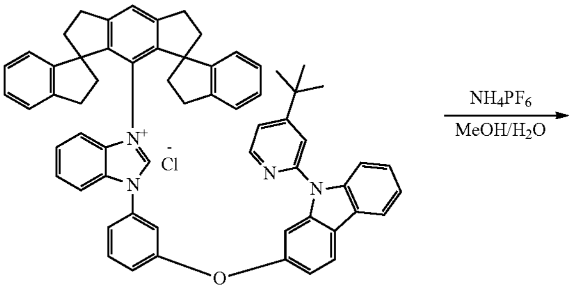

110-d

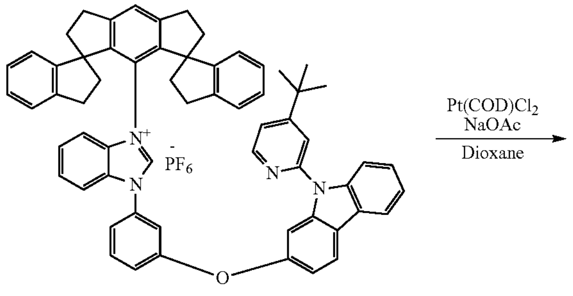

110-e

-continued

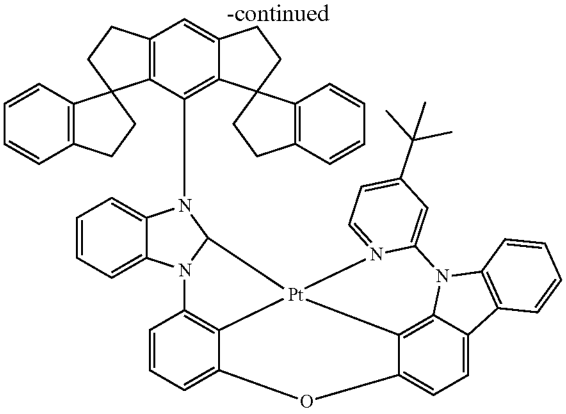

110

(1) Synthesis of Intermediate Compound 110-a 2,2',2",3,3',3",5',6'-octahydrodispiro[indene-1,1'-s-indacene-7',1"-inden]-8'-amine (1.0 eq), 1-bromo-2-nitrobenzene (1.2 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 110-a (yield of 69%).

(2) Synthesis of Intermediate Compound 110-b

Intermediate Compound 110-a (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. An extraction process was performed on the neutralized product by using dichloromethane and water to obtain an organic layer, which was filtered through celite/silica gel. The filtrate was dried by using magnesium sulfate, concentrated, and subjected to column chromatography (a volume ratio of MC:hexane was 1:3), so as to synthesize Intermediate Compound 110-b (yield of 81%).

(3) Synthesis of Intermediate Compound 110-c

Intermediate Compound 110-b (1.2 eq), Intermediate Compound 38-g (1.0 eq), $Pd_2(dba)_3$ (5 mol %), Sphos (7 mol %), and sodium tert-butoxide (2.0 eq) were dissolved in toluene (0.1 M), and stirred at 110 °C for 2 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 110-c (yield of 87%).

(4) Synthesis of Intermediate Compound 110-d

Intermediate Compound 110-c (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 110-d (yield of 89%).

(5) Synthesis of Intermediate Compound 110-e

Intermediate Compound 110-d (1.0 eq) and ammonium hexafluorophosphate (3.0 eq) were dissolved in methanol (0.5 M), and distilled water was added thereto, followed by stirring at room temperature for 6 hours to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 110-e (yield of 91%).

(6) Synthesis of Compound 110

Intermediate Compound 110-e, dichloro(1,5-cyclooctadiene)platinum (II) (1.1 eq), and sodium acetate (2.0 eq) were dissolved in anhydrous 1,4-dioxane (0.05 M), and stirred at 120 °C for 4 days under nitrogen to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 110 (yield of 22%).

Synthesis Example 9: Synthesis of Compound 118

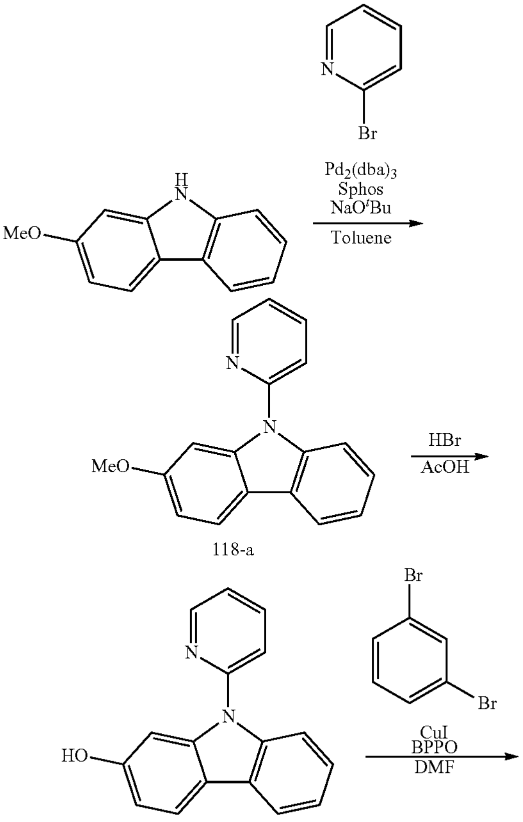

118-a 118-b

-continued

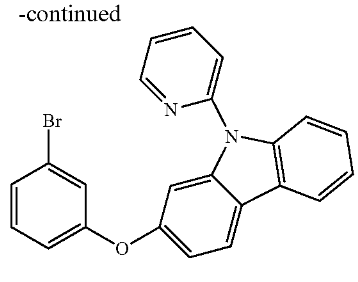

118-c

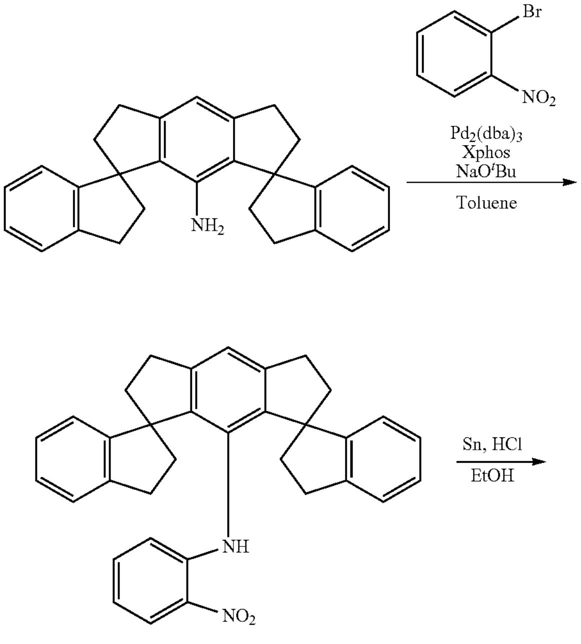

118-d

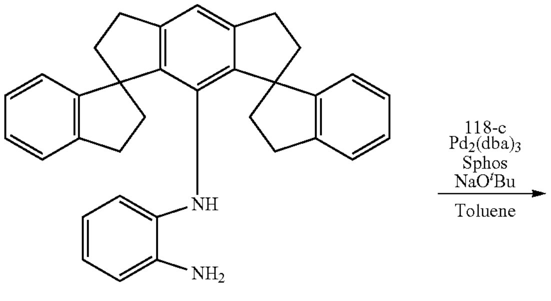

118-e

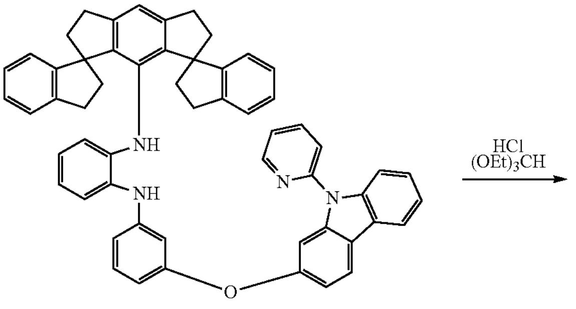

118-f

-continued

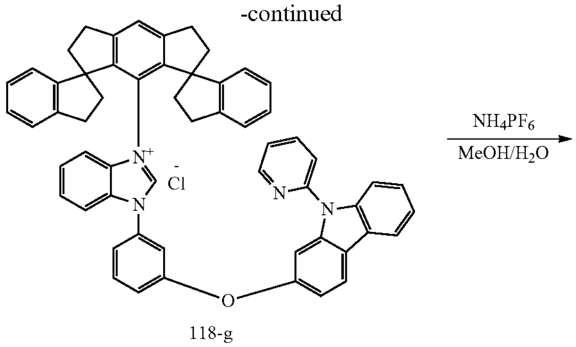

118-g

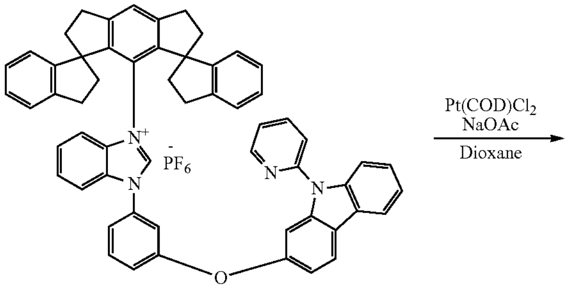

118-h

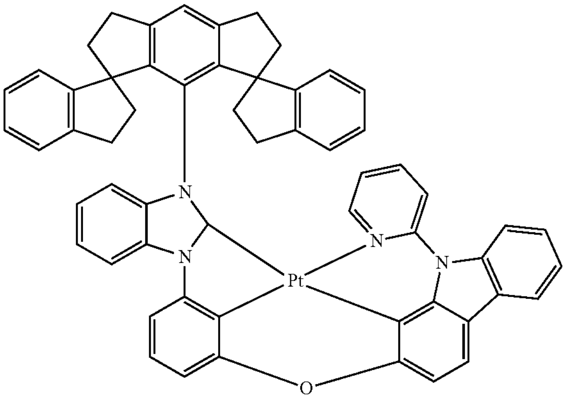

118

(1) Synthesis of Intermediate Compound 118-a 2-methoxy-9H-carbazole (1.0 eq), 2-bromopyridine (1.1 eq), $Pd_2(dba)_3$ (5 mol %), Sphos (7 mol %), and sodium tert-butoxide (2.0 eq) were dissolved in toluene (0.1 M), and stirred at 110 °C for 12 hours to prepare a reaction product. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of EA:hexane was 1:10), so as to synthesize Intermediate Compound 118-a (yield of 95%).

(2) Synthesis of Intermediate Compound 118-b

Intermediate Compound 118-a (1.0 eq), HBr (0.5 M), and acetic acid (0.5 M) were stirred at 120 °C for 16 hours to prepare a reaction product. The reaction mixture was cooled at room temperature, and neutralized to pH 7 by using a NaOH aqueous solution. An extraction process was performed thereon by using EA and water three times to obtain an organic layer. The organic layer thus obtained was dried by using magnesium sulfate, and filtered through silica gel, so as to synthesize Intermediate Compound 118-b (yield of 85%).

(3) Synthesis of Intermediate Compound 118-c 1,3-dibromobenzene (1.2 eq), Intermediate Compound 118-b (1.0 eq), CuI (10 mol %), N,N'-bis(2-phenylphenyl) oxalamide (BPPO) (10 mol %), and potassium phosphate tribasic (2.0 eq) were dissolved in DMSO (0.1 M), and stirred at 110 °C for 12 hours to prepare a reaction mixture. The reaction mixture was cooled at room temperature, and an extraction process was performed thereon by using EA and water three times to obtain an organic layer. The organic layer thus obtained was dried by using magnesium sulfate, concentrated, and subjected to column chromatography (a volume ratio of EA:hexane was 1:20), so as to synthesize Intermediate Compound 118-c (yield of 56%).

(4) Synthesis of Intermediate Compound 118-d 2,2',2'',3,3',3'',5',6'-octahydrodispiro[indene-1,1'-s-indacene-7',1''-inden]-8'-amine (1.0 eq), 1-bromo-2-nitrobenzene (1.2 eq), $Pd_2(dba)_3$ (10 mol %), Sphos (15 mol %), and sodium tert-butoxide (3.0 eq) were dissolved in toluene (0.1 M), and stirred at 110 °C for 12 hours to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 1:4), so as to synthesize Intermediate Compound 118-d (yield of 72%).

(5) Synthesis of Intermediate Compound 118-e

Intermediate Compound 118-d (1.0 eq), Sn (1.5 eq), and HCl (30 eq) were dissolved in ethanol, and stirred at 80 °C for 12 hours to prepare a reaction mixture. The reaction mixture was cooled at room temperature, and neutralized by using a NaOH solution. The neutralizer was subjected to an extraction process using dichloromethane and water to obtain an organic layer, and subjected to filtration through celite/silica gel. The filtrate was dried by using magnesium sulfate, concentrated, and subjected to column chromatography (a volume ratio of MC:hexane was 1:3), so as to synthesize Intermediate Compound 118-e (yield of 87%).

(6) Synthesis of Intermediate Compound 118-f

Intermediate Compound 118-e (1.1 eq), Intermediate Compound 118-c (1.0 eq), $Pd_2(dba)_3$ (5 mol %), Sphos (7 mol %), and sodium tert-butoxide (2.0 eq) were dissolved in toluene (0.1 M), and stirred at 110 °C for 2 hours to prepare a reaction mixture. The reaction mixture was cooled at room temperature, and an extraction process was performed thereon by using dichloromethane and water three times to obtain an organic layer. The organic layer thus obtained was dried by using magnesium sulfate, concentrated, and subjected to column chromatography (a volume ratio of EA:hexane was 1:4), so as to synthesize Intermediate Compound 118-f (yield of 82%).

(7) Synthesis of Intermediate Compound 118-g

Intermediate Compound 118-f (1.0 eq) was dissolved in triethyl orthoformate (30 eq), and 37% HCl (1.5 eq) was added thereto, followed by stirring at 80 °C for 12 hours to prepare a reaction mixture. After the reaction mixture was cooled at room temperature, triethyl orthoformate therein was concentrated, and an extraction process was performed thereon by using dichloromethane and water three times to obtain an organic layer. The organic layer thus obtained was dried by using magnesium sulfate, concentrated, and subjected to column chromatography (a volume ratio of MC:methanol was 95:5), so as to synthesize Intermediate Compound 118-g (yield of 88%).

(8) Synthesis of Intermediate Compound 118-h

Intermediate Compound 118-g (1.0 eq) and ammonium hexafluorophosphate (3.0 eq) were dissolved in methanol (0.5 M), and distilled water was added thereto, followed by stirring at room temperature for 2 hours to prepare a reaction mixture. The reaction mixture was washed by using distilled water, and a solid was obtained by filtering the resultant reaction mixture. An extraction process was performed on the solid thus obtained by using dichloromethane and water three times to obtain an organic layer. The organic layer thus obtained was dried by using magnesium sulfate, and concentrated to synthesize Intermediate Compound 118-h (yield of 96%).

(9) Synthesis of Compound 118

Intermediate Compound 118-h, dichloro(1,5-cyclooctadiene)platinum (II) (1.1 eq), and sodium acetate (2.0 eq) were dissolved in anhydrous 1,4-dioxane (0.05 M), and stirred at 120 °C for 4 days in the nitrogen condition to prepare a reaction mixture. The reaction mixture was cooled at room temperature, and an extraction process was performed thereon by using dichloromethane and water three times, so as to obtain an organic layer. The organic layer thus obtained was dried by using magnesium sulfate, concentrated, and subjected to column chromatography (a volume ratio of MC:hexane was 3:7), so as to synthesize Compound 118 (yield of 25%).

$^1$H NMR and MS/FAB of the compounds synthesized according to Synthesis Examples 1 to 9 are shown in Table 1. Synthesis methods of compounds other than the compounds of Synthesis Examples 1 to 9 may be readily recognized by those skilled in the art by referring to the synthesis paths and source materials.

TABLE 1

| Compound | | MS/FAB | |
|---|---|---|---|
| No. | $^1$H-NMR ($CDCl_3$, 500 MHz) | calc. | Found[M + 1] |
| 38 | 8.74 (1H, dd), 8.39 (1H, s), 8.19 (1H, s), 7.58 (1H, s), 7.51 (2H, d), 7.50 (1H, s), 7.46 (2H, d), 7.43-7.41 (6H, m), 7.40 (1H, s), 7.20 (1H, s), 7.17 (1H, s), 7.14 (2H, s), 7.08 (2H, dd), 6.95 (2H, d), 6.90 (1H, s), 6.69 (1H, s), 6.66 (1H, s), 2.74 (2H, d), 2.70 (2H, m), 1.74-1.72 (4H, dd), 1.32 (9H, s) | 984.08 | 984.02 |
| 47 | 8.74 (1H, dd), 8.39 (1H, s), 8.19 (1H, s), 8.12 (1H, s), 7.58 (1H, s), 7.51 (2H, d), 7.50 (1H, s), 7.46 (2H, d), 7.43-7.41 (5H, m), 7.40 (1H, s), 7.20 (1H, s), 7.17 (1H, s), 7.14 (2H, s), 7.08 (2H, dd), 6.95 (2H, d), 6.90 (1H, s), 6.69 (1H, s), 6.66 (1H, s), 3.59 (2H, d), 3.19 (2H, dd), 2.78 (2H, d), 1.32 (9H, s) | 998.06 | 998.14 |

TABLE 1-continued

| Compound No. | $^1$H-NMR ($CDCl_3$, 500 MHz) | MS/FAB calc. | MS/FAB Found[M + 1] |
|---|---|---|---|
| 82 | 8.74 (1H, dd), 8.39 (1H, s), 7.99 (1H, s), 7.89 (1H, s), 7.77 (1H, s), 7.51 (4H, m), 7.46 (4H, d), 7.41 (2H, d), 7.40 (1H, s), 7.17 (1H, s), 7.14 (2H, s), 6.95 (2H, d), 6.90 (1H, s), 6.69 (1H, s), 6.66 (1H, s), 3.37 (4H, t), 2.73 (4H, t), 1.96 (4H, t), 1.32 (9H, s) | 1106.26 | 1106.23 |
| 101 | 8.74 (1H, dd), 8.39 (1H, s), 8.19 (1H, s), 7.58 (1H, s), 7.50 (2H, d), 7.44 (1H, s), 7.43 (4H, m), 7.41 (1H, s), 7.40 (1H, s), 7.25 (1H, m), 7.20 (1H, s), 7.17 (1H, s), 7.14 (2H, s), 7.12 (2H, m), 7.08 (2H, d), 7.07 (1H, s), 6.95 (2H, d), 6.90 (1H, s), 6.69 (1H, s), 6.66 (1H, s), 3.21-3.11 (4H, m), 2.40-2.11 (4H, m), 1.32 (9H, s) | 995.32 | 995.30 |
| 73 | 8.74 (1H, dd), 8.39 (1H, s), 7.99 (1H, s), 7.89 (1H, s), 7.77 (1H, s), 7.51 (4H, m), 7.46 (4H, d), 7.41 (2H, d), 7.40 (1H, s), 7.17 (1H, s), 7.14 (2H, s), 6.95 (2H, d), 6.90 (1H, s), 6.69 (1H, s), 6.66 (1H, s), 2.87-2.83 (4H, br), 2.75 (1H, s), 1.67-1.42 (4H, br), 1.65-1.55 (4H, br), 1.32 (9H, s) | 1105.27 | 1105.29 |
| 74 | 8.74 (1H, dd), 8.39 (1H, s), 8.19 (1H, s), 7.58 (1H, s), 7.50 (2H, d), 7.43 (4H, m), 7.41 (1H, s), 7.40 (1H, s), 7.20 (1H, s), 7.17 (1H, s), 7.14 (2H, s), 7.08 (2H, d), 7.07 (1H, s), 6.95 (2H, d), 6.90 (1H, s), 6.69 (1H, s), 6.66 (1H, s), 2.87-2.83 (4H, br), 2.75 (1H, s), 1.67-1.42 (4H, br), 1.65-1.55 (4H, br), 1.32 (9H, s) | 1024.14 | 1024.18 |
| 109 | 8.74 (1H, dd), 8.39 (1H, s), 7.99 (1H, s), 7.89 (1H, s), 7.77 (1H, s), 7.40 (1H, s), 7.25 (2H, d), 7.17 (1H, s), 7.14 (2H, s), 7.12 (4H, dd), 6.96 (2H, d), 6.95 (2H, d), 6.90 (1H, s), 6.76 (1H, s), 6.69 (1H, s), 6.66 (1H, s), 3.21-3.11 (8H, br), 2.40-2.15 (8H, br), 1.32 (9H, s) | 1143.32 | 1143.33 |
| 110 | 8.74 (1H, dd), 8.39 (1H, s), 8.19 (1H, s), 7.58 (1H, s), 7.50 (2H, d), 7.43 (4H, m), 7.41 (1H, s), 7.40 (1H, s), 7.20 (1H, s), 7.17 (1H, s), 7.14 (2H, s), 7.08 (2H, d), 7.07 (1H, s), 6.95 (2H, d), 6.90 (1H, s), 6.69 (1H, s), 6.66 (1H, s), 3.21-3.11 (8H, br), 2.40-2.15 (8H, br), 1.32 (9H, s) | 1062.19 | 1062.11 |
| 118 | 8.39 (1H, d), 8.19 (1H, d), 8.15 (1H, s), 8.02 (1H, s), 7.58 (1H, m), 7.50 (1H, d), 7.31 (1H, s), 7.25 (2H, dd), 7.20 (1H, s), 7.17 (1H, s), 7.12 (4H, m), 6.96 (2H, dd), 6.95 (2H, dd), 6.90 (1H, m), 6.69 (1H, s), 6.66 (1H, s), 3.21-3.11 (8H, m), 2.40-2.15 (8H, m) | 1006.09 | 1006.17 |

Evaluation Example 1

For Compounds 38, 47, 82, 101, 73, 74, 109, 110, 118, and C1 to C3, a highest occupied molecular orbital (HOMO) energy level and a lowest unoccupied molecular orbital (LUMO) energy level were evaluated according to the method described in Table 2, and the results are shown in Table 3.

For Compounds 38, 47, 82, 101, 73, 74, 109, 110, 118, and C1 to C3, a simulation maximum emission wavelength ($\lambda_{max}^{sim}$), an actual maximum emission wavelength ($\lambda_{max}^{exp}$), and an existence ratio of triplet metal-to-ligand charge transfer state ($^3$MLCT) were evaluated by using a density functional theory (DFT) method of the Gaussian program which is structure-optimized at the B3LYP/6-31 G(d,p) level, and the results are shown in Table 3.

TABLE 2

| | |
|---|---|
| HOMO energy level evaluation method | By using cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and from the oxidation onset of the graph, the HOMO energy level of each compound was calculated. |
| LUMO energy level evaluation method | By using cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and from the reduction onset of the graph, the LUMO energy level of each compound was calculated. |

TABLE 3

| Compound No. | HOMO (eV) | LUMO (eV) | $\lambda_{max}^{sim}$ (nm) | $\lambda_{max}^{exp}$ (nm) | $^3$MLCT(%) |
|---|---|---|---|---|---|
| 38 | −4.98 | −1.47 | 460 | 455 | 13.10 |
| 47 | −4.98 | −1.47 | 465 | 455 | 13.22 |
| 82 | −4.97 | −1.44 | 455 | 454 | 13.84 |
| 101 | −4.98 | −1.45 | 454 | 456 | 13.11 |
| 73 | −4.98 | −1.47 | 455 | 456 | 13.11 |
| 74 | −4.99 | −1.48 | 455 | 455 | 13.11 |
| 109 | −4.98 | −1.44 | 454 | 455 | 13.08 |
| 110 | −4.97 | −1.48 | 467 | 455 | 13.55 |
| 118 | −4.80 | −1.57 | 471 | 469 | 13.08 |
| C1 | −4.76 | −1.61 | 465 | 460 | 10.20 |
| C2 | −4.81 | −1.48 | 467 | 460 | 11.80 |
| C3 | −4.74 | −1.46 | 465 | 460 | 10.55 |

Referring to Table 3, Compounds 38, 47, 82, 101, 73, 74, 109, 110, and 118 had deep HOMO energy levels compared to Compounds C1 to C3, emitted blue light having color purity equivalent to or higher than that of Compounds C1 to C3, and had a high existence ratio of the $^3$MLCT, compared to Compounds C1 to C3.

Example 1

As an anode, a glass substrate (product of Corning Inc.) with a 15 Ω/$cm^2$ (1,200 Å) ITO formed thereon was cut to a size of 50 mm×50 mm×0.7 mm, sonicated by using isopropyl alcohol and pure water each for 5 minutes, washed by irradiation of ultraviolet rays and exposure of ozone thereto for 30 minutes, and mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred to as NPB) was vacuum-deposited on the hole injection layer to form a hole transport layer having a thickness of 300 Å.

Compound 38 (organometallic compound), Compound ETH85 (second compound), and Compound HTH29 (third compound) were vacuum-deposited on the hole transport layer to form an emission layer having a thickness of 400 Å. An amount of Compound 38 was about 10 wt % based on a total weight (100 wt %) of the emission layer, and a weight ratio of Compound ETH85 to Compound HTH29 was adjusted to be 3:7.

Compound ETH2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and Al was vacuum-deposited thereon to form a cathode having a thickness of 3,000 Å, thereby completing the manufacture of an organic light-emitting device:

2-TNATA

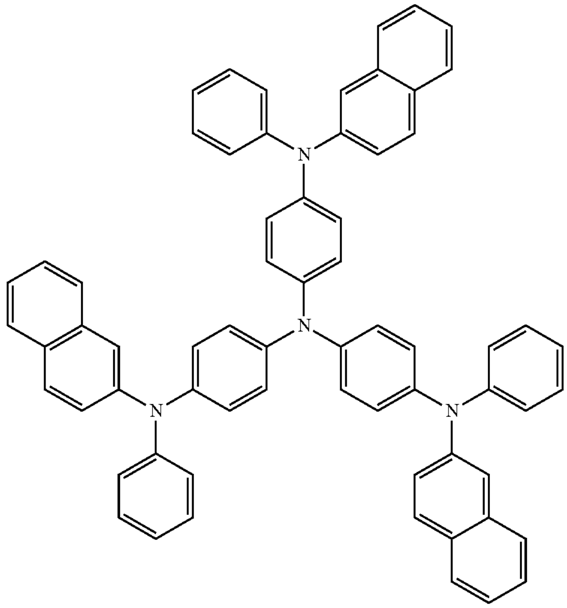

-continued

NPB

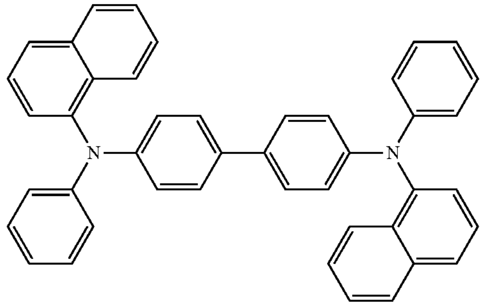

ETH85

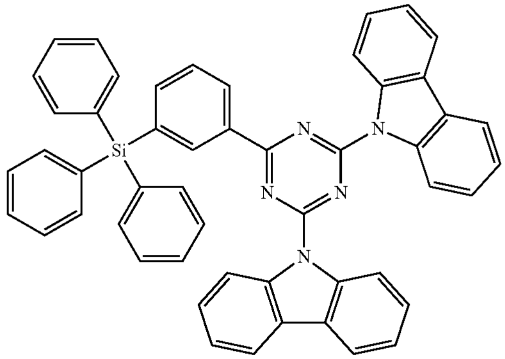

HTH29

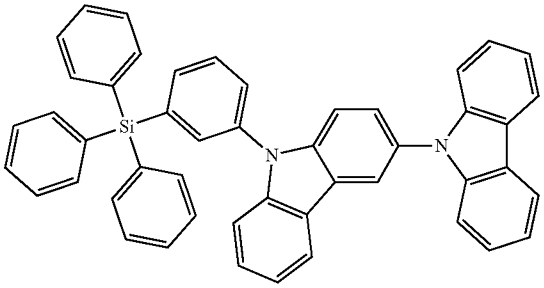

HTH41

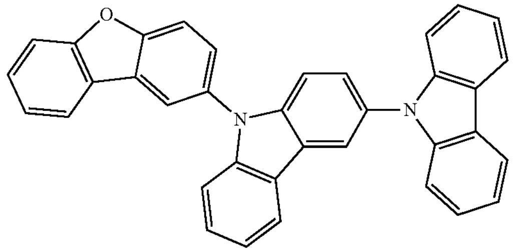

ETH2

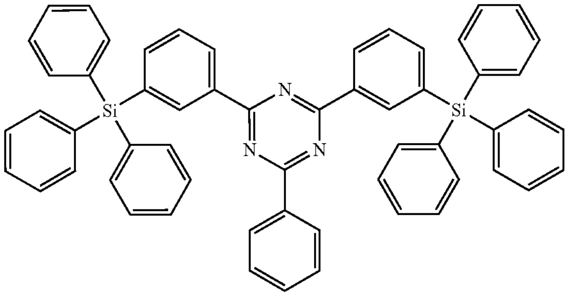

Examples 2 to 10 and Comparative Examples 1 to 3

Organic light-emitting devices were manufactured in a same manner as used in Example 1, except that, in forming the emission layer, compounds shown in Table 4 were used. An amount of the fourth compound (DFD1) in Example 10 was adjusted to be about 0.5 wt % based on a total weight (100 wt %) of the emission layer:

DFD1

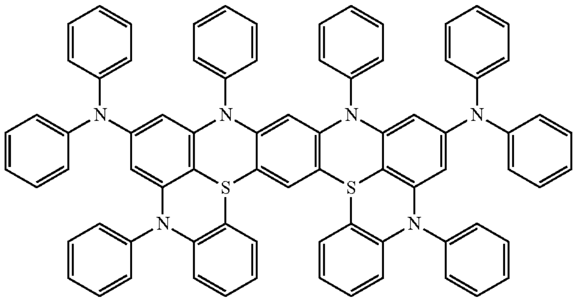

Evaluation Example 2

For the organic light-emitting devices manufactured in Examples 1 to 10 and Comparative Examples 1 to 3, a driving voltage (V) at 1,000 cd/$m^2$, luminescence efficiency (cd/A), and a lifespan ($T_{95}$) were each measured by using Keithley MU 236 and luminance meter PR650, and results thereof are shown in Table 4.

In Table 4, the lifespan ($T_{95}$) is a measure of the time (hr) taken until the luminance declines to 95% of the initial luminance.

TABLE 4

| No. | Organometallic compound | Second compound | Third compound | Weight ratio of second compound to third compound | Fourth compound | Luminance (cd/$m^2$) | Driving voltage (V) | Lumin-escence efficiency (cd/A) | Lifespan ($T_{95}$, hr) |
|---|---|---|---|---|---|---|---|---|---|
| Example 1 | Compound 38 (10 wt %) | ETH85 | HTH29 | 3:7 | — | 1,000 | 4.6 | 52.3 | 63 |
| Example 2 | Compound 47 (10 wt %) | ETH85 | HTH29 | 3:7 | — | 1,000 | 4.6 | 50.2 | 60 |
| Example 3 | Compound 82 (10 wt %) | ETH85 | HTH29 | 3:7 | — | 1,000 | 4.6 | 50.3 | 65 |
| Example 4 | Compound 101 (10 wt %) | ETH85 | HTH29 | 3:7 | — | 1,000 | 4.6 | 52.1 | 63 |
| Example 5 | Compound 73 (10 wt %) | ETH85 | HTH29 | 3:7 | — | 1,000 | 4.6 | 52.1 | 63 |
| Example 6 | Compound 74 (10 wt %) | ETH85 | HTH29 | 3:7 | — | 1,000 | 4.6 | 50.1 | 60 |
| Example 7 | Compound 109 (10 wt %) | ETH85 | HTH29 | 3:7 | — | 1,000 | 4.7 | 52.1 | 61 |
| Example 8 | Compound 110 (10 wt %) | ETH85 | HTH29 | 3:7 | — | 1,000 | 4.6 | 52.1 | 65 |
| Example 9 | Compound 118 (10 wt %) | ETH85 | HTH29 | 3:7 | — | 1,000 | 4.6 | 53.0 | 75 |
| Example 10 | Compound 38 (10 wt %) | ETH85 | HTH29 | 3:7 | DFD1 (0.5 wt %) | 1,000 | 4.6 | 87.0 | 98 |
| Comparative Example 1 | Compound C1 (10 wt %) | ETH85 | HTH29 | 3:7 | | 1,000 | 5.0 | 22.3 | 31 |

TABLE 4-continued
| No. | Organometallic compound | Second compound | Third compound | Weight ratio of second compound to third compound | Fourth compound | Luminance ($cd/m^2$) | Driving voltage (V) | Lumin-escence efficiency (cd/A) | Lifespan ($T_{95}$, hr) |
|---|---|---|---|---|---|---|---|---|---|
| Comparative Example 2 | Compound C2 (10 wt %) | ETH85 | HTH29 | 3:7 | — | 1,000 | 4.9 | 45.1 | 45 |
| Comparative Example 3 | Compound C3 (10 wt %) | ETH85 | HTH29 | 3:7 | — | 1,000 | 4.9 | 40.0 | 47 |
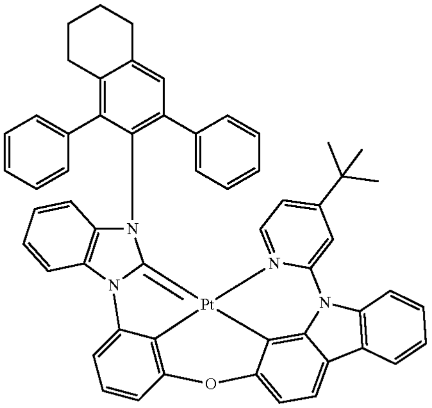
38
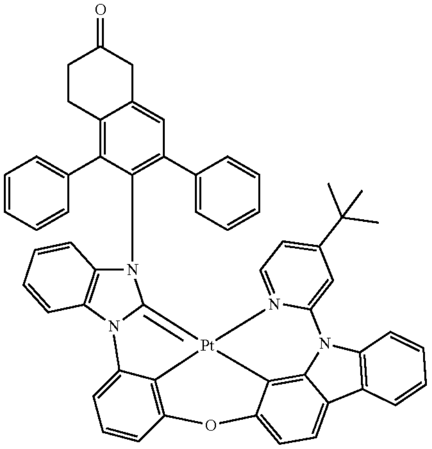
47
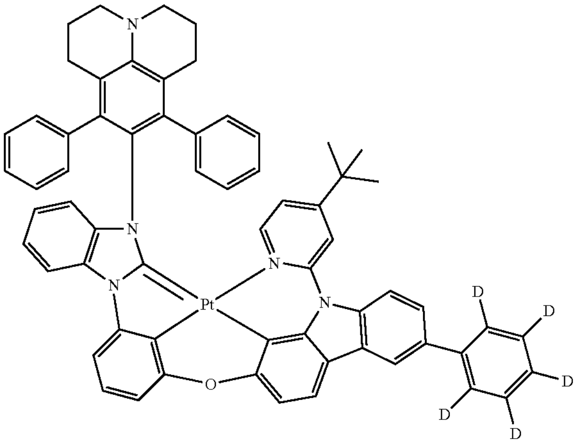
82

TABLE 4-continued
| No. | Organometallic compound | Second compound | Third compound | Weight ratio of second compound to third compound | Fourth compound | Luminance (cd/m$^2$) | Driving voltage (V) | Lumin-escence efficiency (cd/A) | Lifespan ($T_{95}$, hr) |
|---|---|---|---|---|---|---|---|---|---|
| | 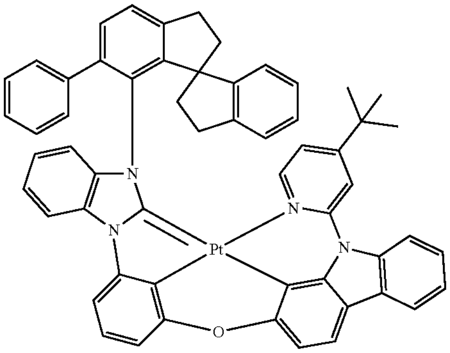 101 | | | | | | | | |
| | 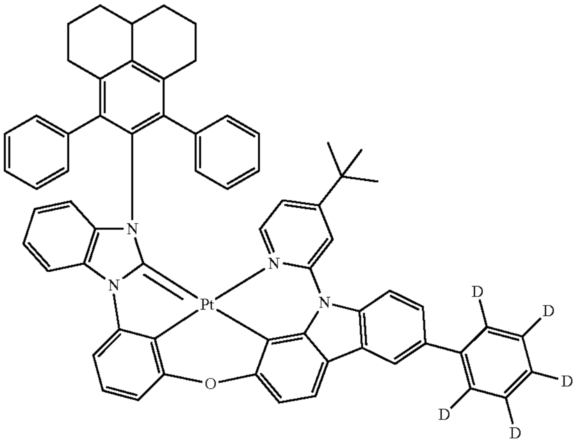 73 | | | | | | | | |
| | 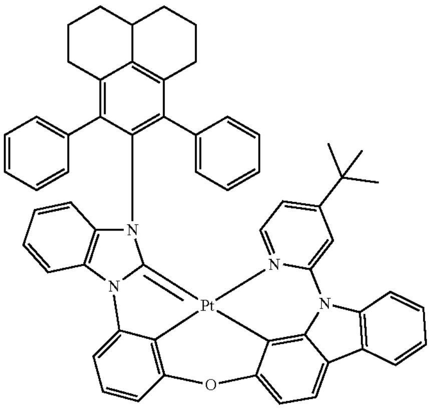 74 | | | | | | | | |

TABLE 4-continued
| No. | Organometallic compound | Second compound | Third compound | Weight ratio of second compound to third compound | Fourth compound | Luminance (cd/m$^2$) | Driving voltage (V) | Lumin-escence efficiency (cd/A) | Lifespan ($T_{95}$, hr) |
|---|---|---|---|---|---|---|---|---|---|
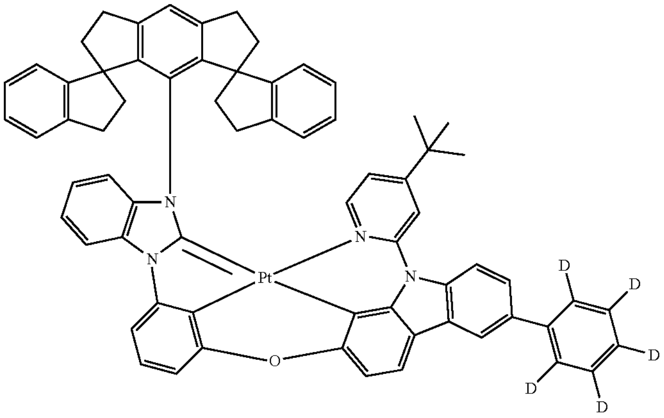
109
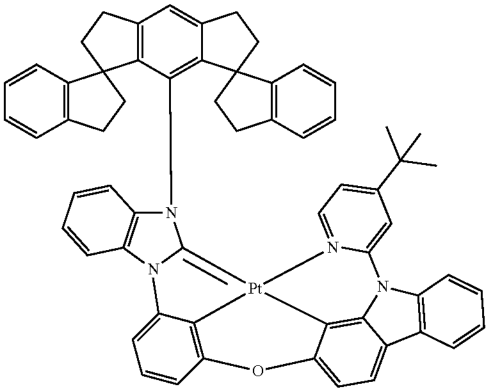
110
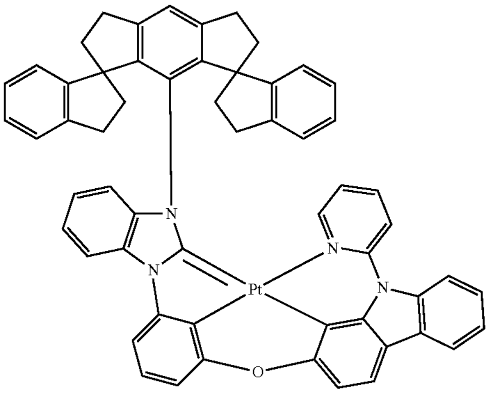
118

TABLE 4-continued
| No. | Organometallic compound | Second compound | Third compound | Weight ratio of second compound to third compound | Fourth compound | Luminance ($cd/m^2$) | Driving voltage (V) | Luminescence efficiency (cd/A) | Lifespan ($T_{95}$, hr) |
|---|---|---|---|---|---|---|---|---|---|
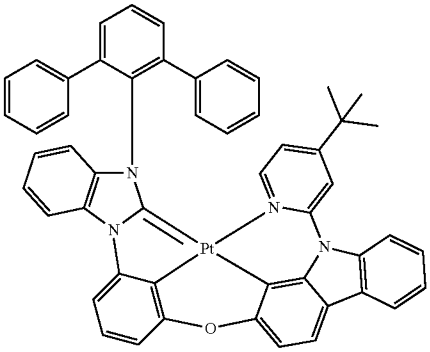
C1
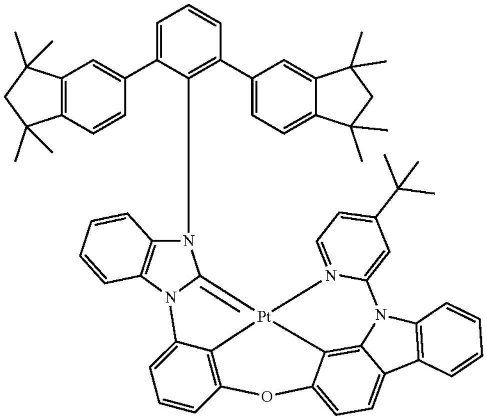
C2
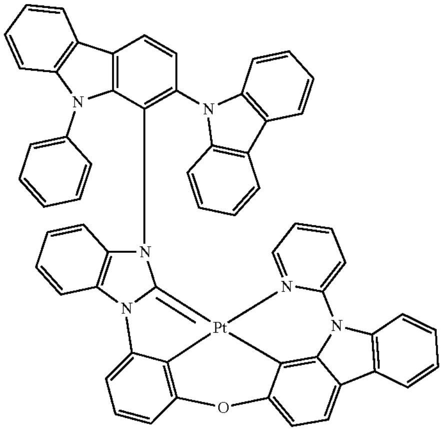
C3

Referring to Table 4, it was confirmed that the organic light-emitting devices of Examples 1 to 10 had lower driving voltage, higher luminescence efficiency, and better lifespan characteristics than those of the organic light-emitting devices of Comparative Examples 1 to 3.

According to the embodiments, a light-emitting device including an organometallic compound may have low driving voltage, high luminescence efficiency, and a long lifespan, and thus, may be used to manufacture a high-quality electronic apparatus having excellent luminescence efficiency and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode;

an interlayer between the first electrode and the second electrode and comprising an emission layer; and an organometallic compound represented by Formula 1:

[Formula 1]

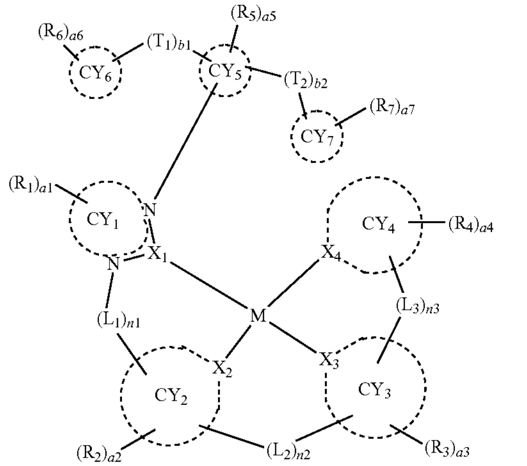

wherein in Formula 1,

M is platinum (Pt), palladium (Pd), gold (Au), nickel (Ni), silver (Ag), or copper (Cu), $X_1$ is C, $X_2$ to $X_4$ are each independently C or N, a bond between $X_1$ and M is a coordinate bond, one of a bond between $X_2$ and M, a bond between $X_3$ and M, and a bond between $X_4$ and M is a coordinate bond, and the remainder thereof are each a covalent bond, ring $CY_1$ is a $C_1$-$C_{60}$ nitrogen-containing heterocyclic group comprising two N atoms as ring-forming atoms and $X_1$, ring $CY_2$ to ring $CY_7$ are each independently a $C_3$-$C_{60}$ carbocyclic group or a $C_1$-$C_{60}$ heterocyclic group, $L_1$ to $L_3$ are each independently a single bond, *—C($R_8$)($R_9$)—*', *—C($R_8$)=*', *=C($R_8$)—*', *—C($R_8$)=C($R_9$)—*', *—C(=O)—*', *—C(=S)—*'*—C≡C—*'*—B($R_8$)—*', *—N($R_8$)—*', *—O—*'*—P($R_8$)—*', *—Si($R_8$)($R_9$)—*', *—P(=O)($R_8$)—*', *—S—*'*—S(=O)—*', *—S(=O)$_2$—*' or *—Ge($R_8$)($R_9$)—*', n1 to n3 are each independently an integer from 1 to 3, $T_1$ is a single bond, *—C($Z_1$)($Z_2$)—*', *—Si($Z_1$)($Z_2$)—*', *—B($Z_1$)—*', *—N($Z_1$)—*', or *—P($Z_1$)—*', but is not *—N(Ph)-*', $T_2$ is a single bond, *—C($Z_3$)($Z_4$)—*', *—Si($Z_3$)($Z_4$)—*', *—B($Z_3$)—*', *—N($Z_3$)—*', or *—P($Z_3$)—*', but is not *—N(Ph)-*',

* and *' each indicate a binding site to a neighboring atom,

Ph is a phenyl group, b1 and b2 are each independently 1, 2, or 3, $R_1$ to $R_9$ and $Z_1$ to $Z_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a divalent carbon atom among $R_1$ to $R_9$ and $Z_1$ to $Z_4$ is optionally substituted with *—C(=O)—*' or *—C(=S)—*', a1 to a7 are each independently an integer from 0 to 20, at least one of Conditions a to c is satisfied:

[Condition a]

two or more $R_5$(s) are connected to each other to form ring W, wherein ring W is a ring condensed with ring $CY_5$;

[Condition b]

$T_1$ is not a single bond, and at least one of $Z_1$ and $Z_2$ is connected to at least one of ring $CY_5$ and ring $CY_6$ to form ring W, wherein ring W is a ring condensed with at least one of ring $CY_5$ and ring $CY_6$;

[Condition c]

$T_2$ is not a single bond, and at least one of $Z_3$ and $Z_4$ is connected to at least one of ring $CY_5$ and ring $CY_7$ to form ring W, wherein ring W is a ring condensed with at least one of ring $CY_5$ and ring $CY_7$, wherein ring W is a $C_3$-$C_{30}$ non-aromatic carbocyclic group unsubstituted or substituted with at least one $R_{10a}$ or a $C_1$-$C_{30}$ non-aromatic heterocyclic group unsubstituted or substituted with at least one $R_{10a}$, and a ring-forming divalent carbon atom of ring W is optionally substituted with *—C(=O)—*' or *—C(=S)—*', in Formula 1, each of: two or more of $R_1$(s) in the number of a1; two or more of $R_2$(s) in the number of a2; two or more of $R_3$(s) in the number of a3; two or more of $R_4$(s) in the number of a4; two or more of $R_6$(s) in the number of a6; two or more of $R_7$(s) in the number of a7; and $R_8$ and $R_9$ are optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ are optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, further comprising:

a second compound including at least one π electron-deficient nitrogen-containing $C_1$-$C_{60}$ cyclic group, a third compound including a group represented by Formula 3, a fourth compound that is a delayed fluorescence compound, or a combination thereof, wherein the organometallic compound, the second compound, the third compound, and the fourth compound are different from each other:

[Formula 3]

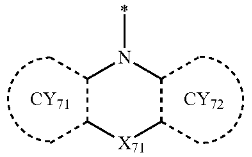

wherein in Formula 3, ring CY71 and ring CY72 are each independently a π electron-rich $C_3$-$C_{60}$ cyclic group or a pyridine group, $X_{71}$ is: a single bond; or a linking group comprising O, S, N, B, C, Si, or a combination thereof, and

* indicates a binding site to a neighboring atom in the third compound.

3. The light-emitting device of claim 2, wherein the second compound comprises a pyridine group, a pyrimidine group, a pyrazine group, a pyridazine group, a triazine group, or a combination thereof.

4. The light-emitting device of claim 2, wherein the emission layer comprises:

a first compound which is the organometallic compound; and the second compound, the third compound, the fourth compound, or a combination thereof.

5. The light-emitting device of claim 1, wherein the emission layer emits blue light, and the blue light has a maximum emission wavelength in a range of about 410 nm to about 500 nm.

6. An electronic apparatus comprising the light-emitting device of claim 1.

7. The electronic apparatus of claim 6, further comprising:

a thin-film transistor, wherein the thin-film transistor comprises a source electrode and a drain electrode, and the first electrode of the light-emitting device is electrically connected to at least one of the source electrode and the drain electrode.

8. The electronic apparatus of claim 7, further comprising:

a color filter, a color conversion layer, a touch screen layer, a polarizing layer, or a combination thereof.

9. An electronic equipment comprising the light-emitting device of claim 1, wherein the electronic equipment is a flat panel display, a curved display, a computer monitor, a medical monitor, a television, an advertisement board, an indoor light, an outdoor light, a signal light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3D display, a virtual reality display, an augmented reality display, a vehicle, a video wall including multiple displays tiled together, a theater screen, a stadium screen, a phototherapy device, or a sign.

10. An organometallic compound represented by Formula 1:

[Formula 1]

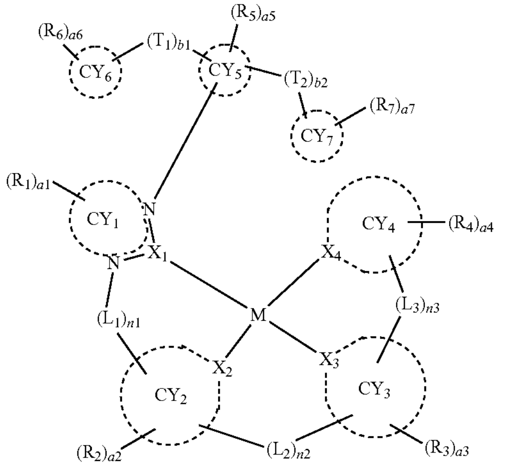

wherein in Formula 1,

M is platinum (Pt), palladium (Pd), gold (Au), nickel (Ni), silver (Ag), or copper (Cu), $X_1$ is C, $X_2$ to $X_4$ are each independently C or N, a bond between $X_1$ and M is a coordinate bond, one of a bond between $X_2$ and M, a bond between $X_3$ and M, and a bond between $X_4$ and M is a coordinate bond, and the remainder thereof are each a covalent bond, ring $CY_1$ is a $C_1$-$C_{60}$ nitrogen-containing heterocyclic group comprising two N atoms as ring-forming atoms and $X_1$, ring $CY_2$ to ring $CY_7$ are each independently a $C_3$-$C_{60}$ carbocyclic group or a $C_1$-$C_{60}$ heterocyclic group, $L_1$ to $L_3$ are each independently a single bond, *—C($R_8$)($R_9$)—*', *—C($R_8$)=*', *=C($R_8$)—*', *—C($R_8$)=C($R_9$)—*', *—C(=O)—*', *—C(=S)—*'*—C≡C—*'*—B($R_8$)—*', *—N($R_8$)—*', *—O *'*—P($R_8$)—*', *—Si($R_8$)($R_9$)—*', *—P(=O)($R_8$)—*', *—S—*'*—S(=O)—*', *—S(=O)$_2$—*' or *—Ge($R_8$)($R_9$)—*', n1 to n3 are each independently an integer from 1 to 3, $T_1$ is a single bond, *—C($Z_1$)($Z_2$)—*', *—Si($Z_1$)($Z_2$)—*', *—B($Z_1$)—*', *—N($Z_1$)—*', or *—P($Z_1$)—*', but is not *—N(Ph)-*', $T_2$ is a single bond, *—C($Z_3$)($Z_4$)—*', *—Si($Z_3$)($Z_4$)—*', *—B($Z_3$)—*', *—N($Z_3$)—*', or *—P($Z_3$)—*', but is not *—N(Ph)-*',

* and *' each indicate a binding site to a neighboring atom,

Ph is a phenyl group, b1 and b2 are each independently 1, 2, or 3, $R_1$ to $R_9$ and $Z_1$ to $Z_4$ are each independently hydrogen, deuterium, —F, —Cl, —Br, —I, a hydroxyl group, a cyano group, a nitro group, a $C_1$-$C_{60}$alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a divalent carbon atom among $R_1$ to $R_9$ and $Z_1$ to $Z_4$ is optionally substituted with *—C(=O)—*' or *—C(=S)—*', a1 to a7 are each independently an integer from 0 to 20, at least one of Conditions a to c is satisfied:

[Condition a]

two or more $R_5$(s) are connected to each other to form ring W, wherein ring W a ring condensed with ring CY5;

[Condition b]

$T_1$ is not a single bond, and at least one of $Z_1$ and $Z_2$ is connected to at least one of ring $CY_5$ and ring $CY_6$ to form ring W, wherein ring W is a ring condensed with at least one of ring $CY_5$ and ring $CY_6$;

[Condition c]

$T_2$ is not a single bond, and at least one of $Z_3$ and $Z_4$ is connected to at least one of ring $CY_5$ and ring $CY_7$ to form ring W, wherein ring W is a ring condensed with at least one of ring $CY_5$ and ring $CY_7$, wherein ring W is a $C_3$-$C_{30}$ non-aromatic carbocyclic group unsubstituted or substituted with at least one $R_{10a}$ or a $C_1$-$C_{30}$ non-aromatic heterocyclic group unsubstituted or substituted with at least one $R_{10a}$, and a ring-forming divalent carbon atom of ring W is optionally substituted with *—C(=O)—*' or *—C(=S)—*', in Formula 1, each of: two or more of $R_1$(s) in the number of a1; two or more of $R_2$(s) in the number of a2; two or more of $R_3$(s) in the number of a3; two or more of $R_4$(s) in the number of a4; two or more of $R_6$(s) in the number of a6; two or more of $R_7$(s) in the number of a7; and $R_8$ and $R_9$ are optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ are optionally linked to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or a combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

11. The organometallic compound of claim 10, wherein M is Pt.

12. The organometallic compound of claim 10, wherein ring $CY_1$ is an imidazole group, a triazole group, an oxadiazole group, a thiadiazole group, a benzimidazole group, an imidazopyridine group, a furoimidazole group, a thienoimidazole group, an imidazopyrimidine group, an imidazopyrazine group, an imidazopyridazine group, a benzoxadiazole group, or a benzothiadiazole group.

13. The organometallic compound of claim 10, wherein ring $CY_2$ to ring $CY_7$ are each independently a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, an imidazopyridazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

14. The organometallic compound of claim 10, wherein $L_1$ to $L_3$ are each independently a single bond, *—C($R_8$)($R_9$)—*', *—B($R_8$)—*', *—N($R_8$)—*', *—O—*', *—P($R_8$)—*', *—Si($R_8$)($R_9$)—*', *—S—*', or *—Ge($R_8$)($R_9$)—*'.

15. The organometallic compound of claim 10, wherein $T_1$ is a single bond, *—C($Z_1$)($Z_2$)—*', or *—Si($Z_1$)($Z_2$)—*', and $T_2$ is a single bond, *—C($Z_3$)($Z_4$)—*', or *—Si($Z_3$)($Z_4$)—*'.

16. The organometallic compound of claim 10, wherein at least one of Conditions 1 to 4 is satisfied:

[Condition 1]

in Formula 1, a moiety represented by

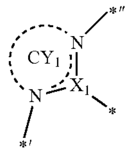

is a moiety represented by one of Formulae CY1-1 to CY1-13:

CY1-1

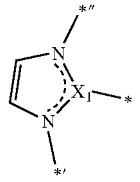

CY1-2

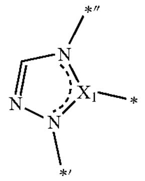

CY1-3

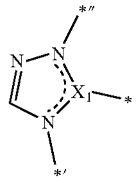

CY1-4

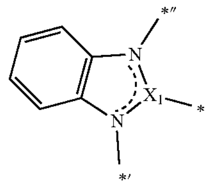

CY1-5

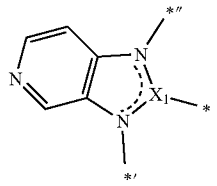

-continued
CY1-6
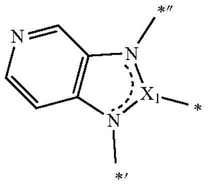
CY1-7
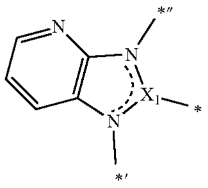
CY1-8
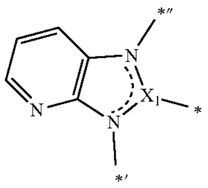
CY1-9
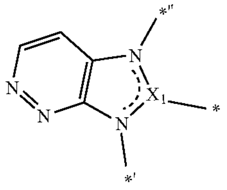
CY1-10
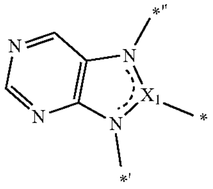
CY1-11
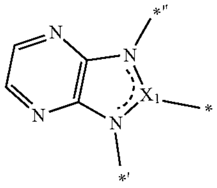
CY1-12
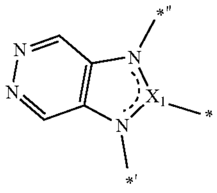
-continued
CY1-13
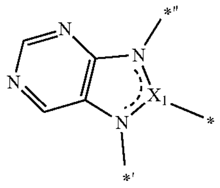
wherein in Formulae CY1-1 to CY1-13,
$X_1$ is as defined in Formula 1,
* indicates a binding site to M in Formula 1,
*' indicates a binding site to $(L_1)_{n1}$ in Formula 1, and
*" indicates a binding site to ring $CY_5$ in Formula 1;
[Condition 2]
in Formula 1, a moiety represented by
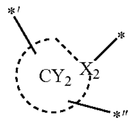
is a moiety represented by one of Formulae CY2-1 to CY2-23:
CY2-1
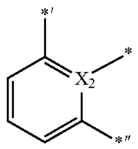
CY2-2
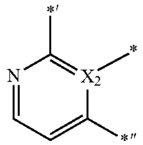
CY2-3
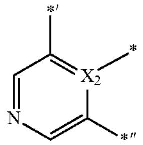
CY2-4
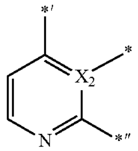
CY2-5
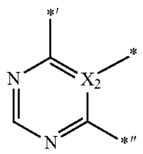

-continued
CY2-6
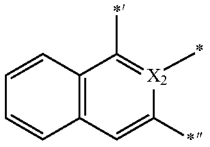
CY2-7
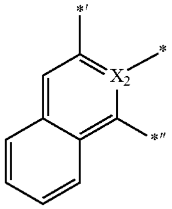
CY2-8
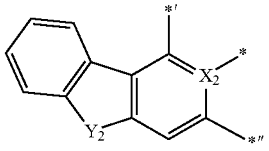
CY2-9
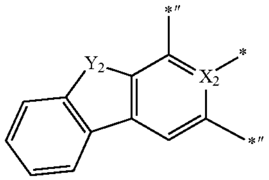
CY2-10
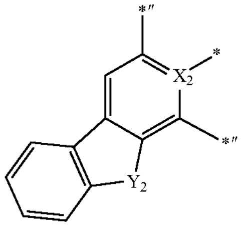
CY2-11
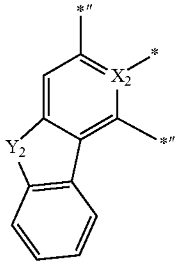
CY2-12
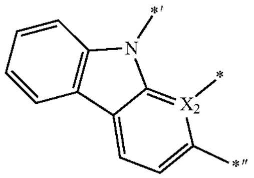
CY2-13
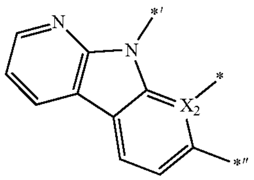
-continued
CY2-14
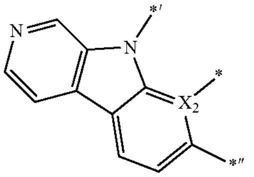
CY2-15
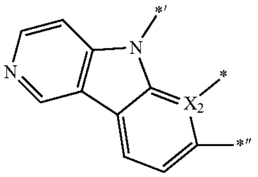
CY2-16
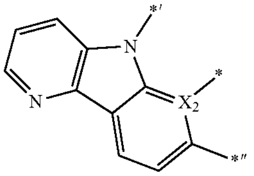
CY2-17
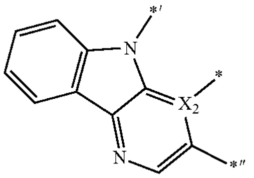
CY2-18
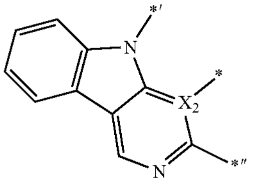
CY2-19
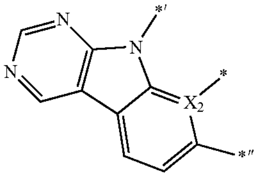
CY2-20
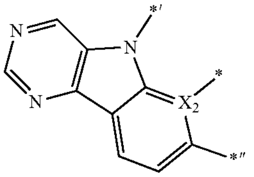
CY2-21
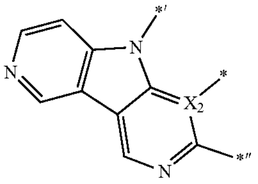

-continued
CY2-22
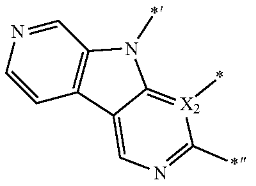
CY2-23
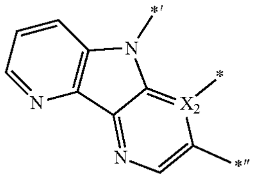
wherein in Formulae CY2-1 to CY2-23,
$X_2$ is as defined in Formula 1,
$Y_2$ comprises O, S, N, C, or Si,
* indicates a binding site to M in Formula 1,
*' indicates a binding site to $(L_1)_{n1}$ in Formula 1, and
*" indicates a binding site to $(L_2)_{n2}$ in Formula 1;
[Condition 3]
in Formula 1, a moiety represented by
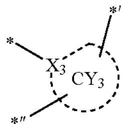
is a moiety represented by one of Formulae CY3-1 to CY3-23:
CY3-1
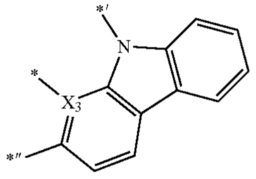
CY3-2
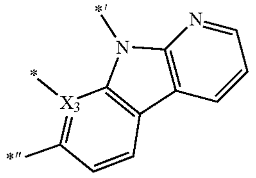
CY3-3
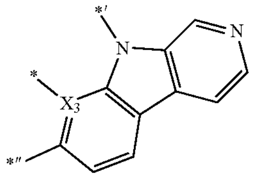
-continued
CY3-4
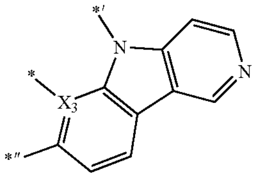
CY3-5
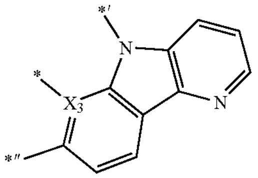
CY3-6
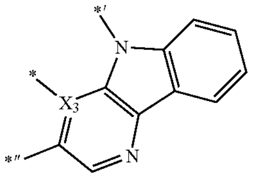
CY3-7
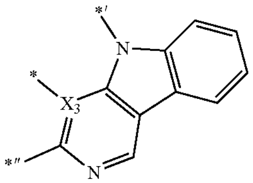
CY3-8
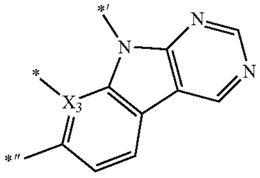
CY3-9
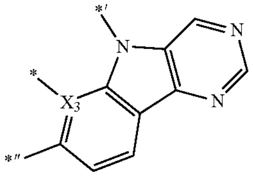
CY3-10
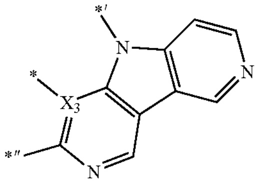
CY3-11
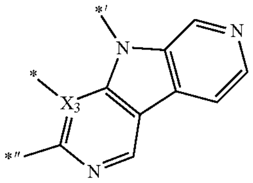

-continued

CY3-12

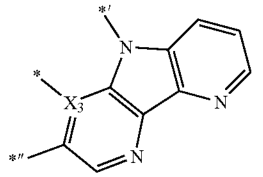

CY3-13

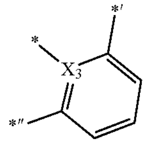

CY3-14

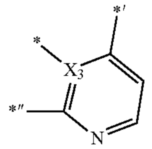

CY3-15

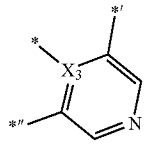

CY3-16

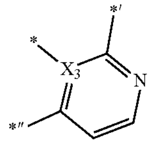

CY3-17

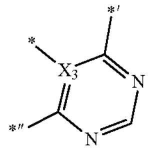

CY3-18

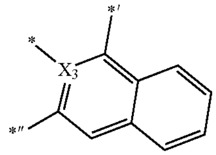

CY3-19

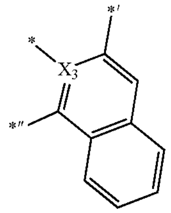

CY3-20

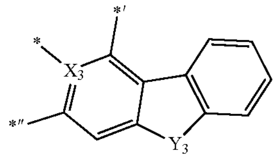

-continued

CY3-21

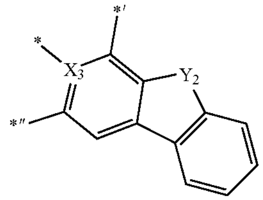

CY3-22

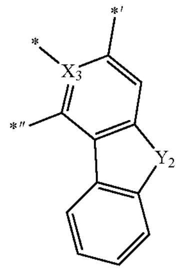

CY3-23

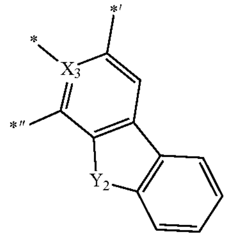

wherein in Formulae CY3-1 to CY3-23, $X_3$ is as defined in Formula 1, $Y_3$ comprises O, S, N, C, or Si,

* indicates a binding site to M in Formula 1,

*' indicates a binding site to $(L_3)_{n3}$ in Formula 1, and

*" indicates a binding site to $(L_2)_{n2}$ in Formula 1; and

[Condition 4]

in Formula 1, a moiety represented by

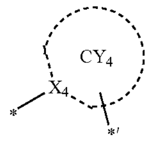

is a moiety represented by one of Formulae CY4-1 to CY4-6:

CY4-1

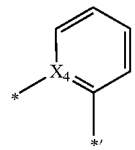

CY4-2

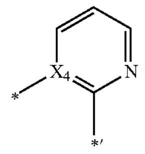

-continued

CY4-3

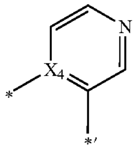

CY4-4

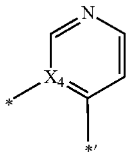

CY4-5

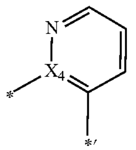

CY4-6

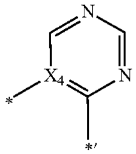

wherein in Formulae CY4-1 to CY4-6, $X_4$ is as defined in Formula 1,

* indicates a binding site to M in Formula 1, and

*' indicates a binding site to $(L_3)_{n3}$ in Formula 1.

17. The organometallic compound of claim 10, wherein in Formula 1, a moiety represented by

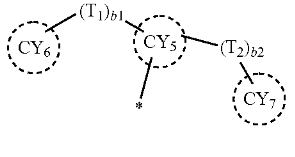

is a moiety represented by Formula CY5A:

CY5A

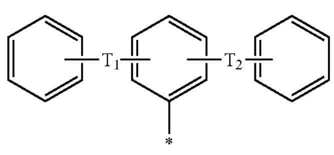

wherein in Formula CY5A, $T_1$ and $T_2$ are each as defined in Formula 1, and

* indicates a binding site to a neighboring atom.

18. The organometallic compound of claim 10, wherein ring W is a cyclobutane group, a cyclopentane group, a cyclohexane group, a cycloheptane group, a cyclooctane group, an adamantane group, a norbornane group, a bicyclo[1.1.1]pentane group, a bicyclo[2.1.1]hexane group, a bicyclo[2.2.2]octane group, a cyclopentene group, a cyclohexene group, a cycloheptane group, a cyclopentadiene group, a 1,2,3,4-tetrahydronaphthalene group, a decahydronaphthalene group, an octahydropentalene group, an indene group, an octahydro-1H-indene group, a benzosilole group, a benzogermole group, an azaindene group, an azabenzosilole group, an azabenzogermole group, a cyclopentanone group, a cyclopentanethione group, a cyclohexanone group, a cyclohexanethione group, a hexahydro-1H-indene-2,4-dione group, an octahydronaphthalene-1,7-dione group, a hexahydronaphthalene-1,6(2H,7H)-dione group, an octahydro-1H-quinolizine group, an octahydroindolizine group, a hexahydro-1H-pyrrolizine group, a decahydroquinoline group, a decahydroisoquinoline group, an octahydro-1H-indole group, a spiro[4.4]nonane group, a spiro[4.5]decane group, a spiro[5.5]undecane group, a 5,6,7,8-tetrahydroisoquinoline group, or a 5,6,7,8-tetrahydroquinoline group, each unsubstituted or substituted with at least one $R_{10a}$.

19. The organometallic compound of claim 10, wherein in Formula 1, a moiety represented by

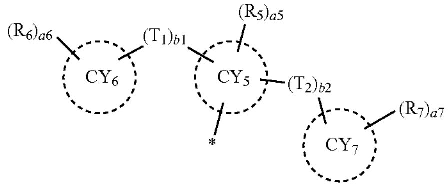

is a moiety represented by one of Formulae W1-1 to W1-7:

W1-1

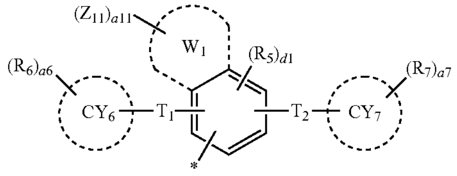

W1-2

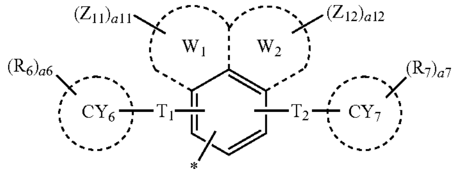

W1-3

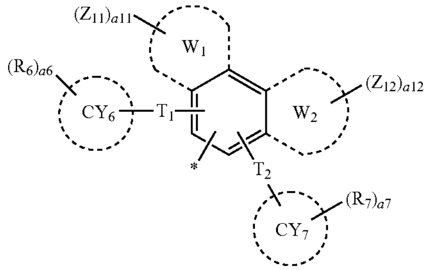

W1-4

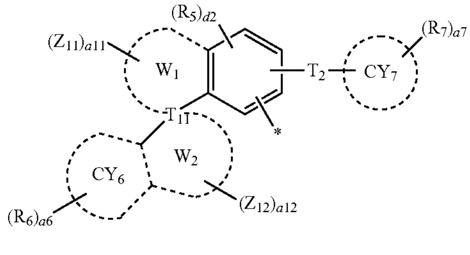

-continued

W1-5

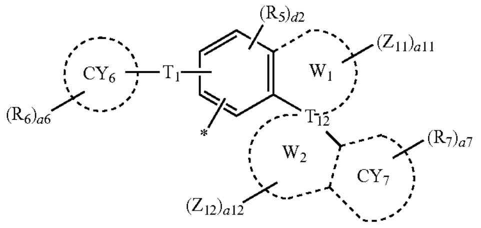

W1-6

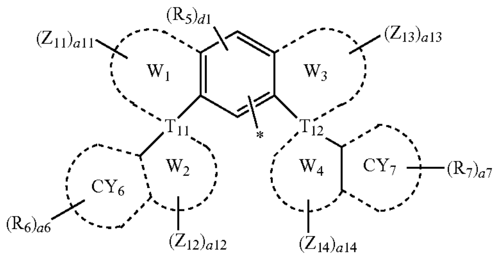

W1-7

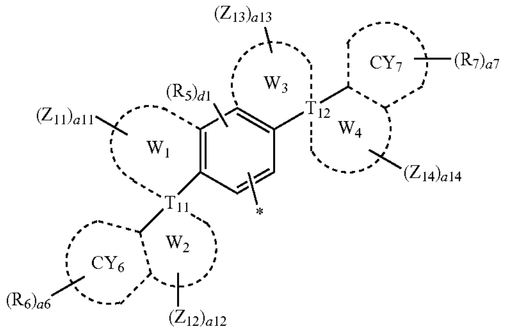

wherein in Formulae W1-1 to W1-7, $CY_6$, $CY_7$, $R_5$ to $R_7$, a6, a7, $T_1$, and $T_2$ are each as defined in Formula 1, $T_{11}$ and $T_{12}$ are each independently C or Si, ring $W_1$ to ring $W_4$ are each independently a $C_3$-$C_{30}$ non-aromatic carbocyclic group or a $C_1$-$C_{30}$ non-aromatic heterocyclic group, $Z_{11}$ to $Z_{14}$ are each independently the same as defined in connection with $R_5$, a11 to a14 are each independently an integer from 0 to 10, d1 is 0 or 1, d2 is an integer from 0 to 2, and

* indicates a binding site to a neighboring atom.

20. The organometallic compound of claim 10, wherein the organometallic compound is represented by Formula 1-1 or Formula 1-2:

[Formula 1-1]

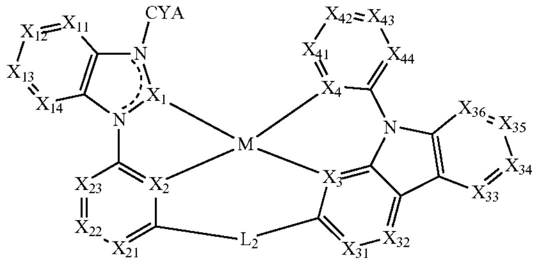

[Formula 1-2]

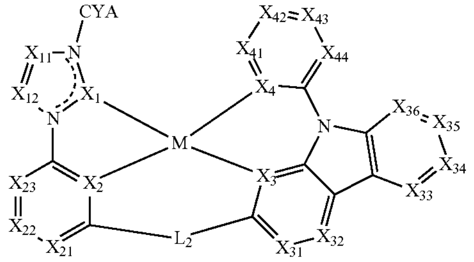

wherein in Formulae 1-1 and 1-2,

M, $X_1$ to $X_4$, and $L_2$ are each as defined in Formula 1,

CYA is a moiety represented by

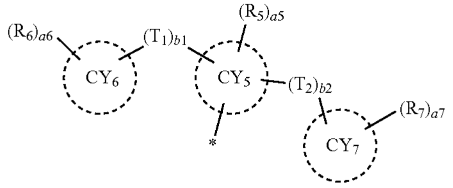

in Formula 1, $X_{11}$ is $C(R_{11})$ or N, $X_{12}$ is $C(R_{12})$ or N, $X_{13}$ is $C(R_{13})$ or N, $X_{14}$ is $C(R_{14})$ or N, $R_{11}$ to $R_{14}$ are each independently the same as defined in connection with $R_1$, two or more of $R_{11}$ to $R_{14}$ are optionally bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{21}$ is $C(R_{21})$ or N, $X_{22}$ is $C(R_{22})$ or N, $X_{23}$ is $C(R_{23})$ or N, $R_{21}$ to $R_{23}$ are each independently the same as defined in connection with $R_2$, two or more of $R_{21}$ to $R_{23}$ are optionally bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, $X_{36}$ is $C(R_{36})$ or N, $R_{31}$ to $R_{36}$ are each independently the same as defined in connection with $R_3$, two or more of $R_{31}$ to $R_{36}$ are optionally bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{41}$ is $C(R_{41})$ or N, $X_{42}$ is $C(R_{42})$ or N, $X_{43}$ is $C(R_{43})$ or N, $X_{44}$ is $C(R_{44})$ or N, $R_{41}$ to $R_{44}$ are each independently the same as defined in connection with $R_4$, and two or more of $R_{41}$ to $R_{44}$ are optionally bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

* * * * *